US011245419B2

(12) United States Patent
Shinohara

(10) Patent No.: US 11,245,419 B2
(45) Date of Patent: Feb. 8, 2022

(54) TRANSMISSION METHOD AND RECEPTION DEVICE

(71) Applicant: SONY CORPORATION, Tokyo (JP)

(72) Inventor: Yuji Shinohara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 47 days.

(21) Appl. No.: 16/638,854

(22) PCT Filed: Aug. 8, 2018

(86) PCT No.: PCT/JP2018/029736

§ 371 (c)(1),
(2) Date: Feb. 13, 2020

(87) PCT Pub. No.: WO2019/039284

PCT Pub. Date: Feb. 28, 2019

(65) Prior Publication Data

US 2021/0075445 A1 Mar. 11, 2021

(30) Foreign Application Priority Data

Aug. 22, 2017 (JP) ............................ JP2017-159737

(51) Int. Cl.
*H03M 13/11* (2006.01)
*H04L 1/00* (2006.01)
(Continued)

(52) U.S. Cl.
CPC .... *H03M 13/1102* (2013.01); *H03M 13/1157* (2013.01); *H03M 13/1165* (2013.01);
(Continued)

(58) Field of Classification Search
CPC ......... H03M 13/1102; H03M 13/1157; H03M 13/1165; H04L 1/0071
See application file for complete search history.

(56) References Cited

U.S. PATENT DOCUMENTS 9,484,957 B2 * 11/2016 Jeong .................. H03M 13/356
2015/0236721 A1 8/2015 Kim et al.
(Continued)

FOREIGN PATENT DOCUMENTS

WO WO 2015/141488 A1 9/2015
WO WO 2016/114156 A1 7/2016

OTHER PUBLICATIONS

"Digital Video Broadcasting (DVB); Next Generation broadcasting System to Handheld, physical layer specification (DVB-NGH)", DVB Document A160, ETSI EN 302 755 V1.3.1,Nov. 30, 2012, XP055248828, 295 pages.
(Continued)

*Primary Examiner* — Joseph D Torres
(74) *Attorney, Agent, or Firm* — Oblon, McClleland, Maier & Neustadt, L.L.P.

(57) ABSTRACT

The present technology relates to a transmission method and a reception device for securing favorable communication quality in data transmission using an LDPC code. In group-wise interleaving, the LDPC code with a code length N of 69120 bits is interleaved in units of 360-bit bit groups 0 to 191. In group-wise deinterleaving, a sequence of the LDPC code after group-wise interleaving is returned to an original sequence. The present technology can be applied, for example, in a case of performing data transmission using an LDPC code, and the like.

22 Claims, 138 Drawing Sheets

(51) Int. Cl.
*H03M 13/27* (2006.01)
*H03M 13/00* (2006.01)
*H04L 27/20* (2006.01)

(52) U.S. Cl.
CPC ..... *H03M 13/2792* (2013.01); *H03M 13/616* (2013.01); *H04L 1/0057* (2013.01); *H04L 1/0071* (2013.01); *H04L 27/206* (2013.01)

(56) References Cited

U.S. PATENT DOCUMENTS

| | | | | |
|---|---|---|---|---|
| 2015/0236884 | A1* | 8/2015 | Suh | H04H 20/33<br>375/295 |
| 2016/0204804 | A1 | 7/2016 | Ikegaya et al. | |
| 2016/0344417 | A1 | 11/2016 | Jeong et al. | |

OTHER PUBLICATIONS

Anonymous: "ATSC Standard: Physical Layer Protocol (A/322)", ATSC A/322,Jun. 6, 2017, XP055578305,Retrieved from the Internet: URL: https ://www. atsc.org/wp-content/uploads/2016/10/A322-2017a-Physical -Layer-Protocol -1.pdf, 262 pages.
Kyung-Joong Kim et al., "Low-Density Parity-Check Codes for ATSC 3.0",IEEE Transactions on Broadcasting., vol. 62, No. 1, Mar. 1, 2016, pp. 189-196, XP055563521,US ISSN: 0018-9316, DOI:10. 1109/TBC.2016.2515538.
International Search Report dated Sep. 25, 2018 in PCT/JP2018/029736 filed on Aug. 8, 2018.
ATSC Standard: Physical Layer Protocol, ATSC A/322:2017, Jun. 6, 2017, 20 total pages.

* cited by examiner

FIG. 3

$$H=\begin{bmatrix} 1&1&1&0&0&0&1&0&1&1&0&0\\ 1&1&0&1&1&0&0&0&0&0&1&1\\ 0&0&1&1&1&1&1&0&0&1&0&0\\ 0&0&0&1&1&1&0&1&1&0&0&1\\ 1&1&0&0&0&1&0&1&0&1&1&0\\ 0&0&1&0&0&0&1&1&1&0&1&1 \end{bmatrix}$$

FIG. 13

NUMBER OF COLUMNS OF EACH COLUMN WEIGHT

| | N=64800 | | | | N=16200 | | | |
|---|---|---|---|---|---|---|---|---|
| Nominal CODING RATE | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | - | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | --- | --- | --- | --- |

FIG. 15
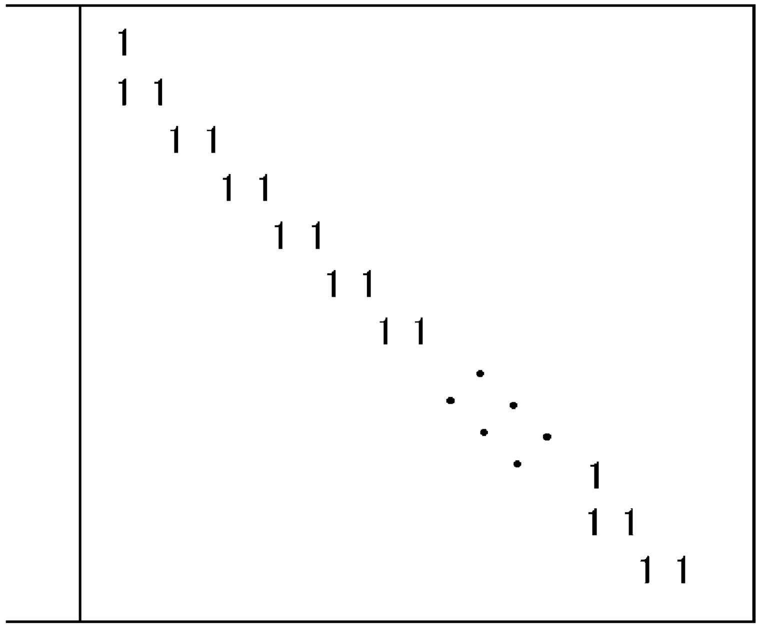
STEP STRUCTURE OF PARITY MATRIX
A
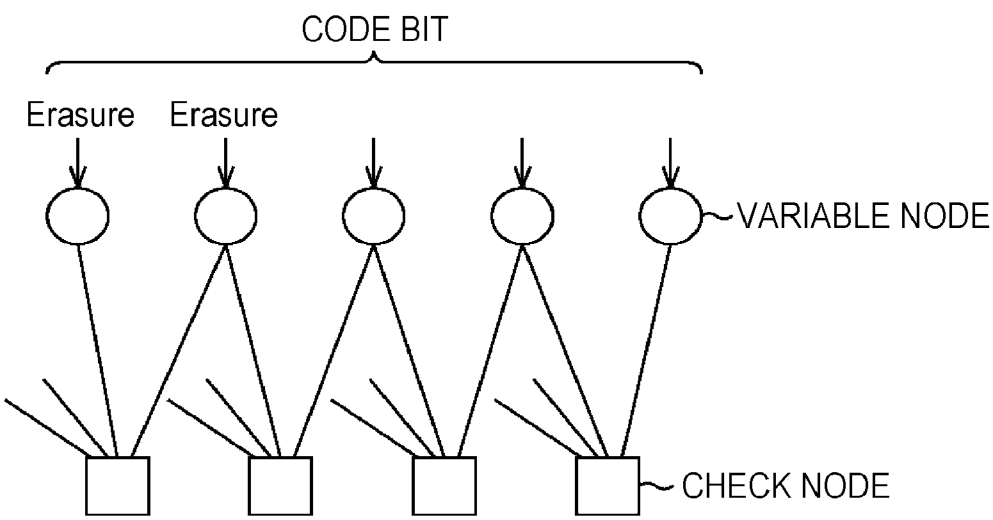
STEP STRUCTURE PORTION OF Tanner Graph
B r1/4 16K 6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

FIG. 21

ROW NUMBER OF PARITY CHECK MATRIX (INFORMATION MATRIX $H_A$) OF EVERY OTHER 360 COLUMNS FROM FIRST COLUMN IS DISPLAYED

ROW NUMBER OF PARITY CHECK MATRIX →

1ST COLUMN OF $H_A$ → 0 2084 1613 1548 1286 1460 3196 4297 2481 3369 3451 4620 2622

361ST COLUMN OF $H_A$ → 1 122 1516 3448 2880 1407 1847 3799 3529 373 971 4358 3108

721ST COLUMN OF $H_A$ → 2 259 3399 929 [2650] 864 3996 3833 107 5287 164 3125 2350 ($h_{3,5}$ = 2650)

1081ST COLUMN OF $H_A$ → 3 342 3529

4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

PARITY CHECK MATRIX INITIAL VALUE TABLE 2 6 18
2 10 19
22
19
15

FIG. 30

Rate 2/16 N=69120 TYPE A 1617 1754 1768 2501 6874 12486 12872 16244 18612 19698 21649 30954 33221 33723 34495 37587 38542 41510 42268 52159 59780
206 610 991 2665 4994 5681 12371 17343 25547 26291 26678 27791 27828 32437 33153 35429 39943 45246 46732 53342 60451
119 682 963 3339 6794 7021 7295 8856 8942 10842 11318 14050 14474 27281 28637 29963 37861 42536 43865 48803 59969
175 201 355 5418 7990 10567 10642 12987 16685 18463 21861 24307 25274 27515 39631 40166 43058 47429 55512 55519 59426
117 839 1043 1960 6896 19146 24022 26586 29342 29906 33129 33647 33883 34113 34550 38720 40247 45651 51156 53053 56614
135 236 257 7505 9412 12642 19752 20201 26010 28967 31146 37156 44685 45667 50066 51283 54365 55475 56501 58763 59121
109 840 1573 5523 19968 23924 24644 27064 29410 31276 31526 32173 38175 43570 43722 46655 46660 48353 54025 57319 59818
522 1236 1573 6563 11625 13846 17570 19547 22579 22584 29338 30497 33124 33152 35407 36364 37726 41426 53800 57130
504 1330 1481 13809 15761 20050 26339 27418 29630 32073 33762 34354 36966 43315 47773 47998 48824 50535 53437 55345
348 1244 1492 9626 9655 15638 22727 22971 28357 28841 31523 37543 41100 42372 48983 50354 51434 54574 55031 58193
742 1223 1459 20477 21731 23163 23587 30829 31144 32186 32235 32593 34130 40829 42217 42294 42753 44058 49940 51993
841 860 1534 5878 7083 7113 9658 10508 12871 12964 14023 21055 22680 23927 32701 35168 40986 42139 50708 55350
657 1018 1690 6454 7645 7698 8657 9615 16462 18030 19850 19857 33265 33552 42208 44424 48965 52762 55439 58299
14 511 1376 2586 6797 9409 9599 10784 13076 18509 27363 27667 30262 34043 37043 38143 40246 53811 58872 59250
315 883 1487 2067 7537 8749 10785 11820 15702 20232 22850 23540 30247 41182 44884 50601 52140 55970 57879 58514
256 1442 1534 2342 9734 10789 15334 15356 20334 20433 22923 23521 29391 30553 35406 35643 35701 37968 39541 58097
260 1238 1557 14167 15271 18046 20588 23444 25820 26660 30619 31625 33258 38554 40401 46471 53589 54904 56455 60016
591 885 1463 3411 14043 17083 17372 23029 23365 24691 25527 26389 28621 29999 40343 40359 40394 45685 46209 54887
1119 1411 1664 7879 17732 27000 28506 32237 32445 34100 34926 36470 42848 43126 44117 48780 49519 49592 51901 56580
147 1333 1560 6045 11526 14867 15647 19496 26626 27600 28044 30446 35920 37523 42907 42974 46452 52480 57061 60152
304 591 680 5557 6948 13550 19689 19697 22417 23237 25813 31836 32736 36321 36493 36671 46756 53311 59230 59248
586 777 1018 2393 2817 4057 8068 10632 12430 13193 16433 17344 24526 24902 27693 39301 39776 42300 45215 52149
684 1425 1732 2436 4279 7375 8493 10023 14908 20703 25656 25757 27251 27316 33211 35741 38872 42908 55079 58753
962 981 1773 2814 3799 6243 8163 12655 21226 31370 32506 35372 36697 47037 49095 55400 57506 58743 59678 60422
6229 6484 8795 8981 13576 28622 35526 36922 37284 42155 43443 44080 44446 46649 50824 52987 59033
2742 5176 10231 10336 16729 17273 18474 25875 28227 34891 39826 42595 48600 52542 53023 53372 57331
3512 4163 4725 8375 8585 19795 22844 28615 28649 29481 41484 41657 53255 54222 54229 57258 57647
3358 5239 9423 10858 15636 17937 20678 22427 31220 37069 38770 42079 47256 52442 55152 56964 59169
2243 10090 12309 15437 19426 23065 24872 36192 36336 36949 41387 49915 50155 54338 54422 56561 57984

FIG. 31

Rate 3/16 N=69120 TYPE A 126 1125 1373 4698 5254 17832 23701 31126 33867 46596 46794 48392 49352 51151 52100 55162
794 1435 1552 4483 14668 16919 21871 36755 42132 43323 46650 47676 50412 53484 54886 55333
698 1356 1519 5555 6877 8407 8414 14248 17811 22998 28378 40695 46542 52817 53284 55968
457 493 1080 2261 4637 5314 9670 11171 12679 29201 35980 43792 44337 47131 49880 55301
467 721 1484 5326 8676 11727 15221 17477 21390 22224 27074 28845 37670 38917 40996 43851
305 389 526 9156 11091 12367 13337 14299 22072 25367 29827 30710 37688 44321 48351 54663
23 342 1426 5889 7362 8213 8512 10655 14549 15486 26010 30403 32196 36341 37705 45137
123 429 485 4093 6933 11291 11639 12558 20096 22292 24696 32438 34615 38061 40659 51577
920 1086 1257 8839 10010 13126 14367 18612 23252 23777 32883 32982 35684 40534 53318 55947
579 937 1593 2549 12702 17659 19393 20047 25145 27792 30322 33311 39737 42052 50294 53363
116 883 1067 9847 10660 12052 18157 20519 21191 24139 27132 27643 30745 33852 37692 37724
915 1154 1698 5197 5249 13741 25043 29802 31354 32707 33804 36856 39887 41245 42065 50240
317 1304 1770 12854 14018 14061 16657 24029 24408 34493 35322 35755 38593 47428 53811 55008
163 216 719 5541 13996 18754 19287 24293 38575 39520 43058 43395 45390 46665 50706 55269
42 415 1326 2553 7963 14878 17850 21757 22166 32986 39076 39267 46154 46790 52877 53780
593 1511 1515 13942 14258 14432 24537 38229 38251 40975 41350 43490 44880 45278 46574 51442
219 262 955 1978 10654 13021 16873 23340 27412 32762 40024 42723 45976 46603 47761 54095
632 944 1598 12924 17942 18478 26487 28036 42462 43513 44487 44584 48245 53274 54343 55453
501 912 1656 2009 6339 15581 20597 26886 32241 34471 37497 43009 45977 46587 46821 51187
610 713 1619 5176 6122 6445 8044 12220 14126 32911 38647 40715 45111 47872 50111 55027
258 445 1137 4517 5846 7644 15604 16606 16969 17622 20691 34589 35808 43692 45126 49527
612 854 1521 13045 14525 15821 21096 23774 24274 25855 26266 27296 30033 40847 44681 46072
714 876 1365 5836 10004 15778 17044 22417 26397 31508 32354 37917 42049 50828 50947 54052
1338 1595 1718 4722 4981 12275 13632 15276 15547 17668 21645 26616 29044 39417 39669 53539
687 721 1054 5918 10421 13356 15941 17657 20704 21564 23649 35798 36475 46109 46414 49845
734 1635 1666 9737 23679 24394 24784 26917 27334 28772 29454 35246 35512 37169 39638 44309
469 918 1212 3912 10712 13084 13906 14000 16602 18040 18697 25940 30677 44811 50590 52018
70 332 496 6421 19082 19665 25460 27377 27378 31086 36629 37104 37236 37771 38622 40678

Rate 4/16 N=69120 TYPE A 561 825 1718 4745 7515 13041 13466 18039 19065 21821 32596 32708 35323 36399 36450 41124 43036 43218 43363 44875 49948
56 102 1779 2427 5381 8768 15336 26473 35717 38748 39066 45002 50720
694 1150 1533 2177 5801 6610 7601 16657 18949 33472 47746 49581 50668
90 1122 1472 2085 2593 4986 8200 9175 15502 44084 46057 48546 50487
521 619 708 6915 8978 14211 17426 23058 23463 27440 29822 33443 42871
449 912 1471 8058 9344 11928 20533 20600 20737 26557 26970 27616 33791
355 700 1528 6478 9588 10790 20992 33122 34283 41295 43439 46249 47763
997 1543 1679 5874 7973 7975 11113 28275 28812 29864 35070 36864 50676
85 326 1392 4186 10855 11005 12913 19263 22984 31733 33787 37567 48173
986 1144 1508 19864 28918 29117 33609 36452 47975 48432 48842 49274 51533
437 1190 1413 3814 6695 17541 22060 25845 28431 37453 38912 44170 49231
327 1171 1204 6952 11880 16469 25058 28956 31523 36770 40189 43422 46481
123 605 619 8118 8455 19550 20529 21762 21950 28485 30946 34755 34765
113 896 971 6400 27059 33383 34537 35827 38796 40582 42594 43098 48525
162 854 1015 2938 10659 12085 13040 32772 33023 35878 49674 51060 51333
100 452 1703 1932 4208 5127 12086 14549 16084 17890 20870 41364 48498
1569 1633 1666 12957 18611 22499 38418 38719 42135 46815 48274 50947 51387
119 691 1190 2457 3865 7468 12512 30782 31811 33508 36586 41789 47426
867 1117 1666 4376 13263 13466 33524 37440 38136 39800 41454 41620 42510
378 900 1754 16303 25369 27103 28360 30958 35316 44165 46682 47016 50004
1321 1549 1570 16276 17284 19431 23482 23920 27386 27517 46253 48617 50118
37 383 1418 15792 22551 28843 36532 36718 38805 39226 45671 47712 51769
150 787 1441 17828 19396 21576 21805 24048 31868 32891 42486 43020 45492
1095 1214 1744 2445 5773 10209 11526 29604 30121 36526 45786 47376 49366
412 448 1281 11164 14501 15538 15773 23305 31960 32721 40744 45731 50269
183 626 837 4491 12237 13705 15177 15973 21266 25374 41232 44147 50529
618 1550 1594 5474 9260 16552 18122 26061 30420 30922 32661 34390 43236
135 496 757 9327 15659 20738 24327 26688 29063 38993 46155 49532 50001
64 126 1714 5561 8921 11300 12688 14454 16857 19585 20528 24107 27252
528 687 1730 9735 11737 16396 19200 33712 34271 38241 42027 44471 45581
69 646 1447 8603 19706 22153 22398 23840 24638 27254 29107 30368 41419
673 845 1285 9100 11064 14804 15425 17357 27248 31223 32410 35444 48018
124 1531 1677 3672 3673 3786 8886 9557 10003 11053 13053 22458 25413
102 1154 1758 5721 6034 14567 17772 28670 33380 34284 35356 47480 48123
48 351 760 2078 9797 22956 26120 34119 39658 41039 45237 47861 49022
254 445 841 6835 18340 19021 20053 22874 32639 36679 42004 45696 49530
16 802 903 6218 16206 22068 23049 28201 30377 33947 44358 44739 49303
153 1542 1629 7992 29900 34931 36927 38651 39981 41085 41327 50185 51484
525 1291 1765 9425 20271 31229 37444 38996 39145 41711 43188 45203 51255
2 244 1648 12321 14991 17426 18456 20126 29915 32581 38880 39516 49013
23 452 705 9414 11862 13764 18179 35458 37892 40471 46041 46494 48746
509 1201 1328 8921 9867 10947 19476 22693 32636 34301 38356 39238 51797
246 249 1390 12438 13266 24060 33628 37130 42923 43298 43709 43721 45413
117 257 748 9419 9461 11350 12790 16724 33147 34168 34683 37884 42699
619 646 740 7468 7604 8152 16296 19120 27614 27748 40170 40289 49366
914 1360 1716 10817 17672 18919 26146 29631 40903 46716 49502 51576 51657
68 702 1552 10431 10925 12856 24516 26440 30834 31179 32277 35019 44108
588 880 1524 6641 9453 9653 13679 14488 20714 25865 42217 42637 48312
6380 12240 12558 12816 21460 24206 26129 28555 41616 51767
8889 16221 21629 23476 33954 40572 43494 44666 44885 49813
16938 17727 17913 18898 21754 32515 35686 36920 39898 43560
9170 11747 14681 22874 24537 24685 26989 28947 33592 34621
2427 10241 29649 30522 37700 37789 41656 44020 49801 51268

FIG. 34

Rate 5/16 N=69120 TYPE A 152 1634 7484 23081 24142 26799 33620 40989 41902 44319 44378 45067
140 701 5137 7313 12672 16929 20359 27052 30236 33846 36254 46973
748 769 2891 7812 9964 15629 19104 20551 25796 28144 31518 34124
542 976 2279 18904 20877 24190 25903 28129 36804 41152 41957 46888
173 960 2926 11682 12304 13284 18037 22702 30255 33718 34073 37152
78 1487 4898 7472 8033 10631 11732 19334 24577 34586 38651 43639
594 1095 1857 2368 8909 17295 17546 21865 23257 31273 37013 41454
72 419 1596 7849 16093 23167 26923 31883 36092 40348 44500
866 1120 1568 1986 3532 20094 21663 26664 26970 33542 42578
868 917 1216 12018 15402 20691 24736 33133 36692 40276 46616
955 1070 1749 7988 10235 19174 22733 24283 27985 38200 44029
613 1729 1787 19542 21227 21376 31057 36104 36874 38078 42445
86 1555 1644 4633 14402 14997 25724 31382 31911 32224 43900
353 1132 1246 5544 7248 17887 25769 27008 28773 33188 44663
600 958 1376 6417 6814 17587 20680 25376 29522 31396 40526
179 528 1472 2481 5589 15696 20148 28040 29690 32370 42163
122 144 681 6613 11230 20862 26396 27737 35928 39396 42713
934 1256 1420 3881 4487 5830 7897 9587 17940 40333 41925
622 1458 1490 16541 18443 19401 24860 26981 28157 32875 38755
1017 1143 1511 2169 17322 24662 25971 29149 31450 31670 34779
935 1084 1534 2918 10596 11534 17476 27269 30344 31104 37975
173 532 1766 8001 10483 17002 19002 26759 31006 43466 47443
221 610 1795 9197 11770 12793 14875 30177 30610 42274 43888
188 439 1332 7030 9246 15150 26060 26541 27190 28259 36763
812 1643 1750 7446 7888 7995 18804 21646 28995 30727 39065
44 481 555 5618 9621 9873 19182 22059 42510 45343 46058
156 532 1799 6258 18733 19988 23237 27657 30835 34738 39503
1128 1553 1790 8372 11543 13764 17062 28627 38502 40796 42461
564 777 1286 3446 5566 12105 16038 18918 21802 25954 28137
1167 1178 1770 4151 11422 11833 16823 17799 19188 22517 29979
576 638 1364 12257 22028 24243 24297 31788 36398 38409 47211
334 592 940 2865 12075 12708 21452 31961 32150 35723 46278
1205 1267 1721 9293 18685 18917 23490 27678 37645 40114 45733
189 628 821 17066 19218 21462 25452 26858 38408 38941 42354
190 951 1019 5572 7135 15647 32613 33863 33981 35670 43727
84 1003 1597 12597 15567 21221 21891 23151 23964 24816 46178
756 1262 1345 6694 6893 9300 9497 17950 19082 35668 38447
848 948 1560 6591 12529 12535 20567 23882 34481 46531 46541
504 631 777 10585 12330 13822 15388 23332 27688 35955 38051
676 1484 1575 2215 5830 6049 13558 25034 33602 35663 41025
1298 1427 1732 13930 15611 19462 20975 23200 30460 30682 34883
1491 1593 1615 4289 7010 10264 21047 26704 27024 29658 46766
969 1730 1748 2217 7181 7623 15860 21332 28133 28998 36077
302 1216 1374 5177 6849 7239 10255 34952 37908 39911 41738
220 362 1491 5235 5439 22708 29228 29481 33272 36831 46487
4 728 1279 4579 8325 8505 27604 31437 33574 41716 45082
472 735 1558 4454 6957 14867 18307 22437 38304 42054 45307
85 466 851 3669 7119 32748 32845 41914 42595 42600 45101
52 553 824 2994 4569 12505 24738 33258 37121 43381 44753
37 495 1553 7684 8908 12412 15563 16461 17872 29292 30619
254 1057 1481 9971 18408 19815 28569 29164 39281 42723 45604
16 1213 1614 4352 8091 8847 10022 24394 35661 43800 44362
395 750 888 2582 3772 4151 26025 36367 42326 42673 47393
862 1379 1441 6413 25621 28378 34869 35491 41774 44165 45411
46 213 1597 2771 4694 4923 17101 17212 19347 22002 43226
1339 1544 1610 13522 14840 15355 29399 30125 33685 36350 37672

Rate 6/16 N=69120 TYPE A 608 1394 3635 14404 15203 19848 22161 23175 26651 31945 41227
481 570 11088 11673 11866 17145 17247 17564 21607 25992 31286
1207 1257 1870 8472 8855 10511 15656 17064 22720 28352 30914
1171 1585 6218 7621 10121 11374 13184 22714 27207 27959 38572
244 548 2073 4937 7509 11840 12850 18762 25618 27902 37150
15 1352 7060 7886 8151 10574 14172 15258 24838 30827 35337
1009 1651 13300 13958 26240 29983 32340 40743 41553 42475 42873
638 1405 5544 6797 10001 14934 24766 35758 40719 41787 42342
1467 1481 3202 11324 14048 15217 17608 22544 26736 32073 33405
1274 1343 3576 4166 8712 10756 21175 26866 37021 40341 42064
1232 1590 4409 8705 13307 28481 30893 36031 36780 37697 39149
189 1678 9943 10774 11765 25520 26133 27351 27353 40664 41534
125 1421 5009 9365 12792 15933 16231 25975 27076 27997 32429
1361 1764 5376 11071 14456 16324 20318 26168 28445 30392 34235
1017 1303 3312 6738 7813 18149 25506 29032 36789 38742 43116
463 967 10876 13874 14303 16789 21656 26555 38738 39195 40668
630 1104 3029 3165 5157 12880 14175 16498 35121 38917 40944
716 1054 10011 11739 16913 19396 20892 23370 24392 27614 38467
1081 1238 2872 10259 13618 16943 17363 23570 29721 32411 38969
775 1002 2978 9202 16618 22697 30716 31750 36517 37294 40454
25 497 10687 13308 15302 17525 17539 21865 22279 24516 26992
781 878 6426 8551 12328 21375 27626 28192 29731 35423 35606
729 1734 3479 6850 14347 14776 21998 33617 34690 38597 38704
122 1378 1660 7448 7659 11900 13039 13796 19908
504 716 1551 5655 6245 8365 9825 16627 29100
88 900 1057 2620 16729 17278 17444 26106 26587
30 1697 1736 8718 11664 20885 27043 42569 42913
293 634 1188 4005 5266 6205 26756 30207 37757
254 755 1187 4631 13433 25055 28354 28583 30446
316 1381 1522 3131 4340 27284 28246 28282 43174
84 293 645 2148 7925 13104 25010 36836 39033
982 1486 1660 4287 5335 18350 26913 30774 31280
418 1028 1039 3334 4577 6553 7011 17259 31922
1324 1361 1690 5991 7740 16880 18479 25713 31823
735 1322 1727 8629 14655 15815 16762 23263 36859
19 928 1561 11161 12894 14226 21331 41128 41883
327 940 1004 13616 15894 31400 34106 34443 37957
576 953 1226 2122 4900 5002 10248 25476 30787
249 632 1240 5432 23019 29225 31719 36658 41360
980 1154 1783 4351 10245 23347 27442 28328 38555
581 863 1552 5057 7572 14544 20482 29482 31672
4 502 1450 4883 5176 6824 10430 32680 39581
81 761 1558 2269 5391 13213 24184 25523 39429
1085 1163 1244 7694 9125 17387 22223 26343 37933
204 1127 1483 18302 19939 20576 31599 32619 42911
345 387 591 8727 18080 20628 32251 34562 42821
957 1126 1133 4099 12272 15595 20906 23606 34564
409 1310 1335 2761 11952 26853 27941 29262 31647
329 818 1527 3890 5238 8742 15586 28739 43015
231 1158 1677 4314 15937 17526 18391 22963 39232
34 275 526 2975 4742 16109 17346 29145 37673
497 735 1261 7468 8769 17342 19763 32646 33497
879 1233 1633 11612 22941 23723 31969 35571 39510
886 954 1355 5532 8283 26965 29267 30820 40402
356 1199 1452 8833 14845 21722 23840 26539 27970
553 1570 1732 8249 16820 23181 23234 30754 40399

Rate 7/16 N=69120 TYPE A 1012 3997 5398 5796 21940 23609 25002 28007 32214 33822 38194
1110 4016 5752 10837 15440 15952 17802 27468 32933 33191 35420
95 1953 6554 11381 12839 12880 22901 26742 26910 27621 37825
1146 2232 5658 13131 13785 16771 17466 20561 29400 32962 36879
2023 3420 5107 10789 12303 13316 14428 24912 35363 36348 38787
3283 3637 12474 14376 20459 22584 23093 28876 31485 31742 34849
1807 3890 4865 7562 9091 13778 18361 21934 24548 34267 38260
1613 3620 10165 11464 14071 20675 20803 26814 27593 29483 36485
849 3946 8585 9208 9939 14676 14990 19276 23459 30577 36838
1890 2583 5951 6003 11943 13641 16319 18379 22957 24644 33430
1936 3939 5267 6314 12665 19626 20457 22010 27958 30238 32976
2153 4318 6782 13048 17730 17923 24137 24741 25594 32852 33209
1869 4262 6616 13522 19266 19384 22769 28883 30389 35102 36019
3037 3116 7478 7841 10627 10908 14060 14163 23772 27946 37835
1668 3125 7485 8525 14659 22834 24080 24838 30890 33391 36788
1623 2836 6776 8549 11448 23281 32033 32729 33650 34069 34607
101 1420 5172 7475 11673 18807 21367 23095 26368 30888 37882
3874 3940 4823 16485 21601 21655 21885 25541 30177 31656 35067
592 643 4847 6870 7671 10412 25081 33412 33478 33495 35976
2578 2677 12592 17140 17185 21962 23206 23838 27624 32594 34828
3058 3443 4959 21179 22411 24033 26004 26489 26775 33816 36694
91 2998 10137 11957 12444 22330 24300 26008 26441 26521 38191
889 1840 8881 10228 12495 18162 22259 23385 25687 35853 38848
1332 3031 13482 14262 15897 23112 25954 28035 34898 36286 36991
2505 2599 10980 15245 20084 20114 24496 26309 31139 34090 37258
599 1778 8935 16154 19546 23537 24938 32059 32406 35564 37175
392 1777 4793 8050 10543 10668 14823 25252 32922 36658 37832
1680 2630 7190 7880 10894 20675 27523 33460 33733 34000 35829
532 3750 5075 10603 12466 19838 24231 24998 27647 35111 38617
1786 3066 11367 12452 13896 15346 24646 25509 26109 30358 37392
1027 1659 6483 16919 17636 18905 19741 30579 35934 36515 37617
2064 2354 14085 16460 21378 21719 22981 23329 31701 32057 32640
2009 4421 7595 8790 12803 17649 18527 24246 27584 28757 31794
364 646 9398 13898 17486 17709 20911 31493 31810 32019 33341
2246 3760 4911 19338 25792 27511 28689 30634 31928 34984 36605
3178 3544 8858 9336 9602 12290 16521 27872 28391 28422 36105
1981 2209 12718 20656 21253 22574 28653 29967 33692 36759 37871
787 1545 7652 8376 9628 9995 10289 16260 17606 22673 34564
795 4580 12749 16670 18727 19131 19449 26152 29165 30820 31678
1577 2980 8659 12301 13813 14838 20782 23068 30185 34308 34676
84 434 13572 21777 24581 28397 28490 32547 33282 34655 37579
2927 4440 8979 14992 19009 20435 23558 26280 31320 35106 37704
1974 2712 6552 8585 10051 14848 15186 22968 24285 25878 36054
585 1990 3457 5010 8808
9 2792 4678 22666 32922
342 507 861 18844 32947
554 3395 4094 8147 34616
356 2061 2801 20330 38214
425 2432 4573 7323 28157
73 1192 2618 7812 17947
842 1053 4088 10818 24053
1234 1249 4171 6645 37350
1498 2113 4175 6432 17014
524 2135 2205 6311 7502
191 954 3166 28938 31869
548 586 4101 12129 25819

Rate 8/16 N=69120 TYPE A 772 2281 3473 15662 19233 22166 24358 31768 34191
3072 3151 3484 20863 23023 26841 27472 27784 29651
2021 3203 4955 5144 12966 13620 14648 18456 30842
1806 2504 3675 6095 15703 15906 16025 19622 24749
745 954 14959 19379 21307 27232 30747 31580 34498
1289 2798 3630 11125 14405 16833 17549 27047 34127
744 805 5289 15458 24911 26399 28735 32526 32568
732 2368 7341 7508 9188 15676 18894 28544 32643
932 1971 3577 13308 13857 23512 27614 30417 34011
509 2152 3819 15873 18472 18916 20285 21421 29629
2475 3045 7516 12450 19365 21118 22154 22988 29632
1826 1847 4147 15787 16852 18336 22299 30945 33813
265 2184 9121 12341 12405 18908 29587 31365 33794
2599 2683 4025 6139 8989 15158 18010 28167 31929
845 2103 6653 7355 12824 15366 16277 17519 23286
1399 2887 11163 25401 26413 26782 27209 28194 33477
921 2171 5580 5853 10183 11788 27575 31160 34061
1908 2156 5805 13283 14262 19954 21960 29163 32575
252 1729 10690 18304 18921 23512 23540 28800 29738
1471 2630 5594 8245 15787 25205 28758 30257 30851
348 1947 5694 17122 20090 21065 22347 29035 33466
737 1373 6599 6614 19068 26595 27778 28013 28882
364 430 6008 6607 8543 13936 23464 29610 31484
2229 2680 18999 20491 21334 26172 28296 28546 33400
1397 3104 5116 6493 6538 13889 25830 28978 32982
1620 2845 3850 10010 18108 18460 22770 23335 27961
498 2120 6084 9410 13331 14260 23516 23987 34035
1231 2804 7437 13770 20375 30750 32395 32396 34111
953 1902 5780 10797 22700 24101 26068 30912 32091
861 936 12129 19924 20120 21381 21388 21447 27204
731 2953 7262 17370 18981 22098 23033 28091 33702
490 583 7131 15101 16559 28310 28868 29782 32476
774 2299 4672 6318 8582 23242 31128 33233 33525
1180 1856 6398 11619 18864 23107 26863 27068 32107
1254 2724 9924 14935 17381 20494 28231 28315 29981
1421 1859 10349 13014 13756 16003 20857 21287 24049
894 1864 5740 6223 7764 10832 14172 16277 25480
401 1753 10617 11842 17705 25037 26925 28610 32447
836 1680 6209 10558 11877 18052 19470 19596 28767
1388 3186 6150 8082 8270 12210 22672 29391 33400
2539 2632 4691 6341 8535 18093 18920 20974 31393
1611 2540 4975 11114 13694 15237 15296 18284 29706
619 1682 11939 18221 23276 24770 25283 25410 32475
453 465 4205 7369 10207 12725 19737 20902 29125
1417 1526 17833 18009 18408 23118 28438 28886 34324
537 2396 6629 6707 6725 16691 17338 20424 23712
800 2808 6021 8438 10096 17394 21026 29668 33876
841 2257 10435 14237 16470 16753 23284 27020 30550
1524 2908 5865 10368 19372 26633 29011 30192 30678
32 1640 6508 11257 26512 26659 28075 30862 33427
1520 2860 15351 20014 20361 22955 23045 25940 29105
1848 3061 5809 6815 8987 17563 20524 22236 34381
1733 3082 5621 9635 12551 21520 21557 28829 31273
573 1926 3702 4446 7768 11703 12656 16747 32712
2705 2727 5610 6984 7075 9535 21223 23408 32966
1483 2888 5752 13993 22125 25473 27225 30868 34054

Rate 7/16 N=69120 TYPE B 5189 9880 13538 15175 16621 16804 17705 17961 20733 21467 21989 22238 22463 22918 23828 24930 25118 29684 33583 37271
70 5848 12393 14052 14252 17346 17509 19994 20675 24493 25258 29167 29758 30689 33714 33848 33910 34528 36773 38204
460 3837 6795 6912 7428 10696 12315 13575 15357 21353 23908 24933 30574 32972 33778 34513 35079 35137 36858 38213
157 8681 9967 11922 12445 14847 16658 19556 22644 24339 25625 28151 28405 29858 30427 31235 32999 33392 33666 38766
3951 10022 12466 13163 13699 15100 16425 17314 22941 23114 23186 23320 31711 32091 32346 32880 33839 34080 35244 35281
1963 3894 4747 5005 9478 11504 11733 13851 15703 18601 19091 20025 23748 26876 28310 33966 36096 36785 38241 38311
1787 5475 7062 11439 11686 12094 13500 14948 16457 21418 23783 27664 29522 30557 30960 31551 31893 32108 32636 35190
420 1601 4105 10709 11003 19228 21225 21427 21627 22632 23597 24691 24876 27272 30053 30632 37024 37337 38287 38865
2010 2747 4310 4828 6790 6992 7149 7686 7839 9174 10122 12007 15980 17263 18970 21288 24460 33544 34955 36082
4728 5125 5485 6758 7027 7310 9319 12741 13418 14280 14608 18831 19770 20620 22885 24340 29811 30383 31190 31328
1394 1527 2639 3398 3525 5055 10589 14304 17665 24839 28525 29530 30637 30730 31979 32294 32322 36477 36553 38823
3045 9911 11773 12368 13334 18650 19865 21411 24014 25991 27310 27609 28086 28782 30162 34481 34903 35059 36026 36601
1245 1578 4372 7080 8475 13246 14436 15058 16006 16453 16536 20386 21253 25032 25217 27143 33582 34233 35898 37013
156 579 1835 2921 4288 5799 13536 17576 18882 19825 20721 21827 22488 23207 30595 30943 33676 34224 36783 37618
1761 2419 4684 5188 8865 11427 13523 22508 22588 22658 23319 24649 27740 28615 28701 30469 31004 31708 38366 38845
3458 4318 8330 11232 11559 12478 14158 14837 16062 22913 23562 27331 27356 27424 27568 27668 30979 34747 35621 36680
144 1310 2076 2897 8483 10803 15403 21321 24285 24473 28105 28715 28756 29235 30570 32778 33148 35641 37148 37821
4019 4750 6236 10250 10853 13526 15851 17279 18650 19259 20752 21209 21331 22157 22387 27086 29179 30736 32244 36708
20671 21714 26907 28806
10538 15159 29903 35695
7414 15003 28833 31718
28014 30364 31097 34164
118 7358 17504 27943
11617 12578 20090 33389
3664 4126 20256 31569
2510 3137 4580 13643
19359 19928 28120 34072
29 28234 33691 33901
1652 4422 9877 32434
9374 16809 26890 27786
6375 7463 20276 25951
877 5288 22733 32789
11506 11756 36420 37946
2188 3978 21657 24557
2467 13247 15618 38099
8086 19322 20602 26103
14418 28964 30852
8699 24256 28148

Rate 7/16 N=69120 ANOTHER TYPE B 3781 6916 6934 11478 12245 13955 15314 15521 16710 18163 21883 24658 26586 27981 28648 31274 31994 34499 37654 38089 38646
3409 4491 5576 6779 8290 9295 10165 10287 12457 13052 15649 18861 22798 24303 27720 28767 31148 32645 33114 34014 34571
1346 3203 4376 8828 12144 12192 14471 15695 16838 16973 19039 20649 20772 22260 22370 23704 26220 30178 31953 32499 38758
1999 2724 2805 5711 5722 8176 8583 12845 13604 14529 16195 19312 19612 19892 22950 23697 24556 26319 27521 27582 31615
5209 8943 9877 10643 10853 11048 13651 17069 17210 19068 22040 23883 25579 28354 28597 29409 29457 31169 34228 36180 38572
271 910 4894 5838 7166 9457 12559 12752 16661 16732 19190 21313 21378 24410 25551 25708 28928 30537 30682 31552 37906
131 4378 6224 8143 9240 11696 14292 14520 19337 22025 26069 27418 29338 31791 32164 32573 33547 34934 36289 37163 37319
1756 4041 7413 9799 10173 10574 11704 12500 13043 14811 15087 15521 16177 18453 18681 28169 30555 31106 32511 34350 37236
589 2827 3183 4406 12246 13112 16739 17616 17952 20154 21240 21938 23145 24248 26189 27216 27386 31623 32819 36361 38005
1214 1245 1755 1940 6822 6895 7750 8687 11684 11802 12942 13362 16423 18240 19600 21676 23939 28782 35714 37597 38146
286 5126 6405 6586 9097 10975 12268 12805 14506 14744 17117 18827 26361 26441 27256 28757 29140 29568 31553 37795 38655
961 2442 3434 3890 4209 4320 6417 6430 7180 9265 20461 21026 27325 31207 33765 36370 36500 36977 38064 38244 38418
5836 8876 9094 9332 13613 13780 14565 15475 15887 16458 16489 16776 18723 21934 24271 24363 25696 27794 37030 38030
2707 3249 3740 7503 10158 11464 12834 14675 18245 18332 18888 20213 23130 25452 29019 30588 32027 34057 34209 38495
381 570 3671 10027 10746 11751 12139 18163 19455 19681 20051 23763 25300 26984 27021 28070 28763 30826 33291 37391
8609 10336 10568 11672 12691 13250 15095 15785 18246 20835 21516 24332 24612 25226 27732 28106 32122 32676 33437 36733
2063 3030 4285 4466 7200 10031 14609 15378 16363 20611 20757 21235 21420 22476 24313 24319 28117 29270 34947 38242
425 1528 3005 4946 5624 6809 11163 11656 14898 16555 19289 20411 22140 23168 27381 28648 31395 34424 37450 37775
7763 12513 14792 20465
3337 4306 13225 26639
3511 4168 7745 18770
3034 26440 31723 32582
2458 13276 28213 34317
4590 5331 9772 22678
6678 16422 17052 22284
4795 7956 23271 34038
5100 15330 23420 23750
20996 25124 29783 38015
3207 5296 6461 26697
16855 27613 31134 31686
645 9868 18039 29836
2837 27058 32786 37066
5648 25181 31874 35839
1831 21924 31081 33927
5649 7669 15910 33928
1748 10198 33744 35288
2171 17317 31053
11028 20243 35491

Rate 8/16 N=69120 TYPE B 1850 4176 4190 7294 8168 8405 9258 9710 13440 16304 16600 18184 18834 19899 22513 25068 26659 27137 27232 29186 29667 30549 31428 33634
2477 2543 5094 8081 9573 10269 11276 11439 13016 13327 16717 18042 19362 19721 20089 20425 20503 21396 24677 24722 28703 32486 32759 33630
1930 2158 2315 2683 3818 4883 5252 5505 8760 9580 11867 13117 14566 15639 17273 18820 21069 24945 25667 26785 30678 31271 33003 33244
1279 1491 2038 2347 2432 4336 4905 6588 7507 7666 8775 9172 10405 12249 12270 12373 12936 13046 13364 15130 17597 22855 27548 32895
620 1897 3775 5552 6799 7621 10167 10172 10615 11367 12093 13241 15426 16623 19467 19792 22069 22370 24472 24594 25205 25954 27800 29422
582 1618 4673 5809 6318 6883 8051 12335 12409 13176 14078 15206 17580 18624 18876 19079 20786 21177 25894 26395 27377 27757 30167 31971
1157 2189 4160 4480 5055 8961 9171 9444 10533 11581 12904 14256 14620 15773 16232 17598 19756 21134 21443 22559 23258 25137 25555 28150
987 1258 1269 2394 4859 5642 5705 6093 6408 7734 8804 10657 11946 16132 20267 25402 26505 26548 27060 29767 29780 31915 31966 33590
1010 1363 1626 5283 6356 10961 12418 14332 14362 16288 16303 16592 17096 20115 20285 20478 21774 22165 22425 23198 25048 25596 31540 32841
895 2743 2912 4971 8803 11183 14500 14617 14638 16776 17901 18622 20244 20845 22214 25676 26161 26281 29978 30392 30922 31542 32038 32443
188 260 411 2823 5512 5645 10019 11856 12671 14273 14673 16091 16169 22333 22934 22945 23542 26503 27159 27279 28277 30114 31626 32722
357 516 3530 4317 8587 9491 10348 11330 13446 14533 15423 17003 17217 19127 20088 20750 21767 22386 24021 27749 29008 29376 30329 32940
2909 3036 4875 9967 10632 12069 12410 14004 14628 15605 15852 18231 18657 19705 20620 22241 29575 29656 31246 32190 32781 33489 33842 34492
4242 5461 5577 7662 11130 13663 17240 17773 18339 19400 22905 24219 25464 25890 26359 27121 27318 27840 30800 32587 32924 33427 33940 34058
421 2222 3457 5257 5600 10147 12754 17380 18854 20333 20345 20752 24578 25196 25638 25725 25822 27610 28006 28563 29632 29973 29991 34166
41 207 1043 4650 5387 6826 7261 8687 9092 10775 11446 12596 16613 19463 20923 24155 24927 25384 26064 27377 28094 32578 32639 34115
1050 5731 15820 16281 26130 29314
5980 6161 14479 22181 22537 32924
7828 9134 11297 17143 25449 29674
8299 10457 14486 21548 22510 32039
1527 7792 10424 19166 29302 29768
5823 13974 21254 21506 25658 29491
6285 9873 12846 14474 17005 29377
1740 4929 8285 20994 32271 34522
12862 16827 22427 23369 27051 30378
4787 10372 10408 12091 20349 26162
6659 22752 24697 28261 28917 32536
6788 15367 21778 28916 30324 33927
7181 12373 21912 24703 28680 34045
2238 4945 14336 19270 29574 33459
10283 15311 17440 24599 24867 28293
324 5264 5375 6581 24348 30288
3112 7656 23825
21624 22318 22633
5284 19790 22758
2700 4039 12576
17028 17520 19579
11914 17834 33989
2199 5502 7184
22 20701 26497

FIG. 47

| | | |
|---|---|---|
| 5551 | 27014 | 32876 |
| 4019 | 26547 | 28521 |
| 7580 | 10016 | 33855 |
| 4328 | 11674 | 34018 |
| 8491 | 9956 | 10029 |
| 6167 | 11267 | 24914 |
| 5317 | 9049 | 29657 |
| 20717 | 28724 | 33012 |
| 16841 | 21647 | 31096 |
| 11931 | 16278 | 20287 |
| 9402 | 10557 | 11008 |
| 11826 | 15349 | 34420 |
| 14369 | 17031 | 20597 |
| 19164 | 27947 | 29775 |
| 15537 | 18796 | 33662 |
| 5404 | 21027 | 26757 |
| 6269 | 12671 | 24309 |
| 8601 | 29048 | 29262 |
| 10099 | 20323 | 21457 |
| 15952 | 17074 | 30434 |
| 7597 | 20987 | 33095 |
| 11298 | 24182 | 29217 |
| 12055 | 16250 | 16971 |
| 5350 | 9354 | 31390 |
| 8168 | 14168 | 18570 |
| 5448 | 13141 | 32381 |
| 3921 | 21113 | 28176 |
| 8756 | 19895 | 27917 |
| 9391 | 16617 | 25586 |
| 3357 | 18527 | 34238 |
| 2378 | 16840 | 28948 |
| 7470 | 27466 | 32928 |
| 8366 | 19376 | 30916 |
| 3116 | 7267 | 18016 |
| 15309 | 18445 | 21799 |
| 4731 | 23773 | 34546 |
| 260 | 4898 | 5180 |
| 8897 | 22266 | 29587 |
| 2539 | 23717 | 33142 |
| 19233 | 28750 | 29724 |
| 9937 | 15384 | 16599 |
| 10234 | 17089 | 26776 |
| 8869 | 9425 | 13658 |
| 6197 | 24086 | 31929 |
| 9237 | 20931 | 27785 |
| 10403 | 13822 | 16734 |
| 20038 | 21196 | 26868 |
| 13170 | 27813 | 28875 |
| 1110 | 20329 | 24508 |
| 11844 | 22662 | 28987 |
| 2891 | 2918 | 14512 |
| 15707 | 27399 | 34135 |
| 8687 | 20019 | 26178 |
| 6847 | 8903 | 16307 |
| 23737 | 23775 | 27776 |
| 17388 | 27970 | 31983 |

FIG. 48

Rate 8/16 N=69120 ANOTHER TYPE B 1194 2400 2789 3893 5030 5033 7851 10775 12793 13985 15133 16913 18431 18436 19931 20421 21073 23361 24493 26860 28864 34457
1818 2451 7250 7687 8756 9438 11365 12085 12956 14339 17179 17395 17695 21298 21870 23350 24405 25359 26180 28086 30345 32192
206 4671 5265 6393 7960 9628 9839 11216 11352 12190 15252 15310 16952 17066 19600 21722 22729 25154 26172 27666 28099 34330
769 3876 4330 7293 8230 8431 14839 14856 17227 18920 18964 22763 22860 23184 24350 25709 26099 27143 27330 28311 33058 33640
123 1567 3562 5478 8714 9355 10394 10413 12711 12949 16390 19491 25027 27126 28594 28897 28965 29846 31037 32273 33114 33164
2545 6567 9115 10916 11048 11526 11675 13251 13359 13758 14344 14795 15700 15994 16516 17918 19530 20572 27737 28087 30591 32277
485 1069 1561 1685 2841 3856 6096 6854 7715 10535 18860 19241 21526 23316 24224 24315 25631 29180 31725 33481 33719 33968
279 1102 5684 6114 8078 10368 10912 11442 11889 14611 15192 16193 16779 17454 21249 23471 23517 24226 25910 26237 28126 33541
774 3559 3708 3919 4588 5736 5816 6424 8253 9708 11379 12845 13139 18161 25545 27698 30011 32310 32388 32894 34141 34274
2136 3009 5250 5692 8090 12167 12227 13741 14201 14671 14674 14899 16619 18688 21509 22772 24361 24681 32835 33835 33878 33996
2410 3265 6681 7912 8316 9076 10257 11336 12959 13043 16289 16798 19530 20607 21636 22652 25743 27170 28501 30316 30381 34192
319 528 2926 3212 8888 9526 10802 16128 16206 17305 17542 17850 18019 21127 22494 23945 24080 24901 25540 27434 29640 33300
7616 9188 9326 10429 10455 11285 11787 13435 14037 16175 18470 19131 21639 21810 22423 24599 25018 28546 29069 29715 32689
1910 2775 3753 4013 6351 8865 12978 13683 14512 18254 18521 18897 19077 20010 21623 21634 24967 26045 31096 33597 33984
313 1368 2647 4352 5022 6109 9941 10298 12553 13196 14783 17155 18100 19718 20620 24301 25486 27909 30534 33259 34513
2174 2552 2756 2831 3660 3838 4124 6346 6923 11057 11348 11716 16473 18152 20008 21875 23400 25136 27305 28890 30208
2677 4884 5180 14655 18383 20722
3731 4560 16588 20888 22987 30500
2776 11584 13605 23303 26861 33705
4750 5877 15021 24513 25807 27249
1733 8791 26142 28266 28573 32676
2576 4916 22443 24303 29550 31838
1609 5086 19583 27560 28457 30786
1555 7025 9030 14979 29890 31128
2134 9879 15542 27554 31328 31506
15899 17881 18012 21037 30363 32843
4086 12709 15898 16296 22656 23283
1646 8284 8347 10975 17603 30820
1384 19111 23378 26081 27575 33447
4029 10225 10310 17309 23450 32464
7980 10708 15814 26794 30307 34137
938 1050 16505 21793 23756 27989
12080 17375 25097
4944 8065 26757
17431 31423 33965
2055 9209 32469
1478 9521 21387
29845 30046 33714
9682 12149 23918
11085 19303 21788

Rate 9/16 N=69120 TYPE B 110 3064 6740 7801 10228 13445 17599 17891 17979 18044 19923 21848 23262 25585 25968 30124
1578 8914 9141 9731 10605 11690 12824 18127 18458 24648 24950 25150 26323 26514 27385 27460
3054 3640 3923 7332 10770 12215 14455 14849 15619 20870 22033 26427 28067 28560 29777 29780
1348 4248 5479 8902 9101 9356 10581 11614 12813 21554 22985 23701 24099 24575 24786 27370
3266 8358 16544 16689 16693 16823 17565 18543 19229 21121 23799 24981 25423 28997 29808 30202
320 1198 1549 5407 6080 8542 9352 12418 13391 14736 15012 18328 19398 23391 28117 28793
2114 3294 3770 5225 5556 5991 7075 7889 11145 11386 16561 18956 19034 23605 26085 27132
3623 4011 4225 5249 5489 5711 7240 9831 10458 14697 15420 16015 17782 23244 24215 24386
2624 2750 3871 8247 11135 13702 19290 22209 22975 23811 23931 24872 25154 25165 28375 30200
1060 1240 2040 2382 7723 9165 9656 10398 14517 16653 21241 22348 23476 27203 28443 28445
1070 1233 3416 6633 11736 12808 15454 16505 18720 20162 21425 21874 26069 26855 27292 27978
420 5524 10279 11218 12500 12913 15389 15824 19414 19588 21138 23846 26621 27907 28594 28781
151 1356 2323 3289 4501 10573 13667 14642 16127 17040 17475 18055 24061 26204 26567 29277
1410 3656 4080 6963 8834 10527 17490 17584 18065 19234 22211 22338 23746 24662 29863 30227
1924 2694 3285 8761 9693 11005 17592 21259 21322 21546 21555 24044 24173 26988 27640 28506
1069 6483 6554 9027 11655 12453 16595 17877 18350 18995 21304 21442 23836 25468 28820 29453
149 1621 2199 3141 8403 11974 14969 16197 18844 21027 21921 22266 22399 22691 25727 27721
3689 4839 7971 8419 10500 12308 13435 14487 16502 16622 17229 17468 22710 23904 25074 28508
1270 7007 9830 12698 14204 16075 17613 19391 21362 21726 21816 23014 23651 26419 26748 27195
96 1953 2456 2712 2809 3196 5939 10634 21828 24606 26169 26801 27391 28578 29725 30142
832 3394 4145 5375 6199 7122 7405 7706 10136 10792 15058 15860 21881 23908 25174 25837
730 1735 2917 4106 5004 5849 8194 8943 9136 17599 18456 20191 22798 27935 29559
6238 6776 6799 9142 11199 11867 15979 16830 18110 18396 21897 22590 24020 29578 29644
407 2138 4493 7979 8225 9467 11956 12940 15566 15809 16058 18211 22073 28314 28713
957 1552 1869 4388 7642 7904 13408 13453 16431 19327 21444 22188 25719 28511 29192
3617 8663 22378 28704
8598 12647 19278 22416
15176 16377 16644 22732
12463 12711 18341
11079 13446 29071
2446 4068 8542
10838 11660 27428
16403 21750 23199
9181 16572 18381

Rate 9/16 N=69120 ANOTHER TYPE B 344 5260 5449 9663 11572 11933 15244 18579 18949 19398 22175 23672 25646 26228 28656 29695
94 6796 7678 7790 9294 13003 13506 17577 19909 21842 23240 24312 25607 25987 26138 30141
3065 9660 10194 11700 12775 17826 17987 18011 18139 24640 24992 25167 25574 26525 27409 27443
1518 3037 3662 7312 8949 9104 10654 10834 12255 15569 18449 20854 26340 26423 28075 29817
3919 4274 5506 8843 9351 12805 14505 14817 22069 23012 23697 24041 24857 27342 28623 29808
1366 3228 8386 9132 10558 11608 16663 16748 18548 21121 21582 23833 24567 25013 25403 29764
308 1250 6105 8501 13402 14997 16464 16818 17606 18331 19164 19334 23429 28729 29007 30169
1554 3279 5266 5459 5567 5975 7137 7853 9379 12396 14725 16695 19013 26100 27158 28072
2133 3771 4208 5514 5638 7263 9895 10454 11108 11387 15416 15975 18907 23647 24254 24409
2608 3636 3885 4012 5274 8303 11157 13722 14668 17777 22255 22941 23224 23929 24944 30207
1070 1235 2018 2770 7700 9196 10392 16689 19241 21249 23477 23848 25122 25188 28342 28421
2429 9607 14502 15391 18716 20177 21473 21901 22390 26796 27148 27280 28004 28402
998 1213 3439 6597 10328 11231 11688 12840 16477 19477 19575 21107 26074 26599
486 1371 3334 5527 12458 12880 15407 15875 18054 23790 27937 28635 28771 29282
120 2312 4476 10565 13656 14622 16086 17050 17477 17581 24038 26200 26615 29827
1348 3651 4047 6897 8889 10520 17523 18098 19120 22206 22293 23689 24682 30177
2079 2735 3279 8789 11028 17564 21316 21515 21532 24039 24130 26966 27697 28492
6469 6581 9021 9726 11535 12494 16590 17814 18338 19023 21298 21308 21437 28882
151 1046 2232 8476 11980 18863 21898 22338 22363 22712 23817 25461 25734 29400
1668 3131 10514 12275 13430 14485 14992 16193 16508 16629 17274 21073 25068 27722
3687 4793 7964 8450 9907 16051 17443 17599 19361 21676 22751 23868 27209 28484
143 1270 6994 12753 14256 21367 21805 21839 22983 23617 26439 26733 26876 30154
1992 2512 2731 2804 3245 5915 10631 15085 15832 24562 26149 27402 28617 29672
834 3370 4116 5323 6152 7121 7454 7716 10103 10818 21888 23912 25179 25823
741 1684 2871 4082 4984 5870 8192 8918 9090 17613 20205 22816 27968 29511
370 6780 8411 26549
5927 9312 11874 20454
4336 17108 18408 18897
6749 18091 26151
7902 18151 21999
15828 18958 24454
404 14744 15626
8591 14022 28659
2040 5109 11281
942 4875 29186
7636 13511 17003
4387 13433 30206
19971 22197 28180
1903 7945 21440
7599 12181 17498
9627 9781 29214
5913 19534 19715
17181 18814 22441
9332 10906 22747
11759 12446 13494

Rate 10/16 N=69120 TYPE B 200 588 3305 4771 6288 8400 11092 11126 14245 14255 17022 17190 19241 20350 20451 21069 25243
80 2914 4126 5426 6129 7790 9546 12909 14660 17357 18278 19612 21168 22367 23314 24801 24907
1216 2713 4897 6540 7016 7787 8321 9717 9934 12295 18749 20344 21386 21682 21735 24205 24825
6784 8163 8691 8743 10045 10319 10767 11141 11756 12004 12463 13407 14682 15458 20771 21060 22914
463 1260 1897 2128 2908 5157 7851 14177 16187 17463 18212 18221 19212 21864 24198 25318 25450
794 835 1163 4551 4597 5792 6092 7809 8576 8862 10986 12164 13053 14459 15978 23829 25072
144 4258 4342 7326 8165 9627 11432 12552 17582 17621 18145 19201 19372 19718 21036 25147 25774
617 2639 2749 2898 3414 4305 4802 6183 8551 9850 13679 20759 22501 24244 24331 24631 25587
1622 2258 4257 6069 10343 10642 11003 12520 13993 17086 18236 18522 24679 25361 25371 25595
1826 3926 5021 5905 6192 6839 7678 9136 9188 9716 10986 11191 12551 14648 16169 16234
2175 2396 2473 8548 9753 12115 12208 13469 15438 16985 19350 20424 21357 22819 22830 25671
265 397 6675 7152 8074 13030 13161 13336 15843 16917 17930 18014 18660 19218 22236 24940
5744 6883 7780 7839 8485 10016 10548 12131 12158 16211 16793 18749 20570 21757 22255 24489
2082 4768 7025 8803 10237 10932 13885 14266 14370 14982 16411 18443 18773 19570 21420 23311
1040 1376 2823 2998 3789 6636 7755 9819 13705 13868 14176 16202 16247 24943 25196 25489
223 1967 3289 4541 7420 9881 11086 12868 13550 14760 15434 18287 19098 20909 22905 25887
1906 2049 2147 2756 2845 4773 8337 8832 9363 12375 13651 16366 17546 20486 21624 22664
1619 1955 2393 3078 3208 3593 5246 8565 10956 11335 11865 14837 15006 15544 18820 22687
2086 3409 3586 4269 6587 8650 10165 11241 15624 16728 17814 18392 18667 19859 21132 25339
382 1160 1912 3700 3783 12069 14672 16842 18053 19626 20724 21244 21792 22679 23873 24517
1217 1486 5139 6774 7413 10622 11571 11697 13406 13487 20713 22436 22610 22806 23522 23632
1225 2927 6221 6247 8197 9322 11826 11948 12230 13899 15820 16791 17444 23155 24543 24650
1056 2975 6018 7698 7736 7940 11870 12964 17498 17577 19541 20124 20705 22693 23151 25627
658 790 1559 3683 6060 9059 12347 12990 13095 16317 17801 18816 20050 20979 23584 25472
1133 3343 6895 7146 7261 8340 9115 11248 14543 16030 16291 17972 22369 22479 24388 25280
1907 4021 8277 17631
7807 8063 10076 24958
5455 8638 13801 18832
15525 24030 24978
7854 21083 21197
8416 15614 24639

Rate 10/16 N=69120 ANOTHER TYPE B 271 1020 5185 7275 8003 11480 12855 14175 14467 15086 15696 16443 16565 18130 20056 24630 24862 25892
1339 1853 2850 3222 4490 4644 4818 5174 6072 6698 10681 12635 14197 16281 20247 22338 23417 24076
3129 3405 3651 4498 4751 4876 6253 8473 8938 9552 9761 12593 13222 13694 15200 16230 20806 20887
1055 2296 2308 3380 7113 9524 11765 16519 19064 19672 19895 20421 20498 21381 21565 21587 24283 25908
932 1729 2020 6611 7879 8243 8912 12436 14276 16021 18171 19185 20154 23285 23342 24000 24372 24391
802 1025 2896 5686 9630 10075 10956 13238 14133 16693 16799 17305 18117 18375 18739 22385 22805 23012
365 1160 2879 4714 8810 10702 11054 13219 13599 14592 15414 20406 20592 22774 24045 24529 24666 25074
113 1165 1947 3823 5944 9058 9129 11673 12560 13816 14978 15027 15095 19019 20354 22452 25588
1637 2422 3115 3487 7500 7590 15048 15512 16354 18274 18449 19120 20724 21135 23145 23732 25911
2845 5592 7719 8334 9489 9892 10722 15313 15721 16306 18219 18232 18387 18503 20614 24467 24761
114 903 1910 5652 7270 10269 14202 16169 18835 19131 19208 19475 20389 21871 22037 23766 25226
1391 2688 6776 9001 10533 11495 12445 12868 13853 14176 14195 14764 18050 19508 20450 21465 24422
1118 3116 4245 5978 7207 8450 10891 13765 14966 15115 16605 18300 18630 19680 22654 22905 23307
99 2340 2383 2766 5097 9097 12169 18669 18716 20237 21059 22426 22990 23495 24511 25416 25790
701 1693 2106 2897 4540 5298 6106 6380 6604 8683 9279 12937 13575 18789 20512 21598 22132
608 1473 2459 3522 3593 4295 5008 7004 7699 7786 14450 15096 15830 17286 19571 23907 25288
5399 5791 5815 6785 7837 9632 10181 13688 15504 15594 15783 18758 18900 19305 20550 25385 25404
355 819 1841 3868 6517 7054 8097 10246 11123 11573 13354 13565 13807 14072 24327 24620 25028
1296 1630 3750 5091 6496 6780 7154 8414 11468 15004 16441 16619 18374 19047 22090 24448 24606
1818 3512 7338 7994 8149 8875 9345 9985 10716 11568 13029 16063 16709 19295 19487 20368 24977
1024 2737 3819 5584 6314 7683 7965 9796 13695 13917 14267 16079 18133 18763 19880 20213 25354
509 3489 4746 5544 6877 7607 9237 11923 12548 13078 14148 14809 15479 18172 23026 23320 24011
565 3039 3652 4540 7101 9564 10165 10898 11473 12788 12884 13091 15654 17926 19344 21818 24494
1554 2393 2767 4498 4755 5179 5306 6509 9849 12108 12920 14191 14607 14854 18992 20294 21249
1680 2417 4122 7193 7727 8288 10235 10518 12601 15579 15606 17894 19077 20170 22807 25023 25075
5260 7065 8165 8835
925 1768 14353 17531
946 1215 1772 12359
816 8662 9026
2813 12966 16694
2230 11960 14896

Rate 11/16 N=69120 TYPE B 983 2226 4091 5418 5824 6483 6914 8239 8364 10220 10322 15658 16928 17307 18061
1584 5655 6787 7213 7270 8585 8995 9294 9832 9982 11185 12221 12889 17573 19096
319 1077 1796 2421 6574 11763 13465 14527 15147 15218 16000 18284 20199 21095 21194
767 1018 3780 3826 4288 4855 7169 7431 9151 10097 10919 12050 13261 19816 20932
173 692 3552 5046 6523 6784 9542 10482 14658 14663 15168 16153 16410 17546 20989
2214 2286 2445 2856 3562 3615 3970 6065 7117 7989 8180 15971 20253 21312 21428
532 1361 1905 3577 5147 10409 11348 11660 15230 17283 18724 20190 20542 21159 21282
3242 5061 7587 7677 8614 8834 9130 9135 9331 13480 13544 14263 15438 20548 21174
1507 4159 4946 5215 5653 6385 7131 8049 10198 10499 12215 14105 16118 17016 21371
212 1856 1981 2056 6766 8123 10128 10957 11159 11237 12893 14064 17760 18933 19009
329 5552 5948 6484 10108 10127 10816 13210 14985 15110 15565 15969 17136 18504 20818
4753 5744 6511 7062 7355 8379 8817 13503 13650 14014 15393 15640 18127 18595 20426
1152 1707 4013 5932 8540 9077 11521 11923 11954 12529 13519 15641 16262 17874 19386
858 2355 2511 3125 5531 6472 8146 11423 11558 11760 13556 15194 20782 20988 21261
216 1722 2750 3809 6210 8233 9183 10734 11339 12321 12898 15902 17437 19085 21588
1560 1718 1757 2292 2349 3992 6943 7369 7806 10282 11373 13624 14608 17087 18011
1375 1640 2015 2539 2691 2967 4344 7125 9176 9435 12378 12520 12901 15704 18897
1703 2861 2986 3574 7208 8486 9412 9879 13027 13945 14873 15546 16516 18931 21070
309 1587 3118 5472 10035 13988 15019 15322 16373 17580 17728 18125 18872 19876 20457
984 991 1203 3159 4303 5734 8850 9626 12217 17227 17269 18695 18854 19580 19684
2429 6165 6828 7761 9761 9899 9942 10151 11198 11271 13184 14026 14560 18962 20570
876 1074 5177 5185 6415 6451 10856 11603 14590 14658 16293 17221 19273 19319 20447
557 607 2473 5002 6601 9876 10284 10809 13563 14849 15710 16798 17509 18927 21306
939 1271 3085 5054 5723 5959 7530 10912 13375 16696 18753 19673 20328 21068 21258
2802 3312 5015 6041 6943 7606 9375 12116 12868 12964 13374 13594 14978 16125 18621
3002 6512 6965 6967 8504 10777 11217 11931 12647 12686 12740 12900 12958 13870 17860
151 3874 4228 7837 10244 10589 14530 15323 16462 17711 18995 19363 19376 19540 20641
1249 2946 2959 3330 4264 7797 10652 11845 12987 15974 16536 17520 19851 20150 20172
4769 11033 14937
1431 2870 15158
9416 14905 20800
1708 9944 16952
1116 1179 20743
3665 8987 16223
655 11424 17411
42 2717 11613
2787 9015 15081
3718 7305 11822
18306 18499 18843
1208 4586 10578
9494 12676 13710
10580 15127 20614
4439 15646 19861
5255 12337 14649
2532 7552 10813
1591 7781 13020
7264 8634 17208
7462 10069 17710
1320 3382 6439
4057 9762 11401
1618 7604 19881
3858 16826 17768

Rate 11/16 N=69120 ANOTHER TYPE B 5490 5926 6153 9501 10594 12266 13298 15737 15849 16368 18972 20100 21448
2883 3284 4934 6022 6970 7082 7565 9582 10633 13616 14218 16328 17327
175 521 2754 3971 5252 9283 9285 14281 16044 16969 17080 17577 21029
2415 4516 5139 6516 10793 11827 11855 14197 14510 15207 16311 17658 20663
80 3472 7951 8080 10234 12239 17853 18113 18604 19386 20179 20679 20725
988 2274 4092 5402 5870 6505 6901 8246 8386 15629 16943 17316 18097
5692 6810 7203 7269 8586 8944 9272 9798 10328 11207 12875 17544 19096
355 1581 1785 9970 11809 12194 13440 14564 15168 15223 18191 20182 21117
667 1018 1025 2413 3831 4298 4819 6560 12059 15977 19856 20922 21207
684 3795 5098 6508 7183 7421 9179 10113 10456 10891 13305 14643 17525
159 3554 3627 6834 7991 9511 14657 15156 15986 16186 16393 20958 21460
2207 2335 2460 2869 3555 3994 6085 7103 8180 17292 20216 20261 21348
499 1362 1881 3575 5138 11393 11691 15210 18752 20530 21177 21242
5077 7604 7627 8584 8821 9172 10386 13490 14242 15449 20528 21129
1507 3244 4191 4940 5204 6376 8096 9178 9336 10454 12190 13538
2082 5646 7082 10181 12858 14150 16128 17004 17819 18937 18971 21407
237 1809 2033 6763 8105 10113 10945 11139 11237 14068 14992 15995
330 5520 5994 6525 10099 10815 13203 15021 15569 17146 18507 20783
4741 5712 6488 7075 8380 10111 13532 14029 15626 18154 18562 20413
5868 7360 8541 8769 11577 11898 11953 13672 15406 16261 17845 19412
1145 1683 2373 2477 3994 5561 8112 9087 12486 13559 15649 21244
887 3164 6234 6422 11430 11562 11788 13538 15200 15956 20795 20985
219 1673 2743 3830 8271 9190 10706 11317 12300 12854 17422 19111
1575 1795 2309 2348 4018 6919 7343 7816 10267 11376 14604 21551
1371 1736 2555 2945 4351 7124 12516 13672 15681 17083 18027 18886
1657 2039 2680 2830 8469 9134 9431 9848 12366 12933 13065 18903
1698 2963 3555 7254 9376 13944 14837 15339 15552 16532 17600 21115
325 1586 3064 5498 10061 14027 15028 16349 17719 18177 19867 20401
990 1009 3173 4310 5642 8862 12180 17278 18682 18874 18888 19573
1213 6143 9641 9722 9924 11186 11264 13174 17240 18977 19716 20530
10313 14037
3209 14570
6831 19778
5185 12416
5204 7840
11612 19708
4659 5323 14616
3845 10823 20987
7315 18851 19284
393 9282 17957
6615 9927 19581
8762 10378 18285
126 979 14823
7406 16098 21548
5070 7514 17416
10867 16714 21080
541 1786 19439
909 7175 7837
6412 21072 21433
600 14981 18811
7068 8454 13564
8869 9382 12550
2959 12960 13342
3342 16081 18877
5024 6538 11481
6968 16526 21138

Rate 12/16 N=69120 TYPE B 1507 1536 2244 4721 6374 7839 11001 12684 13196 13602 14245 14383 14398 16182 17248
623 696 1186 1370 4409 5237 5911 8278 9539 12139 12810 13422 15525 16232 16252
530 1953 3745 5512 6676 9069 9433 10683 11530 12263 12519 14931 15326 15581 16208
273 685 3132 5872 6388 7149 7316 7367 9041 11102 11211 12059 15189 15973 16435
814 1297 1896 6018 7801 8810 9701 9992 10314 13618 13771 14934 15198 16340 16742
58 803 2553 3967 6032 8374 9168 10047 10073 10909 12701 12748 13543 14111 17043
1082 1577 2108 2344 5035 5051 10038 10356 12156 12308 13815 15453 15830 16305 17234
1882 3731 5182 5554 6330 6605 7126 10195 10508 12151 12191 12241 12288 13755 16472
85 604 1278 3768 4831 6820 9471 10773 10873 12785 12973 13623 14562 14697 16811
928 1864 6027 7023 7644 8279 8580 9221 9417 9883 12032 12483 12734 14335 15842
2104 2752 4530 4820 5662 9197 9464 9972 10057 11079 12408 13005 13684 15507 16295
82 752 3374 4026 7265 8112 12236 12434 12460 13110 13495 15110 15299 15359 17221
1137 1411 1546 1614 1835 6053 6151 8618 9059 14057 14941 15670 16321 16965
447 1960 2369 2861 3047 3508 4077 4358 4370 5806 12517 13658 14371 14749
420 981 1657 2313 3353 4699 5094 5184 10076 10530 11521 13040 15960 16853
3572 3851 3870 5218 6400 6780 9167 9603 10328 10543 12892 13722 16910 16929
203 2588 4522 4692 5399 6840 7417 8896 9045 9188 10390 12507 12615 16386
543 1262 2536 4358 7658 7714 9392 11079 12283 12694 14734 16195 16317 16751
905 1059 3393 4347 4554 4758 5568 8652 9991 10717 10975 11146 12824 16373
1229 2308 4876 5329 5424 5906 6227 6667 7141 7697 12055 12969 13582 16638
697 1864 2560 4190 5097 5288 6565 9150 9282 9519 10727 12492 13292 16924
363 3152 3715 3722 4582 5050 8399 9413 9851 10305 12116 13471 15318 16018
338 2342 2404 4733 6189 6792 7251 7921 8509 8579 8729 11921 12900 15546
1630 1867 2018 3038 3202 6364 7648 8692 9496 9705 10433 13508 14583 16341
1041 2754 3015 3427 3512 4351 5174 6539 8100 8639 9912 11911 12666 14187
1134 1619 4758 5545 6842 7045 8421 10373 10390 12672 13484 15178 16697 16727
589 652 1174 2157 3951 4733 5278 5859 7619 9488 11665 12335 15516 16024
1457 1832 2525 3690 5093 6000 6276 7974 8652 9759 10434 15025 15267 16448
932 3328 3349 3511 4776 6266 6711 7761 8674 9748 11167 12134 12942 14354
1939 1979 3141 4238 6715 7148 7673 12025 12455 14829 14989 15081 16491 17242
1363 2451
1953 10230
6218 7655
9302 15856
10461 10503
9005 16075
878 14223 15181
3535 5327 14405
8116 8396 9828
2864 6306 14832
24 11009 16377
7064 11014 16139
4318 8353 14997
583 5626 10217
11196 13669 16585
6123 7518 9304
2258 8250 12082
7564 14195 15236
10104 10233 13778
2044 7801 11705
10906 11443 13227
1592 7853 14796
3054 8887 13077
6486 7003 9238
424 9055 13390
618 4077 11120

Rate 12/16 N=69120 ANOTHER TYPE B 142 2165 3185 4195 5590 5742 7410 10850 12863 13660 14020 16831
397 3640 4105 7434 9470 9491 11337 11448 13018 13562 14133 16512
56 1940 2743 5216 6347 8608 9778 11569 12156 14913 15519 16598
791 4323 4700 5211 6469 8199 12509 13542 14292 14489 16171 16605
1818 3304 4541 5563 5792 6609 6684 7166 8280 13868 14456 15283
1293 5440 5814 6864 7396 7860 8007 8929 9766 10275 14026 16130
315 1405 1943 9455 10782 11634 12127 12159 12802 14565 16894 16955
553 777 857 3044 3415 3866 5269 5942 8716 9617 15845 16739
541 3047 4121 5219 5750 7341 8094 8377 10625 11751 14027 16778
114 2846 2917 5468 6412 7606 11745 12096 12808 12931 13150 17183
1757 1833 1954 2287 2852 3178 4890 5688 6571 13856 16191 17042
436 1494 2848 4085 9080 9348 12151 14977 16140 16443 16917 16995
1083 4047 6060 6867 7084 7325 8350 10757 11419 12374 16450 16904
1239 2629 3357 3945 4129 5112 6106 6439 7300 7470 9760 10841
1634 4538 5696 8145 8363 11300 12883 13607 14248 15134 15181 17123
161 1476 1584 5398 6524 8082 8757 8927 9018 10297 11238 12799
283 4460 4788 8081 8652 10590 11954 12024 12443 13684 14830 16639
3817 4569 5212 5225 5642 6709 8069 10835 11184 12541 14503 16342
4688 5857 7055 9256 9523 9555 10935 12296 13024 14271 14842 15510
950 1364 1886 2001 3202 4445 6861 7266 10005 10827 12503 17034
676 2506 5170 6505 9123 9223 9428 10841 12158 12720 16647 16796
160 1341 2169 3030 4986 6616 7382 8557 9035 9855 10304 13928
1275 1429 1905 3211 5541 5874 6259 8254 9098 11688 15281 17260
1092 1367 1825 2046 3468 5686 10019 10898 12575 13663 14429 15077
1321 1604 2153 2296 2364 7328 7554 7888 9903 10391 10427 15163
1346 2379 2878 5786 6798 7501 11153 11894 12245 12440 13244 16895
240 1276 2457 4404 8038 11188 12037 13089 14099 14497 15895 16362
799 813 2506 3447 4526 7075 9747 13800 14189 14949 15078 15106
988 4928 7720 7814 8950 9006 10522 13788 15213 15671 15755 16432
850 1927 4131 4155 5432 6209 7913 7946 8159 11227 11630 15452
14826 16365
11703 12119
712 13566
3116 11731
7615 15442
1992 5349
221 4010 5696
7888 12867 13468
3483 10904 13985
443 8895 11950
6009 10985 12686
2658 6385 13354
8724 15844 16946
5553 10363 16261
2195 5238 10663
598 14905 15764
1356 4805 10512
1933 5558 9695
2230 7616 10698
1298 2645 10290
4025 8617 14782
9819 10189 16907
1284 4501 8928
10113 10629 17016
947 10255 11116
2798 15081 15460

Rate 13/16 N=69120 TYPE B 1031 4123 6253 6610 8007 8656 9181 9404 9596 11501 11654 11710 11994 12177
399 553 1442 2820 4402 4823 5011 5493 7070 8340 8500 9054 11201 11387
201 607 1428 2354 5358 5524 6617 6785 7708 10220 11970 12268 12339 12537
36 992 1930 4525 5837 6283 6887 7284 7489 7550 10329 11202 11399 12795
589 1564 1747 2960 3833 4502 7491 7746 8196 9567 9574 10187 10591 12947
804 1177 1414 3765 4745 7594 9126 9230 9251 10299 10336 11563 11844 12209
2774 2830 3918 4148 4963 5356 7125 7645 7868 8137 9119 9189 9206 12363
59 448 947 3622 5139 8115 9364 9548 9609 9750 10212 10937 11044 12668
715 1352 4538 5277 5729 6210 6418 6938 7090 7109 7386 9012 10737 11893
1583 2059 3398 3619 4277 6896 7484 7525 8284 9318 9817 10227 11636 12204
53 549 3010 5441 6090 9175 9336 9358 9839 10117 11307 11467 11507 12902
861 1054 1177 1201 1383 2538 4563 6451 6800 10540 11222 11757 12240 12732
330 1450 1798 2301 2652 3038 3187 3277 4324 4610 9395 10240 10796 11100
316 751 1226 1746 2124 2505 3497 3833 3891 7551 8696 9763 11978 12661
2677 2888 2904 3923 4804 5105 6855 7222 7893 7907 9674 10274 12683 12702
173 3397 3520 5131 5560 6666 6783 6893 7742 7842 9364 9442 12287
421 943 1893 1920 3273 4052 5758 5787 7043 11051 12141 12209 12500
679 792 2543 3243 3385 3576 4190 7501 8233 8302 9212 9522 12286
911 3651 4023 4462 4650 5336 5762 6506 8050 8381 9636 9724 12486
1373 1728 1911 4101 4913 5003 6859 7137 8035 9056 9378 9937 10184
515 2357 2779 2797 3163 3845 3976 6969 7704 9104 10102 11507 12700
270 1744 1804 3432 3782 4643 5946 6279 6549 7064 7393 11659 12002
261 1517 2269 3554 4762 5103 5460 6429 6464 8962 9651 10927 12268
782 1217 1395 2383 5754 6060 6540 7109 7286 7438 7846 9488 10119
2070 2247 2589 2644 3270 3875 4901 6475 8953 10090 10629 12496 12547
863 1190 1609 2971 3564 4148 5123 5262 6301 7797 7804 9517 11408
449 488 865 3549 3939 4410 4500 5700 7120 8778 9223 11660 12021
1107 1408 1883 2752 3818 4714 5979 6485 7314 7821 11290 11472 12325
713 2492 2507 2641 3576 4711 5021 5831 7334 8362 9094 9690 10778
1487 2344 5035 5336 5727 6495 9009 9345 11090 11261 11314 12383 12944
1038 1463 1472 2944 3202 5742 5793 6972 7853 8919 9808 10549 12619
134 957 2018 2140 2629 3884 5821 7319 8676 10305 10670 12031 12588
5294 9842
4396 6648
2863 5308
10467 11711
3412 6909
450 3919
5639 9801
298 4323
397 10223
4424 9051
2038 2376
5889 11321 12500
3590 4081 12684
3485 4016 9826
6 2869 8310
5983 9818 10877
2282 9346 11477
4931 6135 10473
300 2901 9937
3185 5215 7479
472 5845 5915
2476 7687 11934
3279 8782 11527
4350 7138 7144

Rate 13/16 N=69120 ANOTHER TYPE B
27 138 512 3648 6422 7200 7557 7879 8302 10042 12340 12482
654 1411 2309 2394 2617 4009 5321 5725 6321 8138 11632 12041
920 1594 2256 2572 3039 3367 4787 4869 7115 8111 10119 11192
1556 1717 1827 2370 2446 3120 4228 4487 6608 6866 10373 10452
1151 1671 2238 3557 4755 5885 6265 7650 9526 9837 9946 10224
446 525 897 1165 8246 10195 10688 10768 10792 12143 12187 12955
1008 3306 3957 4122 4448 6200 7142 9087 9602 10049 11651 12175
399 5015 6604 7077 8014 8665 9207 9372 11161 11503 11677 11992
538 1475 2369 2818 4424 4805 5503 8325 8394 9038 11400
190 593 1430 5341 5541 6607 6796 10193 11986 12256 12326
56 1002 4503 5839 7278 7492 7732 10356 11205 11401 12563
597 1937 2970 4522 6295 6913 7515 7536 9519 10152 12803
793 1554 1755 3782 7529 7765 8204 9551 10336 10556 12947
1169 1414 3763 4723 9110 9224 9261 10325 11591 11864 12240
2800 3882 4166 4965 5362 7650 7862 9124 9130 9201 12351
481 965 2839 3617 7103 8066 8168 9724 10200 10932 12651
62 708 1338 5185 6408 9005 9369 9559 9608 11039 11887
3419 4514 5267 5727 6217 6933 7089 7104 7414 10746 12224
1556 2080 3630 4222 7467 7551 8302 9301 9736 10255 11640
553 3008 5461 6093 6897 9161 9340 9847 10143 11319 11456
60 1391 2546 9359 10530 11218 11515 11750 12251 12718 12916
835 1078 1157 1217 4537 4614 6476 6770 9393 10224 10768
350 1475 1774 2139 2271 2636 3051 3198 3305 4326 11083
311 1742 2486 3492 3819 3912 7554 8672 9776 11970 12655
754 1252 2676 2897 3921 5087 6844 7221 7889 12685 12688
2905 3413 4795 6889 7767 7808 7885 9380 9432 9657 10282
179 933 1916 3494 4062 5134 5560 6669 6785 12166 12295
402 1875 3265 5735 5778 7035 8294 9535 11028 12208 12518
655 813 2536 3263 3389 3565 4184 7498 8212 9204 12304
4021 4438 4647 5363 5778 6514 8050 8383 9641 9733 12479
906 1754 1917 3669 4083 4928 4973 6870 9048 9936 10173
506 1395 3160 3836 3961 6967 7145 8035 9374 10091 12696
3530 11498
2796 10372
8659 9088
4259 6291
11049 12016
270 11119
1751 8793
1882 5943
8569 11663
3543 7916
252 1030
9665 10929
1394 3968 5448
281 337 11360
1609 5754 9754
906 1195 8105
8990 10130 12550
6509 9483 10115
6141 7428 10545
8857 9027 10637
3631 4907 12244
6724 7578 12649
2266 2719 7243
838 1443 3616

Rate 14/16 N=69120 TYPE B 387 648 945 3023 3889 4856 5002 5167 6868 7477 7590 8165 8354
42 406 1279 1968 3016 4196 4599 4996 5019 6350 6785 7051 8529
534 784 1034 1160 2530 5033 5171 5469 6167 6372 6913 7718 8621
944 2506 2806 3149 3559 5101 6076 6083 6092 6147 6866 7908 8155
308 1869 1888 2569 3297 4742 5232 5442 6135 6814 7284 8238 8405
34 464 667 899 2421 3425 5382 6258 6373 6399 6489 7367 7922
2276 3014 3525 3829 4135 4276 4611 4733 4738 4956 6025 7152 8155
1047 1370 2406 2819 4600 4991 5017 5590 6199 6483 6556 6834 7760
66 380 2033 3698 4068 6096 6223 6238 6757 7541 7641 7677 8595
562 697 782 808 921 1703 3032 4300 7027 7481 7839 8160 8526
236 962 1557 2023 2135 2190 2892 3072 4523 6254 6838 7209 7381
196 1167 1179 1426 1675 1763 2345 2560 2613 5024 5761 6522 7973
512 822 1778 1924 2610 3445 4570 4805 5263 5299 8439 8448 8464
1923 2270 3204 3698 4456 4522 4601 5161 5207 6260 6310 6441 6851
104 281 622 1276 2172 2334 2731 3417 3854 4698 8095 8195 8333
451 528 1269 2169 2274 2393 3853 5002 5543 6121 6351 7364 8139
1685 2675 2790 2953 3103 3560 4336 5372 5495 5568 6429 6492 8206
604 1190 1279 2427 2714 3283 3312 3855 4566 6045 6664 6788 8317
338 917 1873 2102 2561 2655 4635 4765 5370 6249 6724 7668 8456
184 1166 1583 1859 2376 2521 3093 4181 4713 4926 5146 6070 8004
175 1227 2367 3402 3628 3982 4265 4282 4355 5972 6434 7280 7765
801 922 1029 1531 1606 3170 3824 4358 4732 4849 5225 6759 8183
509 1507 1704 1765 2183 2574 3271 4050 4299 4964 5968 6324 7091
567 795 1376 2390 2767 3424 5195 6355 6726 7607 8346 8352
308 1060 1973 2364 2937 3526 4221 4745 5185 5845 6146 7762
323 590 732 917 2636 3008 3792 3990 4322 4893 5211 8014
471 1249 1674 1841 2567 3124 3130 4885 5575 7521 7648 8227
1582 1669 1772 2386 3340 3387 3881 4322 6018 6055 6488 7177
976 1003 2127 3575 3816 6225 7404 7499 7542 8237 8421 8630
675 961 1957 3825 3858 4646 5248 5801 5940 6533 7040 8037
79 639 1363 1436 1763 2570 3874 4876 6870 6886 7104 8399
20 297 1330 2264 3287 3534 4441 4746 6569 6971 6976 8179
482 1125 1589 2892 3759 3871 4635 6038 6214 6796 6816 7621
1127 3336 3867 3929 4269 4794 5054 5842 6471 6547 7039 8560
217 1521
1983 8283
3731 4402
208 6703
242 4988
4170 5038
4108 8035
3301 8543
3168 8249
5028 5838
3470 8597
2901 5264
2505 4505
934 5117
1712 5819
3165 7273
3274 6115
4576 6330 7327
5380 6732 8439
2474 3723 7782
384 2783 5846
1453 4436 6625

Rate 14/16 N=69120 ANOTHER TYPE B
95 128 735 809 2382 2719 4381 4445 4500 5651 6000 6009 6400 7394
2222 2648 2825 4051 4054 4330 5281 5407 6228 6263 6861 7261 8175 8307
1954 2285 2329 2649 2954 3340 3544 4626 4776 5451 5603 6158 7148 7422
465 677 939 1007 1600 2226 3425 3645 4766 5036 5404 6247 6539 7760
442 1249 2489 2579 3259 4572 4608 4726 5439 6095 6378 8317 8378 8574
74 663 1080 1534 3128 3293 3730 4292 4521 4924 5148 6979 7633 8630
638 689 717 916 939 1607 2766 2992 4129 4543 5450 5845 6883 7205
598 659 812 1014 1066 1245 1731 2847 3656 3775 4960 4992 6300 7578
673 1149 1176 1436 2884 3475 3951 5169 5226 5591 5950 6603 7573 8426
127 629 1242 2196 3758 4017 6013 6128 6232 6538 7073 7307 7946 8166
388 401 1268 1814 2256 3549 4884 5615 6895 7107 7474 7544 7551 7825
523 2477 3119 3849 3901 3978 4486 4518 5258 5593 6899 7587 7912 8215
421 1000 2064 2070 2723 3941 4076 4640 5827 5846 6525 7719 8169
353 1017 1995 2566 2574 2651 4356 5860 6711 6970 7567 7727 8522
238 257 1225 2032 3000 3955 4116 4325 5462 5932 6285 6680 6994
365 523 2306 2379 4362 5344 5993 7473 7500 7861 8116 8431 8492
1119 1320 1993 2434 2783 3032 3758 4830 5154 5206 5339 5516 6453
1209 2599 2786 3404 4309 4487 4753 5051 5064 5100 5170 5558 7108
1551 1696 2789 3142 4097 4267 5178 5815 6165 7088 7731 7806 8269
60 1189 1720 3119 6403 6586 6603 7019 7623 7732 7934 8081 8157
500 1218 1227 1422 1558 1901 3610 4263 4273 4704 4730 5192 6489
146 377 437 1477 2328 2785 4195 6535 7595 7662 7718 7894 8601
36 453 1103 3738 4136 4580 6604 6917 7166 7538 8002 8105 8632
873 3043 3334 4506 4620 4638 5016 5608 6251 6383 6781 6795 8253
185 223 1023 2907 3101 3330 3654 4088 5876 6460 6482 7657 7838
540 583 1507 2890 2997 3820 4288 4571 5231 7105 7311 7401 7916
761 1368 2218 2456 2562 2701 4744 5161 5247 6038 6430 6551 6957
1003 1115 4045 4052 4491 5573 6070 6225 6528 6770 7087 8484 8526
945 1500 2141 2862 5895 5924 6589 6680 7360 7831 7920 7939 8188
282 686 1010 2301 2830 3248 4635 4810 4847 5099 5873 5905 6844
1796 3108 3214 3282 3746 4286 4995 6281 7235 7276 7773 8245 8328
1349 1762 1823 1935 2526 3184 3511 4531 6070 6697 6969 7190 7760
984 1410 2807 3035 3992 4082 4605 5097 5115 6391 6692 8362 8476
757 1281 1736 2103 4164 5905 6331 7278 7514 8213 8396 8440 8465
645 4414
1338 8195
1237 5945
1000 7040
1171 8124
68 2695
3561 5194
1561 3302
4487 6075
3508 8439
2166 2546
1368 1397
785 6326
657 4177
2314 4074
587 5476
1487 5944 6170
3645 6414 7448
1927 3790 6692
1176 4020 7527
1237 5395 6965
83 928 3291

COLUMN WEIGHT DISTRIBUTION AND PERFORMANCE THRESHOLD LIST:

| Rate | X1 | Y1 | K1 | X2 | Y2 | K2 | X3 | M1 | M2 | PERFORMANCE THRESHOLD (Es/N0) |
|---|---|---|---|---|---|---|---|---|---|---|
| 2/16 | 18 | 3 | 2520 | 17 | 3 | 6120 | 17 | 1800 | 58680 | -6.813095 |
| 3/16 | 13 | 3 | 11160 | 12 | 3 | 1800 | 12 | 1800 | 54360 | -4.865416 |
| 4/16 | 18 | 3 | 360 | 10 | 3 | 16920 | 10 | 1800 | 50040 | -3.416395 |
| 5/16 | 10 | 2 | 2520 | 8 | 3 | 19080 | 8 | 1800 | 45720 | -2.220124 |
| 6/16 | 9 | 2 | 8280 | 6 | 3 | 17640 | 9 | 1800 | 41400 | -1.188440 |
| 7/16 | 9 | 2 | 15480 | 2 | 3 | 14760 | 5 | 4680 | 34200 | -0.237234 |
| 8/16 | 7 | 2 | 22680 | 2 | 3 | 11880 | 3 | 3240 | 31320 | 0.603630 |

FIG. 91

| | Rate | X1 | KX1 | X2 | KX2 | Y1 | KY1 | Y2 | KY2 | M | PERFORMANCE THRESHOLD VALUE (Es/N0) |
|---|---|---|---|---|---|---|---|---|---|---|---|
| TYPE B | 7/16 | – | 0 | 20 | 6480 | 4 | 6480 | 3 | 17280 | 38880 | −0. 093497 |
| ANOTHER TYPE B | 7/16 | 21 | 4320 | 20 | 2160 | 4 | 6480 | 3 | 17280 | 38880 | −0. 095051 |
| TYPE B | 8/16 | – | 0 | 24 | 5760 | 6 | 5760 | 3 | 23040 | 34560 | 0. 668232 |
| ANOTHER TYPE B | 8/16 | 22 | 4320 | 21 | 1440 | 6 | 5760 | 3 | 23040 | 34560 | 0. 677172 |
| TYPE B | 9/16 | 16 | 7560 | 15 | 1440 | 4 | 1080 | 3 | 28800 | 30240 | 1. 428823 |
| ANOTHER TYPE B | 9/16 | 16 | 3960 | 14 | 5040 | 4 | 1080 | 3 | 28800 | 30240 | 1. 437271 |
| TYPE B | 10/16 | 17 | 2880 | 16 | 6120 | 4 | 1080 | 3 | 33120 | 25920 | 2. 16195 |
| ANOTHER TYPE B | 10/16 | 18 | 2520 | 17 | 6480 | 4 | 1080 | 3 | 33120 | 25920 | 2. 155295 |
| TYPE B | 11/16 | – | 0 | 15 | 10080 | – | 0 | 3 | 37440 | 21600 | 2. 911363 |
| ANOTHER TYPE B | 11/16 | 13 | 4320 | 12 | 6480 | 2 | 2160 | 3 | 34560 | 21600 | 2. 935036 |
| TYPE B | 12/16 | 15 | 4320 | 14 | 6480 | 2 | 2160 | 3 | 38880 | 17280 | 3. 683039 |
| ANOTHER TYPE B | 12/16 | – | 0 | 12 | 10800 | 2 | 2160 | 3 | 38880 | 17280 | 3. 712254 |
| TYPE B | 13/16 | 14 | 5400 | 13 | 6120 | 2 | 3960 | 3 | 40680 | 12960 | 4. 524858 |
| ANOTHER TYPE B | 13/16 | 12 | 2880 | 11 | 8640 | 2 | 4320 | 3 | 40320 | 12960 | 4. 552867 |
| TYPE B | 14/16 | 13 | 8280 | 12 | 3960 | 2 | 6120 | 3 | 42120 | 8640 | 5. 498004 |
| ANOTHER TYPE B | 14/16 | 14 | 4320 | 13 | 7920 | 2 | 5760 | 3 | 42480 | 8640 | 5. 492328 |

FIG. 92 r=3/16 N=69120 TYPE A

PROVIDED BY JAPAN BROADCASTING CORPORATION 952 1540 1714 4127 4576 13540 16051 22016 28342 29021 29884 34149 43069 45431 45764 49218
560 888 1582 5282 7435 11414 20275 21957 35445 35564 36316 42800 45024 49586 52439 54495
358 690 1339 2085 4919 9289 13240 13592 17626 36076 40463 47406 48151 51157 51667 55260
782 1148 1256 4476 12529 18812 26102 33987 36409 37822 37985 38839 40816 40824 46035 52233
786 1114 1220 8008 15266 16414 18280 19544 24848 27337 29277 31731 31754 34852 50071 50582
61 1023 1329 5463 7360 10119 16898 19922 26180 27792 39278 43941 46391 48767 51534 55637
122 674 1318 3163 4762 11448 13800 14472 17782 21492 21792 22087 23199 30867 32814 54930
201 1523 1535 3026 3795 21814 23438 31100 33271 35220 36784 41091 44823 45201 52727 53980
214 698 872 11001 22869 28522 37629 39576 45388 45685 46767 47410 49179 49707 51036 54550
629 910 1607 3729 7592 12132 19142 20971 26461 26884 27680 28650 32579 38474 44725 46511
459 1092 1245 8857 14843 36588 37166 37409 39090 42239 42434 44302 48827 50073 54458 55508
142 1429 1738 10436 11485 17886 18871 19534 21030 25169 29234 33017 43639 46823 47778 52878
1045 1362 1383 8988 19638 19798 30793 33457 36553 39107 41860 42393 42880 44006 51970 55778
179 1491 1702 6636 14151 22244 22565 22685 27002 28848 28853 31563 33775 44814 46641 52692
493 750 1681 9933 18582 18955 19486 26708 28169 33862 37472 41993 45441 46130 51970 54787
46 612 1350 4248 9202 17520 19232 19497 20177 24136 34460 36988 37528 37984 55455 56037
18 217 234 2619 5013 10736 16236 22379 26775 27970 32100 35692 38772 45572 46062 55106
732 980 1078 2143 12258 13906 20999 21282 40155 41727 43555 47688 47915 49860 51224 51470
1059 1473 1575 11727 20558 23005 29440 34858 35139 37873 38394 38409 39619 44878 47821 52381
285 1186 1679 2583 9932 14540 15464 20148 35790 41235 43021 43062 43877 48636 49400 54782
382 840 1766 6323 7463 11853 15855 15888 24620 24916 31935 32868 33716 34665 47097 51807

FIG. 93

PROVIDED BY JAPAN BROADCASTING CORPORATION 1056 1390 1573 5794 10258 10870 11690 13333 16252 16645 18210 21635 25024 29621 30501 45634
556 1507 1725 2796 15637 19402 21719 25713 33014 36410 41815 44160 48353 51766 52608 53372
359 1081 1747 6819 17365 18139 18764 20152 26540 29929 30048 31032 37095 46243 50419 51519
297 746 805 5707 17136 27103 27890 32573 41459 42684 43339 44871 47175 48131 54197 55984
526 550 1548 2108 3225 5925 10665 19215 22974 28698 38245 39765 42509 43235 55012 55025
490 576 617 4353 6355 9433 19430 22898 27224 34620 39420 39883 49496 54119 55305
42 933 1646 4807 9972 11771 12825 18574 23969 24871 32236 41052 43446 43661 47268
404 1200 1631 10778 12006 14743 14965 26387 29817 31421 34357 36147 38146 49531 53692
214 291 1408 8185 8434 12709 15768 16504 23823 24554 29691 30908 37157 53726 55573
104 1026 1043 1978 5485 5912 7899 8444 11562 13092 13869 32334 40343 40616 56077
645 724 1231 7118 11033 14589 17299 20360 21124 24232 31152 33848 38095 44594 46191
358 524 1066 6855 8629 11142 13318 20412 20422 21368 26287 29401 36219 39998 53475
172 206 323 2918 6547 11296 12985 18361 25257 26261 28464 32415 33575 53342 53792
517 689 1458 3764 4738 6395 12184 14460 16822 22290 33094 38976 41535 43310 45909
475 762 794 16878 25613 26912 27498 28702 30147 30402 30480 40097 49193 51015 52390
3582 6978 16762 18054 21006 23402 24053 24684 32380 34957 36704 38720 48479
3092 7012 7705 12494 12593 22146 25810 31500 48236 49750 53385 53483 53758
14340 14744 16962 24367 25385 28318 30752 38563 47016 50468 50926 52848 53000
4600 5410 6591 9437 16713 23711 25180 34179 34991 45491 52486 52838 53988
9551 15754 22520 24032 25914 27722 29829 31308 33362 34465 47258 50435 50746

FIG. 94 r=7/16 N=69120 TYPE A

PROVIDED BY JAPAN BROADCASTING CORPORATION 1433 3551 5930 8293 11715 12425 14264 17335 22718 36614 38303
894 2650 5160 5232 7528 9399 10347 24238 26882 29766 32375
1450 3997 6744 7562 15569 23016 27200 29193 32849 33254 38785
864 3803 6092 8688 10188 12474 22379 23067 27329 32483 38596
2013 3598 5353 11116 16065 30523 31706 31920 35688 36896 37067
1058 2985 6167 6222 9627 20193 20308 20842 22592 26702 38094
1148 4564 10015 10902 13059 15423 19165 20249 22138 24136 24267
653 3611 6814 8234 14859 21339 21448 24410 26141 26425 38277
342 1992 4954 5102 7780 15322 20102 22040 24154 27668 38424
2771 2837 7858 16144 20043 20758 21990 25754 32232 37322 37703
624 948 7919 10291 21186 24186 25035 25311 25665 30131 37831
438 1571 5061 16288 26760 26831 28652 30764 35086 35358 36233
3530 4053 9005 9297 18544 19579 19981 26348 34159 36716 38809
1101 3898 13807 14319 14708 17491 18247 19249 26016 29336 34927
1573 4387 7057 7652 10426 12219 14867 18658 19508 24925 33176
852 959 6340 8638 8740 17879 17993 28036 32872 33990 36190
913 3965 9852 9931 12792 13503 16904 21072 27616 29701 30144
541 4496 6682 10168 16470 28558 29133 33523 33712 35456 37857
930 1456 9624 12957 17441 20943 23911 27488 27572 28970 38385
762 3464 10205 13291 13778 21278 24444 25977 26107 28740 37946
962 2901 5701 11153 14516 18395 18421 19375 20526 29455 38178
1068 3731 5566 5690 18953 21960 23425 25481 26598 35770 38577
385 2499 14210 15434 15795 17534 26276 26999 30828 31237 31570
712 4041 6437 9346 11248 13001 19788 23997 25381 35072 37264
1541 3171 9483 9780 11542 18579 19629 26436 26510 26530 29842
2826 3355 7323 9453 11577 23289 24321 30276 31560 33505 35115
2607 4113 13679 14818 18726 19373 19484 25852 28394 29075 31499
101 3335 5484 8378 10366 11346 18498 22065 23394 24120 28534
2037 3746 8809 11429 18345 19858 20305 20657 23642 29075 32758
1342 1353 9580 11652 12352 13162 24304 25782 37628 38319 38739
4289 4537 7789 12239 12318 25144 25583 27760 29935 30001 33627
1407 2104 7593 13341 13772 15658 18768 22949 26269 35834 37053
283 3666 7953 8498 10715 15227 15344 21624 23277 23681 24658
1039 2615 8067 10524 11121 17519 17980 22329 28039 30188 31876
2853 4138 11810 11888 15736 17340 18161 21094 23337 29136 36861
732 3115 12067 19926 24457 24863 30681 30844 33326 34660 36203
1689 4238 5000 6964 13104 17145 18382 18810 21246 27798 34365
1988 4480 6362 19230 19702 20121 24061 25225 32060 33790 34882
782 3030 10663 13188 15079 24594 27063 29207 31128 32035 38604
2160 3389 8023 13978 15900 19635 20416 22839 33076 34962 38577
1639 4378 8166 8781 22347 28062 29530 30459 30907 32229 37670
1302 3700 6531 9943 20841 21722 28860 30397 30966 34328 34469

FIG. 95

PROVIDED BY JAPAN BROADCASTING CORPORATION 2580 3067 14591 17305 24991 27155 28129 31435 33702 34742 38176
878 2302 3513 8792 30097
27 165 1499 11445 26229
2740 3378 4070 8121 11725
464 695 2670 19972 31016
58 551 769 13142 18176
1818 2794 3077 14099 28393
649 4125 4624 29698 32032
200 2480 2912 23789 36598
212 3477 4526 10049 30926
901 2299 3757 10605 24358
321 1488 1718 24930 25738
2283 3823 3943 16768 35564
253 2932 4234 21419 29606
2701 3576 4425 9250 24023
2217 3403 4654 14977 23115
817 2872 3491 17773 23918
1783 1838 4330 11645 36545
1231 3435 4503 9035 29888
826 1836 2994 22108 22827
229 1417 2078 14324 17714
567 3244 3728 22202 33883
799 1180 1329 12496 22390
549 1311 3657 17564 35009
132 517 3180 5304 35588
2767 3953 4221 30887 34291
2242 2335 4254 31326 36839
1652 3276 4195 6960 23609
1091 1113 1669 9056 16776
2487 3652 4670 6131 34644
302 1753 3905 17009 21920
222 1322 1942 33666 36472
610 2708 4634 17641 35678
363 2202 3152 7833 27924
1851 3837 4167 25505 33398
1057 2960 3952 17247 35467
173 1598 3061 28458 36252
585 593 1049 10807 28267
122 277 2230 16115 25459
366 2458 4321 12655 13600
1611 1691 2543 18867 35201
1831 4355 4649 4774 24781
9157 18312 20409 23571 31607

FIG. 96

PROVIDED BY JAPAN BROADCASTING CORPORATION 14457 17051 29658 35875 37742
7110 15010 19055 36741 37883
5419 17091 17716 18981 31131
15196 21587 28478 32583 36053
17134 18820 32977 34175 36060
15599 21709 22462 28663 33979
4691 13050 23737 30447 37128
22733 24839 26808 37191 37396
8896 14951 16202 26775 29470
13355 19354 27988 36027 37312
8938 11340 12434 19496 37986
5876 25181 32766 33412 35330

FIG. 97

PROVIDED BY JAPAN BROADCASTING CORPORATION

| Rate | X1 | Y1 | K1 | X2 | Y2 | K2 | X3 | M1 | M2 |
|---|---|---|---|---|---|---|---|---|---|
| 3/16 | 13 | 3 | 9360 | 12 | 3 | 3600 | 13 | 1800 | 54360 |
| 7/16 | 9 | 2 | 15480 | 2 | 3 | 14760 | 5 | 4680 | 34200 |

FIG. 98

| Input Data Cell y | Constellation Point $z_s$ |
|---|---|
| 00 | $(1+j1)/\sqrt{2}$ |
| 01 | $(-1+j1)/\sqrt{2}$ |
| 10 | $(+1-j1)/\sqrt{2}$ |
| 11 | $(-1-j1)/\sqrt{2}$ |

FIG. 99

| w/CR | 2/15 | 3/15 | 4/15 | 5/15 | 6/15 | 7/15 |
|---|---|---|---|---|---|---|
| w0 | 0. 7062+j0. 7075 | 0. 3620+j0. 5534 | 0. 3412+j0. 5241 | 0. 3192+j0. 5011 | 0. 5115+j1. 2092 | 0. 2592+j0. 4888 |
| w1 | 0. 7075+j0. 7062 | 0. 5534+j0. 3620 | 0. 5241+j0. 3412 | 0. 5011+j0. 3192 | 1. 2092+j0. 5115 | 0. 4888+j0. 2592 |
| w2 | 0. 7072+j0. 7077 | 0. 5940+j1. 1000 | 0. 5797+j1. 1282 | 0. 5575+j1. 1559 | 0. 2663+j0. 4530 | 0. 5072+j1. 1980 |
| w3 | 0. 7077+j0. 7072 | 1. 1000+j0. 5940 | 1. 1282+j0. 5797 | 1. 1559+j0. 5575 | 0. 4530+j0. 2663 | 1. 1980+j0. 5072 |

| w/CR | 8/15 | 9/15 | 10/15 | 11/15 | 12/15 | 13/15 |
|---|---|---|---|---|---|---|
| w0 | 0. 2535+j0. 4923 | 0. 2386+j0. 5296 | 0. 4487+j1. 1657 | 0. 9342+j0. 9847 | 0. 9555+j0. 9555 | 0. 9517+j0. 9511 |
| w1 | 0. 4923+j0. 2535 | 0. 5296+j0. 2386 | 1. 2080+j0. 5377 | 0. 9866+j0. 2903 | 0. 9555+j0. 2949 | 0. 9524+j0. 3061 |
| w2 | 0. 4927+j1. 2044 | 0. 4882+j1. 1934 | 0. 2213+j0. 4416 | 0. 2716+j0. 9325 | 0. 2949+j0. 9555 | 0. 3067+j0. 9524 |
| w3 | 1. 2044+j0. 4927 | 1. 1934+j0. 4882 | 0. 6186+j0. 2544 | 0. 2901+j0. 2695 | 0. 2949+j0. 2949 | 0. 3061+j0. 3067 |

FIG. 100

| u/CR | 2/15 | 3/15 | 4/15 | 5/15 | 6/15 | 7/15 |
|---|---|---|---|---|---|---|
| u0 | 0.3317 | 0.2382 | 0.1924 | 0.1313 | 0.1275 | 0.0951 |
| u1 | 0.3321 | 0.2556 | 0.1940 | 0.1311 | 0.1276 | 0.0949 |
| u2 | 0.3322 | 0.2749 | 0.2070 | 0.1269 | 0.1294 | 0.1319 |
| u3 | 0.3321 | 0.2558 | 0.2050 | 0.1271 | 0.1295 | 0.1322 |
| u4 | 0.3327 | 0.2748 | 0.3056 | 0.3516 | 0.3424 | 0.3170 |
| u5 | 0.3328 | 0.2949 | 0.3096 | 0.3504 | 0.3431 | 0.3174 |
| u6 | 0.3322 | 0.2749 | 0.2890 | 0.3569 | 0.3675 | 0.3936 |
| u7 | 0.3322 | 0.2558 | 0.2854 | 0.3581 | 0.3666 | 0.3921 |
| u8 | 0.9369 | 0.9486 | 0.7167 | 0.6295 | 0.6097 | 0.5786 |
| u9 | 0.9418 | 0.8348 | 0.7362 | 0.6301 | 0.6072 | 0.5789 |
| u10 | 0.9514 | 0.7810 | 0.7500 | 0.6953 | 0.7113 | 0.7205 |
| u11 | 0.9471 | 0.8348 | 0.7326 | 0.6903 | 0.7196 | 0.7456 |
| u12 | 0.9448 | 0.9463 | 0.9667 | 0.9753 | 0.9418 | 0.9299 |
| u13 | 0.9492 | 0.8336 | 0.9665 | 1.0185 | 1.0048 | 1.0084 |
| u14 | 0.9394 | 0.9459 | 1.1332 | 1.2021 | 1.2286 | 1.2349 |
| u15 | 0.9349 | 1.4299 | 1.4761 | 1.4981 | 1.5031 | 1.5118 |

| u/CR | 8/15 | 9/15 | 10/15 | 11/15 | 12/15 | 13/15 |
|---|---|---|---|---|---|---|
| u0 | 0.0773 | 0.0638 | 0.0592 | 0.0502 | 0.0354 | 0.0325 |
| u1 | 0.0773 | 0.0638 | 0.0594 | 0.0637 | 0.0921 | 0.0967 |
| u2 | 0.1614 | 0.1757 | 0.1780 | 0.1615 | 0.1602 | 0.1623 |
| u3 | 0.1614 | 0.1756 | 0.1790 | 0.1842 | 0.2185 | 0.2280 |
| u4 | 0.3086 | 0.3069 | 0.2996 | 0.2760 | 0.2910 | 0.2957 |
| u5 | 0.3085 | 0.3067 | 0.3041 | 0.3178 | 0.3530 | 0.3645 |
| u6 | 0.4159 | 0.4333 | 0.4241 | 0.4040 | 0.4264 | 0.4361 |
| u7 | 0.4163 | 0.4343 | 0.4404 | 0.4686 | 0.4947 | 0.5100 |
| u8 | 0.5810 | 0.5765 | 0.5561 | 0.5535 | 0.5763 | 0.5878 |
| u9 | 0.5872 | 0.5862 | 0.6008 | 0.6362 | 0.6531 | 0.6696 |
| u10 | 0.7213 | 0.7282 | 0.7141 | 0.7293 | 0.7417 | 0.7566 |
| u11 | 0.7604 | 0.7705 | 0.8043 | 0.8302 | 0.8324 | 0.8497 |
| u12 | 0.9212 | 0.9218 | 0.9261 | 0.9432 | 0.9386 | 0.9498 |
| u13 | 1.0349 | 1.0364 | 1.0639 | 1.0704 | 1.0529 | 1.0588 |
| u14 | 1.2281 | 1.2234 | 1.2285 | 1.2158 | 1.1917 | 1.1795 |
| u15 | 1.4800 | 1.4646 | 1.4309 | 1.3884 | 1.3675 | 1.3184 |

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 1 | 1 | 1 | 1 | 1 | 1 | 1 | 1 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 0 | 0 | 0 | 0 | 0 | 0 | 0 | 0 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Re(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

B

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 1 | 1 | 1 | 1 | 1 | 1 | 1 | 1 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 0 | 0 | 0 | 0 | 0 | 0 | 0 | 0 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Im(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 102

| | | |
|---|---|---|
| $y_{0,q}$ | 1 | 0 |
| $Re(z_q)$ | −1 | 1 |

FIG. 103

| | | |
|---|---|---|
| $y_{1,q}$ | 1 | 0 |
| $Im(z_q)$ | −1 | 1 |

FIG. 104

| | | | | |
|---|---|---|---|---|
| $y_{0,q}$<br>$y_{2,q}$ | 1<br>0 | 1<br>1 | 0<br>1 | 0<br>0 |
| $Re(z_q)$ | −3 | −1 | 1 | 3 |

FIG. 105

| | | | | |
|---|---|---|---|---|
| $y_{1,q}$<br>$y_{3,q}$ | 1<br>0 | 1<br>1 | 0<br>1 | 0<br>0 |
| $Im(z_q)$ | −3 | −1 | 1 | 3 |

FIG. 106

| | | | | | | | | |
|---|---|---|---|---|---|---|---|---|
| $y_{0,q}$ | 1 | 1 | 1 | 1 | 0 | 0 | 0 | 0 |
| $y_{2,q}$ | 0 | 0 | 1 | 1 | 1 | 1 | 0 | 0 |
| $y_{4,q}$ | 0 | 1 | 1 | 0 | 0 | 1 | 1 | 0 |
| $Re(z_q)$ | −7 | −5 | −3 | −1 | 1 | 3 | 5 | 7 |

FIG. 107

| | | | | | | | | |
|---|---|---|---|---|---|---|---|---|
| $y_{1,q}$ | 1 | 1 | 1 | 1 | 0 | 0 | 0 | 0 |
| $y_{3,q}$ | 0 | 0 | 1 | 1 | 1 | 1 | 0 | 0 |
| $y_{5,q}$ | 0 | 1 | 1 | 0 | 0 | 1 | 1 | 0 |
| $Im(z_q)$ | −7 | −5 | −3 | −1 | 1 | 3 | 5 | 7 |

FIG. 108

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 0 | 0 | 0 | 0 | 0 | 0 | 0 | 0 |
| $y_{2,q}$ | 0 | 0 | 0 | 0 | 1 | 1 | 1 | 1 | 1 | 1 | 1 | 1 | 0 | 0 | 0 | 0 |
| $y_{4,q}$ | 0 | 0 | 1 | 1 | 1 | 1 | 0 | 0 | 0 | 0 | 1 | 1 | 1 | 1 | 0 | 0 |
| $y_{6,q}$ | 0 | 1 | 1 | 0 | 0 | 1 | 1 | 0 | 0 | 1 | 1 | 0 | 0 | 1 | 1 | 0 |
| $Re(z_q)$ | −15 | −13 | −11 | −9 | −7 | −5 | −3 | −1 | 1 | 3 | 5 | 7 | 9 | 11 | 13 | 15 |

FIG. 109

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 0 | 0 | 0 | 0 | 0 | 0 | 0 | 0 |
| $y_{3,q}$ | 0 | 0 | 0 | 0 | 1 | 1 | 1 | 1 | 1 | 1 | 1 | 1 | 0 | 0 | 0 | 0 |
| $y_{5,q}$ | 0 | 0 | 1 | 1 | 1 | 1 | 0 | 0 | 0 | 0 | 1 | 1 | 1 | 1 | 0 | 0 |
| $y_{7,q}$ | 0 | 1 | 1 | 0 | 0 | 1 | 1 | 0 | 0 | 1 | 1 | 0 | 0 | 1 | 1 | 0 |
| $Im(z_q)$ | −15 | −13 | −11 | −9 | −7 | −5 | −3 | −1 | 1 | 3 | 5 | 7 | 9 | 11 | 13 | 15 |

FIG. 110

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $\mathrm{Re}(z_q)$ | −31 | −29 | −27 | −25 | −23 | −21 | −19 | −17 | −15 | −13 | −11 | −9 | −7 | −5 | −3 | −1 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $\mathrm{Re}(z_q)$ | 1 | 3 | 5 | 7 | 9 | 11 | 13 | 15 | 17 | 19 | 21 | 23 | 25 | 27 | 29 | 31 |

FIG. 111

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | −31 | −29 | −27 | −25 | −23 | −21 | −19 | −17 | −15 | −13 | −11 | −9 | −7 | −5 | −3 | −1 |

| | | | | | | | | | | | | | | | | |
|---|---|---|---|---|---|---|---|---|---|---|---|---|---|---|---|---|
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |

FIG. 112

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | −63 | −61 | −59 | −57 | −55 | −53 | −51 | −49 | −47 | −45 | −43 | −41 | −39 | −37 | −35 | −33 |
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | −31 | −29 | −27 | −25 | −23 | −21 | −19 | −17 | −15 | −13 | −11 | −9 | −7 | −5 | −3 | −1 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 33 | 35 | 37 | 39 | 41 | 43 | 45 | 47 | 49 | 51 | 53 | 55 | 57 | 59 | 61 | 63 |

FIG. 113

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | -63 | -61 | -59 | -57 | -55 | -53 | -51 | -49 | -47 | -45 | -43 | -41 | -39 | -37 | -35 | -33 |
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | -31 | -29 | -27 | -25 | -23 | -21 | -19 | -17 | -15 | -13 | -11 | -9 | -7 | -5 | -3 | -1 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 33 | 35 | 37 | 39 | 41 | 43 | 45 | 47 | 49 | 51 | 53 | 55 | 57 | 59 | 61 | 63 |

FIG. 114

| w/CR | 2/16 | 4/16 | 6/16 | 8/16 | 10/16 | 12/16 | 14/16 |
|---|---|---|---|---|---|---|---|
| w0 | 0.707107+j0.707107 | 0.707107+j0.707107 | 0.463340+j0.284191 | 0.457029+j0.264235 | 0.493628+j0.253004 | 0.418917+j0.217263 | 0.297592+j0.297592 |
| w1 | 0.707107+j0.707107 | 0.707107+j0.707107 | 0.284191+j0.463340 | 0.264235+j0.457029 | 0.253004+j0.493628 | 0.257090+j0.657759 | 0.297592+j0.954693 |
| w2 | 0.707107+j0.707107 | 0.707107+j0.707107 | 1.192750+j0.530940 | 1.210202+j0.506671 | 1.204042+j0.492548 | 1.144505+j0.432606 | 0.954693+j0.297592 |
| w3 | 0.707107+j0.707107 | 0.707107+j0.707107 | 0.530940+j1.192750 | 0.506671+j1.210202 | 0.492548+j1.204042 | 0.565917+j1.208827 | 0.954693+j0.954693 |

FIG. 115

| w/CR | 3/16 | 5/16 | 7/16 | 9/16 | 11/16 | 13/16 |
|---|---|---|---|---|---|---|
| w0 | 0.587870+j0.405339 | 0.453023+j0.266260 | 0.541390+j0.300280 | 0.608698+j0.346004 | 0.611105+j0.349327 | 0.700327+j0.329907 |
| w1 | 0.587870+j0.405339 | 0.453023+j0.266260 | 0.559889+j0.242973 | 0.673707+j0.196861 | 0.675906+j0.148761 | 0.889256+j0.138511 |
| w2 | 0.587870+j0.405339 | 0.453023+j0.266260 | 0.357657+j0.209444 | 0.301149+j0.169680 | 0.259839+j0.153788 | 0.447469+j0.131347 |
| w3 | 0.587870+j0.405339 | 0.453023+j0.266260 | 0.355882+j0.194677 | 0.302029+j0.151421 | 0.251152+j0.128725 | 0.138015+j0.101309 |
| w4 | 0.405339+j0.587870 | 0.266260+j0.453023 | 0.300280+j0.541390 | 0.346004+j0.608698 | 0.416770+j0.616005 | 0.448992+j0.566892 |
| w5 | 0.405339+j0.587870 | 0.266260+j0.453023 | 0.242973+j0.559889 | 0.196861+j0.673707 | 0.174887+j0.744087 | 0.142663+j0.669940 |
| w6 | 0.405339+j0.587870 | 0.266260+j0.453023 | 0.209444+j0.357657 | 0.169680+j0.301149 | 0.182356+j0.382221 | 0.343126+j0.358344 |
| w7 | 0.405339+j0.587870 | 0.266260+j0.453023 | 0.194677+j0.355882 | 0.151421+j0.302029 | 0.129870+j0.410574 | 0.121210+j0.383416 |
| w8 | 1.056554+j0.611394 | 1.209224+j0.511520 | 0.949854+j0.564434 | 0.885139+j0.562962 | 0.890899+j0.557418 | 0.889124+j0.602821 |
| w9 | 1.056554+j0.611394 | 1.209224+j0.511520 | 1.067076+j0.274552 | 1.019339+j0.225537 | 1.029624+j0.193508 | 1.233619+j0.212708 |
| w10 | 1.056554+j0.611394 | 1.209224+j0.511520 | 1.265348+j0.819022 | 1.259403+j0.843530 | 1.248726+j0.812443 | 1.067496+j0.962512 |
| w11 | 1.056554+j0.611394 | 1.209224+j0.511520 | 1.452799+j0.300853 | 1.486685+j0.292085 | 1.462453+j0.283106 | 1.394097+j0.591196 |
| w12 | 0.611394+j1.056554 | 0.511520+j1.209224 | 0.564434+j0.949854 | 0.562962+j0.885139 | 0.617897+j0.860530 | 0.563858+j0.843483 |
| w13 | 0.611394+j1.056554 | 0.511520+j1.209224 | 0.274552+j1.067076 | 0.225537+j1.019339 | 0.218691+j1.046861 | 0.194790+j0.974535 |
| w14 | 0.611394+j1.056554 | 0.511520+j1.209224 | 0.819022+j1.265348 | 0.843530+j1.259403 | 0.842216+j1.227794 | 0.673475+j1.223631 |
| w15 | 0.611394+j1.056554 | 0.511520+j1.209224 | 0.300853+j1.452799 | 0.292085+j1.480085 | 0.299603+j1.462746 | 0.230654+j1.302914 |

FIG. 116

| w/CR | 2/16 | 4/16 | 6/16 | 8/16 | 10/16 | 12/16 | 14/16 |
|---|---|---|---|---|---|---|---|
| w0 | 0.690825+j0.585349 | 0.457029+j0.264235 | 0.585930+j0.319930 | 0.581805+j0.334988 | 0.550392+j0.290156 | 0.578370+j0.309447 | 0.556205+j0.306313 |
| w1 | 0.690825+j0.585350 | 0.457029+j0.264235 | 0.579831+j0.315654 | 0.585635+j0.330968 | 0.681112+j0.358142 | 0.721702+j0.389496 | 0.698107+j0.361975 |
| w2 | 0.690827+j0.585349 | 0.457029+j0.264235 | 0.629024+j0.217617 | 0.638661+j0.155525 | 0.601303+j0.115783 | 0.660123+j0.174184 | 0.583112+j0.186592 |
| w3 | 0.690828+j0.585349 | 0.457029+j0.264235 | 0.621593+j0.216858 | 0.643156+j0.156556 | 0.768180+j0.154857 | 0.799367+j0.241027 | 0.740611+j0.219107 |
| w4 | 0.690826+j0.585350 | 0.457029+j0.264235 | 0.579831+j0.315654 | 0.582963+j0.340165 | 0.544087+j0.309193 | 0.526085+j0.368822 | 0.497423+j0.421234 |
| w5 | 0.690825+j0.585350 | 0.457029+j0.264235 | 0.574244+j0.311784 | 0.586528+j0.335691 | 0.649801+j0.400611 | 0.630503+j0.500103 | 0.632312+j0.499021 |
| w6 | 0.690827+j0.585349 | 0.457029+j0.264235 | 0.621593+j0.216858 | 0.641671+j0.154211 | 0.602332+j0.106466 | 0.685472+j0.083624 | 0.605376+j0.061678 |
| w7 | 0.690827+j0.585350 | 0.457029+j0.264235 | 0.614800+j0.216139 | 0.645888+j0.155218 | 0.779701+j0.111826 | 0.836826+j0.086747 | 0.761043+j0.074016 |
| w8 | 0.690824+j0.585350 | 0.457029+j0.264235 | 0.313766+j0.177294 | 0.256324+j0.154712 | 0.353688+j0.173948 | 0.421081+j0.189169 | 0.372292+j0.238687 |
| w9 | 0.690824+j0.585350 | 0.457029+j0.264235 | 0.314209+j0.177479 | 0.257740+j0.155093 | 0.142216+j0.108687 | 0.254956+j0.091406 | 0.234548+j0.177704 |
| w10 | 0.690826+j0.585350 | 0.457029+j0.264235 | 0.314479+j0.163373 | 0.253905+j0.133141 | 0.383183+j0.095256 | 0.508228+j0.088452 | 0.438984+j0.152224 |
| w11 | 0.690825+j0.585350 | 0.457029+j0.264235 | 0.314993+j0.163511 | 0.255461+j0.133228 | 0.131151+j0.092101 | 0.086721+j0.072310 | 0.071834+j0.148278 |
| w12 | 0.690825+j0.585350 | 0.457029+j0.264235 | 0.314209+j0.177479 | 0.257989+j0.155663 | 0.353498+j0.175656 | 0.411013+j0.203430 | 0.378135+j0.354399 |
| w13 | 0.690824+j0.585350 | 0.457029+j0.264235 | 0.314645+j0.177662 | 0.259423+j0.156052 | 0.141590+j0.108762 | 0.254446+j0.094768 | 0.234014+j0.058219 |
| w14 | 0.690826+j0.585350 | 0.457029+j0.264235 | 0.314993+j0.163511 | 0.255597+j0.133615 | 0.382409+j0.095366 | 0.515559+j0.071509 | 0.440779+j0.051628 |
| w15 | 0.690826+j0.585350 | 0.457029+j0.264235 | 0.315501+j0.163646 | 0.257175+j0.133701 | 0.130510+j0.092363 | 0.086440+j0.072876 | 0.084467+j0.052398 |
| w16 | 0.585350+j0.690825 | 0.264235+j0.457029 | 0.319930+j0.585930 | 0.379008+j0.600742 | 0.388353+j0.540097 | 0.327555+j0.525982 | 0.338331+j0.660786 |
| w17 | 0.585350+j0.690826 | 0.264235+j0.457029 | 0.315654+j0.579831 | 0.375622+j0.606499 | 0.419487+j0.605548 | 0.382772+j0.675704 | 0.418845+j0.776409 |
| w18 | 0.585351+j0.690825 | 0.264235+j0.457029 | 0.217617+j0.629024 | 0.168779+j0.701232 | 0.183551+j0.653534 | 0.175886+j0.592219 | 0.206352+j0.743684 |
| w19 | 0.585351+j0.690825 | 0.264235+j0.457029 | 0.216858+j0.621593 | 0.176024+j0.703042 | 0.192718+j0.682799 | 0.231337+j0.737121 | 0.278826+j0.886705 |
| w20 | 0.585350+j0.690826 | 0.264235+j0.457029 | 0.315654+j0.579831 | 0.381824+j0.601641 | 0.420548+j0.516710 | 0.406824+j0.473389 | 0.433185+j0.545796 |
| w21 | 0.585350+j0.690826 | 0.264235+j0.457029 | 0.311784+j0.574244 | 0.377966+j0.607168 | 0.478320+j0.574186 | 0.507079+j0.602578 | 0.542935+j0.632044 |
| w22 | 0.585351+j0.690825 | 0.264235+j0.457029 | 0.216858+j0.621593 | 0.162549+j0.708528 | 0.130081+j0.671539 | 0.081174+j0.613265 | 0.065905+j0.768425 |
| w23 | 0.585351+j0.690826 | 0.264235+j0.457029 | 0.216139+j0.614800 | 0.169978+j0.709409 | 0.130631+j0.694276 | 0.083021+j0.787926 | 0.090272+j0.923832 |
| w24 | 0.585349+j0.690826 | 0.264235+j0.457029 | 0.177294+j0.313766 | 0.164033+j0.346721 | 0.254460+j0.369220 | 0.269365+j0.373217 | 0.253830+j0.554022 |
| w25 | 0.585349+j0.690826 | 0.264235+j0.457029 | 0.177479+j0.314209 | 0.164869+j0.347827 | 0.149136+j0.316482 | 0.200539+j0.250430 | 0.176737+j0.283231 |
| w26 | 0.585350+j0.690826 | 0.264235+j0.457029 | 0.163373+j0.314479 | 0.128349+j0.362615 | 0.141602+j0.435973 | 0.109576+j0.442010 | 0.156460+j0.607057 |
| w27 | 0.585350+j0.690826 | 0.264235+j0.457029 | 0.163511+j0.314993 | 0.128793+j0.363810 | 0.099783+j0.370718 | 0.075318+j0.256488 | 0.059053+j0.271040 |
| w28 | 0.585350+j0.690826 | 0.264235+j0.457029 | 0.177479+j0.314209 | 0.165196+j0.349443 | 0.256602+j0.364260 | 0.289438+j0.350712 | 0.295727+j0.448465 |
| w29 | 0.585349+j0.690827 | 0.264235+j0.457029 | 0.177662+j0.314645 | 0.166055+j0.350585 | 0.145729+j0.314336 | 0.205632+j0.245612 | 0.182567+j0.384902 |
| w30 | 0.585351+j0.690826 | 0.264235+j0.457029 | 0.163511+j0.314993 | 0.128552+j0.366258 | 0.131228+j0.437877 | 0.076874+j0.448991 | 0.058840+j0.576445 |
| w31 | 0.585350+j0.690826 | 0.264235+j0.457029 | 0.163646+j0.315501 | 0.129002+j0.367499 | 0.095964+j0.371670 | 0.072444+j0.254884 | 0.061187+j0.420342 |
| w32 | 0.837320+j0.692111 | 1.210202+j0.506671 | 0.915494+j0.562969 | 0.875123+j0.541294 | 1.015975+j0.544514 | 1.010495+j0.556385 | 1.003447+j0.483696 |

FIG. 117

| | | | | | | | |
|---|---|---|---|---|---|---|---|
| w33 | 0.837320+j0.692111 | 1.210202+j0.506671 | 0.899840+j0.548599 | 0.857263+j0.493450 | 0.865222+j0.447394 | 0.861166+j0.469956 | 0.845525+j0.420972 |
| w34 | 0.837322+j0.692111 | 1.210202+j0.506671 | 1.041461+j0.244937 | 1.005452+j0.192113 | 1.128584+j0.334833 | 1.106160+j0.346451 | 1.062454+j0.293134 |
| w35 | 0.837322+j0.692111 | 1.210202+j0.506671 | 1.020188+j0.244325 | 0.959325+j0.208138 | 0.956829+j0.243315 | 0.944982+j0.295093 | 0.896494+j0.255193 |
| w36 | 0.837321+j0.692112 | 1.210202+j0.506671 | 0.899840+j0.548599 | 0.835873+j0.546548 | 0.880528+j0.680980 | 0.875484+j0.737255 | 0.913205+j0.665202 |
| w37 | 0.837320+j0.692112 | 1.210202+j0.506671 | 0.883121+j0.533505 | 0.820382+j0.497932 | 0.787015+j0.549425 | 0.745110+j0.618549 | 0.767362+j0.579003 |
| w38 | 0.837323+j0.692111 | 1.210202+j0.506671 | 1.020188+j0.244325 | 0.978090+j0.164900 | 1.176544+j0.123217 | 1.156123+j0.117857 | 1.090971+j0.098120 |
| w39 | 0.837322+j0.692112 | 1.210202+j0.506671 | 0.997866+j0.243471 | 0.934838+j0.182858 | 0.984649+j0.117137 | 0.989858+j0.099899 | 0.921093+j0.085363 |
| w40 | 0.837319+j0.692112 | 1.210202+j0.506671 | 1.151606+j0.765652 | 1.146306+j0.718300 | 1.215599+j0.699359 | 1.191952+j0.656926 | 1.187342+j0.536796 |
| w41 | 0.837318+j0.692112 | 1.210202+j0.506671 | 1.215021+j0.808778 | 1.291524+j0.653771 | 1.470503+j0.909385 | 1.428402+j0.781680 | 1.372857+j0.669123 |
| w42 | 0.837321+j0.692111 | 1.210202+j0.506671 | 1.352992+j0.268569 | 1.334471+j0.242999 | 1.345613+j0.437140 | 1.302908+j0.407617 | 1.251173+j0.323729 |
| w43 | 0.837320+j0.692112 | 1.210202+j0.506671 | 1.427958+j0.282998 | 1.395846+j0.389207 | 1.641491+j0.562622 | 1.558455+j0.483525 | 1.461132+j0.407370 |
| w44 | 0.837320+j0.692112 | 1.210202+j0.506671 | 1.215021+j0.808778 | 1.124883+j0.844081 | 1.036455+j0.904332 | 1.034030+j0.874552 | 1.088040+j0.742804 |
| w45 | 0.837319+j0.692113 | 1.210202+j0.506671 | 1.479922+j0.989013 | 1.534980+j0.961645 | 1.216171+j1.212947 | 1.241676+j1.044629 | 1.239054+j0.916396 |
| w46 | 0.837322+j0.692112 | 1.210202+j0.506671 | 1.427958+j0.282998 | 1.404319+j0.139223 | 1.412229+j0.146603 | 1.360208+j0.138162 | 1.281447+j0.108014 |
| w47 | 0.837321+j0.692112 | 1.210202+j0.506671 | 1.747630+j0.343683 | 1.784855+j0.324115 | 1.729269+j0.190765 | 1.625172+j0.163628 | 1.504307+j0.136707 |
| w48 | 0.692112+j0.837321 | 0.506671+j1.210202 | 0.562969+j0.915494 | 0.608985+j0.850637 | 0.520270+j0.894599 | 0.523810+j0.993510 | 0.639937+j0.977245 |
| w49 | 0.692111+j0.837321 | 0.506671+j1.210202 | 0.548599+j0.899840 | 0.551777+j0.870592 | 0.483940+j0.849621 | 0.448217+j0.829659 | 0.537002+j0.862344 |
| w50 | 0.692113+j0.837320 | 0.506671+j1.210202 | 0.244937+j1.041461 | 0.190487+j1.082774 | 0.232928+j0.985823 | 0.321209+j1.067223 | 0.455568+j1.065457 |
| w51 | 0.692113+j0.837321 | 0.506671+j1.210202 | 0.244325+j1.020188 | 0.244881+j1.048792 | 0.257181+j0.965383 | 0.276744+j0.893825 | 0.281384+j1.059541 |
| w52 | 0.692112+j0.837321 | 0.506671+j1.210202 | 0.548599+j0.899840 | 0.610952+j0.803882 | 0.694953+j0.796701 | 0.710545+j0.883461 | 0.792733+j0.832232 |
| w53 | 0.692112+j0.837322 | 0.506671+j1.210202 | 0.533506+j0.883121 | 0.555010+j0.811974 | 0.623283+j0.720032 | 0.605159+j0.738080 | 0.662410+j0.724582 |
| w54 | 0.692114+j0.837321 | 0.506671+j1.210202 | 0.244325+j1.020188 | 0.168637+j1.002744 | 0.107976+j0.949083 | 0.108346+j1.104617 | 0.105974+j1.274300 |
| w55 | 0.692113+j0.837321 | 0.506671+j1.210202 | 0.243471+j0.997866 | 0.205501+j0.980310 | 0.122236+j0.924513 | 0.093597+j0.927820 | 0.098152+j1.088542 |
| w56 | 0.692111+j0.837322 | 0.506671+j1.210202 | 0.765652+j1.151606 | 0.811871+j1.077059 | 0.634215+j1.095182 | 0.616510+j1.185736 | 0.775759+j1.106874 |
| w57 | 0.692110+j0.837322 | 0.506671+j1.210202 | 0.808778+j1.215021 | 0.708577+j1.212442 | 0.555938+j1.212930 | 0.741498+j1.425730 | 0.816189+j1.333815 |
| w58 | 0.692112+j0.837321 | 0.506671+j1.210202 | 0.268569+j1.352992 | 0.232238+j1.415900 | 0.134887+j1.326793 | 0.376428+j1.273967 | 0.549851+j1.233599 |
| w59 | 0.692112+j0.837321 | 0.506671+j1.210202 | 0.282998+j1.427958 | 0.447381+j1.368136 | 0.343747+j1.293003 | 0.452484+j1.534369 | 0.549193+j1.472735 |
| w60 | 0.692111+j0.837322 | 0.506671+j1.210202 | 0.808778+j1.215021 | 0.945797+j1.067632 | 0.842609+j1.029273 | 0.838816+j1.052224 | 0.952209+j0.936182 |
| w61 | 0.692111+j0.837322 | 0.506671+j1.210202 | 0.989012+j1.479922 | 1.098653+j1.408274 | 0.867471+j1.388566 | 1.008623+j1.261597 | 1.056456+j1.143504 |
| w62 | 0.692113+j0.837322 | 0.506671+j1.210202 | 0.282998+j1.427958 | 0.188583+j1.727023 | 0.174737+j1.671315 | 0.126520+j1.317668 | 0.319114+j1.324413 |
| w63 | 0.692113+j0.837322 | 0.506671+j1.210202 | 0.343683+j1.747630 | 0.657638+j1.731517 | 0.546701+j1.623153 | 0.151986+j1.588069 | 0.151901+j1.531081 |

FIG. 118

| u/CR | 3/16 | 5/16 | 7/16 | 9/16 | 11/16 | 13/16 |
|---|---|---|---|---|---|---|
| u0 | 0.964850 | 0.746358 | 0.682758 | 0.720492 | 0.718420 | 0.741203 |
| u1 | 0.964851 | 0.724327 | 0.689494 | 0.745635 | 0.785950 | 0.837561 |
| u2 | 0.964850 | 0.701244 | 0.614079 | 0.578601 | 0.566863 | 0.571567 |
| u3 | 0.964851 | 0.724852 | 0.608604 | 0.578878 | 0.591711 | 0.652725 |
| u4 | 0.964851 | 1.089143 | 1.229555 | 1.234916 | 1.228615 | 1.196834 |
| u5 | 0.964851 | 1.487807 | 1.519290 | 1.511816 | 1.446265 | 1.354509 |
| u6 | 0.964851 | 1.016430 | 0.952184 | 0.929933 | 0.919117 | 0.944049 |
| u7 | 0.964851 | 0.981269 | 1.010198 | 1.008385 | 1.055715 | 1.062656 |
| u8 | 0.262799 | 0.188668 | 0.119570 | 0.131917 | 0.179189 | 0.158838 |
| u9 | 0.262799 | 0.187756 | 0.119309 | 0.132245 | 0.179229 | 0.216557 |
| u10 | 0.262799 | 0.183302 | 0.122704 | 0.095129 | 0.060071 | 0.034740 |
| u11 | 0.262799 | 0.184133 | 0.122986 | 0.094858 | 0.060040 | 0.089245 |
| u12 | 0.262799 | 0.299163 | 0.361306 | 0.393581 | 0.431407 | 0.422770 |
| u13 | 0.262799 | 0.295502 | 0.360929 | 0.392102 | 0.437930 | 0.493766 |
| u14 | 0.262799 | 0.306233 | 0.349187 | 0.316988 | 0.303511 | 0.286845 |
| u15 | 0.262799 | 0.310441 | 0.349698 | 0.317410 | 0.304552 | 0.350258 |

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 1 | 1 | 1 | 1 | 1 | 1 | 1 | 1 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 0 | 0 | 0 | 0 | 0 | 0 | 0 | 0 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Re(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

B

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 1 | 1 | 1 | 1 | 1 | 1 | 1 | 1 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 0 | 0 | 0 | 0 | 0 | 0 | 0 | 0 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Im(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 120

| u/CR | 2/16 | 4/16 | 6/16 | 8/16 | 10/16 | 12/16 | 14/16 |
|---|---|---|---|---|---|---|---|
| u0 | 0.951821 | 0.772242 | 0.670816 | 0.720040 | 0.687860 | 0.725026 | 0.776914 |
| u1 | 0.951821 | 0.755105 | 0.671187 | 0.717092 | 0.687453 | 0.682522 | 0.731844 |
| u2 | 0.951821 | 0.733323 | 0.684394 | 0.742371 | 0.784311 | 0.833407 | 0.872060 |
| u3 | 0.951821 | 0.748492 | 0.683930 | 0.746130 | 0.778844 | 0.779595 | 0.823606 |
| u4 | 0.951821 | 0.762565 | 0.601258 | 0.568017 | 0.529234 | 0.542187 | 0.605096 |
| u5 | 0.951821 | 0.741006 | 0.601273 | 0.568434 | 0.529245 | 0.530376 | 0.565319 |
| u6 | 0.951821 | 0.771170 | 0.594244 | 0.571550 | 0.587945 | 0.627093 | 0.688258 |
| u7 | 0.951821 | 0.797312 | 0.594239 | 0.571162 | 0.588065 | 0.601059 | 0.646057 |
| u8 | 0.951821 | 1.144458 | 1.253351 | 1.234492 | 1.288591 | 1.273237 | 1.213263 |
| u9 | 0.951821 | 1.153922 | 1.197825 | 1.174495 | 1.172818 | 1.182640 | 1.148415 |
| u10 | 0.951821 | 1.658369 | 1.695168 | 1.675628 | 1.610570 | 1.491684 | 1.361829 |
| u11 | 0.951821 | 1.306308 | 1.431932 | 1.433385 | 1.432017 | 1.374447 | 1.283388 |
| u12 | 0.951821 | 0.910861 | 0.932278 | 0.907903 | 0.905961 | 0.956192 | 0.974968 |
| u13 | 0.951821 | 0.864684 | 0.935172 | 0.914425 | 0.885027 | 0.892801 | 0.922447 |
| u14 | 0.951821 | 0.903549 | 0.990523 | 1.005079 | 1.064442 | 1.100380 | 1.087536 |
| u15 | 0.951821 | 0.940034 | 0.989938 | 0.980523 | 1.006622 | 1.025215 | 1.029882 |
| u16 | 0.306654 | 0.215961 | 0.115733 | 0.153556 | 0.169392 | 0.148680 | 0.177357 |
| u17 | 0.306654 | 0.220732 | 0.115734 | 0.153554 | 0.169393 | 0.148677 | 0.145054 |
| u18 | 0.306654 | 0.224176 | 0.115606 | 0.153573 | 0.172311 | 0.209035 | 0.243373 |
| u19 | 0.306654 | 0.219360 | 0.115605 | 0.153576 | 0.172310 | 0.209018 | 0.210474 |
| u20 | 0.306654 | 0.196638 | 0.116628 | 0.075094 | 0.056177 | 0.029660 | 0.047926 |
| u21 | 0.306654 | 0.200750 | 0.116629 | 0.075095 | 0.056177 | 0.029660 | 0.016211 |
| u22 | 0.306654 | 0.197697 | 0.116766 | 0.075098 | 0.057134 | 0.088798 | 0.112331 |
| u23 | 0.306654 | 0.193649 | 0.116765 | 0.075098 | 0.057134 | 0.088798 | 0.080421 |
| u24 | 0.306654 | 0.263498 | 0.361114 | 0.411488 | 0.400665 | 0.399082 | 0.451783 |
| u25 | 0.306654 | 0.268956 | 0.361058 | 0.411542 | 0.400670 | 0.397734 | 0.415679 |
| u26 | 0.306654 | 0.272340 | 0.359367 | 0.411127 | 0.427709 | 0.467702 | 0.526543 |
| u27 | 0.306654 | 0.266958 | 0.359424 | 0.411075 | 0.427698 | 0.463378 | 0.488786 |
| u28 | 0.306654 | 0.299845 | 0.342823 | 0.304005 | 0.283846 | 0.270711 | 0.310792 |
| u29 | 0.306654 | 0.305269 | 0.342769 | 0.303985 | 0.283843 | 0.270625 | 0.277078 |
| u30 | 0.306654 | 0.302366 | 0.344552 | 0.303827 | 0.293434 | 0.333743 | 0.380080 |
| u31 | 0.306654 | 0.296777 | 0.344606 | 0.303847 | 0.293437 | 0.333375 | 0.345309 |

FIG. 121

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 0 | 0 | 0 | 0 | 0 | 0 | 0 | 0 |
| $y_{4,s}$ | 0 | 0 | 0 | 0 | 0 | 0 | 0 | 0 | 1 | 1 | 1 | 1 | 1 | 1 | 1 | 1 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 1 | 1 | 1 | 1 | 1 | 1 | 1 | 1 | 1 | 1 | 1 | 1 | 1 | 1 | 1 | 1 |
| $y_{4,s}$ | 1 | 1 | 1 | 1 | 1 | 1 | 1 | 1 | 0 | 0 | 0 | 0 | 0 | 0 | 0 | 0 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-u_{0}$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 1 | 1 | 1 | 1 | 1 | 1 | 1 | 1 |
| $y_{4,s}$ | 0 | 0 | 0 | 0 | 0 | 0 | 0 | 0 | 1 | 1 | 1 | 1 | 1 | 1 | 1 | 1 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $u_{0}$ | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 0 | 0 | 0 | 0 | 0 | 0 | 0 | 0 | 0 | 0 | 0 | 0 | 0 | 0 | 0 | 0 |
| $y_{4,s}$ | 1 | 1 | 1 | 1 | 1 | 1 | 1 | 1 | 0 | 0 | 0 | 0 | 0 | 0 | 0 | 0 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 122

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 0 | 0 | 0 | 0 | 0 | 0 | 0 | 0 |
| $y_{5,s}$ | 0 | 0 | 0 | 0 | 0 | 0 | 0 | 0 | 1 | 1 | 1 | 1 | 1 | 1 | 1 | 1 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 1 | 1 | 1 | 1 | 1 | 1 | 1 | 1 | 1 | 1 | 1 | 1 | 1 | 1 | 1 | 1 |
| $y_{5,s}$ | 1 | 1 | 1 | 1 | 1 | 1 | 1 | 1 | 0 | 0 | 0 | 0 | 0 | 0 | 0 | 0 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-u_{0}$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 1 | 1 | 1 | 1 | 1 | 1 | 1 | 1 |
| $y_{5,s}$ | 0 | 0 | 0 | 0 | 0 | 0 | 0 | 0 | 1 | 1 | 1 | 1 | 1 | 1 | 1 | 1 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $u_{0}$ | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 0 | 0 | 0 | 0 | 0 | 0 | 0 | 0 | 0 | 0 | 0 | 0 | 0 | 0 | 0 | 0 |
| $y_{5,s}$ | 1 | 1 | 1 | 1 | 1 | 1 | 1 | 1 | 0 | 0 | 0 | 0 | 0 | 0 | 0 | 0 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 124

| Modulation | Rows in Part 1 $N_{part1}$ | Rows in Part 2 $N_{part2}$ | Columns m |
|---|---|---|---|
| QPSK | 69120 | 0 | 2 |
| 16QAM | 69120 | 0 | 4 |
| 64QAM | 69120 | 0 | 6 |
| 256QAM | 69120 | 0 | 8 |
| 1024QAM | 68400 | 720 | 10 |
| 4096QAM | 69120 | 0 | 12 |

FIG. 127

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 133 | 69 | 28 | 111 | 127 | 5 | 97 | 42 | 9 | 160 | 139 | 135 | 138 | 130 | 86 | 94 | 75 | 15 | 21 | 73 | 89 | 59 |
| 76 | 17 | 64 | 152 | 55 | 106 | 34 | 2 | 163 | 187 | 170 | 52 | 1 | 174 | 45 | 99 | 57 | 105 | 4 | 35 | 119 | 31 |
| 114 | 155 | 67 | 156 | 8 | 88 | 103 | 172 | 149 | 58 | 166 | 37 | 164 | 189 | 71 | 30 | 72 | 148 | 38 | 98 | 176 | 185 |
| 182 | 134 | 95 | 173 | 78 | 48 | 96 | 26 | 151 | 167 | 159 | 175 | 74 | 53 | 162 | 110 | 54 | 49 | 83 | 79 | 171 | 90 |
| 61 | 100 | 150 | 121 | 43 | 66 | 144 | 44 | 132 | 188 | 115 | 41 | 25 | 80 | 13 | 104 | 161 | 65 | 116 | 14 | 158 | 51 |
| 117 | 60 | 190 | 140 | 186 | 123 | 40 | 122 | 102 | 128 | 107 | 183 | 11 | 146 | 10 | 68 | 0 | 84 | 36 | 143 | 153 | 93 |
| 33 | 50 | 101 | 7 | 27 | 137 | 120 | 191 | 165 | 131 | 18 | 70 | 112 | 154 | 169 | 92 | 29 | 136 | 12 | 157 | 47 | 19 |
| 181 | 147 | 180 | 141 | 142 | 126 | 118 | 129 | 124 | 3 | 177 | 62 | 16 | 22 | 179 | 39 | 145 | 85 | 32 | 168 | 77 | 6 |
| 23 | 125 | 82 | 113 | 20 | 109 | 24 | 178 | 46 | 81 | 108 | 63 | 56 | 87 | 91 | 184 | | | | | | |

FIG. 128

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 56 | 85 | 9 | 118 | 38 | 182 | 80 | 116 | 96 | 47 | 69 | 176 | 49 | 180 | 8 | 72 | 44 | 154 | 177 | 101 | 35 | 125 |
| 17 | 34 | 121 | 37 | 170 | 174 | 78 | 4 | 27 | 10 | 65 | 6 | 25 | 15 | 33 | 169 | 188 | 46 | 93 | 36 | 129 | 152 |
| 59 | 167 | 122 | 184 | 54 | 148 | 42 | 40 | 134 | 189 | 28 | 87 | 70 | 144 | 161 | 185 | 29 | 173 | 166 | 146 | 67 | 57 |
| 187 | 76 | 19 | 71 | 50 | 158 | 94 | 24 | 43 | 133 | 98 | 149 | 119 | 61 | 90 | 3 | 179 | 2 | 68 | 12 | 111 | 138 |
| 109 | 141 | 103 | 13 | 66 | 112 | 147 | 21 | 135 | 20 | 7 | 139 | 162 | 55 | 110 | 39 | 26 | 106 | 97 | 114 | 123 | 91 |
| 100 | 18 | 150 | 178 | 108 | 126 | 75 | 62 | 99 | 89 | 168 | 88 | 175 | 0 | 95 | 77 | 11 | 48 | 191 | 171 | 102 | 41 |
| 5 | 74 | 86 | 128 | 181 | 53 | 22 | 105 | 140 | 45 | 16 | 73 | 104 | 30 | 143 | 79 | 84 | 145 | 142 | 164 | 117 | 23 |
| 31 | 159 | 51 | 136 | 157 | 107 | 58 | 156 | 165 | 83 | 155 | 1 | 163 | 113 | 81 | 82 | 127 | 137 | 64 | 186 | 124 | 160 |
| 120 | 52 | 151 | 190 | 92 | 32 | 153 | 60 | 172 | 63 | 183 | 130 | 131 | 14 | 115 | 132 | | | | | | |

FIG. 129

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 17 | 64 | 171 | 69 | 132 | 126 | 31 | 140 | 181 | 157 | 32 | 119 | 50 | 3 | 158 | 86 | 51 | 82 | 154 | 176 | 60 | 70 |
| 117 | 110 | 107 | 111 | 61 | 186 | 178 | 7 | 188 | 81 | 19 | 30 | 165 | 104 | 22 | 35 | 145 | 113 | 155 | 97 | 131 | 26 |
| 179 | 142 | 63 | 57 | 175 | 122 | 105 | 12 | 24 | 4 | 42 | 147 | 172 | 183 | 120 | 25 | 180 | 95 | 48 | 15 | 150 | 162 |
| 170 | 148 | 108 | 20 | 149 | 90 | 23 | 83 | 47 | 103 | 5 | 187 | 163 | 137 | 52 | 189 | 184 | 11 | 87 | 84 | 151 | 177 |
| 174 | 34 | 139 | 75 | 54 | 96 | 102 | 33 | 166 | 167 | 59 | 127 | 134 | 78 | 121 | 182 | 133 | 46 | 124 | 9 | 106 | 71 |
| 37 | 76 | 94 | 123 | 45 | 16 | 144 | 115 | 10 | 160 | 185 | 85 | 164 | 99 | 91 | 136 | 173 | 1 | 66 | 141 | 152 | 6 |
| 13 | 41 | 14 | 168 | 89 | 101 | 72 | 67 | 98 | 29 | 62 | 190 | 93 | 73 | 100 | 153 | 28 | 135 | 161 | 39 | 116 | 65 |
| 56 | 156 | 2 | 27 | 80 | 143 | 40 | 129 | 36 | 21 | 146 | 88 | 18 | 138 | 38 | 169 | 74 | 109 | 68 | 49 | 159 | 112 |
| 114 | 58 | 118 | 77 | 191 | 53 | 8 | 92 | 44 | 55 | 0 | 130 | 128 | 125 | 79 | 43 | | | | | | |

FIG. 130

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 173 | 36 | 60 | 172 | 41 | 149 | 45 | 75 | 144 | 68 | 148 | 168 | 134 | 58 | 86 | 50 | 115 | 167 | 54 | 29 | 1 | 132 |
| 125 | 114 | 69 | 77 | 135 | 39 | 145 | 139 | 163 | 44 | 146 | 40 | 106 | 178 | 52 | 14 | 78 | 174 | 3 | 126 | 20 | 169 |
| 98 | 47 | 33 | 121 | 109 | 88 | 185 | 157 | 183 | 152 | 158 | 76 | 56 | 30 | 123 | 137 | 186 | 89 | 83 | 141 | 156 | 143 |
| 2 | 90 | 151 | 111 | 170 | 161 | 182 | 79 | 66 | 26 | 108 | 119 | 38 | 35 | 180 | 154 | 153 | 175 | 181 | 72 | 80 | 23 |
| 15 | 122 | 49 | 10 | 4 | 17 | 155 | 179 | 46 | 24 | 37 | 129 | 0 | 171 | 34 | 63 | 27 | 57 | 166 | 177 | 117 | 120 |
| 113 | 100 | 28 | 6 | 55 | 71 | 150 | 187 | 131 | 147 | 43 | 64 | 102 | 176 | 130 | 93 | 105 | 128 | 138 | 164 | 127 | 142 |
| 51 | 12 | 42 | 53 | 99 | 133 | 87 | 188 | 13 | 159 | 190 | 140 | 84 | 59 | 104 | 65 | 7 | 189 | 160 | 162 | 74 | 107 |
| 118 | 101 | 22 | 62 | 61 | 103 | 25 | 124 | 112 | 70 | 16 | 97 | 67 | 116 | 82 | 81 | 110 | 48 | 92 | 184 | 96 | 94 |
| 91 | 165 | 19 | 31 | 5 | 11 | 32 | 95 | 18 | 21 | 73 | 85 | 136 | 191 | 9 | 8 | | | | | | |

FIG. 131

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

| | | | | | | | | | | | | | | | | | | | | | |
|---|---|---|---|---|---|---|---|---|---|---|---|---|---|---|---|---|---|---|---|---|---|
| 72 | 32 | 158 | 84 | 105 | 181 | 63 | 16 | 111 | 87 | 112 | 185 | 120 | 74 | 176 | 14 | 81 | 79 | 34 | 128 | 163 | 64 |
| 161 | 146 | 42 | 26 | 191 | 173 | 60 | 3 | 41 | 162 | 23 | 44 | 38 | 24 | 149 | 172 | 88 | 104 | 21 | 118 | 91 | 184 |
| 70 | 85 | 142 | 25 | 159 | 186 | 148 | 96 | 188 | 190 | 61 | 123 | 169 | 136 | 33 | 109 | 54 | 101 | 7 | 19 | 145 | 137 |
| 107 | 82 | 121 | 90 | 144 | 187 | 180 | 8 | 132 | 114 | 65 | 29 | 51 | 103 | 139 | 141 | 55 | 108 | 68 | 0 | 124 | 170 |
| 18 | 143 | 177 | 2 | 22 | 179 | 166 | 53 | 6 | 99 | 73 | 12 | 43 | 69 | 129 | 183 | 71 | 39 | 165 | 171 | 28 | 92 |
| 189 | 119 | 113 | 20 | 151 | 59 | 46 | 66 | 102 | 182 | 153 | 94 | 140 | 115 | 174 | 125 | 127 | 116 | 31 | 47 | 156 | 147 |
| 135 | 48 | 110 | 160 | 89 | 86 | 40 | 155 | 100 | 36 | 35 | 57 | 56 | 9 | 80 | 126 | 62 | 75 | 52 | 83 | 1 | 76 |
| 17 | 122 | 178 | 30 | 131 | 27 | 164 | 106 | 152 | 49 | 37 | 167 | 78 | 95 | 168 | 175 | 117 | 4 | 50 | 13 | 93 | 97 |
| 150 | 45 | 157 | 130 | 154 | 10 | 133 | 77 | 15 | 67 | 98 | 134 | 138 | 11 | 58 | 5 | | | | | | |

FIG. 132

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 9 | 5 | 13 | 50 | 156 | 80 | 30 | 150 | 18 | 84 | 54 | 87 | 40 | 140 | 12 | 169 | 1 | 65 | 90 | 99 | 21 | 94 |
| 20 | 158 | 27 | 168 | 19 | 128 | 57 | 151 | 37 | 36 | 15 | 45 | 59 | 136 | 4 | 2 | 106 | 160 | 83 | 48 | 103 | 78 |
| 173 | 33 | 172 | 186 | 24 | 164 | 181 | 35 | 183 | 72 | 73 | 176 | 161 | 119 | 76 | 125 | 121 | 124 | 16 | 174 | 66 | 34 |
| 177 | 137 | 46 | 44 | 126 | 116 | 69 | 41 | 145 | 3 | 114 | 132 | 32 | 7 | 105 | 31 | 56 | 134 | 155 | 135 | 108 | 93 |
| 89 | 167 | 81 | 190 | 131 | 127 | 102 | 88 | 62 | 49 | 163 | 170 | 53 | 63 | 38 | 178 | 0 | 77 | 188 | 22 | 180 | 185 |
| 191 | 153 | 61 | 129 | 144 | 39 | 138 | 166 | 14 | 154 | 82 | 29 | 110 | 146 | 123 | 60 | 187 | 11 | 162 | 25 | 157 | 52 |
| 91 | 118 | 133 | 17 | 28 | 10 | 130 | 111 | 159 | 42 | 58 | 141 | 142 | 189 | 68 | 107 | 8 | 113 | 6 | 74 | 47 | 75 |
| 109 | 175 | 147 | 64 | 149 | 92 | 43 | 85 | 96 | 122 | 117 | 171 | 152 | 26 | 79 | 86 | 51 | 95 | 67 | 165 | 112 | 148 |
| 182 | 143 | 179 | 120 | 139 | 97 | 184 | 104 | 71 | 70 | 115 | 23 | 100 | 98 | 101 | 55 | | | | | | |

FIG. 133

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 173 | 19 | 14 | 40 | 115 | 80 | 35 | 24 | 79 | 94 | 33 | 109 | 101 | 61 | 142 | 128 | 130 | 162 | 11 | 159 | 47 | 160 |
| 143 | 38 | 65 | 122 | 6 | 181 | 12 | 45 | 0 | 106 | 153 | 56 | 21 | 125 | 17 | 129 | 85 | 186 | 27 | 155 | 107 | 156 |
| 191 | 151 | 90 | 135 | 64 | 57 | 113 | 175 | 49 | 108 | 149 | 164 | 26 | 146 | 105 | 104 | 29 | 100 | 84 | 92 | 3 | 58 |
| 41 | 91 | 139 | 174 | 70 | 182 | 89 | 131 | 25 | 119 | 178 | 7 | 48 | 54 | 184 | 1 | 126 | 43 | 179 | 168 | 120 | 60 |
| 190 | 68 | 136 | 176 | 163 | 13 | 71 | 147 | 63 | 37 | 72 | 32 | 30 | 123 | 185 | 154 | 167 | 86 | 103 | 138 | 127 | 148 |
| 50 | 152 | 66 | 46 | 118 | 96 | 10 | 111 | 145 | 99 | 180 | 88 | 158 | 114 | 110 | 73 | 117 | 112 | 52 | 165 | 62 | 23 |
| 102 | 59 | 36 | 5 | 116 | 98 | 53 | 188 | 39 | 93 | 31 | 28 | 55 | 172 | 189 | 187 | 67 | 15 | 16 | 4 | 22 | 133 |
| 76 | 44 | 87 | 77 | 18 | 78 | 169 | 166 | 83 | 82 | 161 | 74 | 134 | 157 | 81 | 95 | 42 | 132 | 121 | 8 | 97 | 141 |
| 20 | 170 | 69 | 177 | 34 | 140 | 124 | 183 | 51 | 137 | 9 | 2 | 75 | 144 | 171 | 150 | | | | | | |

FIG. 134

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 27 | 109 | 45 | 105 | 174 | 62 | 185 | 69 | 102 | 91 | 37 | 39 | 31 | 34 | 127 | 111 | 30 | 23 | 157 | 155 | 76 | 19 |
| 85 | 172 | 122 | 5 | 36 | 100 | 26 | 59 | 136 | 79 | 25 | 134 | 101 | 3 | 96 | 135 | 21 | 2 | 35 | 82 | 47 | 143 |
| 56 | 54 | 149 | 7 | 175 | 170 | 144 | 71 | 190 | 94 | 64 | 131 | 145 | 40 | 191 | 86 | 90 | 24 | 139 | 20 | 184 | 181 |
| 29 | 176 | 124 | 159 | 12 | 43 | 187 | 16 | 162 | 57 | 0 | 188 | 11 | 42 | 4 | 164 | 156 | 22 | 95 | 81 | 153 | 141 |
| 169 | 117 | 50 | 151 | 89 | 120 | 189 | 167 | 177 | 173 | 140 | 118 | 51 | 55 | 113 | 171 | 41 | 63 | 148 | 106 | 9 | 17 |
| 80 | 97 | 77 | 83 | 182 | 161 | 137 | 15 | 125 | 186 | 88 | 98 | 32 | 138 | 129 | 46 | 52 | 73 | 168 | 115 | 165 | 142 |
| 38 | 84 | 128 | 166 | 107 | 116 | 123 | 114 | 93 | 78 | 178 | 66 | 146 | 160 | 104 | 121 | 48 | 74 | 13 | 61 | 70 | 60 |
| 75 | 163 | 179 | 28 | 130 | 154 | 53 | 110 | 10 | 33 | 112 | 18 | 180 | 147 | 133 | 1 | 65 | 68 | 8 | 44 | 108 | 132 |
| 183 | 6 | 119 | 67 | 14 | 152 | 72 | 150 | 103 | 87 | 58 | 99 | 126 | 92 | 49 | 158 | | | | | | |

FIG. 136

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 163 | 174 | 26 | 190 | 68 | 80 | 112 | 146 | 97 | 44 | 156 | 134 | 51 | 167 | 19 | 127 | 145 | 102 | 20 | 58 | 30 | 9 |
| 153 | 143 | 32 | 63 | 189 | 180 | 110 | 41 | 101 | 166 | 104 | 138 | 89 | 42 | 27 | 8 | 161 | 67 | 72 | 81 | 106 | 132 |
| 175 | 107 | 116 | 186 | 108 | 13 | 96 | 154 | 10 | 103 | 139 | 99 | 164 | 29 | 12 | 118 | 123 | 109 | 133 | 61 | 64 | 0 |
| 128 | 17 | 6 | 45 | 159 | 1 | 66 | 24 | 38 | 33 | 95 | 187 | 50 | 120 | 21 | 168 | 182 | 184 | 141 | 148 | 31 | 79 |
| 25 | 144 | 170 | 18 | 176 | 135 | 183 | 7 | 90 | 52 | 94 | 77 | 65 | 3 | 15 | 85 | 43 | 100 | 35 | 124 | 39 | 57 |
| 78 | 88 | 70 | 76 | 171 | 149 | 121 | 125 | 84 | 16 | 140 | 40 | 150 | 157 | 36 | 48 | 162 | 2 | 62 | 22 | 147 | 83 |
| 53 | 82 | 177 | 98 | 115 | 69 | 105 | 151 | 136 | 181 | 56 | 173 | 122 | 111 | 47 | 179 | 191 | 119 | 87 | 178 | 155 | 131 |
| 185 | 91 | 60 | 55 | 54 | 37 | 172 | 169 | 4 | 188 | 158 | 11 | 59 | 160 | 129 | 5 | 34 | 14 | 137 | 117 | 126 | 114 |
| 49 | 73 | 74 | 28 | 75 | 152 | 142 | 71 | 23 | 86 | 93 | 130 | 92 | 113 | 46 | 165 | | | | | | |

H=

TRANSMISSION METHOD AND RECEPTION DEVICE

TECHNICAL FIELD

The present technology relates to a transmission method and a reception device, and more particularly to, for example, a transmission method and a reception device for securing favorable communication quality in data transmission using an LDPC code.

BACKGROUND ART

Low density parity check (LDPC) codes have high error correction capability and are in recent years widely adopted in transmission systems for digital broadcasting or the like, such as the digital video broadcasting (DVB)-S.2 in Europe and the like, DVB-T.2, DVB-C.2, and the advanced television systems committee (ATSC) 3.0 in the United States, and the like, for example (see, for example, Non-Patent Document 1).

With recent researches, it has been found that the LDPC codes are able to obtain performance close to the Shannon limit as the code length is increased, similarly to turbo codes and the like. Furthermore, the LDPC codes have a property that the minimum distance is proportional to the code length and thus have a good block error probability characteristic, as characteristics. Moreover, a so-called error floor phenomenon observed in decoding characteristics of turbo codes and the like hardly occur, which is also an advantage.

CITATION LIST

Non-Patent Document

Non-Patent Document 1: ATSC Standard: Physical Layer Protocol (A/322), 7 Sep. 2016

SUMMARY OF THE INVENTION

Problems to be Solved by the Invention

In data transmission using an LDPC code, for example, the LDPC code is symbols (symbolized) of quadrature modulation (digital modulation) such as quadrature phase shift keying (QPSK), and the symbols are mapped at signal points of the quadrature modulation and are sent.

The data transmission using an LDPC code is spreading worldwide and is required to secure favorable communication (transmission) quality.

The present technology has been made in view of such a situation, and aims to secure favorable communication quality in data transmission using an LDPC code.

Solutions to Problems

A first transmission method of the present technology is a transmission method including a coding step of performing LDPC coding on the basis of a parity check matrix of an LDPC code with a code length N of 69120 bits and a coding rate r of 7/16, a group-wise interleaving step of performing group-wise interleaving in which the LDPC code is interleaved in units of bit groups of 360 bits, and a mapping step of mapping the LDPC code to one of 4 signal points of quadrature phase shift keying (QPSK) on a 2-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 191, 12, 188, 158, 173, 48, 75, 146, 113, 15, 51, 119, 132, 161, 91, 189, 142, 93, 120, 29, 156, 101, 100, 22, 165, 65, 98, 153, 127, 74, 39, 80, 38, 130, 148, 81, 13, 24, 125, 0, 174, 140, 124, 5, 68, 3, 104, 136, 63, 162, 106, 8, 25, 182, 178, 90, 96, 79, 168, 172, 128, 64, 69, 102, 45, 66, 86, 155, 163, 6, 152, 164, 108, 9, 111, 16, 177, 53, 94, 85, 72, 32, 147, 184, 117, 30, 54, 34, 70, 149, 157, 109, 73, 41, 131, 187, 185, 18, 4, 150, 92, 143, 14, 115, 20, 50, 26, 83, 36, 58, 169, 107, 129, 121, 43, 103, 21, 139, 52, 167, 19, 2, 40, 116, 181, 61, 141, 17, 33, 11, 135, 1, 37, 123, 180, 137, 77, 166, 183, 82, 23, 56, 88, 67, 176, 76, 35, 71, 105, 87, 78, 171, 55, 62, 44, 57, 97, 122, 112, 59, 27, 99, 84, 10, 134, 42, 118, 144, 49, 28, 126, 95, 7, 110, 186, 114, 151, 145, 175, 138, 133, 31, 179, 89, 46, 160, 170, 60, 154, 159, 47, 190, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |

-continued

| | | | | | | | | | | |
|---|---|---|---|---|---|---|---|---|---|---|
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |
| 5419 | 17091 | 17716 | 18981 | 31131 | | | | | | |
| 15196 | 21587 | 28478 | 32583 | 36053 | | | | | | |
| 17134 | 18820 | 32977 | 34175 | 36060 | | | | | | |
| 15599 | 21709 | 22462 | 28663 | 33979 | | | | | | |
| 4691 | 13050 | 23737 | 30447 | 37128 | | | | | | |
| 22733 | 24839 | 26808 | 37191 | 37396 | | | | | | |
| 8896 | 14951 | 16202 | 26775 | 29470 | | | | | | |

-continued

| | | | | |
|---|---|---|---|---|
| 13355 | 19354 | 27988 | 36027 | 37312 |
| 8938 | 11340 | 12434 | 19496 | 37986 |
| 5876 | 25181 | 32766 | 33412 | 35330. |

A first reception device of the present technology is a reception device including a group-wise deinterleaving unit configured to return a sequence of an LDPC code with a code length N of 69120 bits and a coding rate r of 7/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 4 signal points of quadrature phase shift keying (QPSK) on a 2-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 191, 12, 188, 158, 173, 48, 75, 146, 113, 15, 51, 119, 132, 161, 91, 189, 142, 93, 120, 29, 156, 101, 100, 22, 165, 65, 98, 153, 127, 74, 39, 80, 38, 130, 148, 81, 13, 24, 125, 0, 174, 140, 124, 5, 68, 3, 104, 136, 63, 162, 106, 8, 25, 182, 178, 90, 96, 79, 168, 172, 128, 64, 69, 102, 45, 66, 86, 155, 163, 6, 152, 164, 108, 9, 111, 16, 177, 53, 94, 85, 72, 32, 147, 184, 117, 30, 54, 34, 70, 149, 157, 109, 73, 41, 131, 187, 185, 18, 4, 150, 92, 143, 14, 115, 20, 50, 26, 83, 36, 58, 169, 107, 129, 121, 43, 103, 21, 139, 52, 167, 19, 2, 40, 116, 181, 61, 141, 17, 33, 11, 135, 1, 37, 123, 180, 137, 77, 166, 183, 82, 23, 56, 88, 67, 176, 76, 35, 71, 105, 87, 78, 171, 55, 62, 44, 57, 97, 122, 112, 59, 27, 99, 84, 10, 134, 42, 118, 144, 49, 28, 126, 95, 7, 110, 186, 114, 151, 145, 175, 138, 133, 31, 179, 89, 46, 160, 170, 60, 154, 159, 47, 190, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |

-continued

| | | | | | | | | | | |
|---|---|---|---|---|---|---|---|---|---|---|
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |
| 5419 | 17091 | 17716 | 18981 | 31131 | | | | | | |
| 15196 | 21587 | 28478 | 32583 | 36053 | | | | | | |
| 17134 | 18820 | 32977 | 34175 | 36060 | | | | | | |
| 15599 | 21709 | 22462 | 28663 | 33979 | | | | | | |
| 4691 | 13050 | 23737 | 30447 | 37128 | | | | | | |
| 22733 | 24839 | 26808 | 37191 | 37396 | | | | | | |
| 8896 | 14951 | 16202 | 26775 | 29470 | | | | | | |
| 13355 | 19354 | 27988 | 36027 | 37312 | | | | | | |
| 8938 | 11340 | 12434 | 19496 | 37986 | | | | | | |
| 5876 | 25181 | 32766 | 33412 | 35330. | | | | | | |

A second transmission method of the present technology is a transmission method including a coding step of performing LDPC coding on the basis of a parity check matrix of an LDPC code with a code length N of 69120 bits and a coding rate r of 3/16, a group-wise interleaving step of performing group-wise interleaving in which the LDPC code is interleaved in units of bit groups of 360 bits, and a mapping step of mapping the LDPC code to one of 16 signal points of uniform constellation (UC) in 16 quadrature amplitude modulation (16QAM) on a 4-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 133, 69, 28, 111, 127, 5, 97, 42, 9, 160, 139, 135, 138, 130, 86, 94, 75, 15, 21, 73, 89, 59, 76, 17, 64, 152, 55, 106, 34, 2, 163, 187, 170, 52, 1, 174, 45, 99, 57, 105, 4, 35, 119, 31, 114, 155, 67, 156, 8, 88, 103, 172, 149, 58, 166, 37, 164, 189, 71, 30, 72, 148, 38, 98, 176, 185, 182, 134, 95, 173, 78, 48, 96, 26, 151, 167, 159, 175, 74, 53, 162, 110, 54, 49, 83, 79, 171, 90, 61, 100, 150, 121, 43, 66, 144, 44, 132, 188, 115, 41, 25, 80, 13, 104, 161, 65, 116, 14, 158, 51, 117, 60, 190, 140, 186, 123, 40, 122, 102, 128, 107, 183, 11, 146, 10, 68, 0, 84, 36, 143, 153, 93, 33, 50, 101, 7, 27, 137, 120, 191, 165, 131, 18, 70, 112, 154, 169, 92, 29, 136, 12, 157, 47, 19, 181, 147, 180, 141, 142, 126, 118, 129, 124, 3, 177, 62, 16, 22, 179, 39, 145, 85, 32, 168, 77, 6, 23, 125, 82, 113, 20, 109, 24, 178, 46, 81, 108, 63, 56, 87, 91, 184, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |

-continued

| | | | | | | | | | |
|---|---|---|---|---|---|---|---|---|---|
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

A second reception device of the present technology is a reception device including: a group-wise deinterleaving unit configured to return a sequence of an LDPC code with a code length N of 69120 bits and a coding rate r of 3/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 16 signal points of uniform constellation (UC) of 16 quadrature amplitude modulation (16QAM) on a 4-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 133, 69, 28, 111, 127, 5, 97, 42, 9, 160, 139, 135, 138, 130, 86, 94, 75, 15, 21, 73, 89, 59, 76, 17, 64, 152, 55, 106, 34, 2, 163, 187, 170, 52, 1, 174, 45, 99, 57, 105, 4, 35, 119, 31, 114, 155, 67, 156, 8, 88, 103, 172, 149, 58, 166, 37, 164, 189, 71, 30, 72, 148, 38, 98, 176, 185, 182, 134, 95, 173, 78, 48, 96, 26, 151, 167, 159, 175, 74, 53, 162, 110, 54, 49, 83, 79, 171, 90, 61, 100, 150, 121, 43, 66, 144, 44, 132, 188, 115, 41, 25, 80, 13, 104, 161, 65, 116, 14, 158, 51, 117, 60, 190, 140, 186, 123, 40, 122, 102, 128, 107, 183, 11, 146, 10, 68, 0, 84, 36, 143, 153, 93, 33, 50, 101, 7, 27, 137, 120, 191, 165, 131, 18, 70, 112, 154, 169, 92, 29, 136, 12, 157, 47, 19, 181, 147, 180, 141, 142, 126, 118, 129, 124, 3, 177, 62, 16, 22, 179, 39, 145, 85, 32, 168, 77, 6, 23, 125, 82, 113, 20, 109, 24, 178, 46, 81, 108, 63, 56, 87, 91, 184, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |

-continued

| | | | | | | | | | |
|---|---|---|---|---|---|---|---|---|---|
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

A third transmission method of the present technology is a transmission method including a coding step of performing LDPC coding on the basis of a parity check matrix of an LDPC code with a code length N of 69120 bits and a coding rate r of 7/16, a group-wise interleaving step of performing group-wise interleaving in which the LDPC code is interleaved in units of bit groups of 360 bits, and a mapping step of mapping the LDPC code to one of 16 signal points of uniform constellation (UC) in 16 quadrature amplitude modulation (16QAM) on a 4-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 56, 85, 9, 118, 38, 182, 80, 116, 96, 47, 69, 176, 49, 180, 8, 72, 44, 154, 177, 101, 35, 125, 17, 34, 121, 37, 170, 174, 78, 4, 27, 10, 65, 6, 25, 15, 33, 169, 188, 46, 93, 36, 129, 152, 59, 167, 122, 184, 54, 148, 42, 40, 134, 189, 28, 87, 70, 144, 161, 185, 29, 173, 166, 146, 67, 57, 187, 76, 19, 71, 50, 158, 94, 24, 43, 133, 98, 149, 119, 61, 90, 3, 179, 2, 68, 12, 111, 138, 109, 141, 103, 13, 66, 112, 147, 21, 135, 20, 7, 139, 162, 55, 110, 39, 26, 106, 97, 114, 123, 91, 100, 18, 150, 178, 108, 126, 75, 62, 99, 89, 168, 88, 175, 0, 95, 77, 11, 48, 191, 102, 171, 41, 5, 74, 86, 128, 181, 53, 22, 105, 140, 45, 16, 73, 104, 30, 143, 79, 84, 145, 142, 164, 117, 23, 31, 159, 51, 136, 157, 107, 58, 156, 165, 83, 155, 1, 163, 113, 81, 82, 127, 137, 64, 186, 124, 160, 120, 52, 151, 190, 92, 32, 153, 60, 172, 63, 183, 130, 131, 14, 115, 132, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |

-continued

| | | | | |
|---|---|---|---|---|
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

A third reception device of the present technology is a reception device including: a group-wise deinterleaving unit configured to return a sequence of an LDPC code with a code length N of 69120 bits and a coding rate r of 7/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 16 signal points of uniform constellation (UC) of 16 quadrature amplitude modulation (16QAM) on a 4-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 56, 85, 9, 118, 38, 182, 80, 116, 96, 47, 69, 176, 49, 180, 8, 72, 44, 154, 177, 101, 35, 125, 17, 34, 121, 37, 170, 174, 78, 4, 27, 10, 65, 6, 25, 15, 33, 169, 188, 46, 93, 36, 129, 152, 59, 167, 122, 184, 54, 148, 42, 40, 134, 189, 28, 87, 70, 144, 161, 185, 29, 173, 166, 146, 67, 57, 187, 76, 19, 71, 50, 158, 94, 24, 43, 133, 98, 149, 119, 61, 90, 3, 179, 2, 68, 12, 111, 138, 109, 141, 103, 13, 66, 112, 147, 21, 135, 20, 7, 139, 162, 55, 110, 39, 26, 106, 97, 114, 123, 91, 100, 18, 150, 178, 108, 126, 75, 62, 99, 89, 168, 88, 175, 0, 95, 77, 11, 48, 191, 102, 171, 41, 5, 74, 86, 128, 181, 53, 22, 105, 140, 45, 16, 73, 104, 30, 143, 79, 84, 145, 142, 164, 117, 23, 31, 159, 51, 136, 157, 107, 58, 156, 165, 83, 155, 1, 163, 113, 81, 82, 127, 137, 64, 186, 124, 160, 120, 52, 151, 190, 92, 32, 153, 60, 172, 63, 183, 130, 131, 14, 115, 132, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |

-continued

| | | | | | | | | | | |
|---|---|---|---|---|---|---|---|---|---|---|
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |
| 5419 | 17091 | 17716 | 18981 | 31131 | | | | | | |
| 15196 | 21587 | 28478 | 32583 | 36053 | | | | | | |
| 17134 | 18820 | 32977 | 34175 | 36060 | | | | | | |
| 15599 | 21709 | 22462 | 28663 | 33979 | | | | | | |
| 4691 | 13050 | 23737 | 30447 | 37128 | | | | | | |
| 22733 | 24839 | 26808 | 37191 | 37396 | | | | | | |
| 8896 | 14951 | 16202 | 26775 | 29470 | | | | | | |
| 13355 | 19354 | 27988 | 36027 | 37312 | | | | | | |
| 8938 | 11340 | 12434 | 19496 | 37986 | | | | | | |
| 5876 | 25181 | 32766 | 33412 | 35330. | | | | | | |

A fourth transmission method of the present technology is a transmission method including a coding step of performing LDPC coding on the basis of a parity check matrix of an LDPC code with a code length N of 69120 bits and a coding rate r of 3/16, a group-wise interleaving step of performing group-wise interleaving in which the LDPC code is interleaved in units of bit groups of 360 bits, and a mapping step of mapping the LDPC code to one of 64 signal points of 2D-non-uniform constellation (2D-NUC) in 64 quadrature amplitude modulation (64QAM) on a 6-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 17, 64, 171, 69, 132, 126, 31, 140, 181, 157, 32, 119, 50, 3, 158, 86, 51, 82, 154, 176, 60, 70, 117, 110, 107, 111, 61, 186, 178, 7, 188, 81, 19, 30, 165, 104, 22, 35, 145, 113, 155, 97, 131, 26, 179, 142, 63, 57, 175, 122, 105, 12, 24, 4, 42, 147, 172, 183, 120, 25, 180, 95, 48, 15, 150, 162, 170, 148, 108, 20, 149, 90, 23, 83, 47, 103, 5, 187, 163, 137, 52, 189, 184, 11, 87, 84, 151, 177, 174, 34, 139, 75, 54, 96, 102, 33, 166, 167, 59, 127, 134, 78, 121, 182, 133, 46, 124, 9, 106, 71, 37, 76, 94, 123, 45, 16, 144, 115, 10, 160, 185, 85, 164, 99, 91, 136, 173, 1, 66, 141, 152, 6, 13, 41, 14, 168, 89, 101, 72, 67, 98, 29, 62, 190, 93, 73, 100, 153, 28, 135, 161, 39, 116, 65, 56, 156, 2, 27, 80, 143, 40, 129, 36, 21, 146, 88, 18, 138, 38, 169, 74, 109, 68, 49, 159, 112, 114, 58, 118, 77, 191, 53, 8, 92, 44, 55, 0, 130, 128, 125, 79, 43, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |

-continued

| | | | | | | | | | |
|---|---|---|---|---|---|---|---|---|---|
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

A fourth reception device of the present technology is a reception device including: a group-wise deinterleaving unit configured to return a sequence of an LDPC code with a code length N of 69120 bits and a coding rate r of 3/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 64 signal points of 2D-non-uniform constellation (2D-NUC) of 64 quadrature amplitude modulation (64QAM) on a 6-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 17, 64, 171, 69, 132, 126, 31, 140, 181, 157, 32, 119, 50, 3, 158, 86, 51, 82, 154, 176, 60, 70, 117, 110, 107, 111, 61, 186, 178, 7, 188, 81, 19, 30, 165, 104, 22, 35, 145, 113, 155, 97, 131, 26, 179, 142, 63, 57, 175, 122, 105, 12, 24, 4, 42, 147, 172, 183, 120, 25, 180, 95, 48, 15, 150, 162, 170, 148, 108, 20, 149, 90, 23, 83, 47, 103, 5, 187, 163, 137, 52, 189, 184, 11, 87, 84, 151, 177, 174, 34, 139, 75, 54, 96, 102, 33, 166, 167, 59, 127, 134, 78, 121, 182, 133, 46, 124, 9, 106, 71, 37, 76, 94, 123, 45, 16, 144, 115, 10, 160, 185, 85, 164, 99, 91, 136, 173, 1, 66, 141, 152, 6, 13, 41, 14, 168, 89, 101, 72, 67, 98, 29, 62, 190, 93, 73, 100, 153, 28, 135, 161, 39, 116, 65, 56, 156, 2, 27, 80, 143, 40, 129, 36, 21, 146, 88, 18, 138, 38, 169, 74, 109, 68, 49, 159, 112, 114, 58, 118, 77, 191, 53, 8, 92, 44, 55, 0, 130, 128, 125, 79, 43, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |

-continued

| | | | | | | | | | |
|---|---|---|---|---|---|---|---|---|---|
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

A fifth transmission method of the present technology is a transmission method including a coding step of performing LDPC coding on the basis of a parity check matrix of an LDPC code with a code length N of 69120 bits and a coding rate r of 7/16, a group-wise interleaving step of performing group-wise interleaving in which the LDPC code is interleaved in units of bit groups of 360 bits, and a mapping step of mapping the LDPC code to one of 64 signal points of 2D-non-uniform constellation (2D-NUC) in 64 quadrature amplitude modulation (64QAM) on a 6-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 173, 36, 60, 172, 41, 149, 45, 75, 144, 68, 148, 168, 134, 58, 86, 50, 115, 167, 54, 29, 1, 132, 125, 114, 69, 77, 135, 39, 145, 139, 163, 44, 146, 40, 106, 178, 52, 14, 78, 174, 3, 126, 20, 169, 98, 47, 33, 121, 109, 88, 185, 157, 183, 152, 158, 76, 56, 30, 123, 137, 186, 89, 83, 141, 156, 143, 2, 90, 151, 111, 170, 161, 182, 79, 66, 26, 108, 119, 38, 35, 180, 154, 153, 175, 181, 72, 80, 23, 15, 122, 49, 10, 4, 17, 155, 179, 46, 24, 37, 129, 0, 171, 34, 63, 27, 57, 166, 177, 117, 120, 113, 100, 28, 6, 55, 71, 150, 187, 131, 147, 43, 64, 102, 176, 130, 93, 105, 128, 138, 164, 127, 142, 51, 12, 42, 53, 99, 133, 87, 188, 13, 159, 190, 140, 84, 59, 104, 65, 7, 189, 160, 162, 74, 107, 118, 101, 22, 62, 61, 103, 25, 124, 112, 70, 16, 97, 67, 116, 82, 81, 110, 48, 92, 184, 96, 94, 91, 165, 19, 31, 5, 11, 32, 95, 18, 21, 73, 85, 136, 191, 9, 8, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |

-continued

| | | | | |
|---|---|---|---|---|
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

A fifth reception device of the present technology is a reception device including: a group-wise deinterleaving unit configured to return a sequence of an LDPC code with a code length N of 69120 bits and a coding rate r of 7/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 64 signal points of 2D-non-uniform constellation (2D-NUC) of 64 quadrature amplitude modulation (64QAM) on a 6-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 173, 36, 60, 172, 41, 149, 45, 75, 144, 68, 148, 168, 134, 58, 86, 50, 115, 167, 54, 29, 1, 132, 125, 114, 69, 77, 135, 39, 145, 139, 163, 44, 146, 40, 106, 178, 52, 14, 78, 174, 3, 126, 20, 169, 98, 47, 33, 121, 109, 88, 185, 157, 183, 152, 158, 76, 56, 30, 123, 137, 186, 89, 83, 141, 156, 143, 2, 90, 151, 111, 170, 161, 182, 79, 66, 26, 108, 119, 38, 35, 180, 154, 153, 175, 181, 72, 80, 23, 15, 122, 49, 10, 4, 17, 155, 179, 46, 24, 37, 129, 0, 171, 34, 63, 27, 57, 166, 177, 117, 120, 113, 100, 28, 6, 55, 71, 150, 187, 131, 147, 43, 64, 102, 176, 130, 93, 105, 128, 138, 164, 127, 142, 51, 12, 42, 53, 99, 133, 87, 188, 13, 159, 190, 140, 84, 59, 104, 65, 7, 189, 160, 162, 74, 107, 118, 101, 22, 62, 61, 103, 25, 124, 112, 70, 16, 97, 67, 116, 82, 81, 110, 48, 92, 184, 96, 94, 91, 165, 19, 31, 5, 11, 32, 95, 18, 21, 73, 85, 136, 191, 9, 8, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |

-continued

| | | | | | | | | | | |
|---|---|---|---|---|---|---|---|---|---|---|
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |
| 5419 | 17091 | 17716 | 18981 | 31131 | | | | | | |
| 15196 | 21587 | 28478 | 32583 | 36053 | | | | | | |
| 17134 | 18820 | 32977 | 34175 | 36060 | | | | | | |
| 15599 | 21709 | 22462 | 28663 | 33979 | | | | | | |
| 4691 | 13050 | 23737 | 30447 | 37128 | | | | | | |
| 22733 | 24839 | 26808 | 37191 | 37396 | | | | | | |
| 8896 | 14951 | 16202 | 26775 | 29470 | | | | | | |

-continued

| | | | | |
|---|---|---|---|---|
| 13355 | 19354 | 27988 | 36027 | 37312 |
| 8938 | 11340 | 12434 | 19496 | 37986 |
| 5876 | 25181 | 32766 | 33412 | 35330. |

A sixth transmission method of the present technology is a transmission method including a coding step of performing LDPC coding on the basis of a parity check matrix of an LDPC code with a code length N of 69120 bits and a coding rate r of 3/16, a group-wise interleaving step of performing group-wise interleaving in which the LDPC code is interleaved in units of bit groups of 360 bits, and a mapping step of mapping the LDPC code to one of 256 signal points of uniform constellation (UC) in 256 quadrature amplitude modulation (256QAM) on an 8-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 72, 32, 158, 84, 105, 181, 63, 16, 111, 87, 112, 185, 120, 74, 176, 14, 81, 79, 34, 128, 163, 64, 161, 146, 42, 26, 191, 173, 60, 3, 41, 162, 23, 44, 38, 24, 149, 172, 88, 104, 21, 118, 91, 184, 70, 85, 142, 25, 159, 186, 148, 96, 188, 190, 61, 123, 169, 136, 33, 109, 54, 101, 7, 19, 145, 137, 107, 82, 121, 90, 144, 187, 180, 8, 132, 114, 65, 29, 51, 103, 139, 141, 55, 108, 68, 0, 124, 170, 18, 143, 177, 2, 22, 179, 166, 53, 6, 99, 73, 12, 43, 69, 129, 183, 71, 39, 165, 171, 28, 92, 189, 119, 113, 20, 151, 59, 46, 66, 102, 182, 153, 94, 140, 115, 174, 125, 127, 116, 31, 47, 156, 147, 135, 48, 110, 160, 89, 86, 40, 155, 100, 36, 35, 57, 56, 9, 80, 126, 62, 75, 52, 83, 1, 76, 17, 122, 178, 30, 131, 27, 164, 106, 152, 49, 37, 167, 78, 95, 168, 175, 117, 4, 50, 13, 93, 97, 150, 45, 157, 130, 154, 10, 133, 77, 15, 67, 98, 134, 138, 11, 58, 5, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |

-continued

| | | | | | | | | | |
|---|---|---|---|---|---|---|---|---|---|
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

A sixth reception device of the present technology is a reception device including: a group-wise deinterleaving unit configured to return a sequence of an LDPC code with a code length N of 69120 bits and a coding rate r of 3/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 256 signal points of uniform constellation (UC) of 256 quadrature amplitude modulation (256QAM) on an 8-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 72, 32, 158, 84, 105, 181, 63, 16, 111, 87, 112, 185, 120, 74, 176, 14, 81, 79, 34, 128, 163, 64, 161, 146, 42, 26, 191, 173, 60, 3, 41, 162, 23, 44, 38, 24, 149, 172, 88, 104, 21, 118, 91, 184, 70, 85, 142, 25, 159, 186, 148, 96, 188, 190, 61, 123, 169, 136, 33, 109, 54, 101, 7, 19, 145, 137, 107, 82, 121, 90, 144, 187, 180, 8, 132, 114, 65, 29, 51, 103, 139, 141, 55, 108, 68, 0, 124, 170, 18, 143, 177, 2, 22, 179, 166, 53, 6, 99, 73, 12, 43, 69, 129, 183, 71, 39, 165, 171, 28, 92, 189, 119, 113, 20, 151, 59, 46, 66, 102, 182, 153, 94, 140, 115, 174, 125, 127, 116, 31, 47, 156, 147, 135, 48, 110, 160, 89, 86, 40, 155, 100, 36, 35, 57, 56, 9, 80, 126, 62, 75, 52, 83, 1, 76, 17, 122, 178, 30, 131, 27, 164, 106, 152, 49, 37, 167, 78, 95, 168, 175, 117, 4, 50, 13, 93, 97, 150, 45, 157, 130, 154, 10, 133, 77, 15, 67, 98, 134, 138, 11, 58, 5, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | |
|---|---|---|---|---|---|---|---|---|
| 952 | 1540 | 1714 | 4127 | 4576 | 13540 | 16051 | 22016 | 28342 |
| 29021 | 29884 | 34149 | 43069 | 45431 | 45764 | 49218 | | |
| 560 | 888 | 1582 | 5282 | 7435 | 11414 | 20275 | 21957 | 35445 |
| 35564 | 36316 | 42800 | 45024 | 49586 | 52439 | 54495 | | |

-continued

| | | | | | | | | | |
|---|---|---|---|---|---|---|---|---|---|
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

A seventh transmission method of the present technology is a transmission method including a coding step of performing LDPC coding on the basis of a parity check matrix of an LDPC code with a code length N of 69120 bits and a coding rate r of 7/16, a group-wise interleaving step of performing group-wise interleaving in which the LDPC code is interleaved in units of bit groups of 360 bits, and a mapping step of mapping the LDPC code to one of 256 signal points of uniform constellation (UC) in 256 quadrature amplitude modulation (256QAM) on an 8-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 9, 5, 13, 50, 156, 80, 30, 150, 18, 84, 54, 87, 40, 140, 12, 169, 1, 65, 90, 99, 21, 94, 20, 158, 27, 168, 19, 128, 57, 151, 37, 36, 15, 45, 59, 136, 4, 2, 106, 160, 83, 48, 103, 78, 173, 33, 172, 186, 24, 164, 181, 35, 183, 72, 73, 176, 161, 119, 76, 125, 121, 124, 16, 174, 66, 34, 177, 137, 46, 44, 126, 116, 69, 41, 145, 3, 114, 132, 32, 7, 105, 31, 56, 134, 155, 135, 108, 93, 89, 167, 81, 190, 131, 127, 102, 88, 62, 49, 163, 170, 53, 63, 38, 178, 0, 77, 188, 22, 180, 185, 191, 153, 61, 129, 144, 39, 138, 166, 14, 154, 82, 29, 110, 146, 123, 60, 187, 11, 162, 25, 157, 52, 91, 118, 133, 17, 28, 10, 130, 111, 159, 42, 58, 141, 142, 189, 68, 107, 8, 113, 6, 74, 47, 75, 109, 175, 147, 64, 149, 92, 43, 85, 96, 122, 117, 171, 152, 26, 79, 86, 51, 95, 67, 165, 112, 148, 182, 143, 179, 120, 139, 97, 184, 104, 71, 70, 115, 23, 100, 98, 101, 55, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |

-continued

| | | | | |
|---|---|---|---|---|
| 901 | 2299 | 3757 | 10605 | 24358 |
| 321 | 1488 | 1718 | 24930 | 25738 |
| 2283 | 3823 | 3943 | 16768 | 35564 |
| 253 | 2932 | 4234 | 21419 | 29606 |
| 2701 | 3576 | 4425 | 9250 | 24023 |
| 2217 | 3403 | 4654 | 14977 | 23115 |
| 817 | 2872 | 3491 | 17773 | 23918 |
| 1783 | 1838 | 4330 | 11645 | 36545 |
| 1231 | 3435 | 4503 | 9035 | 29888 |
| 826 | 1836 | 2994 | 22108 | 22827 |
| 229 | 1417 | 2078 | 14324 | 17714 |
| 567 | 3244 | 3728 | 22202 | 33883 |
| 799 | 1180 | 1329 | 12496 | 22390 |
| 549 | 1311 | 3657 | 17564 | 35009 |
| 132 | 517 | 3180 | 5304 | 35588 |
| 2767 | 3953 | 4221 | 30887 | 34291 |
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

A seventh reception device of the present technology is a reception device including: a group-wise deinterleaving unit configured to return a sequence of an LDPC code with a code length N of 69120 bits and a coding rate r of 7/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 256 signal points of uniform constellation (UC) of 256 quadrature amplitude modulation (256QAM) on an 8-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 9, 5, 13, 50, 156, 80, 30, 150, 18, 84, 54, 87, 40, 140, 12, 169, 1, 65, 90, 99, 21, 94, 20, 158, 27, 168, 19, 128, 57, 151, 37, 36, 15, 45, 59, 136, 4, 2, 106, 160, 83, 48, 103, 78, 173, 33, 172, 186, 24, 164, 181, 35, 183, 72, 73, 176, 161, 119, 76, 125, 121, 124, 16, 174, 66, 34, 177, 137, 46, 44, 126, 116, 69, 41, 145, 3, 114, 132, 32, 7, 105, 31, 56, 134, 155, 135, 108, 93, 89, 167, 81, 190, 131, 127, 102, 88, 62, 49, 163, 170, 53, 63, 38, 178, 0, 77, 188, 22, 180, 185, 191, 153, 61, 129, 144, 39, 138, 166, 14, 154, 82, 29, 110, 146, 123, 60, 187, 11, 162, 25, 157, 52, 91, 118, 133, 17, 28, 10, 130, 111, 159, 42, 58, 141, 142, 189, 68, 107, 8, 113, 6, 74, 47, 75, 109, 175, 147, 64, 149, 92, 43, 85, 96, 122, 117, 171, 152, 26, 79, 86, 51, 95, 67, 165, 112, 148, 182, 143, 179, 120, 139, 97, 184, 104, 71, 70, 115, 23, 100, 98, 101, 55, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |

-continued

| | | | | |
|---|---|---|---|---|
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

An eighth transmission method of the present technology is a transmission method including a coding step of performing LDPC coding on the basis of a parity check matrix of an LDPC code with a code length N of 69120 bits and a coding rate r of 3/16, a group-wise interleaving step of performing group-wise interleaving in which the LDPC code is interleaved in units of bit groups of 360 bits, and a mapping step of mapping the LDPC code to one of 1024 signal points of 1D-non-uniform constellation (1D-NUC) in 1024 quadrature amplitude modulation (1024QAM) on a 10-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 173, 19, 14, 40, 115, 80, 35, 24, 79, 94, 33, 109, 101, 61, 142, 128, 130, 162, 11, 159, 47, 160, 143, 38, 65, 122, 6, 181, 12, 45, 0, 106, 153, 56, 21, 125, 17, 129, 85, 186, 27, 155, 107, 156, 191, 151, 90, 135, 64, 57, 113, 175, 49, 108, 149, 164, 26, 146, 105, 104, 29, 100, 84, 92, 3, 58, 41, 91, 139, 174, 70, 182, 89, 131, 25, 119, 178, 7, 48, 54, 184, 1, 126, 43, 179, 168, 120, 60, 190, 68, 136, 176, 163, 13, 71, 147, 63, 37, 72, 32, 30, 123, 185, 154, 167, 86, 103, 138, 127, 148, 50, 152, 66, 46, 118, 96, 10, 111, 145, 99, 180, 88, 158, 114, 110, 73, 117, 112, 52, 165, 62, 23, 102, 59, 36, 5, 116, 98, 53, 188, 39, 93, 31, 28, 55, 172, 189, 187, 67, 15, 16, 4, 22, 133, 76, 44, 87, 77, 18, 78, 169, 166, 83, 82, 161, 74, 134, 157, 81, 95, 42, 132, 121, 8, 97, 141, 20, 170, 69, 177, 34, 140, 124, 183, 51, 137, 9, 2, 75, 144, 171, 150, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |

-continued

| | | | | | | | | | |
|---|---|---|---|---|---|---|---|---|---|
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

An eighth reception device of the present technology is a reception device including: a group-wise deinterleaving unit configured to return a sequence of an LDPC code with a code length N of 69120 bits and a coding rate r of 3/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 1024 signal points of 1D-non-uniform constellation (1D-NUC) of 1024 quadrature amplitude modulation (1024QAM) on a 10-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 173, 19, 14, 40, 115, 80, 35, 24, 79, 94, 33, 109, 101, 61, 142, 128, 130, 162, 11, 159, 47, 160, 143, 38, 65, 122, 6, 181, 12, 45, 0, 106, 153, 56, 21, 125, 17, 129, 85, 186, 27, 155, 107, 156, 191, 151, 90, 135, 64, 57, 113, 175, 49, 108, 149, 164, 26, 146, 105, 104, 29, 100, 84, 92, 3, 58, 41, 91, 139, 174, 70, 182, 89, 131, 25, 119, 178, 7, 48, 54, 184, 1, 126, 43, 179, 168, 120, 60, 190, 68, 136, 176, 163, 13, 71, 147, 63, 37, 72, 32, 30, 123, 185, 154, 167, 86, 103, 138, 127, 148, 50, 152, 66, 46, 118, 96, 10, 111, 145, 99, 180, 88, 158, 114, 110, 73, 117, 112, 52, 165, 62, 23, 102, 59, 36, 5, 116, 98, 53, 188, 39, 93, 31, 28, 55, 172, 189, 187, 67, 15, 16, 4, 22, 133, 76, 44, 87, 77, 18, 78, 169, 166, 83, 82, 161, 74, 134, 157, 81, 95, 42, 132, 121, 8, 97, 141, 20, 170, 69, 177, 34, 140, 124, 183, 51, 137, 9, 2, 75, 144, 171, 150, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |

-continued

| | | | | | | | | | |
|---|---|---|---|---|---|---|---|---|---|
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

A ninth transmission method of the present technology is a transmission method including a coding step of performing LDPC coding on the basis of a parity check matrix of an LDPC code with a code length N of 69120 bits and a coding rate r of 7/16, a group-wise interleaving step of performing group-wise interleaving in which the LDPC code is interleaved in units of bit groups of 360 bits, and a mapping step of mapping the LDPC code to one of 1024 signal points of 1D-non-uniform constellation (1D-NUC) in 1024 quadrature amplitude modulation (1024QAM) on a 10-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 27, 109, 45, 105, 174, 62, 185, 69, 102, 91, 37, 39, 31, 34, 127, 111, 30, 23, 157, 155, 76, 19, 85, 172, 122, 5, 36, 100, 26, 59, 136, 79, 25, 134, 101, 3, 96, 135, 21, 2, 35, 82, 47, 143, 56, 54, 149, 7, 175, 170, 144, 71, 190, 94, 64, 131, 145, 40, 191, 86, 90, 24, 139, 20, 184, 181, 29, 176, 124, 159, 12, 43, 187, 16, 162, 57, 0, 188, 11, 42, 4, 164, 156, 22, 95, 81, 153, 141, 169, 117, 50, 151, 89, 120, 189, 167, 177, 173, 140, 118, 51, 55, 113, 171, 41, 63, 148, 106, 9, 17, 80, 97, 77, 83, 182, 161, 137, 15, 125, 186, 88, 98, 32, 138, 129, 46, 52, 73, 168, 115, 165, 142, 38, 84, 128, 166, 107, 116, 123, 114, 93, 78, 178, 66, 146, 160, 104, 121, 48, 74, 13, 61, 70, 60, 75, 163, 179, 28, 130, 154, 53, 110, 10, 33, 112, 18, 180, 147, 133, 1, 65, 68, 8, 44, 108, 132, 183, 6, 119, 67, 14, 152, 72, 150, 103, 87, 58, 99, 126, 92, 49, 158, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |

-continued

| | | | | | | | | | | |
|---|---|---|---|---|---|---|---|---|---|---|
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |
| 5419 | 17091 | 17716 | 18981 | 31131 | | | | | | |
| 15196 | 21587 | 28478 | 32583 | 36053 | | | | | | |
| 17134 | 18820 | 32977 | 34175 | 36060 | | | | | | |
| 15599 | 21709 | 22462 | 28663 | 33979 | | | | | | |
| 4691 | 13050 | 23737 | 30447 | 37128 | | | | | | |
| 22733 | 24839 | 26808 | 37191 | 37396 | | | | | | |
| 8896 | 14951 | 16202 | 26775 | 29470 | | | | | | |
| 13355 | 19354 | 27988 | 36027 | 37312 | | | | | | |
| 8938 | 11340 | 12434 | 19496 | 37986 | | | | | | |
| 5876 | 25181 | 32766 | 33412 | 35330. | | | | | | |

A ninth reception device of the present technology is a reception device including: a group-wise deinterleaving unit configured to return a sequence of an LDPC code with a code length N of 69120 bits and a coding rate r of 7/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 1024 signal points of 1D-non-uniform constellation (1D-NUC) of 1024 quadrature amplitude modulation (1024QAM) on a 10-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 27, 109, 45, 105, 174, 62, 185, 69, 102, 91, 37, 39, 31, 34, 127, 111, 30, 23, 157, 155, 76, 19, 85, 172, 122, 5, 36, 100, 26, 59, 136, 79, 25, 134, 101, 3, 96, 135, 21, 2, 35, 82, 47, 143, 56, 54, 149, 7, 175, 170, 144, 71, 190, 94, 64, 131, 145, 40, 191, 86, 90, 24, 139, 20, 184, 181, 29, 176, 124, 159, 12, 43, 187, 16, 162, 57, 0, 188, 11, 42, 4, 164, 156, 22, 95, 81, 153, 141, 169, 117, 50, 151, 89, 120, 189, 167, 177, 173, 140, 118, 51, 55, 113, 171, 41, 63, 148, 106, 9, 17, 80, 97, 77, 83, 182, 161, 137, 15, 125, 186, 88, 98, 32, 138, 129, 46, 52, 73, 168, 115, 165, 142, 38, 84, 128, 166, 107, 116, 123, 114, 93, 78, 178, 66, 146, 160, 104, 121, 48, 74, 13, 61, 70, 60, 75, 163, 179, 28, 130, 154, 53, 110, 10, 33, 112, 18, 180, 147, 133, 1, 65, 68, 8, 44, 108, 132, 183, 6, 119, 67, 14, 152, 72, 150, 103, 87, 58, 99, 126, 92, 49, 158, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |

-continued

| | | | | |
|---|---|---|---|---|
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

A tenth transmission method of the present technology is a transmission method including a coding step of performing LDPC coding on the basis of a parity check matrix of an LDPC code with a code length N of 69120 bits and a coding rate r of 3/16, a group-wise interleaving step of performing group-wise interleaving in which the LDPC code is interleaved in units of bit groups of 360 bits, and a mapping step of mapping the LDPC code to one of 4096 signal points of uniform constellation (UC) in 4096 quadrature amplitude modulation (4096QAM) on a 12-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 50, 30, 180, 100, 44, 21, 25, 130, 190, 135, 154, 84, 150, 20, 16, 184, 137, 109, 189, 36, 105, 151, 49, 107, 108, 79, 148, 121, 88, 128, 62, 7, 185, 145, 166, 64, 141, 102, 181, 191, 94, 171, 1, 14, 11, 170, 63, 67, 17, 51, 90, 155, 98, 115, 173, 26, 56, 87, 138, 81, 13, 31, 27, 24, 29, 46, 54, 78, 118, 120, 164, 58, 95, 122, 106, 85, 96, 41, 3, 187, 72, 0, 143, 142, 186, 146, 101, 89, 23, 133, 83, 92, 22, 99, 136, 158, 156, 91, 97, 28, 162, 147, 65, 139, 111, 38, 161, 163, 4, 75, 125, 177, 12, 70, 114, 6, 45, 165, 126, 132, 134, 40, 149, 104, 188, 80, 55, 34, 119, 175, 66, 93, 39, 47, 153, 8, 69, 157, 61, 35, 182, 124, 168, 76, 131, 59, 112, 152, 82, 116, 123, 9, 73, 15, 86, 159, 172, 18, 183, 68, 103, 167, 113, 5, 74, 42, 174, 140, 2, 10, 32, 19, 127, 48, 169, 117, 129, 178, 53, 179, 71, 52, 60, 110, 57, 144, 160, 43, 37, 33, 77, 176, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |

-continued

| | | | | | | | | | |
|---|---|---|---|---|---|---|---|---|---|
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

A tenth reception device of the present technology is a reception device including: a group-wise deinterleaving unit configured to return a sequence of an LDPC code with a code length N of 69120 bits and a coding rate r of 3/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 4096 signal points of uniform constellation (UC) of 4096 quadrature amplitude modulation (4096QAM) on a 12-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 50, 30, 180, 100, 44, 21, 25, 130, 190, 135, 154, 84, 150, 20, 16, 184, 137, 109, 189, 36, 105, 151, 49, 107, 108, 79, 148, 121, 88, 128, 62, 7, 185, 145, 166, 64, 141, 102, 181, 191, 94, 171, 1, 14, 11, 170, 63, 67, 17, 51, 90, 155, 98, 115, 173, 26, 56, 87, 138, 81, 13, 31, 27, 24, 29, 46, 54, 78, 118, 120, 164, 58, 95, 122, 106, 85, 96, 41, 3, 187, 72, 0, 143, 142, 186, 146, 101, 89, 23, 133, 83, 92, 22, 99, 136, 158, 156, 91, 97, 28, 162, 147, 65, 139, 111, 38, 161, 163, 4, 75, 125, 177, 12, 70, 114, 6, 45, 165, 126, 132, 134, 40, 149, 104, 188, 80, 55, 34, 119, 175, 66, 93, 39, 47, 153, 8, 69, 157, 61, 35, 182, 124, 168, 76, 131, 59, 112, 152, 82, 116, 123, 9, 73, 15, 86, 159, 172, 18, 183, 68, 103, 167, 113, 5, 74, 42, 174, 140, 2, 10, 32, 19, 127, 48, 169, 117, 129, 178, 53, 179, 71, 52, 60, 110, 57, 144, 160, 43, 37, 33, 77, 176, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |

-continued

| | | | | | | | | | |
|---|---|---|---|---|---|---|---|---|---|
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

An eleventh transmission method of the present technology is a transmission method including a coding step of performing LDPC coding on the basis of a parity check matrix of an LDPC code with a code length N of 69120 bits and a coding rate r of 7/16, a group-wise interleaving step of performing group-wise interleaving in which the LDPC code is interleaved in units of bit groups of 360 bits, and a mapping step of mapping the LDPC code to one of 4096 signal points of uniform constellation (UC) in 4096 quadrature amplitude modulation (4096QAM) on a 12-bit basis, in which, in the group-wise interleaving, an (i+1)th bit group from a head of the LDPC code is set as a bit group i, and a sequence of bit groups 0 to 191 of the 69120-bit LDPC code is interleaved into a sequence of bit groups 163, 174, 26, 190, 68, 80, 112, 146, 97, 44, 156, 134, 51, 167, 19, 127, 145, 102, 20, 58, 30, 9, 153, 143, 32, 63, 189, 180, 110, 41, 101, 166, 104, 138, 89, 42, 27, 8, 161, 67, 72, 81, 106, 132, 175, 107, 116, 186, 108, 13, 96, 154, 10, 103, 139, 99, 164, 29, 12, 118, 123, 109, 133, 61, 64, 0, 128, 17, 6, 45, 159, 1, 66, 24, 38, 33, 95, 187, 50, 120, 21, 168, 182, 184, 141, 148, 31, 79, 25, 144, 170, 18, 176, 135, 183, 7, 90, 52, 94, 77, 65, 3, 15, 85, 43, 100, 35, 124, 39, 57, 78, 88, 70, 76, 171, 149, 121, 125, 84, 16, 140, 40, 150, 157, 36, 48, 162, 2, 62, 22, 147, 83, 53, 82, 177, 98, 115, 69, 105, 151, 136, 181, 56, 173, 122, 111, 47, 179, 191, 119, 87, 178, 155, 131, 185, 91, 60, 55, 54, 37, 172, 169, 4, 188, 158, 11, 59, 160, 129, 5, 34, 14, 137, 117, 126, 114, 49, 73, 74, 28, 75, 152, 142, 71, 23, 86, 93, 130, 92, 113, 46, 165, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |

-continued

| | | | | | | | | | | |
|---|---|---|---|---|---|---|---|---|---|---|
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |
| 5419 | 17091 | 17716 | 18981 | 31131 | | | | | | |
| 15196 | 21587 | 28478 | 32583 | 36053 | | | | | | |
| 17134 | 18820 | 32977 | 34175 | 36060 | | | | | | |
| 15599 | 21709 | 22462 | 28663 | 33979 | | | | | | |
| 4691 | 13050 | 23737 | 30447 | 37128 | | | | | | |
| 22733 | 24839 | 26808 | 37191 | 37396 | | | | | | |
| 8896 | 14951 | 16202 | 26775 | 29470 | | | | | | |
| 13355 | 19354 | 27988 | 36027 | 37312 | | | | | | |
| 8938 | 11340 | 12434 | 19496 | 37986 | | | | | | |
| 5876 | 25181 | 32766 | 33412 | 35330. | | | | | | |

An eleventh reception device of the present technology is a reception device including: a group-wise deinterleaving unit configured to return a sequence of an LDPC code with a code length N of 69120 bits and a coding rate r of 7/16 after group-wise interleaving to an original sequence, the sequence being obtained from data transmitted by a transmission method including a coding step of performing LDPC coding on the basis of a parity check matrix of the LDPC code, a group-wise interleaving step of performing group-wise interleaving in which the LDPC code is interleaved in units of bit groups of 360 bits, and a mapping step of mapping the LDPC code to one of 4096 signal points of uniform constellation (UC) of 4096 quadrature amplitude modulation (4096QAM) on a 12-bit basis, in which in the group-wise interleaving, an (i+1)th bit group from a head of the LDPC code is set as a bit group i, and a sequence of bit groups 0 to 191 of the 69120-bit LDPC code is interleaved into a sequence of bit groups 163, 174, 26, 190, 68, 80, 112, 146, 97, 44, 156, 134, 51, 167, 19, 127, 145, 102, 20, 58, 30, 9, 153, 143, 32, 63, 189, 180, 110, 41, 101, 166, 104, 138, 89, 42, 27, 8, 161, 67, 72, 81, 106, 132, 175, 107, 116, 186, 108, 13, 96, 154, 10, 103, 139, 99, 164, 29, 12, 118, 123, 109, 133, 61, 64, 0, 128, 17, 6, 45, 159, 1, 66, 24, 38, 33, 95, 187, 50, 120, 21, 168, 182, 184, 141, 148, 31, 79, 25, 144, 170, 18, 176, 135, 183, 7, 90, 52, 94, 77, 65, 3, 15, 85, 43, 100, 35, 124, 39, 57, 78, 88, 70, 76, 171, 149, 121, 125, 84, 16, 140, 40, 150, 157, 36, 48, 162, 2, 62, 22, 147, 83, 53, 82, 177, 98, 115, 69, 105, 151, 136, 181, 56, 173, 122, 111, 47, 179, 191, 119, 87, 178, 155, 131, 185, 91, 60, 55, 54, 37, 172, 169, 4, 188, 158, 11, 59, 160, 129, 5, 34, 14, 137, 117, 126, 114, 49, 73, 74, 28, 75, 152, 142, 71, 23, 86, 93, 130, 92, 113, 46, 165, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |

-continued

| | | | | |
|---|---|---|---|---|
| 1783 | 1838 | 4330 | 11645 | 36545 |
| 1231 | 3435 | 4503 | 9035 | 29888 |
| 826 | 1836 | 2994 | 22108 | 22827 |
| 229 | 1417 | 2078 | 14324 | 17714 |
| 567 | 3244 | 3728 | 22202 | 33883 |
| 799 | 1180 | 1329 | 12496 | 22390 |
| 549 | 1311 | 3657 | 17564 | 35009 |
| 132 | 517 | 3180 | 5304 | 35588 |
| 2767 | 3953 | 4221 | 30887 | 34291 |
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

In the first transmission method of the present technology, LDPC coding is performed on the basis of the parity check matrix of the LDPC code with the code length N of 69120 bits and the coding rate r of 7/16, and group-wise interleaving to interleave the LDPC code in units of bit groups of 360 bits is performed. Then, the LDPC code is mapped to any one of 4 signal points in quadrature phase shift keying (QPSK) on a 2-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 191, 12, 188, 158, 173, 48, 75, 146, 113, 15, 51, 119, 132, 161, 91, 189, 142, 93, 120, 29, 156, 101, 100, 22, 165, 65, 98, 153, 127, 74, 39, 80, 38, 130, 148, 81, 13, 24, 125, 0, 174, 140, 124, 5, 68, 3, 104, 136, 63, 162, 106, 8, 25, 182, 178, 90, 96, 79, 168, 172, 128, 64, 69, 102, 45, 66, 86, 155, 163, 6, 152, 164, 108, 9, 111, 16, 177, 53, 94, 85, 72, 32, 147, 184, 117, 30, 54, 34, 70, 149, 157, 109, 73, 41, 131, 187, 185, 18, 4, 150, 92, 143, 14, 115, 20, 50, 26, 83, 36, 58, 169, 107, 129, 121, 43, 103, 21, 139, 52, 167, 19, 2, 40, 116, 181, 61, 141, 17, 33, 11, 135, 1, 37, 123, 180, 137, 77, 166, 183, 82, 23, 56, 88, 67, 176, 76, 35, 71, 105, 87, 78, 171, 55, 62, 44, 57, 97, 122, 112, 59, 27, 99, 84, 10, 134, 42, 118, 144, 49, 28, 126, 95, 7, 110, 186, 114, 151, 145, 175, 138, 133, 31, 179, 89, 46, 160, 170, 60, 154, 159, 47, 190. The parity check matrix includes the A matrix of M1 rows and K columns expressed by a predetermined value M1 and the information length K=N×r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |

-continued

| | | | | | | | | | | |
|---|---|---|---|---|---|---|---|---|---|---|
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |
| 5419 | 17091 | 17716 | 18981 | 31131 | | | | | | |
| 15196 | 21587 | 28478 | 32583 | 36053 | | | | | | |

-continued

| | | | | |
|---|---|---|---|---|
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

In the first reception device of the present technology, the sequence of the LDPC code after group-wise interleaving obtained from the data transmitted by the first transmission method is returned to the original sequence.

In the second transmission method of the present technology, LDPC coding is performed on the basis of the parity check matrix of the LDPC code with the code length N of 69120 bits and the coding rate r of 3/16, and group-wise interleaving to interleave the LDPC code in units of bit groups of 360 bits is performed. Then, the LDPC code is mapped to any one of 16 signal points of uniform constellation (UC) in 16 quadrature amplitude modulation (16QAM) on a 4-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 133, 69, 28, 111, 127, 5, 97, 42, 9, 160, 139, 135, 138, 130, 86, 94, 75, 15, 21, 73, 89, 59, 76, 17, 64, 152, 55, 106, 34, 2, 163, 187, 170, 52, 1, 174, 45, 99, 57, 105, 4, 35, 119, 31, 114, 155, 67, 156, 8, 88, 103, 172, 149, 58, 166, 37, 164, 189, 71, 30, 72, 148, 38, 98, 176, 185, 182, 134, 95, 173, 78, 48, 96, 26, 151, 167, 159, 175, 74, 53, 162, 110, 54, 49, 83, 79, 171, 90, 61, 100, 150, 121, 43, 66, 144, 44, 132, 188, 115, 41, 25, 80, 13, 104, 161, 65, 116, 14, 158, 51, 117, 60, 190, 140, 186, 123, 40, 122, 102, 128, 107, 183, 11, 146, 10, 68, 0, 84, 36, 143, 153, 93, 33, 50, 101, 7, 27, 137, 120, 191, 165, 131, 18, 70, 112, 154, 169, 92, 29, 136, 12, 157, 47, 19, 181, 147, 180, 141, 142, 126, 118, 129, 124, 3, 177, 62, 16, 22, 179, 39, 145, 85, 32, 168, 77, 6, 23, 125, 82, 113, 20, 109, 24, 178, 46, 81, 108, 63, 56, 87, 91, 184. The parity check matrix includes the A matrix of M1 rows and K columns expressed by a predetermined value M1 and the information length K=N r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |

-continued

| | | | | | | | | | |
|---|---|---|---|---|---|---|---|---|---|
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

In the second reception device of the present technology, the sequence of the LDPC code after group-wise interleaving obtained from the data transmitted by the second transmission method is returned to the original sequence.

In the third transmission method of the present technology, LDPC coding is performed on the basis of the parity check matrix of the LDPC code with the code length N of 69120 bits and the coding rate r of 7/16, and group-wise interleaving to interleave the LDPC code in units of bit groups of 360 bits is performed. Then, the LDPC code is mapped to any one of 16 signal points of uniform constellation (UC) in 16 quadrature amplitude modulation (16QAM) on a 4-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 56, 85, 9, 118, 38, 182, 80, 116, 96, 47, 69, 176, 49, 180, 8, 72, 44, 154, 177, 101, 35, 125, 17, 34, 121, 37, 170, 174, 78, 4, 27, 10, 65, 6, 25, 15, 33, 169, 188, 46, 93, 36, 129, 152, 59, 167, 122, 184, 54, 148, 42, 40, 134, 189, 28, 87, 70, 144, 161, 185, 29, 173, 166, 146, 67, 57, 187, 76, 19, 71, 50, 158, 94, 24, 43, 133, 98, 149, 119, 61, 90, 3, 179, 2, 68, 12, 111, 138, 109, 141, 103, 13, 66, 112, 147, 21, 135, 20, 7, 139, 162, 55, 110, 39, 26, 106, 97, 114, 123, 91, 100, 18, 150, 178, 108, 126, 75, 62, 99, 89, 168, 88, 175, 0, 95, 77, 11, 48, 191, 102, 171, 41, 5, 74, 86, 128, 181, 53, 22, 105, 140, 45, 16, 73, 104, 30, 143, 79, 84, 145, 142, 164, 117, 23, 31, 159, 51, 136, 157, 107, 58, 156, 165, 83, 155, 1, 163, 113, 81, 82, 127, 137, 64, 186, 124, 160, 120, 52, 151, 190, 92, 32, 153, 60, 172, 63, 183, 130, 131, 14, 115, 132. The parity check matrix includes the A matrix of M1 rows and K columns expressed by a predetermined value M1 and the information length K=N×r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |

-continued

| | | | | |
|---|---|---|---|---|
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

In the third reception device of the present technology, the sequence of the LDPC code after group-wise interleaving obtained from the data transmitted by the third transmission method is returned to the original sequence.

In the fourth transmission method of the present technology, LDPC coding is performed on the basis of the parity check matrix of the LDPC code with the code length N of 69120 bits and the coding rate r of 3/16, and group-wise interleaving to interleave the LDPC code in units of bit groups of 360 bits is performed. Then, the LDPC code is mapped to any one of 64 signal points of 2D-non-uniform constellation (2D-NUC) in 64 quadrature amplitude modulation (64QAM) on a 6-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 17, 64, 171, 69, 132, 126, 31, 140, 181, 157, 32, 119, 50, 3, 158, 86, 51, 82, 154, 176, 60, 70, 117, 110, 107, 111, 61, 186, 178, 7, 188, 81, 19, 30, 165, 104, 22, 35, 145, 113, 155, 97, 131, 26, 179, 142, 63, 57, 175, 122, 105, 12, 24, 4, 42, 147, 172, 183, 120, 25, 180, 95, 48, 15, 150, 162, 170, 148, 108, 20, 149, 90, 23, 83, 47, 103, 5, 187, 163, 137, 52, 189, 184, 11, 87, 84, 151, 177, 174, 34, 139, 75, 54, 96, 102, 33, 166, 167, 59, 127, 134, 78, 121, 182, 133, 46, 124, 9, 106, 71, 37, 76, 94, 123, 45, 16, 144, 115, 10, 160, 185, 85, 164, 99, 91, 136, 173, 1, 66, 141, 152, 6, 13, 41, 14, 168, 89, 101, 72, 67, 98, 29, 62, 190, 93, 73, 100, 153, 28, 135, 161, 39, 116, 65, 56, 156, 2, 27, 80, 143, 40, 129, 36, 21, 146, 88, 18, 138, 38, 169, 74, 109, 68, 49, 159, 112, 114, 58, 118, 77, 191, 53, 8, 92, 44, 55, 0, 130, 128, 125, 79, 43. The parity check matrix includes the A matrix of M1 rows and K columns expressed by a predetermined value M1 and the information length K=N r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |

-continued

| | | | | | | | | | |
|---|---|---|---|---|---|---|---|---|---|
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

In the fourth reception device of the present technology, the sequence of the LDPC code after group-wise interleaving obtained from the data transmitted by the fourth transmission method is returned to the original sequence.

In the fifth transmission method of the present technology, LDPC coding is performed on the basis of the parity check matrix of the LDPC code with the code length N of 69120 bits and the coding rate r of 7/16, and group-wise interleaving to interleave the LDPC code in units of bit groups of 360 bits is performed. Then, the LDPC code is mapped to any one of 64 signal points of 2D-non-uniform constellation (2D-NUC) in 64 quadrature amplitude modulation (64QAM) on a 6-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 173, 36, 60, 172, 41, 149, 45, 75, 144, 68, 148, 168, 134, 58, 86, 50, 115, 167, 54, 29, 1, 132, 125, 114, 69, 77, 135, 39, 145, 139, 163, 44, 146, 40, 106, 178, 52, 14, 78, 174, 3, 126, 20, 169, 98, 47, 33, 121, 109, 88, 185, 157, 183, 152, 158, 76, 56, 30, 123, 137, 186, 89, 83, 141, 156, 143, 2, 90, 151, 111, 170, 161, 182, 79, 66, 26, 108, 119, 38, 35, 180, 154, 153, 175, 181, 72, 80, 23, 15, 122, 49, 10, 4, 17, 155, 179, 46, 24, 37, 129, 0, 171, 34, 63, 27, 57, 166, 177, 117, 120, 113, 100, 28, 6, 55, 71, 150, 187, 131, 147, 43, 64, 102, 176, 130, 93, 105, 128, 138, 164, 127, 142, 51, 12, 42, 53, 99, 133, 87, 188, 13, 159, 190, 140, 84, 59, 104, 65, 7, 189, 160, 162, 74, 107, 118, 101, 22, 62, 61, 103, 25, 124, 112, 70, 16, 97, 67, 116, 82, 81, 110, 48, 92, 184, 96, 94, 91, 165, 19, 31, 5, 11, 32, 95, 18, 21, 73, 85, 136, 191, 9, 8. The parity check matrix includes the A matrix of M1 rows and K columns expressed by a predetermined value M1 and the information length K=N r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |

-continued

| | | | | |
|---|---|---|---|---|
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

In the fifth reception device of the present technology, the sequence of the LDPC code after group-wise interleaving obtained from the data transmitted by the fifth transmission method is returned to the original sequence.

In the sixth transmission method of the present technology, LDPC coding is performed on the basis of the parity check matrix of the LDPC code with the code length N of 69120 bits and the coding rate r of 3/16, and group-wise interleaving to interleave the LDPC code in units of bit groups of 360 bits is performed. Then, the LDPC code is mapped to any one of 256 signal points of uniform constellation (UC) of 256 quadrature amplitude modulation (256QAM) on an 8-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 72, 32, 158, 84, 105, 181, 63, 16, 111, 87, 112, 185, 120, 74, 176, 14, 81, 79, 34, 128, 163, 64, 161, 146, 42, 26, 191, 173, 60, 3, 41, 162, 23, 44, 38, 24, 149, 172, 88, 104, 21, 118, 91, 184, 70, 85, 142, 25, 159, 186, 148, 96, 188, 190, 61, 123, 169, 136, 33, 109, 54, 101, 7, 19, 145, 137, 107, 82, 121, 90, 144, 187, 180, 8, 132, 114, 65, 29, 51, 103, 139, 141, 55, 108, 68, 0, 124, 170, 18, 143, 177, 2, 22, 179, 166, 53, 6, 99, 73, 12, 43, 69, 129, 183, 71, 39, 165, 171, 28, 92, 189, 119, 113, 20, 151, 59, 46, 66, 102, 182, 153, 94, 140, 115, 174, 125, 127, 116, 31, 47, 156, 147, 135, 48, 110, 160, 89, 86, 40, 155, 100, 36, 35, 57, 56, 9, 80, 126, 62, 75, 52, 83, 1, 76, 17, 122, 178, 30, 131, 27, 164, 106, 152, 49, 37, 167, 78, 95, 168, 175, 117, 4, 50, 13, 93, 97, 150, 45, 157, 130, 154, 10, 133, 77, 15, 67, 98, 134, 138, 11, 58, 5. The parity check matrix includes the A matrix of M1 rows and K columns expressed by a predetermined value M1 and the information length K=N r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |

-continued

| | | | | | | | | | |
|---|---|---|---|---|---|---|---|---|---|
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

In the sixth reception device of the present technology, the sequence of the LDPC code after group-wise interleaving obtained from the data transmitted by the sixth transmission method is returned to the original sequence.

In the seventh transmission method of the present technology, LDPC coding is performed on the basis of the parity check matrix of the LDPC code with the code length N of 69120 bits and the coding rate r of 7/16, and group-wise interleaving to interleave the LDPC code in units of bit groups of 360 bits is performed. Then, the LDPC code is mapped to any one of 256 signal points of uniform constellation (UC) of 256 quadrature amplitude modulation (256QAM) on an 8-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 9, 5, 13, 50, 156, 80, 30, 150, 18, 84, 54, 87, 40, 140, 12, 169, 1, 65, 90, 99, 21, 94, 20, 158, 27, 168, 19, 128, 57, 151, 37, 36, 15, 45, 59, 136, 4, 2, 106, 160, 83, 48, 103, 78, 173, 33, 172, 186, 24, 164, 181, 35, 183, 72, 73, 176, 161, 119, 76, 125, 121, 124, 16, 174, 66, 34, 177, 137, 46, 44, 126, 116, 69, 41, 145, 3, 114, 132, 32, 7, 105, 31, 56, 134, 155, 135, 108, 93, 89, 167, 81, 190, 131, 127, 102, 88, 62, 49, 163, 170, 53, 63, 38, 178, 0, 77, 188, 22, 180, 185, 191, 153, 61, 129, 144, 39, 138, 166, 14, 154, 82, 29, 110, 146, 123, 60, 187, 11, 162, 25, 157, 52, 91, 118, 133, 17, 28, 10, 130, 111, 159, 42, 58, 141, 142, 189, 68, 107, 8, 113, 6, 74, 47, 75, 109, 175, 147, 64, 149, 92, 43, 85, 96, 122, 117, 171, 152, 26, 79, 86, 51, 95, 67, 165, 112, 148, 182, 143, 179, 120, 139, 97, 184, 104, 71, 70, 115, 23, 100, 98, 101, 55. The parity check matrix includes the A matrix of M1 rows and K columns expressed by a predetermined value M1 and the information length K=N×r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |

-continued

| | | | | |
|---|---|---|---|---|
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

In the seventh reception device of the present technology, the sequence of the LDPC code after group-wise interleaving obtained from the data transmitted by the seventh transmission method is returned to the original sequence.

In the eighth transmission method of the present technology, LDPC coding is performed on the basis of the parity check matrix of the LDPC code with the code length N of 69120 bits and the coding rate r of 3/16, and group-wise interleaving to interleave the LDPC code in units of bit groups of 360 bits is performed. Then, the LDPC code is mapped to any one of 1024 signal points of 1D-non-uniform constellation (1D-NUC) in 1024 quadrature amplitude modulation (1024QAM) on a 10-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 173, 19, 14, 40, 115, 80, 35, 24, 79, 94, 33, 109, 101, 61, 142, 128, 130, 162, 11, 159, 47, 160, 143, 38, 65, 122, 6, 181, 12, 45, 0, 106, 153, 56, 21, 125, 17, 129, 85, 186, 27, 155, 107, 156, 191, 151, 90, 135, 64, 57, 113, 175, 49, 108, 149, 164, 26, 146, 105, 104, 29, 100, 84, 92, 3, 58, 41, 91, 139, 174, 70, 182, 89, 131, 25, 119, 178, 7, 48, 54, 184, 1, 126, 43, 179, 168, 120, 60, 190, 68, 136, 176, 163, 13, 71, 147, 63, 37, 72, 32, 30, 123, 185, 154, 167, 86, 103, 138, 127, 148, 50, 152, 66, 46, 118, 96, 10, 111, 145, 99, 180, 88, 158, 114, 110, 73, 117, 112, 52, 165, 62, 23, 102, 59, 36, 5, 116, 98, 53, 188, 39, 93, 31, 28, 55, 172, 189, 187, 67, 15, 16, 4, 22, 133, 76, 44, 87, 77, 18, 78, 169, 166, 83, 82, 161, 74, 134, 157, 81, 95, 42, 132, 121, 8, 97, 141, 20, 170, 69, 177, 34, 140, 124, 183, 51, 137, 9, 2, 75, 144, 171, 150. The parity check matrix includes the A matrix of M1 rows and K columns expressed by a predetermined value M1 and the information length K=N×r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |

-continued

| | | | | | | | | | |
|---|---|---|---|---|---|---|---|---|---|
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

In the eighth reception device of the present technology, the sequence of the LDPC code after group-wise interleaving obtained from the data transmitted by the eighth transmission method is returned to the original sequence.

In the ninth transmission method of the present technology, LDPC coding is performed on the basis of the parity check matrix of the LDPC code with the code length N of 69120 bits and the coding rate r of 7/16, and group-wise interleaving to interleave the LDPC code in units of bit groups of 360 bits is performed. Then, the LDPC code is mapped to any one of 1024 signal points of 1D-non-uniform constellation (1D-NUC) in 1024 quadrature amplitude modulation (1024QAM) on a 10-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 27, 109, 45, 105, 174, 62, 185, 69, 102, 91, 37, 39, 31, 34, 127, 111, 30, 23, 157, 155, 76, 19, 85, 172, 122, 5, 36, 100, 26, 59, 136, 79, 25, 134, 101, 3, 96, 135, 21, 2, 35, 82, 47, 143, 56, 54, 149, 7, 175, 170, 144, 71, 190, 94, 64, 131, 145, 40, 191, 86, 90, 24, 139, 20, 184, 181, 29, 176, 124, 159, 12, 43, 187, 16, 162, 57, 0, 188, 11, 42, 4, 164, 156, 22, 95, 81, 153, 141, 169, 117, 50, 151, 89, 120, 189, 167, 177, 173, 140, 118, 51, 55, 113, 171, 41, 63, 148, 106, 9, 17, 80, 97, 77, 83, 182, 161, 137, 15, 125, 186, 88, 98, 32, 138, 129, 46, 52, 73, 168, 115, 165, 142, 38, 84, 128, 166, 107, 116, 123, 114, 93, 78, 178, 66, 146, 160, 104, 121, 48, 74, 13, 61, 70, 60, 75, 163, 179, 28, 130, 154, 53, 110, 10, 33, 112, 18, 180, 147, 133, 1, 65, 68, 8, 44, 108, 132, 183, 6, 119, 67, 14, 152, 72, 150, 103, 87, 58, 99, 126, 92, 49, 158. The parity check matrix includes the A matrix of M1 rows and K columns expressed by a predetermined value M1 and the information length K=N r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |

-continued

| | | | | |
|---|---|---|---|---|
| 799 | 1180 | 1329 | 12496 | 22390 |
| 549 | 1311 | 3657 | 17564 | 35009 |
| 132 | 517 | 3180 | 5304 | 35588 |
| 2767 | 3953 | 4221 | 30887 | 34291 |
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

In the ninth reception device of the present technology, the sequence of the LDPC code after group-wise interleaving obtained from the data transmitted by the ninth transmission method is returned to the original sequence.

In the tenth transmission method of the present technology, LDPC coding is performed on the basis of the parity check matrix of the LDPC code with the code length N of 69120 bits and the coding rate r of 3/16, and group-wise interleaving to interleave the LDPC code in units of bit groups of 360 bits is performed. Then, the LDPC code is mapped to any one of 4096 signal points of uniform constellation (UC) in 4096 quadrature amplitude modulation (4096QAM) on a 12-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 50, 30, 180, 100, 44, 21, 25, 130, 190, 135, 154, 84, 150, 20, 16, 184, 137, 109, 189, 36, 105, 151, 49, 107, 108, 79, 148, 121, 88, 128, 62, 7, 185, 145, 166, 64, 141, 102, 181, 191, 94, 171, 1, 14, 11, 170, 63, 67, 17, 51, 90, 155, 98, 115, 173, 26, 56, 87, 138, 81, 13, 31, 27, 24, 29, 46, 54, 78, 118, 120, 164, 58, 95, 122, 106, 85, 96, 41, 3, 187, 72, 0, 143, 142, 186, 146, 101, 89, 23, 133, 83, 92, 22, 99, 136, 158, 156, 91, 97, 28, 162, 147, 65, 139, 111, 38, 161, 163, 4, 75, 125, 177, 12, 70, 114, 6, 45, 165, 126, 132, 134, 40, 149, 104, 188, 80, 55, 34, 119, 175, 66, 93, 39, 47, 153, 8, 69, 157, 61, 35, 182, 124, 168, 76, 131, 59, 112, 152, 82, 116, 123, 9, 73, 15, 86, 159, 172, 18, 183, 68, 103, 167, 113, 5, 74, 42, 174, 140, 2, 10, 32, 19, 127, 48, 169, 117, 129, 178, 53, 179, 71, 52, 60, 110, 57, 144, 160, 43, 37, 33, 77, 176.

The parity check matrix includes the A matrix of M1 rows and K columns expressed by a predetermined value M1 and the information length K=N×r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |

-continued

| | | | | | | | | | |
|---|---|---|---|---|---|---|---|---|---|
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

In the tenth reception device of the present technology, the sequence of the LDPC code after group-wise interleaving obtained from the data transmitted by the tenth transmission method is returned to the original sequence.

In the eleventh transmission method of the present technology, LDPC coding is performed on the basis of the parity check matrix of the LDPC code with the code length N of 69120 bits and the coding rate r of 7/16, and group-wise interleaving to interleave the LDPC code in units of bit groups of 360 bits is performed. Then, the LDPC code is mapped to any one of 4096 signal points of uniform constellation (UC) in 4096 quadrature amplitude modulation (4096QAM) on a 12-bit basis. In the group-wise interleaving, the (i+1)th bit group from a head of the LDPC code is set as the bit group i, and the sequence of bit groups 0 to 191 of the 69120-bit LDPC code is interleaved into the sequence of bit groups 163, 174, 26, 190, 68, 80, 112, 146, 97, 44, 156, 134, 51, 167, 19, 127, 145, 102, 20, 58, 30, 9, 153, 143, 32, 63, 189, 180, 110, 41, 101, 166, 104, 138, 89, 42, 27, 8, 161, 67, 72, 81, 106, 132, 175, 107, 116, 186, 108, 13, 96, 154, 10, 103, 139, 99, 164, 29, 12, 118, 123, 109, 133, 61, 64, 0, 128, 17, 6, 45, 159, 1, 66, 24, 38, 33, 95, 187, 50, 120, 21, 168, 182, 184, 141, 148, 31, 79, 25, 144, 170, 18, 176, 135, 183, 7, 90, 52, 94, 77, 65, 3, 15, 85, 43, 100, 35, 124, 39, 57, 78, 88, 70, 76, 171, 149, 121, 125, 84, 16, 140, 40, 150, 157, 36, 48, 162, 2, 62, 22, 147, 83, 53, 82, 177, 98, 115, 69, 105, 151, 136, 181, 56, 173, 122, 111, 47, 179, 191, 119, 87, 178, 155, 131, 185, 91, 60, 55, 54, 37, 172, 169, 4, 188, 158, 11, 59, 160, 129, 5, 34, 14, 137, 117, 126, 114, 49, 73, 74, 28, 75, 152, 142, 71, 23, 86, 93, 130, 92, 113, 46, 165. The parity check matrix includes the A matrix of M1 rows and K columns expressed by a predetermined value M1 and the information length K=N r of the LDPC code, the A matrix being an upper left matrix of the parity check matrix, the B matrix of M1 rows and M1 columns, having a step structure adjacent to right of the A matrix, the Z matrix of M1 rows and N−K−M1 columns, the Z matrix being a zero matrix adjacent to right of the B matrix, the C matrix of N−K−M1 rows and K+M1 columns, adjacent to below the A matrix and the B matrix, and the D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |

-continued

| | | | | |
|---|---|---|---|---|
| 1783 | 1838 | 4330 | 11645 | 36545 |
| 1231 | 3435 | 4503 | 9035 | 29888 |
| 826 | 1836 | 2994 | 22108 | 22827 |
| 229 | 1417 | 2078 | 14324 | 17714 |
| 567 | 3244 | 3728 | 22202 | 33883 |
| 799 | 1180 | 1329 | 12496 | 22390 |
| 549 | 1311 | 3657 | 17564 | 35009 |
| 132 | 517 | 3180 | 5304 | 35588 |
| 2767 | 3953 | 4221 | 30887 | 34291 |
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

In the eleventh reception device of the present technology, the sequence of the LDPC code after group-wise interleaving obtained from the data transmitted by the eleventh transmission method is returned to the original sequence.

Note that the reception device may be an independent device or may be internal blocks configuring one device.

Effects of the Invention

According to the present technology, good communication quality can be secured in data transmission using an LDPC code.

Note that effects described here are not necessarily limited, and any of effects described in the present disclosure may be exhibited.

BRIEF DESCRIPTION OF DRAWINGS

FIG. 3 is a diagram illustrating an example of a parity check matrix of an LDPC code.

FIG. 13 is a diagram for describing a parity check matrix of an LDPC code defined in the standard of DVB-T.2.

FIG. 15 is a diagram illustrating examples of a parity matrix $H_T$ having a step structure and a Tanner graph corresponding to the parity matrix $H_T$.

FIG. 21 is a diagram for describing a method of obtaining the parity check matrix H from the parity check matrix initial value table.

FIG. 30 is a diagram illustrating an example of a parity check matrix initial value table of a type A code with N=69120 bits and r=2/16.

FIG. 31 is a diagram illustrating an example of the parity check matrix initial value table of a type A code with N=69120 bits and r=3/16.

FIG. 32 is a diagram illustrating the example of a parity check matrix initial value table of a type A code with N=69120 bits and r=3/16.

FIG. 33 is a diagram illustrating an example of a parity check matrix initial value table of a type A code with N=69120 bits and r=4/16.

FIG. 34 is a diagram illustrating an example of a parity check matrix initial value table of a type A code with N=69120 bits and r=5/16.

FIG. 35 is a diagram illustrating the example of a parity check matrix initial value table of a type A code with N=69120 bits and r=5/16.

FIG. 36 is a diagram illustrating an example of a parity check matrix initial value table of a type A code with N=69120 bits and r=6/16.

FIG. 37 is a diagram illustrating the example of a parity check matrix initial value table of a type A code with N=69120 bits and r=6/16.

FIG. 38 is a diagram illustrating an example of a parity check matrix initial value table of a type A code with N=69120 bits and r=7/16.

FIG. 39 is a diagram illustrating the example of a parity check matrix initial value table of a type A code with N=69120 bits and r=7/16.

FIG. 40 is a diagram illustrating an example of a parity check matrix initial value table of a type A code with N=69120 bits and r=8/16.

FIG. 41 is a diagram illustrating the example of a parity check matrix initial value table of a type A code with N=69120 bits and r=8/16.

FIG. 42 is a diagram illustrating an example of a parity check matrix initial value table of a type B code with N=69120 bits and r=7/16.

FIG. 43 is a diagram illustrating the example of a parity check matrix initial value table of a type B code with N=69120 bits and r=7/16.

FIG. 44 is a diagram illustrating another example of a parity check matrix initial value table of a type B code with N=69120 bits and r=7/16.

FIG. 45 is a diagram illustrating the another example of a parity check matrix initial value table of a type B code with N=69120 bits and r=7/16.

FIG. 46 is a diagram illustrating an example of a parity check matrix initial value table of a type B code with N=69120 bits and r=8/16.

FIG. 47 is a diagram illustrating the example of a parity check matrix initial value table of a type B code with N=69120 bits and r=8/16.

FIG. 48 is a diagram illustrating another example of a parity check matrix initial value table of a type B code with N=69120 bits and r=8/16.

FIG. 49 is a diagram illustrating the another example of a parity check matrix initial value table of a type B code with N=69120 bits and r=8/16.

FIG. 50 is a diagram illustrating an example of a parity check matrix initial value table of a type B code with N=69120 bits and r=9/16.

FIG. 51 is a diagram illustrating the example of a parity check matrix initial value table of a type B code with N=69120 bits and r=9/16.

FIG. 52 is a diagram illustrating the example of a parity check matrix initial value table of a type B code with N=69120 bits and r=9/16.

FIG. 53 is a diagram illustrating another example of a parity check matrix initial value table of a type B code with N=69120 bits and r=9/16.

FIG. 54 is a diagram illustrating the another example of a parity check matrix initial value table of a type B code with N=69120 bits and r=9/16.

FIG. 55 is a diagram illustrating the another example of a parity check matrix initial value table of a type B code with N=69120 bits and r=9/16.

FIG. 56 is a diagram illustrating an example of a parity check matrix initial value table of a type B code with N=69120 bits and r=10/16.

FIG. 57 is a diagram illustrating the example of a parity check matrix initial value table of a type B code with N=69120 bits and r=10/16.

FIG. 58 is a diagram illustrating the example of a parity check matrix initial value table of a type B code with N=69120 bits and r=10/16.

FIG. 59 is a diagram illustrating another example of a parity check matrix initial value table of a type B code with N=69120 bits and r=10/16.

FIG. 60 is a diagram illustrating the another example of a parity check matrix initial value table of a type B code with N=69120 bits and r=10/16.

FIG. 61 is a diagram illustrating the another example of a parity check matrix initial value table of a type B code with N=69120 bits and r=10/16.

FIG. 62 is a diagram illustrating an example of a parity check matrix initial value table of a type B code with N=69120 bits and r=11/16.

FIG. 63 is a diagram illustrating the example of a parity check matrix initial value table of a type B code with N=69120 bits and r=11/16.

FIG. 64 is a diagram illustrating the example of a parity check matrix initial value table of a type B code with N=69120 bits and r=11/16.

FIG. 65 is a diagram illustrating another example of a parity check matrix initial value table of a type B code with N=69120 bits and r=11/16.

FIG. 66 is a diagram illustrating the another example of a parity check matrix initial value table of a type B code with N=69120 bits and r=11/16.

FIG. 67 is a diagram illustrating the another example of a parity check matrix initial value table of a type B code with N=69120 bits and r=11/16.

FIG. 68 is a diagram illustrating an example of a parity check matrix initial value table of a type B code with N=69120 bits and r=12/16.

FIG. 69 is a diagram illustrating the example of a parity check matrix initial value table of a type B code with N=69120 bits and r=12/16.

FIG. 70 is a diagram illustrating the example of a parity check matrix initial value table of a type B code with N=69120 bits and r=12/16.

FIG. 71 is a diagram illustrating another example of a parity check matrix initial value table of a type B code with N=69120 bits and r=12/16.

FIG. 72 is a diagram illustrating the another example of a parity check matrix initial value table of a type B code with N=69120 bits and r=12/16.

FIG. 73 is a diagram illustrating the another example of a parity check matrix initial value table of a type B code with N=69120 bits and r=12/16.

FIG. 74 is a diagram illustrating an example of a parity check matrix initial value table of a type B code with N=69120 bits and r=13/16.

FIG. 75 is a diagram illustrating the example of a parity check matrix initial value table of a type B code with N=69120 bits and r=13/16.

FIG. 76 is a diagram illustrating the example of a parity check matrix initial value table of a type B code with N=69120 bits and r=13/16.

FIG. 77 is a diagram illustrating another example of a parity check matrix initial value table of a type B code with N=69120 bits and r=13/16.

FIG. 78 is a diagram illustrating the another example of a parity check matrix initial value table of a type B code with N=69120 bits and r=13/16.

FIG. 79 is a diagram illustrating the another example of a parity check matrix initial value table of a type B code with N=69120 bits and r=13/16.

FIG. 80 is a diagram illustrating an example of a parity check matrix initial value table of a type B code with N=69120 bits and r=14/16.

FIG. 81 is a diagram illustrating the example of a parity check matrix initial value table of a type B code with N=69120 bits and r=14/16.

FIG. 82 is a diagram illustrating the example of a parity check matrix initial value table of a type B code with N=69120 bits and r=14/16.

FIG. 83 is a diagram illustrating another example of a parity check matrix initial value table of a type B code with N=69120 bits and r=14/16.

FIG. 84 is a diagram illustrating the another example of a parity check matrix initial value table of a type B code with N=69120 bits and r=14/16.

FIG. 85 is a diagram illustrating the another example of a parity check matrix initial value table of a type B code with N=69120 bits and r=14/16.

FIG. 89 is a diagram for describing a parity check matrix by the type A method.

FIG. 91 is a diagram for describing a parity check matrix by the type B method.

FIG. 92 is a diagram illustrating a parity check matrix initial value table of a new type A code with N=69120 bits and r=3/16.

FIG. 93 is a diagram illustrating the parity check matrix initial value table of a new type A code with N=69120 bits and r=3/16.

FIG. 94 is a diagram illustrating a parity check matrix initial value table of a new type A code with N=69120 bits and r=7/16.

FIG. 95 is a diagram illustrating the parity check matrix initial value table of a new type A code with N=69120 bits and r=7/16.

FIG. 96 is a diagram illustrating the parity check matrix initial value table of a new type A code with N=69120 bits and r=7/16.

FIG. 97 is a diagram illustrating parameters of a parity check matrix H of the new type A code of r=3/16 and the new type A code of r=7/16.

FIG. 98 is a diagram illustrating examples of a coordinate of a signal point of UC in a case where a modulation method is QPSK.

FIG. 99 is a diagram illustrating examples of a coordinate of a signal point of 2D-NUC in a case where the modulation method is 16QAM.

FIG. 100 is a diagram illustrating examples of a coordinate of a signal point of 1D-NUC in a case where the modulation method is 1024QAM.

FIG. 101 is a diagram illustrating a relationship between a symbol y of 1024QAM and a position vector u.

FIG. 102 is a diagram illustrating examples of coordinates $z_q$ of signal points of QPSK-UC.

FIG. 103 is a diagram illustrating examples of coordinates $z_q$ of signal points of QPSK-UC.

FIG. 104 is a diagram illustrating examples of coordinates $z_q$ of signal points of 16QAM-UC.

FIG. 105 is a diagram illustrating examples of coordinates $z_q$ of signal points of 16QAM-UC.

FIG. 106 is a diagram illustrating examples of coordinates $z_q$ of signal points of 64QAM-UC.

FIG. 107 is a diagram illustrating examples of coordinates $z_q$ of signal points of 64QAM-UC.

FIG. 108 is a diagram illustrating examples of coordinates $z_q$ of signal points of 256QAM-UC.

FIG. 109 is a diagram illustrating examples of coordinates $z_q$ of signal points of 256QAM-UC.

FIG. 110 is a diagram illustrating examples of coordinates $z_q$ of signal points of 1024QAM-UC.

FIG. 111 is a diagram illustrating examples of coordinates $z_q$ of signal points of 1024QAM-UC.

FIG. 112 is a diagram illustrating examples of coordinates $z_q$ of signal points of 4096QAM-UC.

FIG. 113 is a diagram illustrating examples of coordinates $z_q$ of signal points of 4096QAM-UC.

FIG. 114 is a diagram illustrating examples of coordinates $z_s$ of signal points of 16QAM-2D-NUC.

FIG. 115 is a diagram illustrating examples of coordinates $z_s$ of signal points of 64QAM-2D-NUC.

FIG. 116 is a diagram illustrating examples of coordinates $z_s$ of signal points of 256QAM-2D-NUC.

FIG. 117 is a diagram illustrating examples of coordinates $z_s$ of signal points of 256QAM-2D-NUC.

FIG. 118 is a diagram illustrating examples of coordinates $z_s$ of signal points of 1024QAM-1D-NUC.

FIG. 119 is a diagram illustrating a relationship between a symbol y of 1024QAM and a position vector u.

FIG. 120 is a diagram illustrating examples of coordinates $z_s$ of signal points of 4096QAM-1D-NUC.

FIG. 121 is a diagram illustrating a relationship between a symbol y of 4096QAM and a position vector u.

FIG. 122 is a diagram illustrating a relationship between a symbol y of 4096QAM and a position vector u.

FIG. 123 is a diagram for describing block interleaving performed by a block interleaver 25.

FIG. 124 is a diagram for describing the block interleaving performed by the block interleaver 25.

FIG. 125 is a diagram for describing group-wise interleaving performed by a group-wise interleaver 24.

FIG. 126 is a diagram illustrating a first example of a GW pattern for an LDPC code with a code length N of 69120 bits.

FIG. 127 is a diagram illustrating a second example of the GW pattern for the LDPC code with a code length N of 69120 bits.

FIG. 128 is a diagram illustrating a third example of the GW pattern for the LDPC code with a code length N of 69120 bits.

FIG. 129 is a diagram illustrating a fourth example of the GW pattern for the LDPC code with a code length N of 69120 bits.

FIG. 130 is a diagram illustrating a fifth example of the GW pattern for the LDPC code with a code length N of 69120 bits.

FIG. 131 is a diagram illustrating a sixth example of the GW pattern for the LDPC code with a code length N of 69120 bits.

FIG. 132 is a diagram illustrating a seventh example of the GW pattern for the LDPC code with a code length N of 69120 bits.

FIG. 133 is a diagram illustrating an eighth example of the GW pattern for the LDPC code with a code length N of 69120 bits.

FIG. 134 is a diagram illustrating a ninth example of the GW pattern for the LDPC code with a code length N of 69120 bits.

Figure 135:
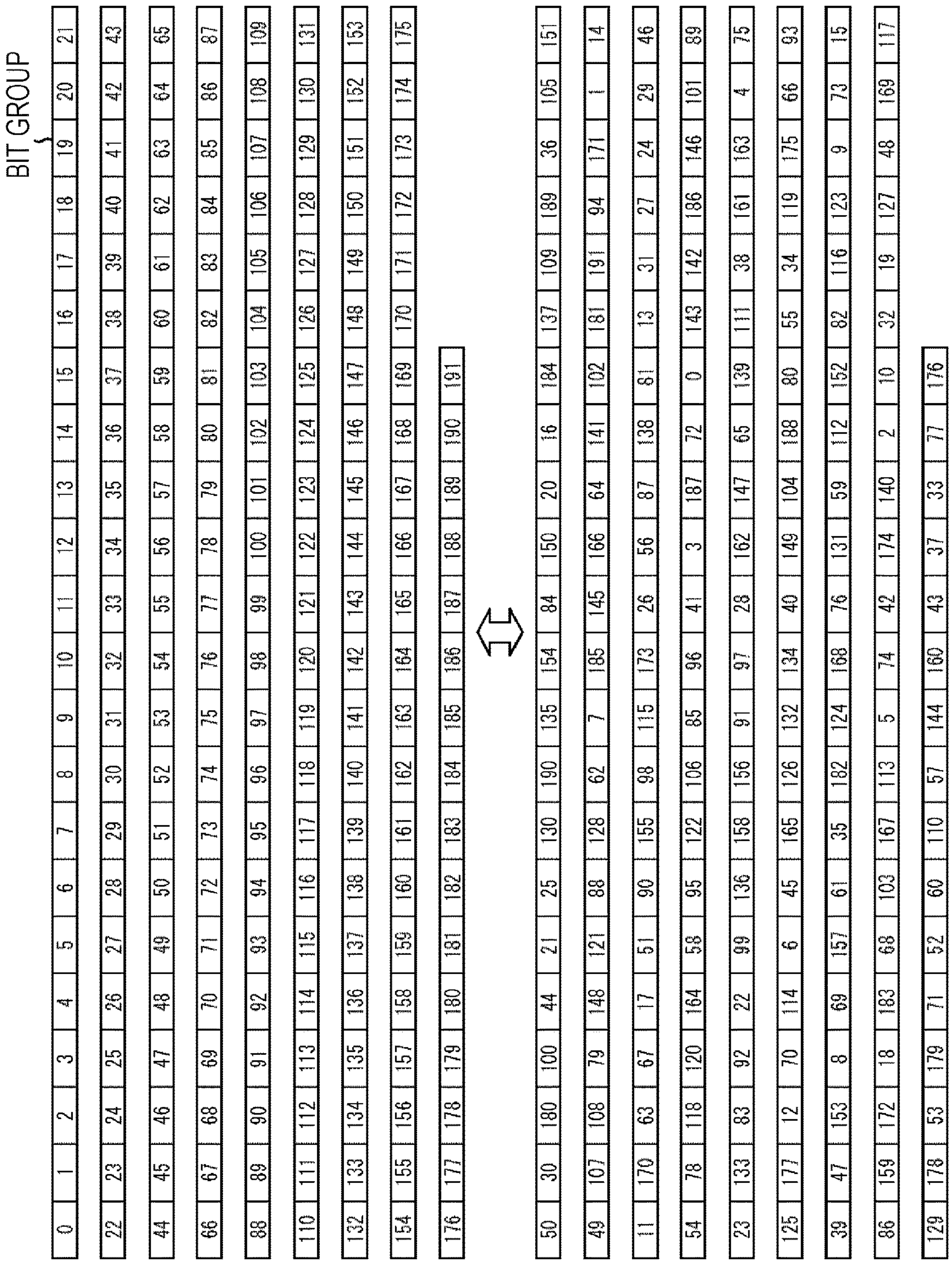

FIG. 135 is a diagram illustrating a tenth example of the GW pattern for the LDPC code with a code length N of 69120 bits.

FIG. 136 is a diagram illustrating an eleventh example of the GW pattern for the LDPC code with a code length N of 69120 bits.

Figure 137:
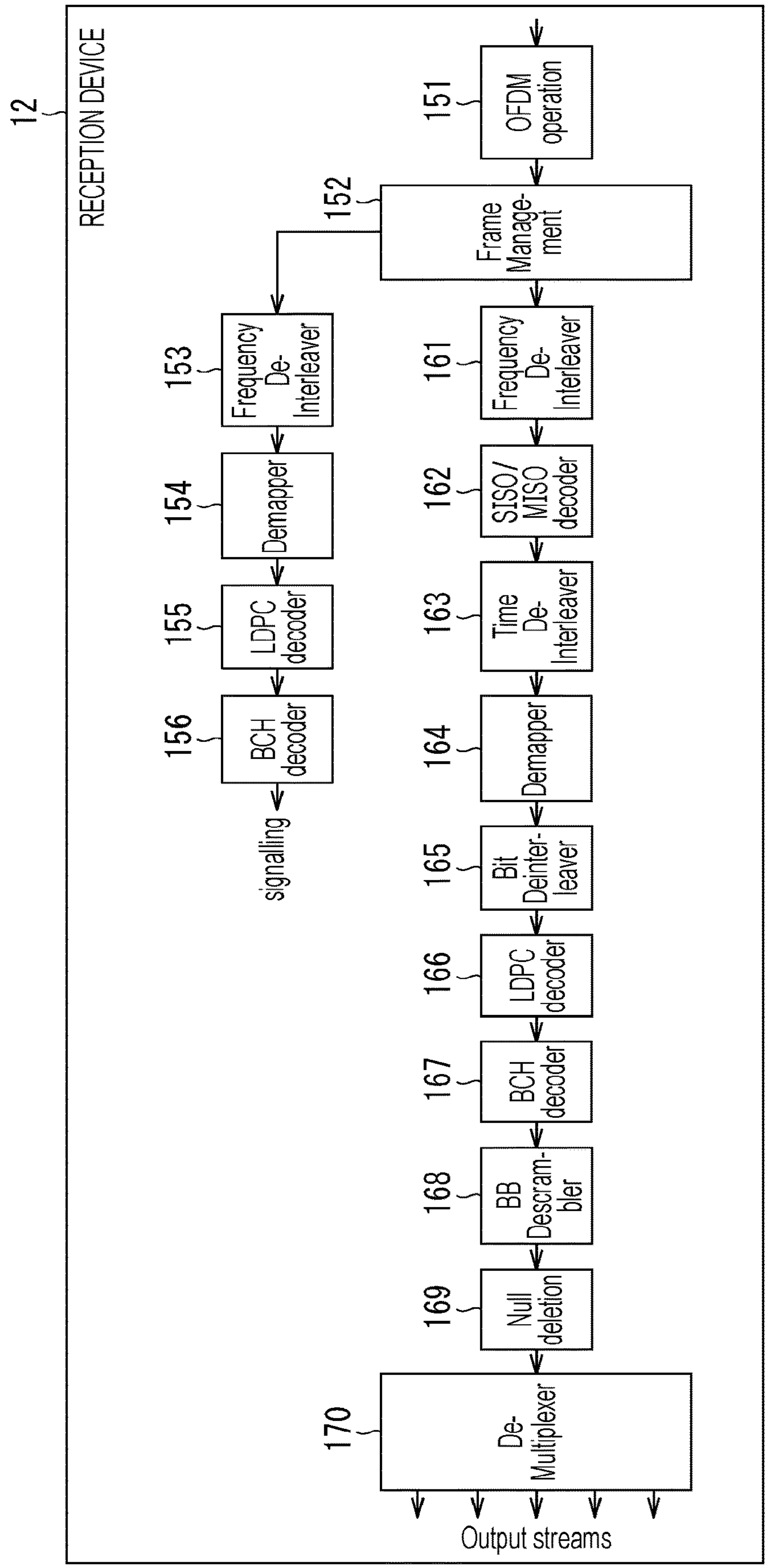

FIG. 137 is a block diagram illustrating a configuration example of a reception device 12.

Figure 138:
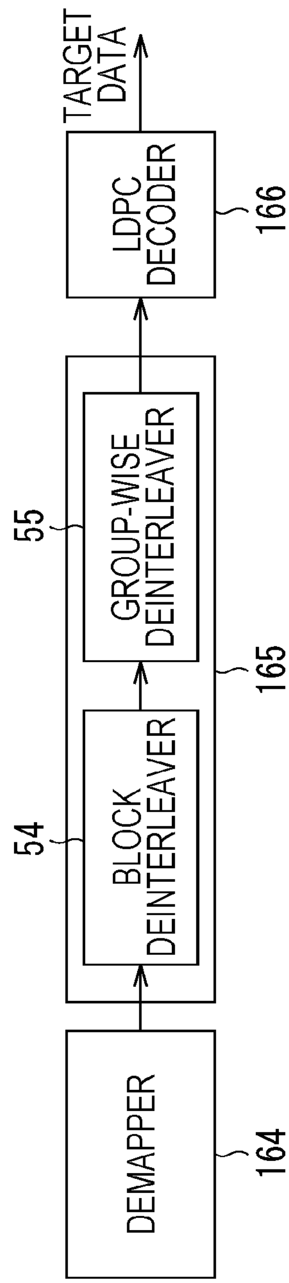

FIG. 138 is a block diagram illustrating a configuration example of a bit deinterleaver 165.

Figure 139:
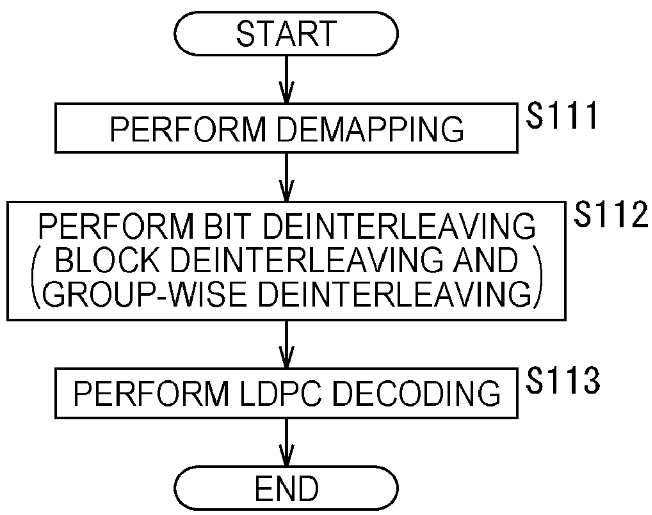

FIG. 139 is a flowchart for describing an example of processing performed by a demapper 164, a bit deinterleaver 165, and an LDPC decoder 166.

Figure 140:
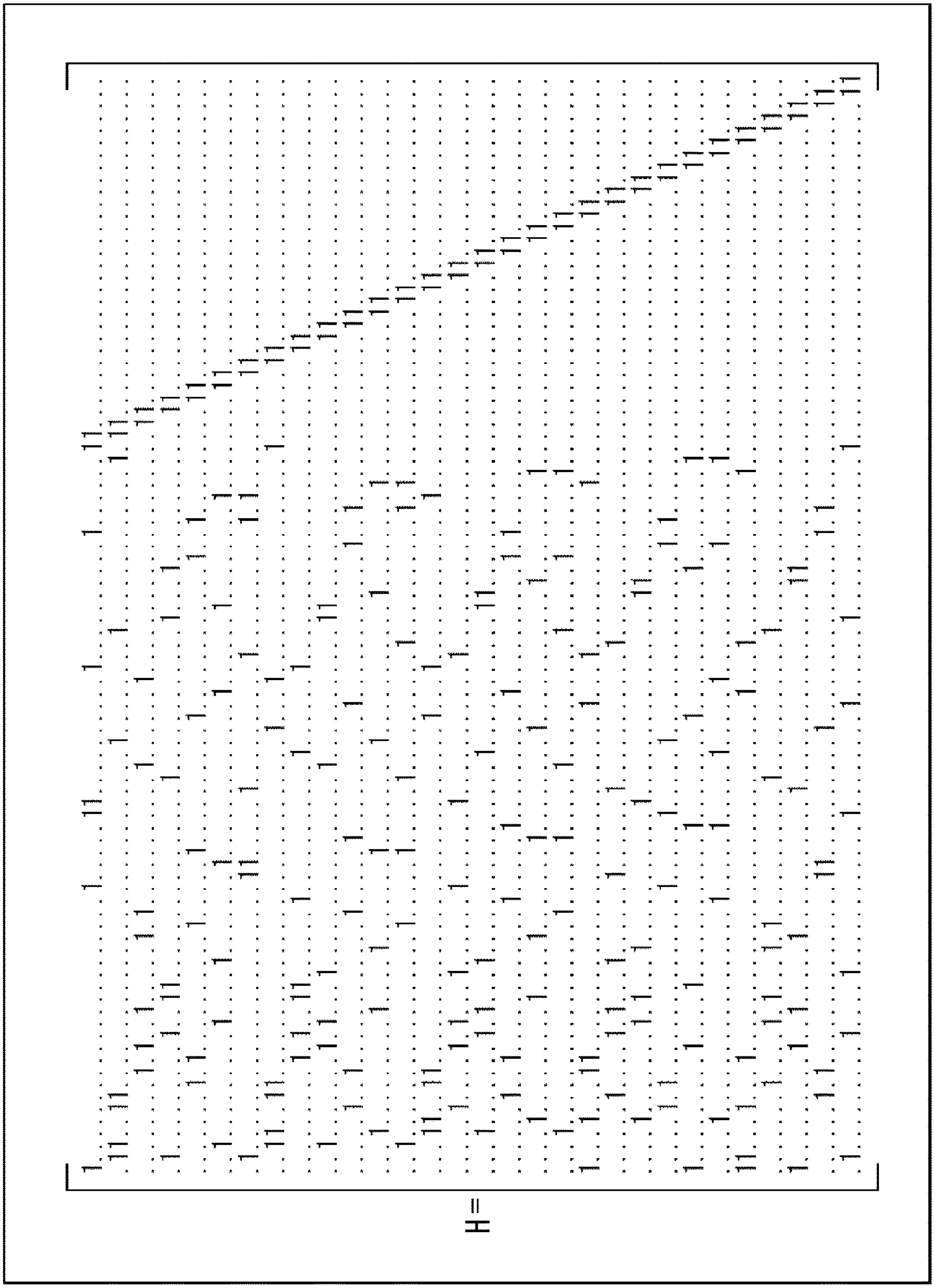

FIG. 140 is a diagram illustrating an example of a parity check matrix of an LDPC code.

Figure 141:
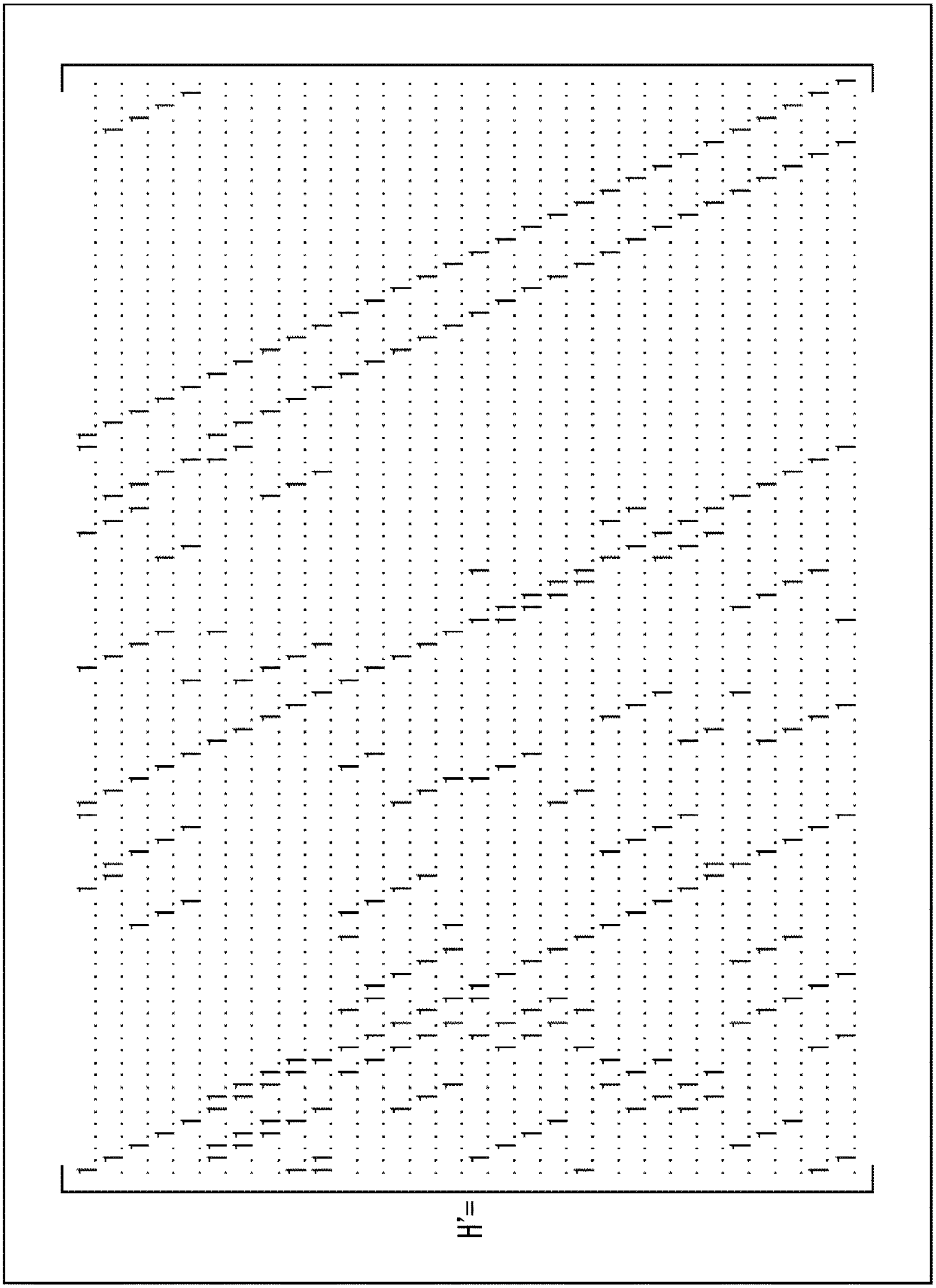

FIG. 141 is a diagram illustrating an example of a matrix (transformed parity check matrix) obtained by applying row permutation and column permutation to a parity check matrix.

Figure 142:
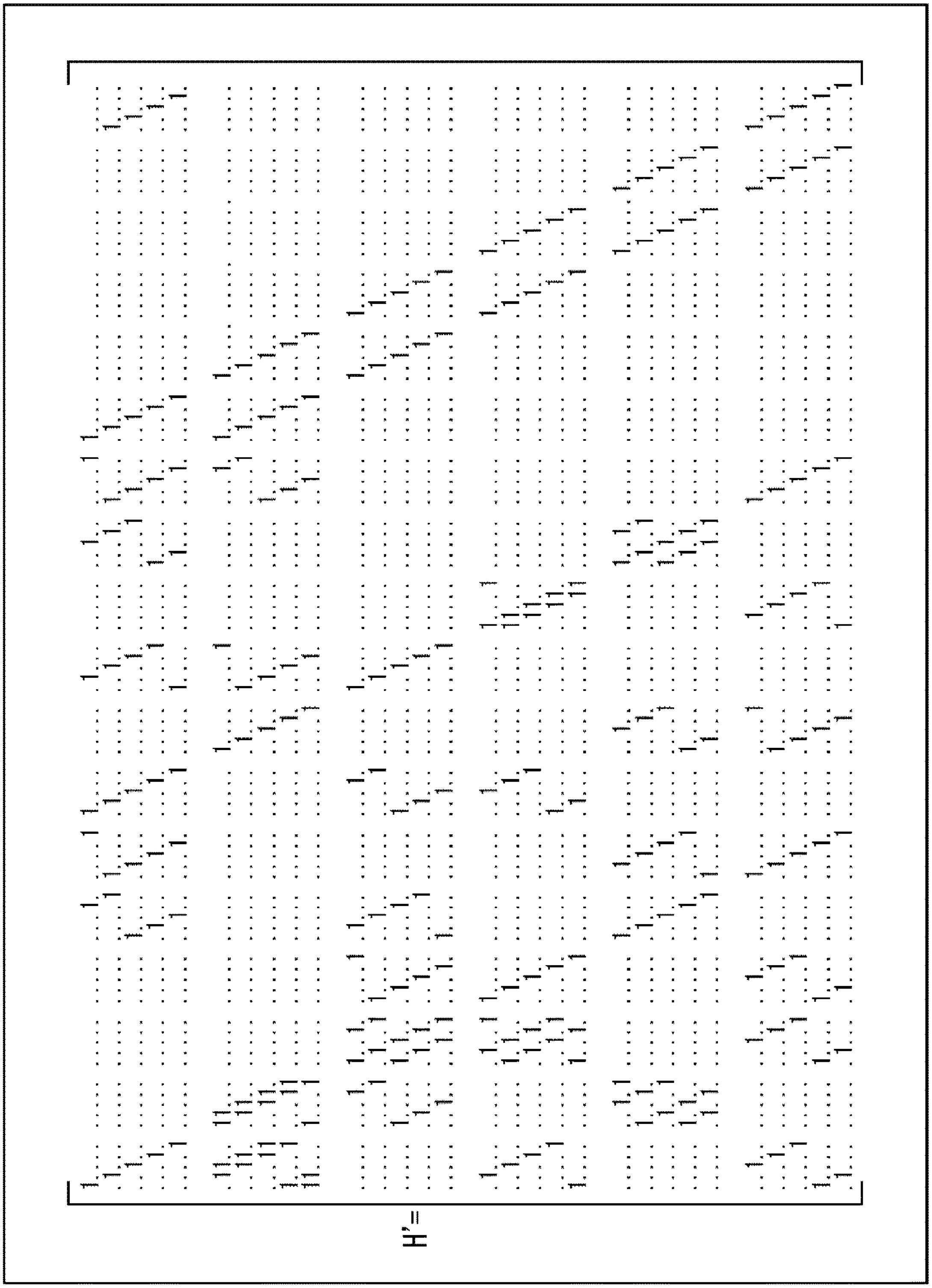

FIG. 142 is a diagram illustrating an example of a transformed parity check matrix divided into 5×5 units.

Figure 143:
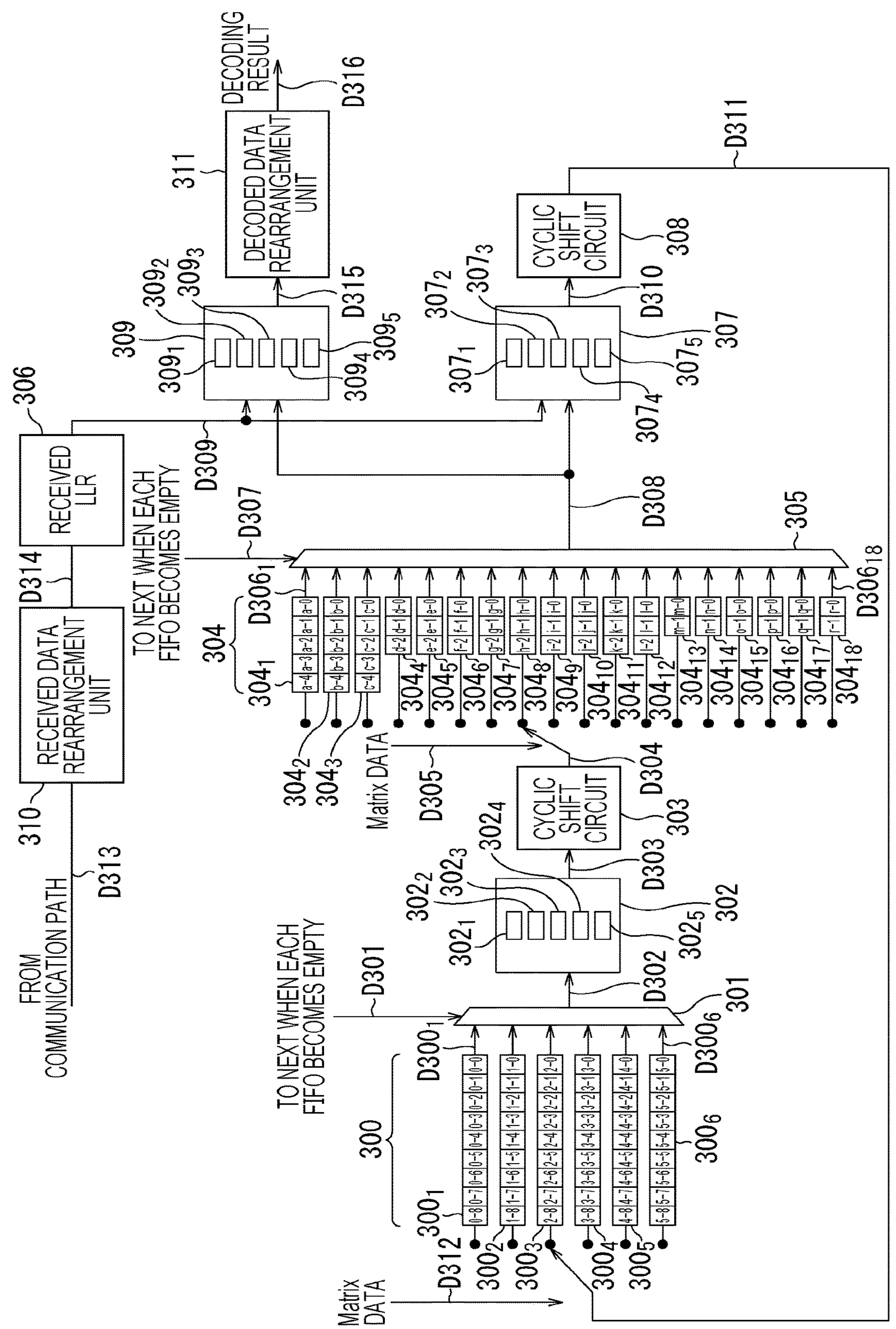

FIG. 143 is a block diagram illustrating a configuration example of a decoding device that collectively performs P node operations.

Figure 144:
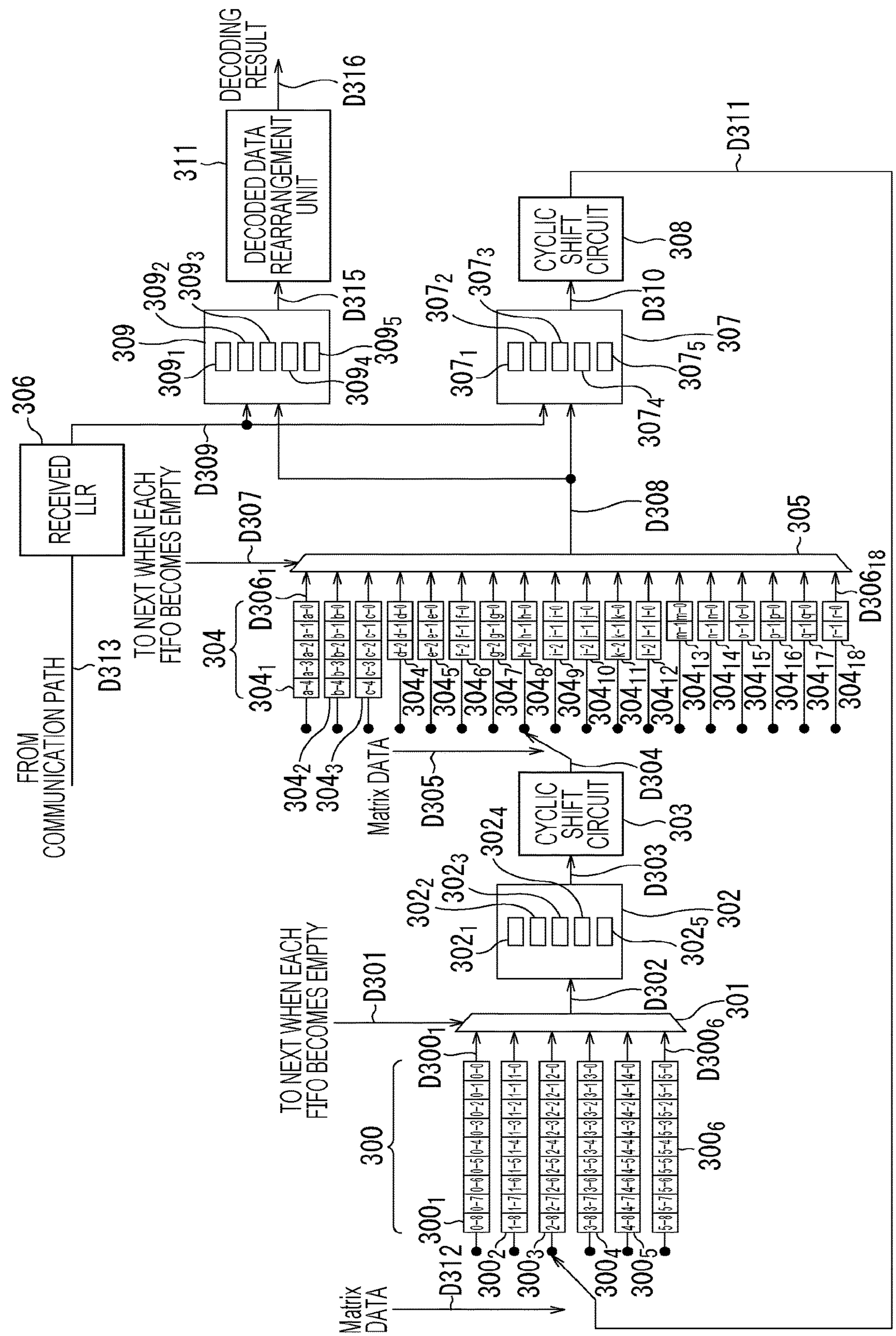

FIG. 144 is a block diagram illustrating a configuration example of the LDPC decoder 166.

Figure 145:
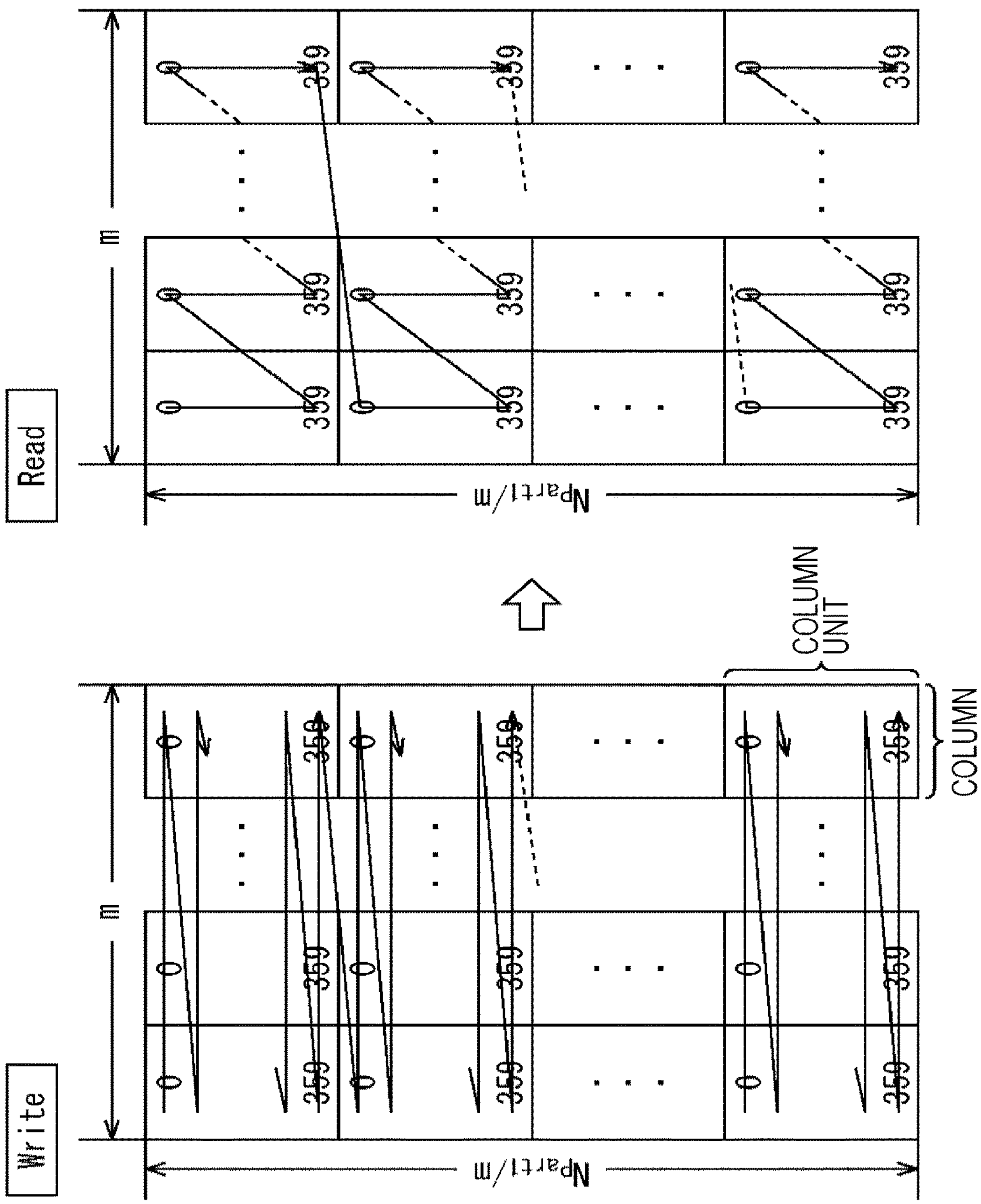

FIG. 145 is a diagram for describing block deinterleaving performed by a block deinterleaver 54.

Figure 146:
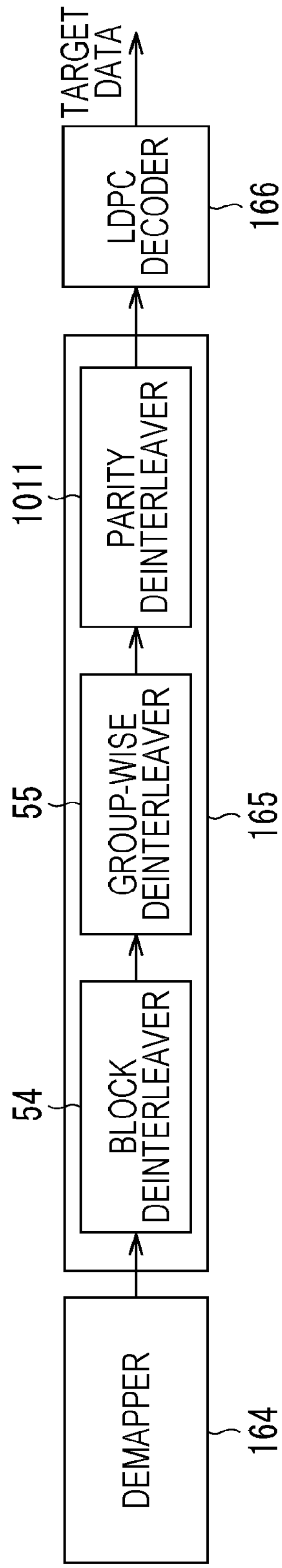

FIG. 146 is a block diagram illustrating another configuration example of the bit deinterleaver 165.

Figure 147:
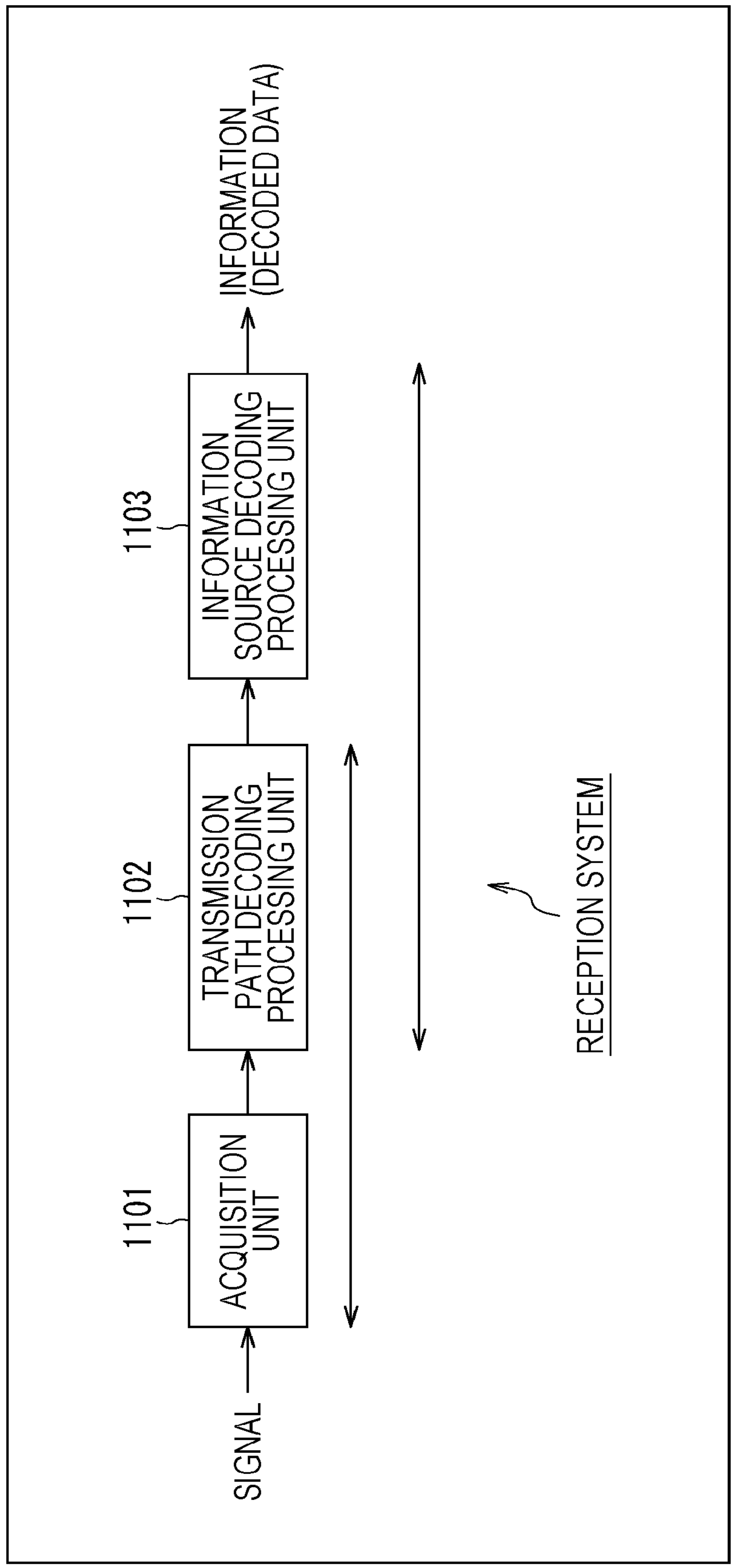

FIG. 147 is a block diagram illustrating a first configuration example of a reception system to which the reception device 12 is applicable.

Figure 148:
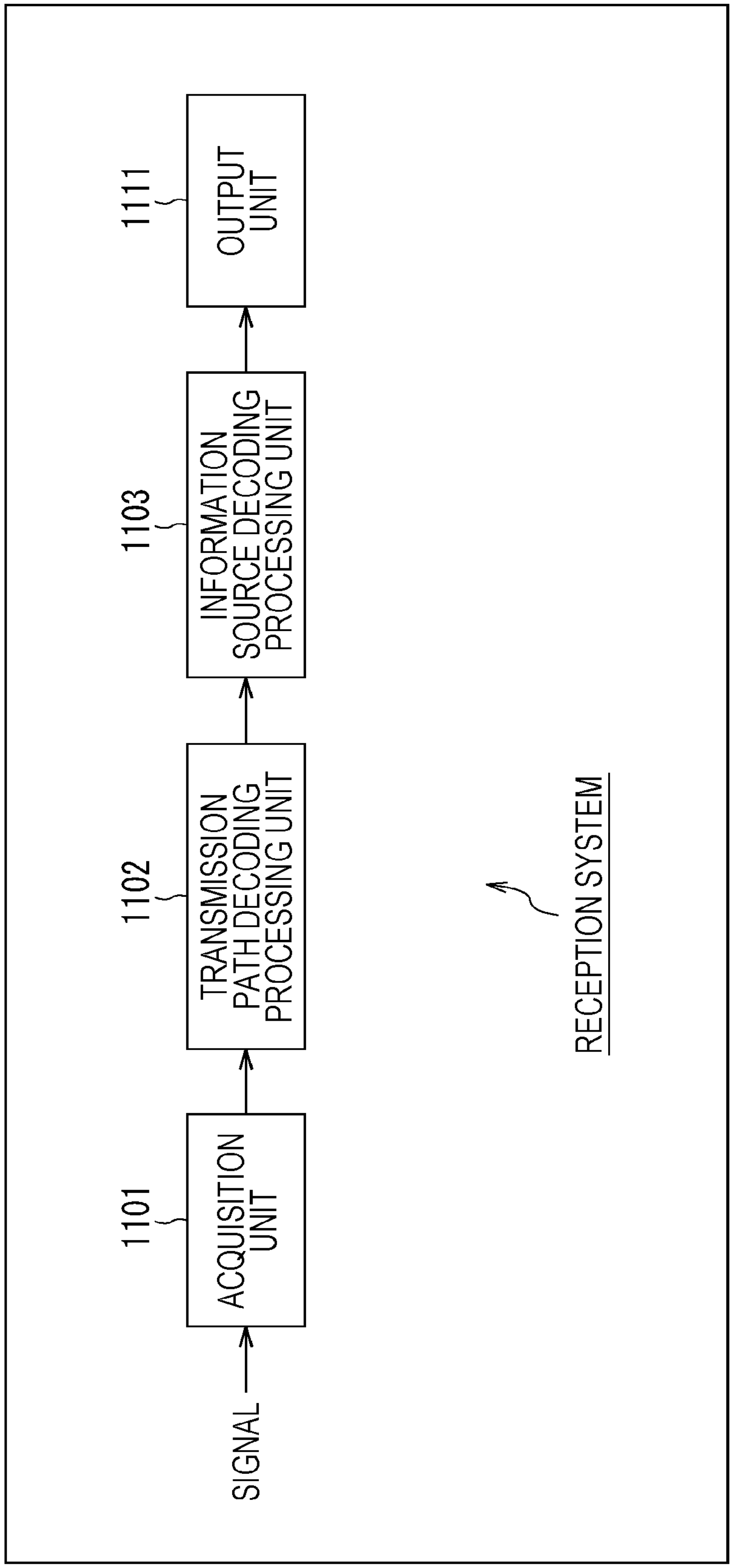

FIG. 148 is a block diagram illustrating a second configuration example of the reception system to which the reception device 12 is applicable.

Figure 149:
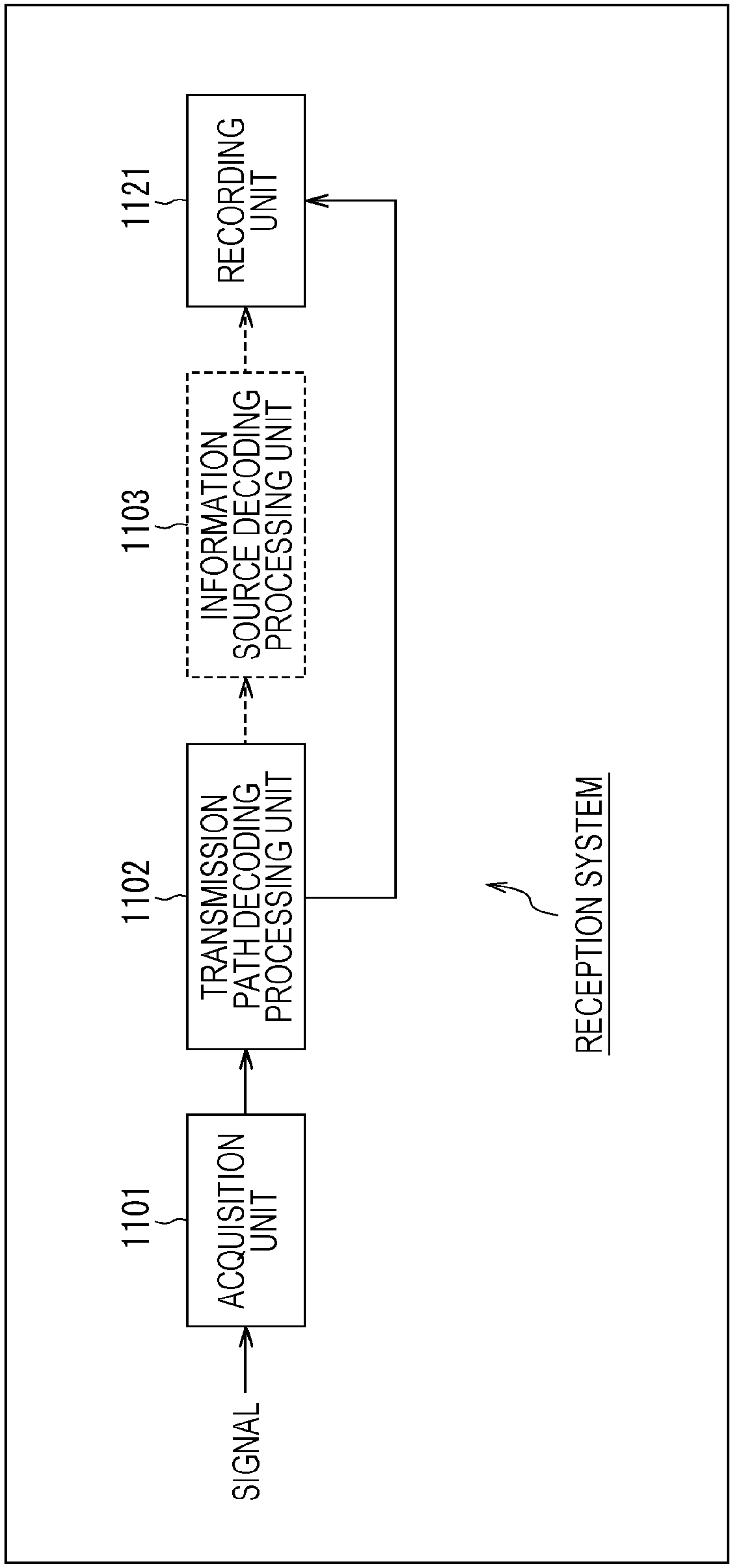

FIG. 149 is a block diagram illustrating a third configuration example of the reception system to which the reception device 12 is applicable.

Figure 150:
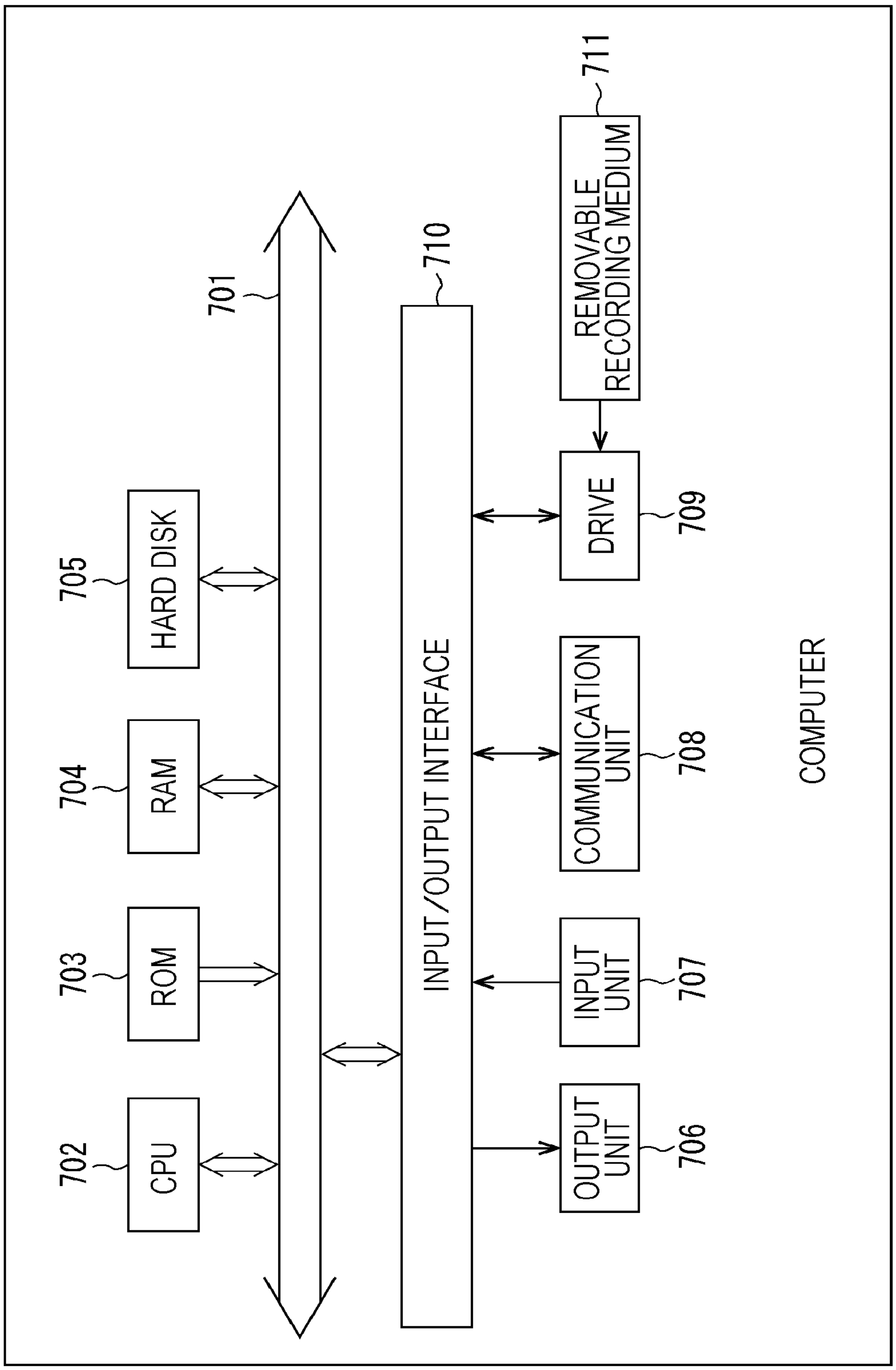

FIG. 150 is a block diagram illustrating a configuration example of an embodiment of a computer to which the present technology is applied.

MODE FOR CARRYING OUT THE INVENTION

Hereinafter, an embodiment of the present technology will be described. Before the description of the embodiment, an LDPC code will be described.

<LDPC Code>

Note that the LDPC code is a linear code and is not necessarily binary. However, description will be given on the assumption that the LDPC code is binary.

An LDPC code is most characterized in that a parity check matrix defining the LDPC code is sparse. Here, a sparse matrix is a matrix in which the number of "1"s of matrix elements is very small (a matrix in which most elements are 0).

Figure 1:
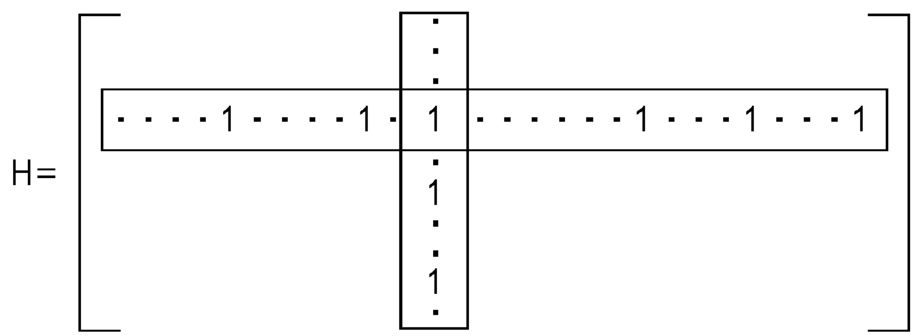
FIG. 1 is a diagram for describing a parity check matrix H of an LDPC code.

FIG. 1 is a diagram illustrating an example of a parity check matrix H of the LDPC code.

In the parity check matrix H in FIG. 1, a weight of each column (column weight) (the number of "1" s) (weight) is "3", and a weight of each row (row weight) is "6".

In coding with an LDPC code (LDPC coding), for example, a codeword (LDPC code) is generated by generating a generator matrix G on the basis of the parity check matrix H and multiplying binary information bits by the generator matrix G.

Specifically, a coding device for performing the LDPC coding first calculates the generator matrix G that holds an expression $GH^T=0$ with a transposed matrix $H_T$ of the parity check matrix H. Here, in a case where the generator matrix G is a K×N matrix, the coding device multiplies the generator matrix G by a bit string (vector u) of information bits including K bits and generates a codeword c (=uG) including N bits. The codeword (LDPC code) generated by the coding device is received at a reception side via a predetermined communication path.

Decoding of the LDPC code can be performed by an algorithm called probabilistic decoding proposed by Gallager, which is a message passing algorithm according to belief propagation on a so-called Tanner graph including a variable node (also called message node) and a check node. Here, as appropriate, the variable node and the check node are hereinafter also simply referred to as nodes.

Figure 2:
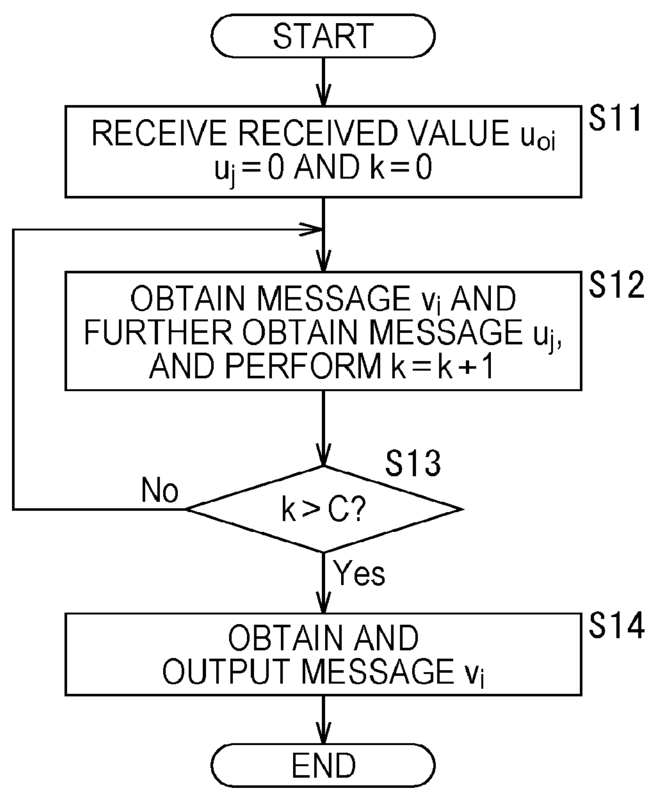
FIG. 2 is a flowchart for describing a procedure of decoding an LDPC code.

FIG. 2 is a flowchart illustrating a procedure of decoding an LDPC code.

Note that, hereinafter, a real value (received LLR) expressing "0" likeliness of a value of an i-th code bit of the LDPC code (1 codeword) received on the reception side, using a log likelihood ratio, is also referred to as a received value $u_{0i}$ as appropriate. Furthermore, a message output from the check node is $u_j$ and a message output from the variable node is $v_i$.

First, in decoding the LDPC code, as illustrated in FIG. 2, in step S11, the LDPC code is received, a message (check node message) $u_j$ is initialized to "0", a variable k that is an integer as a counter for repeated processing is initialized to "0", and the processing proceeds to step S12. In step S12, a message (variable node message) $v_i$ is obtained by performing an operation (variable node operation) illustrated in the expression (1) on the basis of the received value $u_{0i}$ obtained by receiving the LDPC code, and moreover, the message $u_j$ is obtained by performing an operation (check node operation) illustrated in the expression (2) on the basis of the message $v_i$.

[Expression 1]

$$v_i = u_{0i} + \sum_{j=1}^{d_v-1} u_j \tag{1}$$

[Expression 2]

$$\tanh\left(\frac{u_j}{2}\right) = \prod_{i=1}^{d_c-1} \tanh\left(\frac{v_i}{2}\right) \tag{2}$$

Here, $d_v$ and $d_c$ in the expressions (1) and (2) are arbitrarily selectable parameters respectively indicating the numbers of "1"s in a vertical direction (column) and a cross direction (row) of the parity check matrix H. For example, in the case of the LDPC code ((3, 6) LDPC code) for the parity check matrix H with the column weight of 3 and the row weight of 6 as illustrated in FIG. 1, $d_v=3$ and $d_c=6$.

Note that, in each of the variable node operation in the expression (1) and the check node operation in the expression (2), a message input from an edge (a line connecting the variable node and the check node) that is about to output a message is not an object for the operation. Therefore, an operation range is 1 to $d_v-1$ or 1 to $d_c-1$. Furthermore, the check node operation in the expression (2) is performed by, in practice, creating a table of a function R ($v_1$, $v_2$) illustrated in the expression (3) defined by one output for two inputs $v_1$ and $v_2$, in advance, and continuously (recursively) using the table as illustrated in the expression (4).

[Expression 3]

$$x=2\tan h^{-1}\{\tan h(v_1/2)\tan h(v_2/2)\}R(v_1,v_2) \tag{3}$$

[Expression 4]

$$u_j=R(v_1,R(v_2,R(v_3, \ldots R(v_{d_c-2},v_{d_c-1})) \tag{4}$$

In step S12, the variable k is further incremented by "1", and the processing proceeds to step S13. In step S13, whether or not the variable k is larger than a predetermined number of repetitive decoding times C is determined. In a case where the variable k is determined not to be larger than C in step S13, the processing returns to step S12 and hereinafter similar processing is repeated.

Furthermore, in a case where the variable k is determined to be larger than C in step S13, the processing proceeds to step S14, the operation illustrated in the expression (5) is performed to obtain the message $v_i$ as a decoding result to be finally output and the message $v_i$ is output, and the decoding processing for the LDPC code is terminated.

[Expression 5]

$$v_i = u_{0i} + \sum_{j=1}^{d_v-1} u_j \tag{5}$$

Here, the operation in the expression (5) is performed using messages $u_j$ from all the edges connected to the variable node, differently from the variable node operation in the expression (1).

FIG. 3 is a diagram illustrating an example of the parity check matrix H of a (3, 6) LDPC code (a coding rate of 1/2 and a code length of 12).

In the parity check matrix H in FIG. 3, as in FIG. 1, the column weight is 3 and the row weight is 6.

Figure 4:
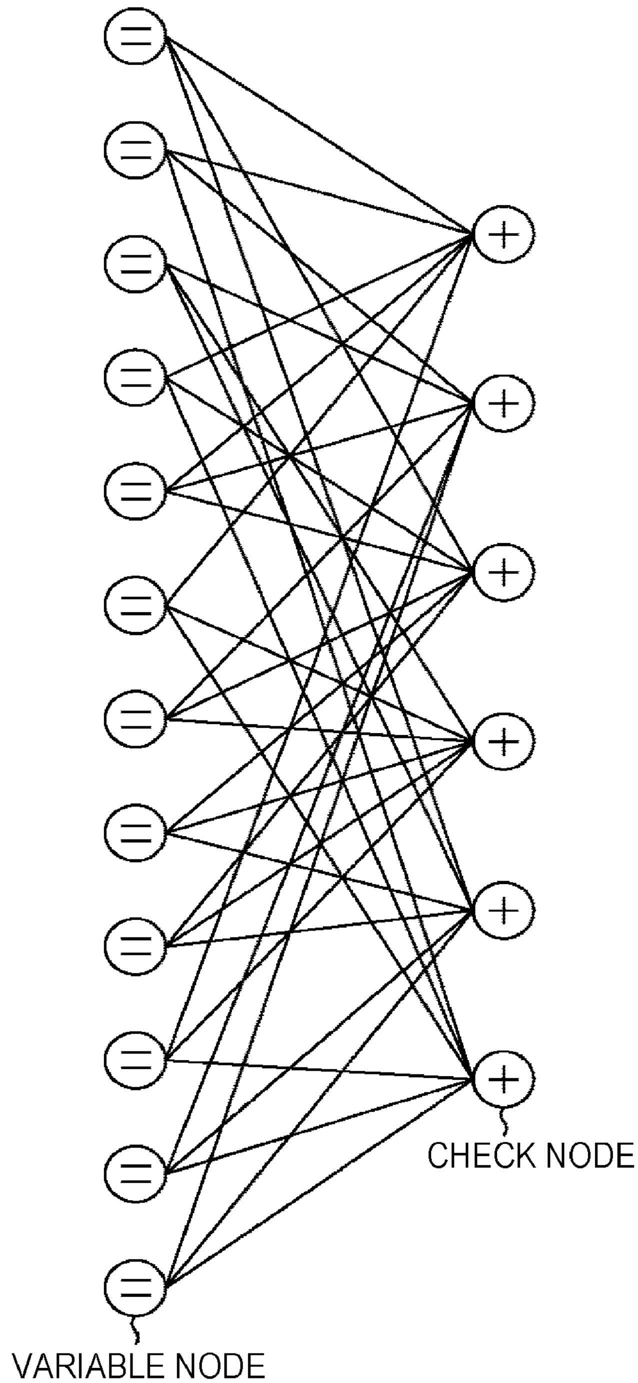
FIG. 4 is a diagram illustrating an example of a Tanner graph of the parity check matrix.

FIG. 4 is a diagram illustrating a Tanner graph of the parity check matrix H in FIG. 3.

Here, in FIG. 4, the check node is represented by plus "+", and the variable node is represented by equal "=". The check node and variable node correspond to a row and a column of the parity check matrix H, respectively. A connection between the check node and the variable node is an edge and corresponds to "1" of an element of the parity check matrix.

In other words, in a case where an element of the j-th row and the i-th column of the parity check matrix is 1, the i-th variable node from the top ("=" node) and the j-th check node from the top ("+" node) are connected by an edge in FIG. 4. The edge indicates that a code bit corresponding to the variable node has a constraint corresponding to the check node.

In a sum product algorithm that is a decoding method of an LDPC code, the variable node operation and the check node operation are repeatedly performed.

Figure 5:
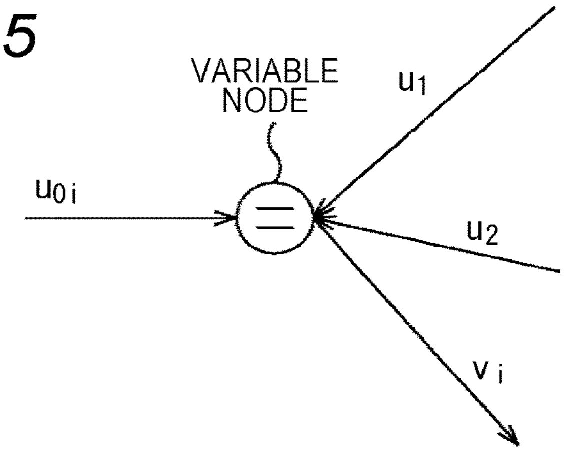
FIG. 5 is a diagram illustrating an example of a variable node.

FIG. 5 is a diagram illustrating the variable node operation performed in the variable node.

In the variable node, the message $v_i$ corresponding to the edge to be calculated is obtained by the variable node operation in the expression (1) using messages $u_1$ and $u_2$ from the remaining edges connected to the variable node and the received value $u_{0i}$. Messages corresponding to other edges are similarly obtained.

Figure 6:
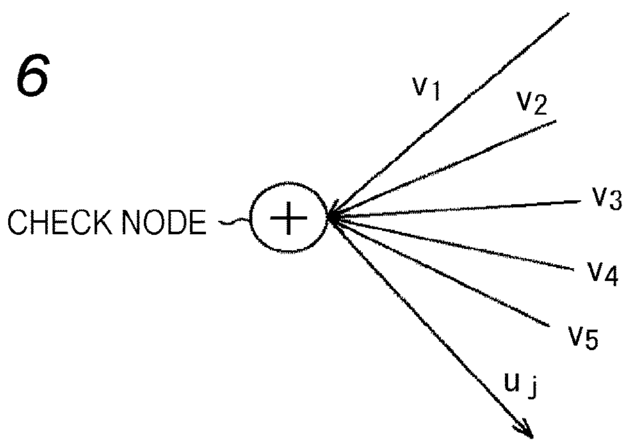
FIG. 6 is a diagram illustrating an example of a check node.

FIG. 6 is a diagram illustrating the check node operation performed in the check node.

Here, the check node operation in the expression (2) can be rewritten to the expression (6), using a relationship of an expression $a\times b=\exp\{\ln(|a|)+\ln(|b|)\}\times \text{sign}(a)\times \text{sign}(b)$. Note that sign (x) is 1 when $x\geq 0$ and $-1$ when $x<0$.

[Expression 6]

$$\begin{aligned} u_j = u_j &= 2\tanh^{-1}\left(\prod_{i=1}^{d_c-1}\tanh\left(\frac{v_i}{2}\right)\right) \\ &= 2\tanh^{-1}\left[\exp\left\{\sum_{i=1}^{d_c-1}\ln\left(\left|\tanh\left(\frac{v_i}{2}\right)\right|\right)\right\}\times\prod_{i=1}^{d_c-1}\text{sign}\left(\tanh\left(\frac{v_i}{2}\right)\right)\right] \\ &= 2\tanh^{-1}\left[\exp\left\{-\left(\sum_{i=1}^{d_c-1}-\ln\left(\tanh\left(\frac{|v_i|}{2}\right)\right)\right)\right\}\right]\times\prod_{i=1}^{d_c-1}\text{sign}(v_i) \end{aligned} \tag{6}$$

When the function $\varphi(x)$ is defined as an expression $\varphi(x)=\ln(\tan h(x/2))$ when $x\geq 0$, an expression $\varphi^{-1}(x)=2\tan h^{-1}(e^{-x})$ holds and thus the expression (6) can be deformed into the expression (7).

[Expression 7]

$$u_j = \phi^{-1}\left(\sum_{i=1}^{d_c-1}\phi(|v_i|)\right)\times\prod_{i=1}^{d_c-1}\text{sign}(v_i) \tag{7}$$

In the check node, the check node operation in the expression (2) is performed according to the expression (7).

In other words, in the check node, the message $u_j$ corresponding to the edge to be calculated is obtained by the check node operation in the expression (7) using messages $v_1$, $v_2$, $v_3$, $v_4$, and $v_5$ from the remaining edges connected to the check node, as illustrated in FIG. 6. Messages corresponding to other edges are similarly obtained.

Note that the function φ(x) in the expression (7) can be expressed by the expression $\varphi(x)=\ln((e^x+1)/(e^x-1))$, and $\varphi(x)=\varphi^{-1}(x)$ holds when x>0. When the functions φ(x) and $\varphi^{-1}$ (x) are implemented in hardware, the functions may be implemented using look up tables (LUTs), and the LUTs are the same.

<Configuration Example of Transmission System to Which Present Technology is Applied>

Figure 7:
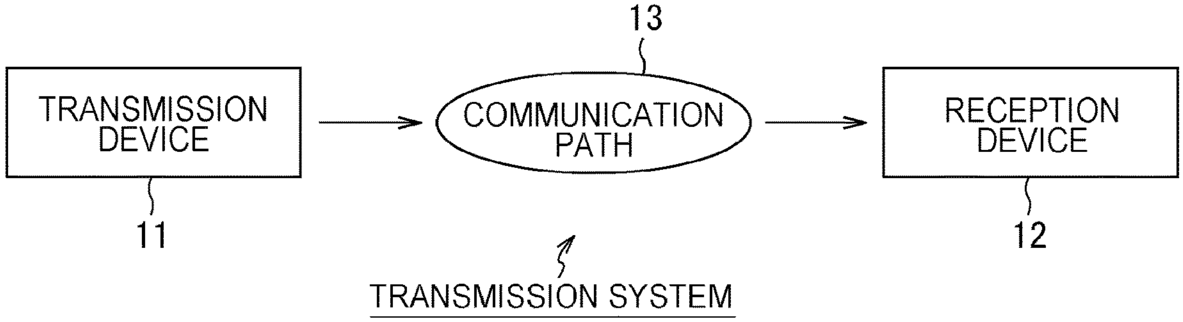
FIG. 7 is a diagram illustrating a configuration example of an embodiment of a transmission system to which the present technology is applied.

FIG. 7 is a diagram illustrating a configuration example of an embodiment of a transmission system (a system refers to a group of a plurality of logically gathered devices, and whether or not the devices of configurations are in the same casing is irrelevant) to which the present technology is applied.

The transmission system in FIG. 7 is configured by a transmission device 11 and a reception device 12.

The transmission device 11 performs transmission (broadcasting) of, for example, a television broadcast program or the like. In other words, the transmission device 11 encodes target data to be transmitted, such as image data and audio data as a program, into an LDPC code, for example, and transmits the LDPC code via a communication path 13 such as a satellite line, a ground wave, or a cable (wired line), for example.

The reception device 12 receives the LDPC code transmitted from the transmission device 11 via the communication path 13, decodes the LDPC code to the target data, and outputs the target data.

Here, it is known that the LDPC code used in the transmission system in FIG. 7 exhibits extremely high capability in an additive white Gaussian noise (AWGN) communication path.

Meanwhile, in the communication path 13, burst errors and erasures may occur. For example, in particular, in a case where the communication path 13 is a ground wave, power of a certain symbol becomes zero (erasure) in some cases according to a delay of an echo (a path other than a main path) in a multipath environment where a desired to undesired ratio (D/U) is 0 dB (power of undesired=echo is equal to power of desired=main path) in an orthogonal frequency division multiplexing (OFDM) system.

Furthermore, power of the entire symbols of OFDM at a specific time may become zero (erasure) due to a Doppler frequency in the case where D/U is 0 db even in a flutter (a communication path in which a delay is 0 and to which an echo with Doppler frequency is added).

Moreover, a burst error may occur due to a wiring condition from a receiving unit (not illustrated) on the reception device 12 side such as an antenna that receives a signal from the transmission device 11 to the reception device 12, or power supply instability of the reception device 12.

Meanwhile, in decoding the LDPC code, the variable node operation in the expression (1) with addition of (the received value $u_{0i}$ of) the code bit of the LDPC code is performed, as illustrated in FIG. 5, at a column of the parity check matrix H and thus at the variable node corresponding to the code bit of the LDPC code. Therefore, if an error occurs in the code bit used in the variable node operation, the accuracy of an obtained message decreases.

Then, in decoding the LDPC code, the check node operation in the expression (7) is performed in the check node using the messages obtained at the variable nodes connected to the check node. Therefore, if the number of check nodes in which (the code bits of the LDPC codes corresponding to) a plurality of connected variable nodes becomes error (including erasure) at the same time is large, the performance of the decoding deteriorates.

In other words, for example, if two or more of the variable nodes connected to the check node become erasures at the same time, the check node returns a message informing that a probability of a value being 0 and a probability of a value being 1 are equal to all the variable nodes. In this case, the check node returning the equal probability message will not contribute to one decoding processing (a set of the variable node operation and the check node operation). As a result, a large number of repetitions of the decoding processing is required, resulting in degradation of the performance of the decoding and an increase in the power consumption of the reception device 12 for decoding the LDPC code.

Therefore, in the transmission system in FIG. 7, improvement of resistance to burst errors and erasure is possible while maintaining the performance in the AWGN communication path (AWGN channel).

<Configuration Example of Transmission Device 11>

Figure 8:
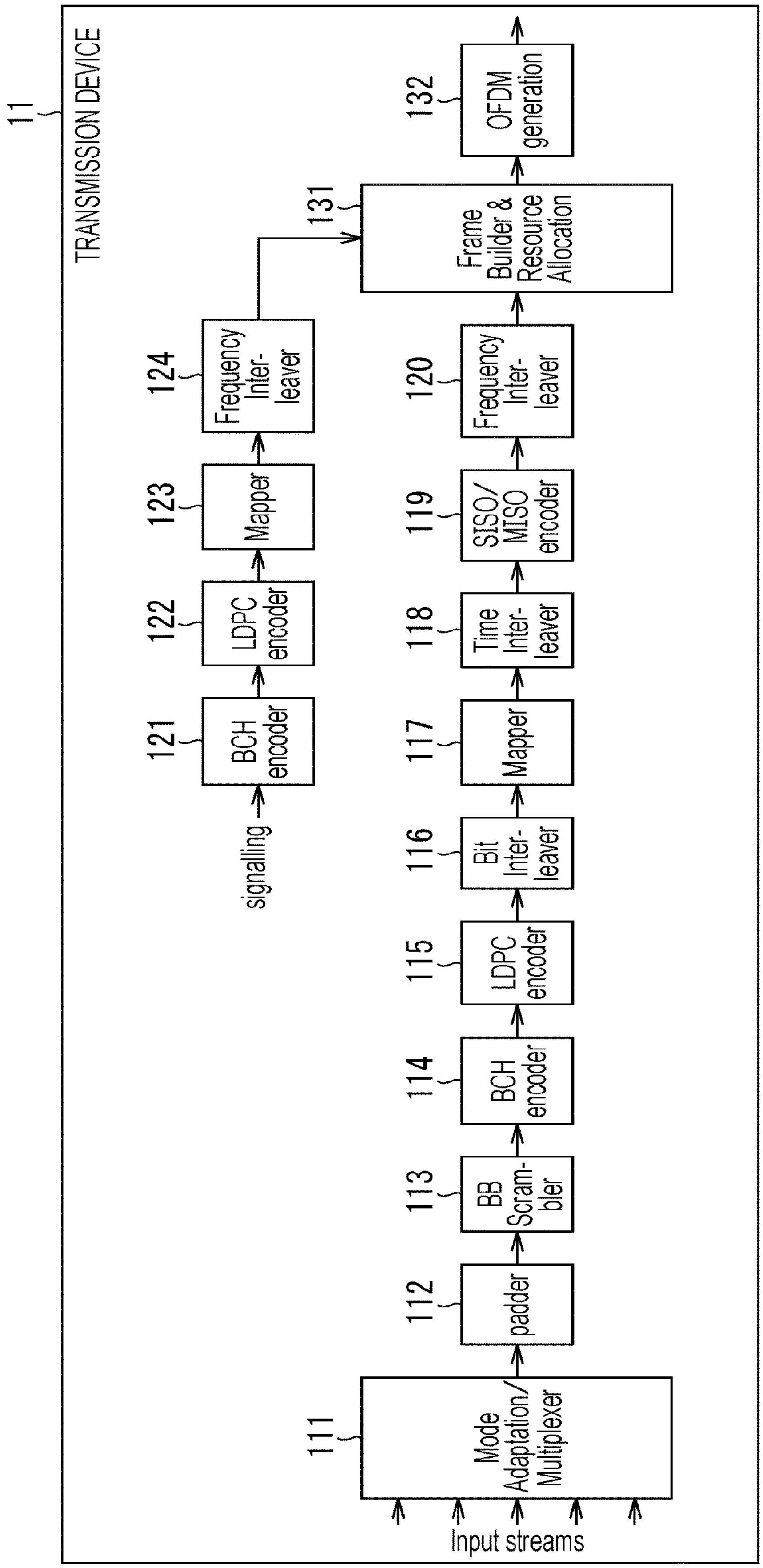
FIG. 8 is a block diagram illustrating a configuration example of a transmission device 11.

FIG. 8 is a block diagram illustrating a configuration example of the transmission device 11 in FIG. 7.

In the transmission device 11, one or more input streams as the target data is supplied to a mode adaptation/multiplexer 111.

The mode adaptation/multiplexer 111 performs processing such as mode selection and multiplexing of the one or more input streams supplied thereto as necessary, and supplies resulting data to a padder 112.

The padder 112 performs necessary zero padding (insertion of null) to the data from the mode adaptation/multiplexer 111, and supplies resulting data to a base band (BB) scrambler 113.

The BB scrambler 113 applies BB scramble to the data from the padder 112, and supplies resulting data to a BCH encoder 114.

The BCH encoder 114 performs BCH coding for the data from the BB scrambler 113, and supplies resulting data to an LDPC encoder 115 as LDPC target data to be LDPC encoded.

The LDPC encoder 115 performs, for the LDPC target data from the BCH encoder 114, LDPC coding according to a parity check matrix in which a parity matrix that is a portion corresponding to a parity bit of the LDPC code has a step (dual diagonal) structure, or the like, for example, and outputs an LDPC code with the LDPC target data as information bits.

In other words, the LDPC encoder 115 performs LDPC coding for coding the LDPC target data to an LDPC code (corresponding to the parity check matrix) defined in a predetermined standard such as DVB-S.2, DVB-T.2, DVB-C.2, or ATSC 3.0 or to another LDPC code, for example, and outputs a resulting LDPC code.

Here, the LDPC code defined in the standard of DVB-S.2 or ATSC 3.0 is an irregular repeat accumulate (IRA) code, and (a part or all of) the parity matrix in the parity check matrix of the LDPC code has a step structure. The parity matrix and the step structure will be described below. Furthermore, the IRA code is described in, for example, "Irregular Repeat-Accumulate Codes," H. Jin, A.

Khandekar, and R. J. McEliece, in Proceedings of 2nd International Symposium on Turbo codes and Related Topics, pp. 1-8, September 2000.

The LDPC code output by the LDPC encoder 115 is supplied to a bit interleaver 116.

The bit interleaver 116 performs bit interleaving described below for the LDPC code from the LDPC encoder 115, and supplies the LDPC code after the bit interleaving to a mapper (Mapper) 117.

The mapper 117 maps the LDPC code from the bit interleaver 116 to a signal point representing one symbol of quadrature modulation in units of code bits of one bit or more (in units of symbols) of the LDPC code and performs quadrature modulation (multiple value modulation).

In other words, the mapper 117 maps the LDPC code from the bit interleaver 116 into signal points determined by a modulation method for performing the quadrature modulation of an LDPC code, on a constellation that is an IQ plane defined with an I axis representing an I component in phase with a carrier and a Q axis representing a Q component orthogonal to the carrier, and performs the quadrature modulation.

In a case where the number of constellation signal points used in the modulation method of the quadrature modulation performed by the mapper 117 is $2^m$, the mapper 117 maps the LDPC code from the bit interleaver 116 into signal points representing symbols, of $2^m$ signal points, in units of symbols, where m-bit code bits of the LDPC code are a symbol (one symbol).

Here, examples of the modulation method of the quadrature modulation performed by the mapper 117 include the modulation method defined in the standard such as DVB-S.2 or ATSC 3.0, and other modulation methods, in other words, for example, binary phase shift keying (BPSK), quadrature phase shift keying (QPSK), phase-shift keying (8PSK), amplitude phase-shift keying (16APSK), 32APSK, quadrature amplitude modulation (16QAM), 16QAM, 64QAM, 256QAM, 1024QAM, 4096QAM, and pulse amplitude modulation (4PAM). Which modulation method of the quadrature modulation is used in the mapper 117 is set in advance according to an operation of an operator of the transmission device 11, or the like, for example.

Data obtained by the processing in the mapper 117 (the mapping result of mapped symbols at the signal points) is supplied to a time interleaver 118.

The time interleaver 118 performs time interleaving (interleaving in a time direction) in units of symbols, for the data from the mapper 117, and supplies resulting data to a single input single output/multiple input single output encoder (SISO/MISO encoder) 119.

The SISO/MISO encoder 119 applies space-time coding to the data from the time interleaver 118, and supplies the data to a frequency interleaver 120.

The frequency interleaver 120 performs frequency interleaving (interleaving in a frequency direction) in units of symbols, for the data from the SISO/MISO encoder 119, and supplies the data to a frame builder/resource allocation unit 131.

Meanwhile, control data (signalling) for transmission control such as base band (BB) signalling (BB header) is supplied to a BCH encoder 121, for example.

The BCH encoder 121 performs BCH coding for the control data supplied thereto, similarly to the BCH encoder 114, and supplies resulting data to an LDPC encoder 122.

The LDPC encoder 122 performs LDPC coding for the data from the BCH encoder 121 as LDPC target data, similarly to the LDPC encoder 115, and supplies a resulting LDPC code to a mapper 123.

The mapper 123 maps the LDPC code from the LDPC encoder 122 to a signal point representing one symbol of quadrature modulation in units of code bits of one bit or more (in units of symbols) of the LDPC code and performs quadrature modulation, similarly to the mapper 117, and supplies resulting data to a frequency interleaver 124.

The frequency interleaver 124 performs frequency interleaving in units of symbols, for the data from the mapper 123, similarly to the frequency interleaver 120, and supplies resulting data to a frame builder/resource allocation unit 131.

The frame builder/resource allocation unit 131 inserts pilot symbols into necessary positions of the data (symbols) from the frequency interleavers 120 and 124, and configures a frame by a predetermined number of symbols (for example, a physical layer (PL) frame, a T2 frame, a C2 frame, or the like) from resulting data (symbols), and supplies the frame to an OFDM generation unit 132.

The OFDM generation unit 132 generates an OFDM signal corresponding to the frame from the frame builder/resource allocation unit 131, and transmits the OFDM signal via the communication path 13 (FIG. 7).

Note that the transmission device 11 can be configured without including part of the blocks illustrated in FIG. 8, such as the time interleaver 118, the SISO/MISO encoder 119, the frequency interleaver 120, and the frequency interleaver 124, for example.

<Configuration Example of Bit Interleaver 116>

Figure 9:
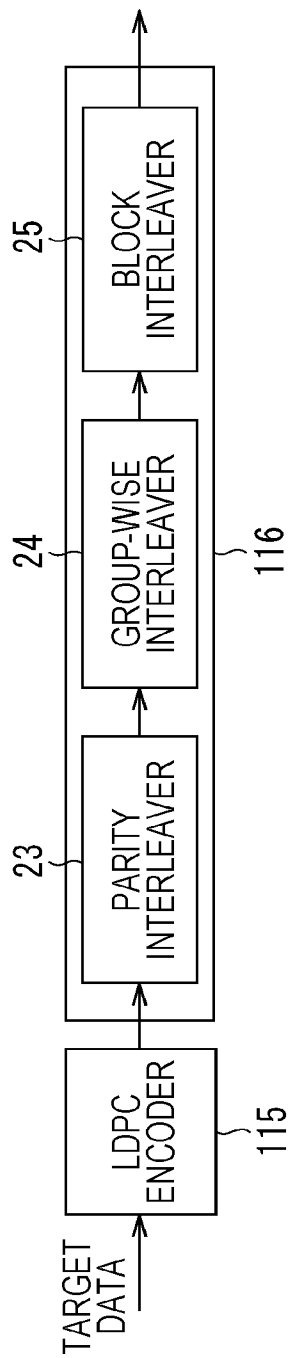
FIG. 9 is a block diagram illustrating a configuration example of a bit interleaver 116.

FIG. 9 is a block diagram illustrating a configuration example of the bit interleaver 116 in FIG. 8.

The bit interleaver 116 has a function to interleave data, and is configured by a parity interleaver 23, a group-wise interleaver 24, and a block interleaver 25.

The parity interleaver 23 performs parity interleaving to interleave the position of another parity bit with the parity bit of the LDPC code from the LDPC encoder 115, and supplies the LDPC code after the parity interleaving to the group-wise interleaver 24.

The group-wise interleaver 24 performs group-wise interleaving for the LDPC code from the parity interleaver 23, and supplies the LDPC code after the group-wise interleaving to the block interleaver 25.

Here, in the group-wise interleaving, the LDPC code from the parity interleaver 23 is interleaved in units of bit groups, where 360 bits of one section is set as a bit group, the one section being obtained by dividing the LDPC code of one code from the head of the LDPC code into sections in units of 360 bits, the unit being equal to a parallel factor P to be described below, and taking one of the divided sections as the one section.

In a case of performing the group-wise interleaving, an error rate can be improved as compared with a case of not performing the group-wise interleaving. As a result, favorable communication quality can be secured in data transmission.

For example, the block interleaver 25 performs block interleaving for demultiplexing the LDPC code from the group-wise interleaver 24 to symbolize the LDPC code of one code into an m-bit symbol that is a unit of mapping, and supplies the symbol to the mapper 117 (FIG. 8).

Here, in the block interleaving, for example, the LDPC code from the group-wise interleaver 24 is written in a column (vertical) direction and is read in a row (cross) direction with respect to a storage region in which columns as storage regions each storing a predetermined bit length in the column direction are arranged in the row direction by the number of bit length m of the symbol, whereby the LDPC code is symbolized into the m-bit symbol.

<Parity Check Matrix of LDPC Code>

Figure 10:
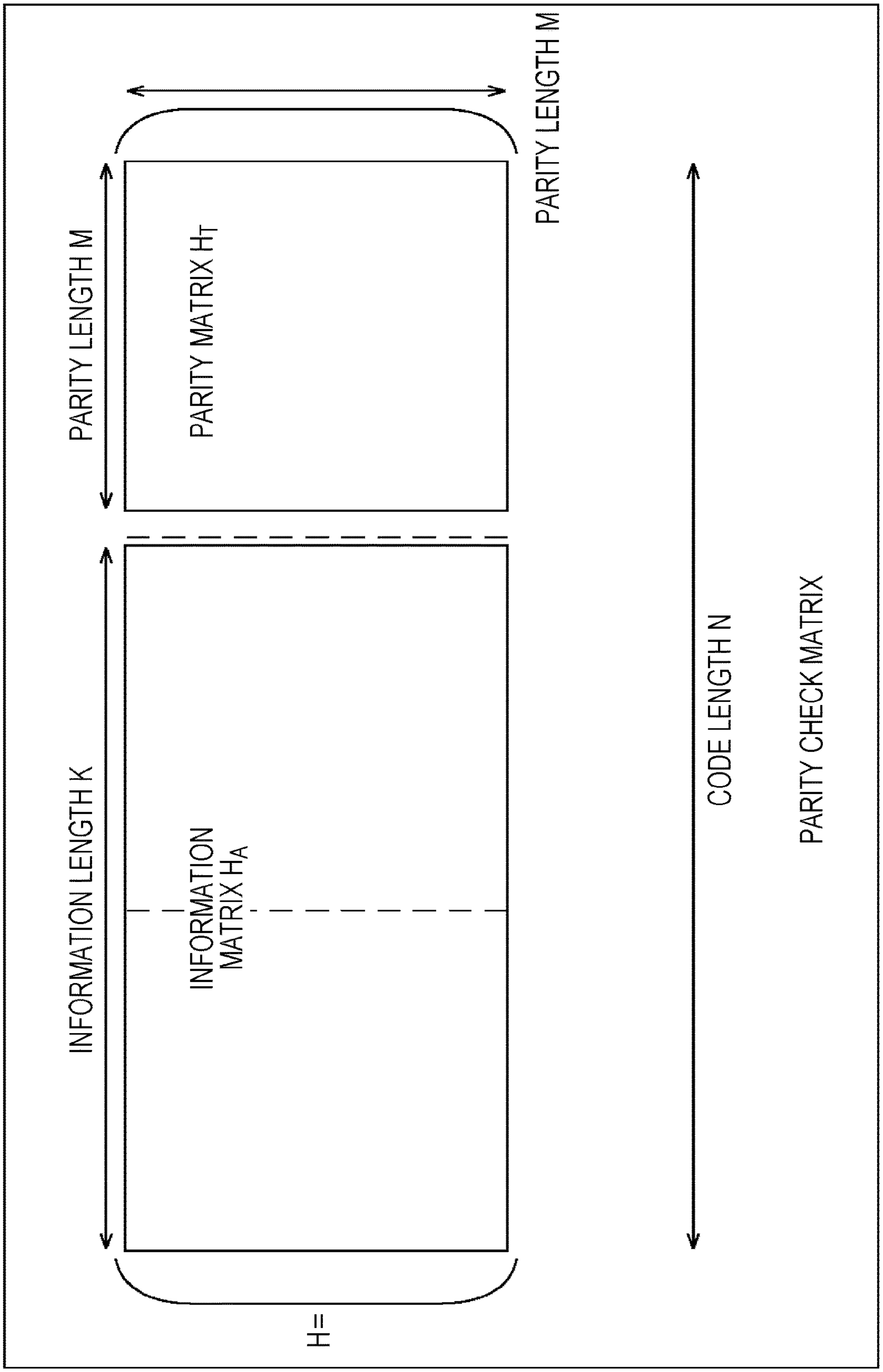
FIG. 10 is a diagram illustrating an example of a parity check matrix.

FIG. 10 is a diagram illustrating an example of the parity check matrix H used for LDPC coding in the LDPC encoder 115 in FIG. 8.

The parity check matrix H has a low-density generation matrix (LDGM) structure and can be expressed as an expression $H=[H_A|H_T]$ (elements of the information matrix $H_A$ are on the left side and elements of the parity matrix $H_T$ are on the right side) using an information matrix $H_A$ of a portion corresponding to the information bits and a parity matrix $H_T$ corresponding to the parity bits, of the code bits of the LDPC code.

Here, the bit length of the information bits and the bit length of the parity bits, of the code bits of the LDPC code of one code (one codeword), are respectively referred to as an information length K and a parity length M, and the bit length of the code bits of one (one codeword) LDPC code is referred to as code length N (=K+M).

The information length K and the parity length M of the LDPC code of a given code length N are determined by a coding rate. Furthermore, the parity check matrix H is a matrix of M×N in rows×columns (M-row N-column matrix). Then, the information matrix $H_A$ is an M×K matrix, and the parity matrix $H_T$ is an M×M matrix.

Figure 11:
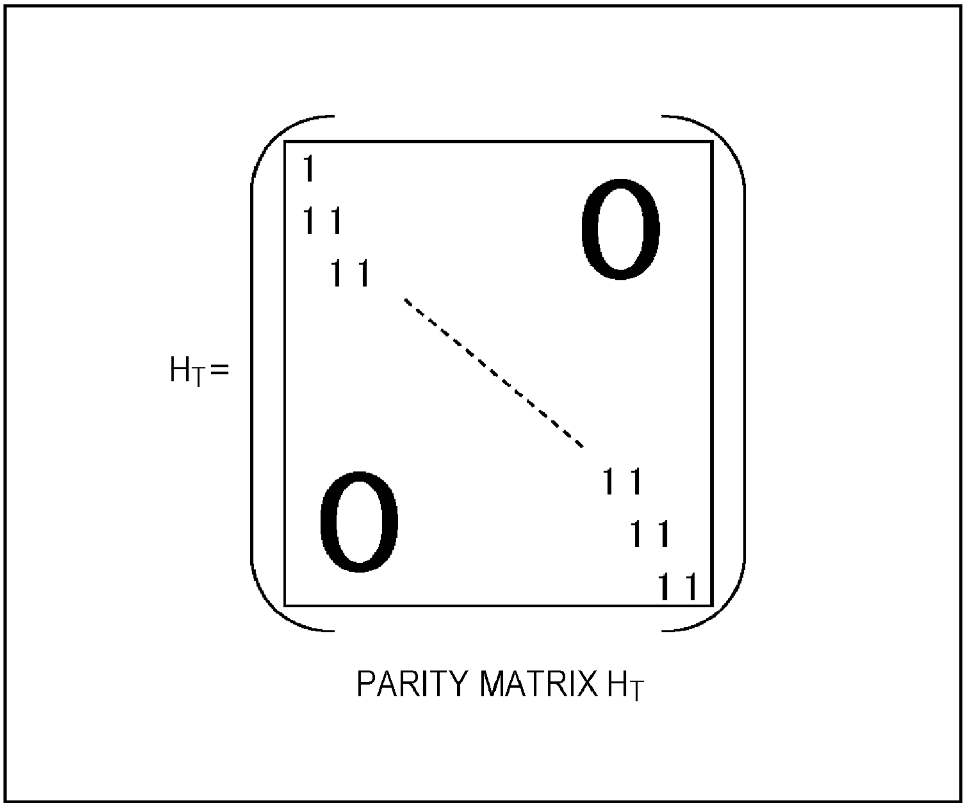
FIG. 11 is a diagram illustrating an example of a parity matrix.

FIG. 11 is a diagram illustrating an example of the parity matrix $H_T$ of the parity check matrix H used for LDPC coding in the LDPC encoder 115 in FIG. 8.

As the parity matrix $H_T$ of the parity check matrix H used for LDPC coding in the LDPC encoder 115, a parity matrix $H_T$ similar to the parity check matrix H of the LDPC code defined in the standard such as DVB-T.2 can be adopted, for example.

The parity matrix $H_T$ of the parity check matrix H of the LDPC code defined in the standard such as DVB-T.2 is a matrix having a step structure (lower bidiagonal matrix) in which elements of 1 are arranged in a step-like manner, as illustrated in FIG. 11. The row weight of the parity matrix $H_T$ is 1 in the 1st row and 2 in all the remaining rows. Furthermore, the column weight is 1 in the last one column and 2 in all the remaining columns.

As described above, the LDPC code of the parity check matrix H in which the parity matrix $H_T$ has the step structure can be easily generated using the parity check matrix H.

In other words, the LDPC code (one codeword) is expressed with a row vector c, and a column vector obtained by transposing the row vector thereof is represented as $c^T$. Furthermore, a portion of the information bits, of the row vector c that is the LDPC code, is expressed with a row vector A, and a portion of the parity bits, of the row vector c, is expressed with a row vector T.

In this case, the row vector c can be expressed as an expression c=[A|T] (elements of the row vector A are on the left side and elements of the row vector T are on the right side) using the row vector A as the information bits and the row vector T as the parity bits.

The parity check matrix H and the row vector c=[A|T] as the LDPC code need to satisfy an expression $Hc^T=0$, and the row vector T as the parity bits constituting the row vector c=[A|T] satisfying the expression $Hc^T=0$ can be sequentially obtained (in order) by sequentially setting the element of each row to 0 from the element in the 1st row of the column vector $Hc^T$ in the expression $Hc^T=0$ in a case where the parity matrix $H_T$ of the parity check matrix $H=[H_A|H_T]$ has the step structure illustrated in FIG. 11.

Figure 12:
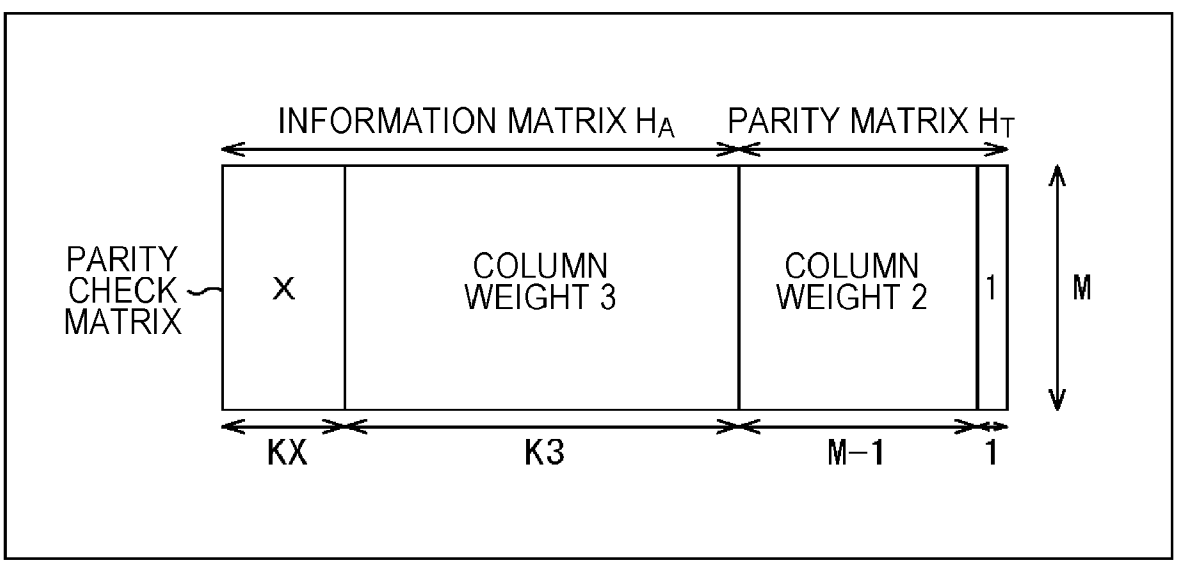
FIG. 12 is a diagram for describing a parity check matrix of an LDPC code defined in the standard of DVB-T.2.

FIG. 12 is a diagram for describing the parity check matrix H of the LDPC code defined in the standard such as DVB-T.2.

In the parity check matrix H of the LDPC code defined in the standard such as DVB-T.2, the column weight is X in KX columns from the 1st column, 3 in following K3 columns, 2 in following M−1 columns, and 1 in the last one column.

Here, KX+K3+M−1+1 is equal to the code length N.

FIG. 13 is a diagram illustrating the numbers of columns KX, K3, and M, and the column weight X for each coding rate r of the LDPC code defined in the standard such as DVB-T.2.

In the standard such as DVB-T.2, LDPC codes having code lengths N of 64800 bits and 16200 bits are defined.

Then, eleven coding rates (nominal rates) of 1/4, 1/3, 2/5, 1/2, 3/5, 2/3, 3/4, 4/5, 5/6, 8/9, and 9/10 are defined for the LDPC code with the code length N of 64800 bits. Ten coding rates of 1/4, 1/3, 2/5, 1/2, 3/5, 2/3, 3/4, 4/5, 5/6, and 8/9 are defined for the LDPC code with the code length N of 16200 bits.

Here, the code length N of 64800 bits is also referred to as 64 k bits and the code length N of 16200 bits is also referred to as 16 k bits.

In regard to the LDPC code, code bits corresponding to a column having a larger column weight of the parity check matrix H tend to have a lower error rate.

In the parity check matrix H defined in the standard such as DVB-T.2 illustrated in FIGS. 12 and 13, the column weight tends to be larger in columns on the head side (left side), and therefore the code bits on the head side are more resistant to errors and end code bits are more susceptible to errors in the LDPC code corresponding to the parity check matrix H.

<Parity Interleaving>

The parity interleaving by the parity interleaver 23 in FIG. 9 will be described with reference to FIGS. 14 to 16.

Figure 14:
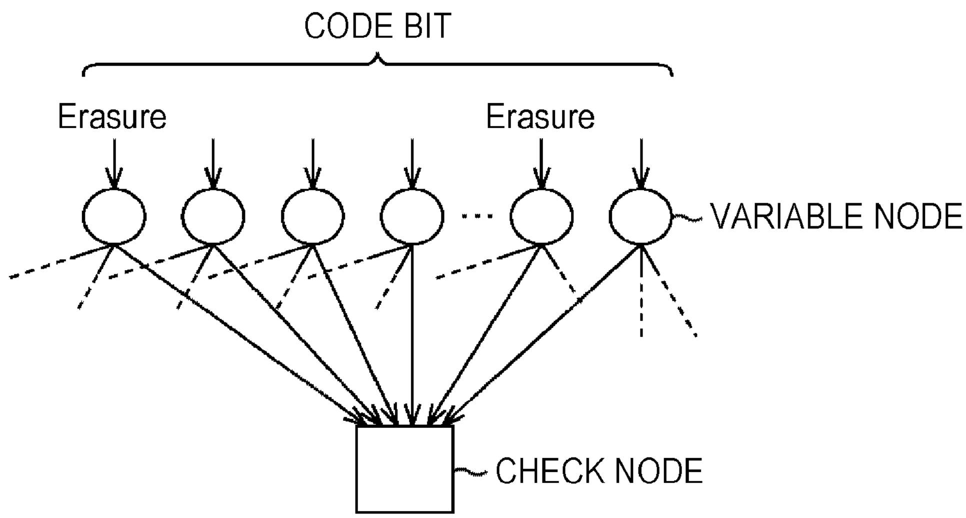
FIG. 14 is a diagram illustrating an example of a Tanner graph regarding decoding of an LDPC code.

FIG. 14 is a diagram illustrating an example of (a part of) a Tanner graph of the parity check matrix of the LDPC code.

As illustrated in FIG. 14, when two or more of (the code bits corresponding to) the variable nodes connected to the check node become errors such as erasures at the same time, the check node returns a message informing that a probability of a value being 0 and a probability of a value being 1 are equal to all the variable nodes connected to the check node. Therefore, if a plurality of variable nodes connected to the same check node becomes erasures or the like at the same time, the performance of the decoding will deteriorate.

By the way, the LDPC code output from the LDPC encoder 115 in FIG. 8 is an IRA code, similarly to the LDPC code defined in the standard such as DVB-T.2, for example, and the parity matrix $H_T$ of the parity check matrix H has a step structure, as illustrated in FIG. 11.

FIG. 15 is a diagram illustrating examples of the parity matrix $H_T$ having the step structure, as illustrated in FIG. 11, and a Tanner graph corresponding to the parity matrix $H_T$.

A in FIG. 15 illustrates an example of the parity matrix $H_T$ having a step structure, and B in FIG. 15 illustrate a Tanner graph corresponding to the parity matrix $H_T$ in A in FIG. 15.

In the parity matrix $H_T$ having a step structure, elements of 1 are adjacent (except the 1st row) in rows. Therefore, in the Tanner graph of the parity matrix $H_T$, two adjacent variable nodes corresponding to columns of the two adjacent elements where values of the parity matrix $H_T$ are 1 are connected to the same check node.

Therefore, when the parity bits corresponding to the above two adjacent variable nodes become errors at the same time due to burst errors, erasures, or the like, the check node connected to the two variable nodes corresponding to the two error parity bits (variable nodes seeking a message using the parity bits) returns the message informing that a probability of a value being 0 and a probability of a value being 1 are equal to the variable nodes connected to the check node. Therefore, the performance of the decoding deteriorates. Then, when a burst length (the bit length of the parity bits which becomes an error in succession) becomes large, the number of check nodes returning the message of equal probability increases, and the performance of the decoding further deteriorates.

Therefore, the parity interleaver 23 (FIG. 9) performs parity interleaving to interleave the positions of other parity bits with the parity bits of the LDPC code from the LDPC encoder 115 in order to prevent degradation of the performance of the decoding.

Figure 16:
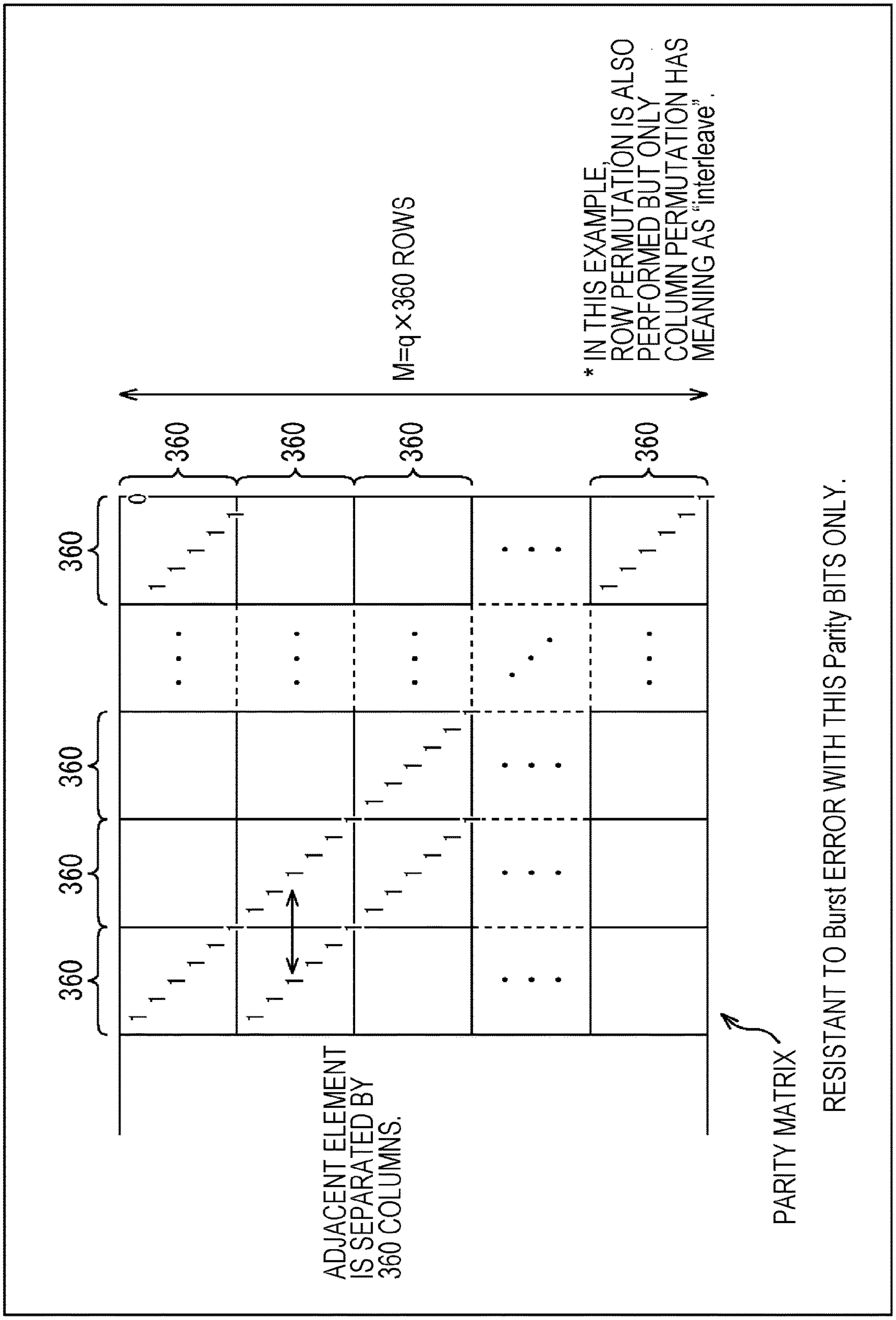
FIG. 16 is a diagram illustrating the parity matrix $H_T$ of the parity check matrix H corresponding to the LDPC code after parity interleaving.

FIG. 16 is a diagram illustrating the parity matrix $H_T$ of the parity check matrix H corresponding to the LDPC code after the parity interleaving performed by the parity interleaver 23 in FIG. 9.

Here, the information matrix $H_A$ of the parity check matrix H corresponding to the LDPC code output by the LDPC encoder 115 has a cyclic structure, similarly to the information matrix of the parity check matrix H corresponding to the LDPC code defined in the standard such as DVB-T.2.

The cyclic structure is a structure in which a certain column matches a cyclically shifted another column, and includes, for example, a structure in which, for each P columns, positions of 1 of rows of the P columns become positions cyclically shifted in the column direction by a predetermined value such as a value proportional to a value q obtained by dividing the first column of the P columns by the parity length M. Hereinafter, the P columns in the cyclic structure are referred to as a parallel factor, as appropriate.

As the LDPC code defined in the standard such as DVB-T.2, there are two types of LDPC codes with the code lengths N of 64800 bits and 16200 bits as described in FIGS. 12 and 13. For both the two types of LDPC codes, the parallel factor P is defined as 360, which is one of divisors of the parity length M except 1 and M.

Furthermore, the parity length M is a value other than a prime number represented by an expression $M=q\times P=q\times 360$, using a value q that varies depending on the coding rate. Therefore, similarly to the parallel factor P, the value q is also another one of the divisors of the parity length M except 1 and M, and is obtained by dividing the parity length M by the parallel factor P (a product of P and q, which are the divisors of the parity length M, becomes the parity length M).

As described above, the parity interleaver 23 interleaves the position of (K+Py+x+1)th code bit with (K+qx+y+1)th code bit of code bits of an N-bit LDPC code, as the parity interleaving, where the information length is K, an integer from 0 to P, exclusive of P, is x, and an integer from 0 to q, exclusive of q, is y.

Since both the (K+qx+y+1)th code bit and the (K+Py+x+1)th code bit are subsequent code bits of (K+1)th code bit and thus are parity bits, the positions of the parity bits of the LDPC code are moved according to the parity interleaving.

According to such parity interleaving, (the parity bits corresponding to) the variable nodes connected to the same check node are separated by the parallel factor P, in other words, 360 bits. Therefore, in a case where the burst length is less than 360 bits, a situation where a plurality of variable nodes connected to the same check node becomes error at the same time can be avoided, and as a result, the resistance to the burst errors can be improved.

Note that the LDPC code after the parity interleaving to interleave the position of the (K+Py+x+1)th code bit with the (K+qx+y+1)th code bit matches the LDPC code of the parity check matrix (hereinafter also referred to as a transformed parity check matrix) that is obtained by performing column permutation to permutate the (K+qx+y+1)th column of the original parity check matrix H with the (K+Py+x+1)th column.

Furthermore, a pseudo cyclic structure having P columns (360 columns in FIG. 16) as a unit appears in the parity matrix of the transformed parity check matrix, as illustrated in FIG. 16.

Here, the pseudo cyclic structure means a structure having a cyclic structure excluding a part.

A transformed parity check matrix obtained by applying column permutation corresponding to the parity interleaving to the parity check matrix of the LDPC code defined in the standard such as DVB-T.2 lacks one element of 1 (has an element of 0) in a portion (a shift matrix to be described below) of 360 rows×360 columns in an upper right corner portion of the transformed parity check matrix, and thus has a so-called pseudo cyclic structure, rather than a (complete) cyclic structure on that regard.

A transformed parity check matrix for the parity check matrix of the LDPC code output by the LDPC encoder 115 has a pseudo cyclic structure, similarly to the transformed parity check matrix for the parity check matrix of the LDPC code defined in the standard such as DVB-T.2, for example.

Note that the transformed parity check matrix in FIG. 16 is a matrix obtained by applying the column permutation corresponding to the parity interleaving to the original parity check matrix H, and applying permutation for rows (row permutation) so as to configure the transformed parity check with configuration matrices to be described below.

Figure 17:
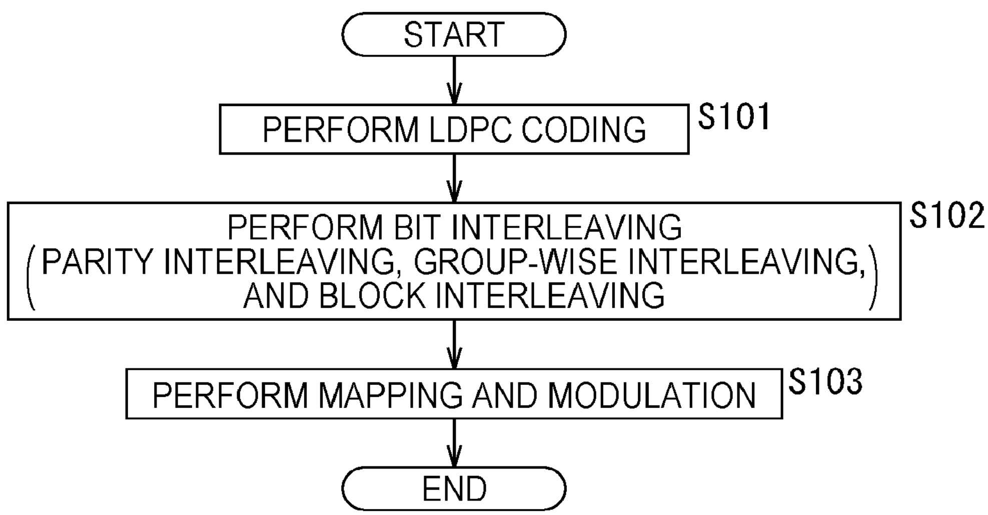
FIG. 17 is a flowchart for describing processing performed by a bit interleaver 116 and a mapper 117.

FIG. 17 is a flowchart for describing processing performed by the LDPC encoder 115, the bit interleaver 116, and the mapper 117 in FIG. 8.

The LDPC encoder 115 waits for supply of the LDPC target data from the BCH encoder 114. In step S101, the LDPC encoder 115 encodes the LDPC target data into the LDPC code, and supplies the LDPC code to the bit interleaver 116. The processing proceeds to step S102.

In step S102, the bit interleaver 116 performs the bit interleaving for the LDPC code from the LDPC encoder 115, and supplies the symbol obtained by the bit interleaving to the mapper 117. The processing proceeds to step S103.

In other words, in step S102, in the bit interleaver 116 (FIG. 9), the parity interleaver 23 performs the parity interleaving for the LDPC code from the LDPC encoder 115, and supplies the LDPC code after the parity interleaving to the group-wise interleaver 24.

The group-wise interleaver 24 performs the group-wise interleaving for the LDPC code from the parity interleaver 23, and supplies the LDPC code to the block interleaver 25.

The block interleaver 25 performs the block interleaving for the LDPC code after the group-wise interleaving by the group-wise interleaver 24, and supplies a resulting m-bit symbol to the mapper 117.

In step S103, the mapper 117 maps the symbol from the block interleaver 25 to any of $2^m$ signal points determined by the modulation method of the quadrature modulation performed by the mapper 117 and performs the quadrature modulation, and supplies resulting data to the time interleaver 118.

As described above, by performing the parity interleaving and the group-wise interleaving, the error rate of the case where a plurality of code bits of the LDPC code is transmitted as one symbol can be improved.

Here, in FIG. 9, for convenience of description, the parity interleaver 23 as a block for performing the parity interleaving and the group-wise interleaver 24 as a block for performing the group-wise interleaving are separately configured. However, the parity interleaver 23 and the group-wise interleaver 24 can be integrally configured.

In other words, both the parity interleaving and the group-wise interleaving can be performed by writing and reading code bits with respect to a memory, and can be expressed by a matrix for converting an address for writing code bits (write address) into an address for reading code bits (read address).

Therefore, by obtaining a matrix obtained by multiplying a matrix expressing the parity interleaving and a matrix expressing the group-wise interleaving, the parity interleaving is performed by converting code bits by these matrices, and further the group-wise interleaving is performed for the LDPC code after the parity interleaving, whereby a result can be obtained.

Furthermore, the block interleaver 25 can also be integrally configured in addition to the parity interleaver 23 and the group-wise interleaver 24

In other words, the block interleaving performed by the block interleaver 25 can also be expressed by the matrix converting the write address of the memory for storing the LDPC code into the read address.

Therefore, by obtaining a matrix obtained by multiplying the matrix expressing the parity interleaving, the matrix expressing the group-wise interleaving, and the matrix expressing the block interleaving, the parity interleaving, the group-wise interleaving, and the block interleaving can be collectively performed by the matrices.

Note that one or the amount of the parity interleaving and the group-wise interleaving may not be performed.

<Configuration Example of LDPC Encoder 115>

Figure 18:
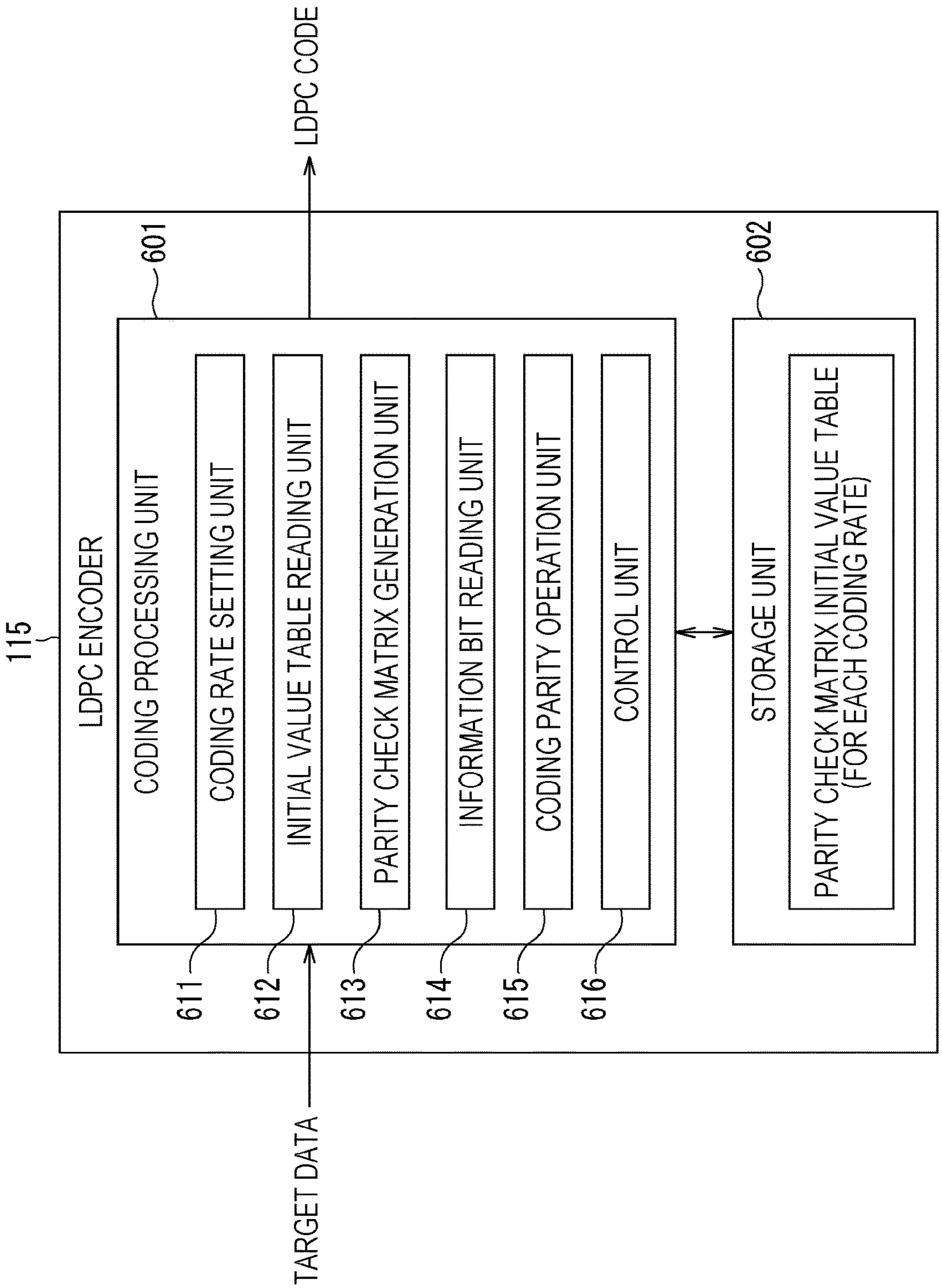
FIG. 18 is a block diagram illustrating a configuration example of an LDPC encoder 115.

FIG. 18 is a block diagram illustrating a configuration example of the LDPC encoder 115 in FIG. 8.

Note that the LDPC encoder 122 in FIG. 8 is similarly configured.

As described in FIGS. 12 and 13, in the standard such as DVB-T.2, LDPC codes having two types of code lengths N of 64800 bits and 16200 bits are defined.

Then, the eleven coding rates of 1/4, 1/3, 2/5, 1/2, 3/5, 2/3, 3/4, 4/5, 5/6, 8/9, and 9/10 are defined for the LDPC code with the code length N of 64800 bits. The ten coding rates of 1/4, 1/3, 2/5, 1/2, 3/5, 2/3, 3/4, 4/5, 5/6, and 8/9 are defined for the LDPC code with the code length N of 16200 bits (FIGS. 12 and 13).

The LDPC encoder 115 can perform, for example, such coding (error correction coding) with the LDPC codes with the coding rates of the code lengths N of 64800 bits and 16200 bits according to the parity check matrix H prepared for each code length N and each coding rate.

Besides, the LDPC encoder 115 can perform LDPC coding according to the parity check matrix H of the LDPC code with an arbitrary code length N and an arbitrary coding rate r.

The LDPC encoder 115 is configured by a coding processing unit 601 and a storage unit 602.

The coding processing unit 601 is configured by a coding rate setting unit 611, an initial value table reading unit 612, a parity check matrix generation unit 613, an information bit reading unit 614, a coding parity operation unit 615, and a control unit 616. The coding processing unit 601 performs the LDPC coding for the LDPC target data supplied to the LDPC encoder 115, and supplies a resulting LDPC code to the bit interleaver 116 (FIG. 8).

In other words, the coding rate setting unit 611 sets the code length N and the coding rate r of the LDPC code, and in addition, specific information specifying the LDPC code, according to the operation of the operator or the like, for example.

The initial value table reading unit 612 reads, from the storage unit 602, a parity check matrix initial value table to be described below, expressing the parity check matrix of the LDPC code specified with the specific information set by the coding rate setting unit 611.

The parity check matrix generation unit 613 generates the parity check matrix H on the basis of the parity check matrix initial value table read by the initial value table reading unit 612, and stores the parity check matrix H in the storage unit 602. For example, the parity check matrix generation unit 613 arranges the elements of 1 of the information matrix $H_A$ corresponding to the information length K (=the code length N−the parity length M) according to the code length N and the coding rate r set by the coding rate setting unit 611 with a period of every 360 columns (parallel factor P) in the column direction to generate the parity check matrix H, and stores the parity check matrix H in the storage unit 602.

The information bit reading unit 614 reads (extracts) the information bits of the information length K from the LDPC target data supplied to the LDPC encoder 115.

The coding parity operation unit 615 reads the parity check matrix H generated by the parity check matrix generation unit 613 from the storage unit 602, and calculates the parity bits for the information bits read by the information bit reading unit 614 on the basis of a predetermined expression using the parity check matrix H, thereby generating the codeword (LDPC code).

The control unit 616 controls the blocks constituting the coding processing unit 601.

The storage unit 602 stores a plurality of parity check matrix initial value tables and the like respectively corresponding to the plurality of coding rates and the like illustrated in FIGS. 12 and 13 for the code lengths N of 64800 bits and 16200 bits, and the like, for example. Furthermore, the storage unit 602 temporarily stores data necessary for the processing of the coding processing unit 601.

Figures 19, 20:
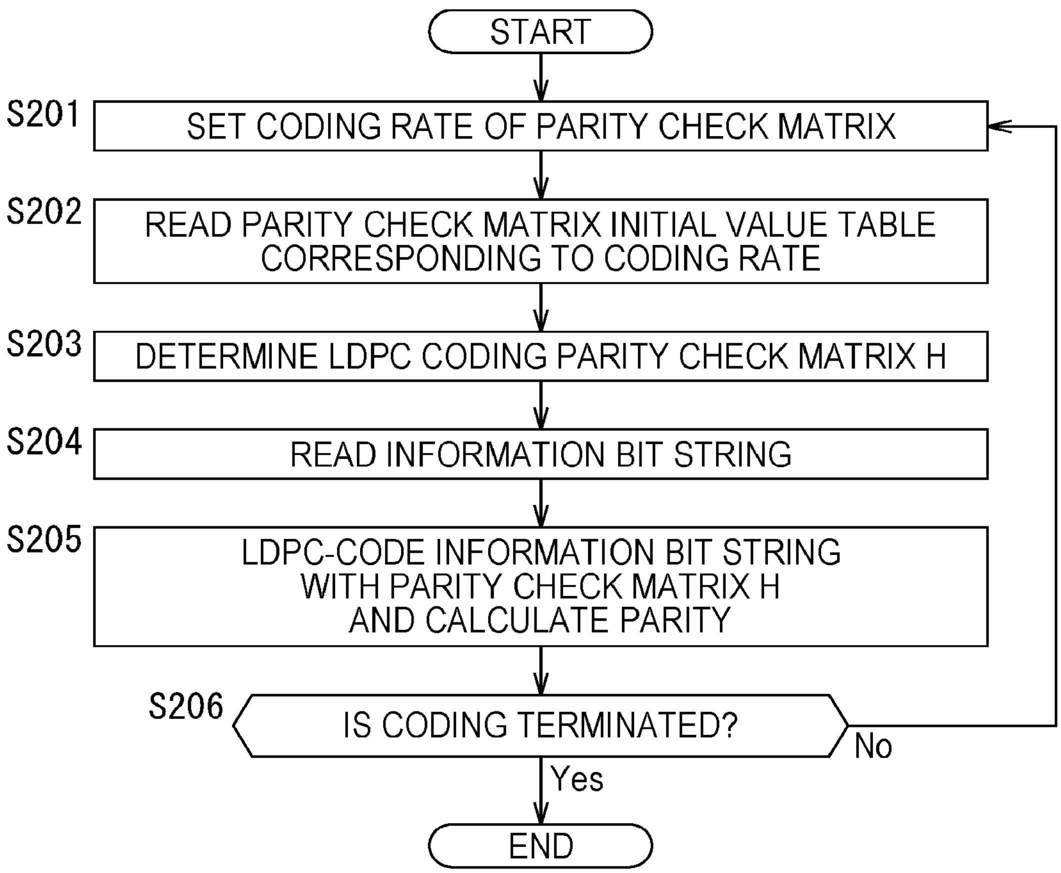
FIG. 19 is a flowchart for describing an example of processing of the LDPC encoder 115.
FIG. 20 is a diagram illustrating an example of a parity check matrix initial value table with a coding rate of 1/4 and a code length of 16200.

FIG. 19 is a flowchart for describing an example of the processing of the LDPC encoder 115 in FIG. 18.

In step S201, the coding rate setting unit 611 sets the code length N and the coding rate r for performing the LDPC coding, and in addition, the specific information specifying another LDPC code.

In step S202, the initial value table reading unit 612 reads, from the storage unit 602, the predetermined parity check matrix initial value table specified with the code length N, the coding rate r, and the like as the specific information set by the coding rate setting unit 611.

In step S203, the parity check matrix generation unit 613 obtains (generates) the parity check matrix H of the LDPC code with the code length N and the coding rate r set by the coding rate setting unit 611, using the parity check matrix initial value table read from the storage unit 602 by the initial value table reading unit 612, and supplies and stores the parity check matrix H in the storage unit 602.

In step S204, the information bit reading unit 614 reads the information bits of the information length K (=N×r) corresponding to the code length N and the coding rate r set by the coding rate setting unit 611 from the LDPC target data supplied to the LDPC encoder 115, and reads the parity check matrix H obtained by the parity check matrix generation unit 613 from the storage unit 602, and supplies the information bits and the parity check matrix H to the coding parity operation unit 615.

In step S205, the coding parity operation unit 615 sequentially operates the parity bit of the codeword c that satisfies the expression (8), using the information bits and the parity check matrix H from the information bit reading unit 614.

$$Hc^T=0 \quad (8)$$

In the expression (8), c represents the row vector as the codeword (LDPC code), and $c^T$ represents transposition of the row vector c.

Here, as described above, in the case of expressing the portion of the information bits, of the row vector c as the LDPC code (one codeword), with the row vector A, and the portion of the parity bits, of the row vector c, with the row vector T, the row vector c can be expressed as the expression c=[A|T] using the row vector A as the information bits and the row vector T as the parity bits.

The parity check matrix H and the row vector c=[A|T] as the LDPC code need to satisfy the expression $Hc^T=0$, and the row vector T as the parity bits constituting the row vector c=[A|T] satisfying the expression $Hc^T=0$ can be sequentially obtained by sequentially setting the element of each row to 0 from the element in the 1st row of the column vector $Hc^T$ in the expression $Hc^T=0$ in the case where the parity matrix $H_T$ of the parity check matrix $H=[H_A|H_T]$ has the step structure illustrated in FIG. 11.

The coding parity operation unit 615 obtains the parity bits T for the information bits A from the information bit reading unit 614, and outputs the codeword c=[A|T] expressed with the information bits A and the parity bits T as an LDPC coding result of the information bits A.

Thereafter, in step S206, the control unit 616 determines whether or not to terminate the LDPC coding. In a case where it is determined in step S206 that the LDPC coding is not terminated, in other words, in a case where there is still LDPC target data to be LDPC-encoded, for example, the processing returns to step S201 (or step S204), and hereinafter the processing from step S201 (or step S204) to step S206 is repeated.

Furthermore, in a case where it is determined in step S206 that the LDPC coding is terminated, in other words, for example, in a case where there is no LDPC target data to be LDPC-encoded, the LDPC encoder 115 terminates the processing.

In regard to the LDPC encoder 115, the parity check matrix initial value table (expressing the parity check matrix) of the LDPC codes of various code lengths N and coding rates r can be prepared in advance. The LDPC encoder 115 can perform the LDPC coding for the LDPC codes of various code lengths N and coding rates r, using the parity check matrix H generated from the parity check matrix initial value table prepared in advance.

<Example of Parity Check Matrix Initial Value Table>

The parity check matrix initial value table is, for example, a table representing the positions of the elements of 1 of the information matrix $H_A$ (FIG. 10) corresponding to the information length K according to the code length N and the coding rate r of the LDPC code (the LDPC code defined by the parity check matrix H) of the parity check matrix H in every 360 columns (parallel factor P), and is created in advance for each parity check matrix H of each code length N and each coding rate r.

In other words, the parity check matrix initial value table represents at least the positions of the elements of 1 of the information matrix $H_A$ in every 360 columns (parallel factor P).

Furthermore, as the parity check matrix H, there are a parity check matrix in which the entire parity matrix $H_T$ has a step structure, and a parity check matrix in which a part of the parity matrix $H_T$ has a step structure and the remaining part is a diagonal matrix (identity matrix).

Hereinafter, an expression method for the parity check matrix initial value table representing the parity check matrix in which a part of the parity matrix $H_T$ has a step structure and the remaining part is a diagonal matrix is also referred to as type A method. Furthermore, an expression method for the parity check matrix initial value table representing the parity check matrix in which the entire parity matrix $H_T$ has a step structure is also referred to as type B method.

Furthermore, the LDPC code for the parity check matrix represented by the parity check matrix initial value table by the type A method is also referred to as type A code, and the LDPC code for the parity check matrix represented by the parity check matrix initial value table by the type B method is also referred to as type B code.

The designations of "type A" and "type B" are designations in accordance with the standard of ATSC 3.0. For example, in ATSC 3.0, both the type A code and type B code are adopted.

Note that, in DVB-T.2 and the like, the type B code is adopted.

FIG. 20 is a diagram illustrating an example of the parity check matrix initial value table by the type B method.

In other words, FIG. 20 illustrates the parity check matrix initial value table (representing the parity check matrix H) of the type B code with the code length N of 16200 bits and the coding rate (coding rate on the notation of DVB-T.2) r of 1/4 defined in the standard of DVB-T.2.

The parity check matrix generation unit 613 (FIG. 18) obtains the parity check matrix H as follows using the parity check matrix initial value table by the type B method.

FIG. 21 is a diagram for describing a method of obtaining the parity check matrix H from the parity check matrix initial value table by the type B method.

In other words, FIG. 21 illustrates the parity check matrix initial value table of the type B code with the code length N of 16200 bits and the coding rate r of 2/3 defined in the standard of DVB-T.2.

The parity check matrix initial value table by the type B method is a table representing the positions of the elements of 1 of the entire information matrix $H_A$ corresponding to the information length K according to the code length N and the coding rate r of the LDPC code in every 360 columns (parallel factor P). In the i-th row, row numbers of the elements of 1 of the (1+360×(i−1))th column of the parity check matrix H (row numbers of when the row number of the 1st row of the parity check matrix H is counted as 0) are arranged by the number of the column weights of the (1+360×(i−1))th column.

Here, since the parity matrix $H_T$ (FIG. 10) corresponding to the parity length M of the parity check matrix H by the type B method has the step structure as illustrated in FIG. 15, the parity check matrix H can be obtained if the information matrix $H_A$ (FIG. 10) corresponding to the information length K can be obtained according to the parity check matrix initial value table.

The number of rows k+1 of the parity check matrix initial value table by the type B method differs depending on the information length K.

The relationship of the expression (9) holds between the information length K and the number of rows k+1 of the parity check matrix initial value table.

$$K=(k+1)\times 360 \quad (9)$$

Here, 360 in the expression (9) is the parallel factor P described in FIG. 16.

In the parity check matrix initial value table in FIG. 21, thirteen numerical values are arranged in the 1st to 3rd rows, and three numerical values are arranged in the 4th to (k+1)th rows (30th row in FIG. 21).

Therefore, the column weight of the parity check matrix H obtained from the parity check matrix initial value table in FIG. 21 is 13 from the 1st to (1+360×(3−1)−1)th columns, and 3 from the (1+360×(3−1))th to K-th columns.

The 1st row of the parity check matrix initial value table in FIG. 21 is 0, 2084, 1613, 1548, 1286, 1460, 3196, 4297, 2481, 3369, 3451, 4620, and 2622, which indicates that, in the 1st column of the parity check matrix H, the elements of the rows with the row numbers of 0, 2084, 1613, 1548, 1286, 1460, 3196, 4297, 2481, 3369, 3451, 4620, and 2622 are 1 (and the other elements are 0).

Furthermore, the 2nd row of the parity check matrix initial value table in FIG. 21 is 1, 122, 1516, 3448, 2880, 1407, 1847, 3799, 3529, 373, 971, 4358, and 3108, which indicates that, in the 361 (=1+360×(2−1))st column of the parity check matrix H, the elements of the rows with the row numbers of 1, 122, 1516, 3448, 2880, 1407, 1847, 3799, 3529, 373, 971, 4358, and 3108 are 1.

As described above, the parity check matrix initial value table represents the positions of the elements of 1 of the information matrix $H_A$ of the parity check matrix H in every 360 columns.

The columns other than the (1+360 χ(i−1))th column of the parity check matrix H, that is, the (2+360×(i−1)th to (360×i)th columns are obtained by cyclically shifting and arranging the elements of 1 of the (1+360×(i−1))th column determined by the parity check matrix initial value table downward (downward of the columns) according to the parity length M.

In other words, for example, the (2+360×(i−1))th column is obtained by cyclically shifting the (1+360×(i−1))th column downward by M/360 (=q). The next (3+360×(i−1))th column is obtained by cyclically shifting the (1+360×(i−1))th column downward by 2×M/360 (=2×q) (by cyclically shifting the (2+360×(i−1))th column downward by M/360 (=q)).

Now, in a case where the numerical value of the j-th column (j-th from the left) in the i-th row (i-th from the top) of the parity check matrix initial value table is represented as $h_{i,j}$ and the row number of the element of j-th 1 of the w-th column of the parity check matrix H is represented as $H_{w-j}$, the row number $H_{w-j}$ of the element of 1 of the w-th column that is a column other than the (1+360×(i−1))th column of the parity check matrix H can be obtained by the expression (10).

$$H_{w-j}=\mathrm{mod}\{h_{i,j}+\mathrm{mod}((w-1),P)\times q,M) \quad (10)$$

Here, mod (x, y) means the remainder of dividing x by y.

Furthermore, P is the above-described parallel factor, and in the present embodiment, P is 360 as in DVB-T.2 or the like and the standard of ATSC 3.0, for example. Moreover, q is a value M/360 obtained by dividing the parity length M by the parallel factor P (=360).

The parity check matrix generation unit 613 (FIG. 18) specifies the row number of the element of 1 in the (1+360×(i−1))th column of the parity check matrix H using the parity check matrix initial value table.

Moreover, the parity check matrix generation unit 613 (FIG. 18) calculates the row number $H_{w-j}$ of the element of 1 in the w-th column that is a column other than the (1+360×(i−1))th column of the parity check matrix H according to the expression (10), and generates the parity check matrix H in which the elements of the row numbers obtained as described above are 1.

Figures 22, 23:
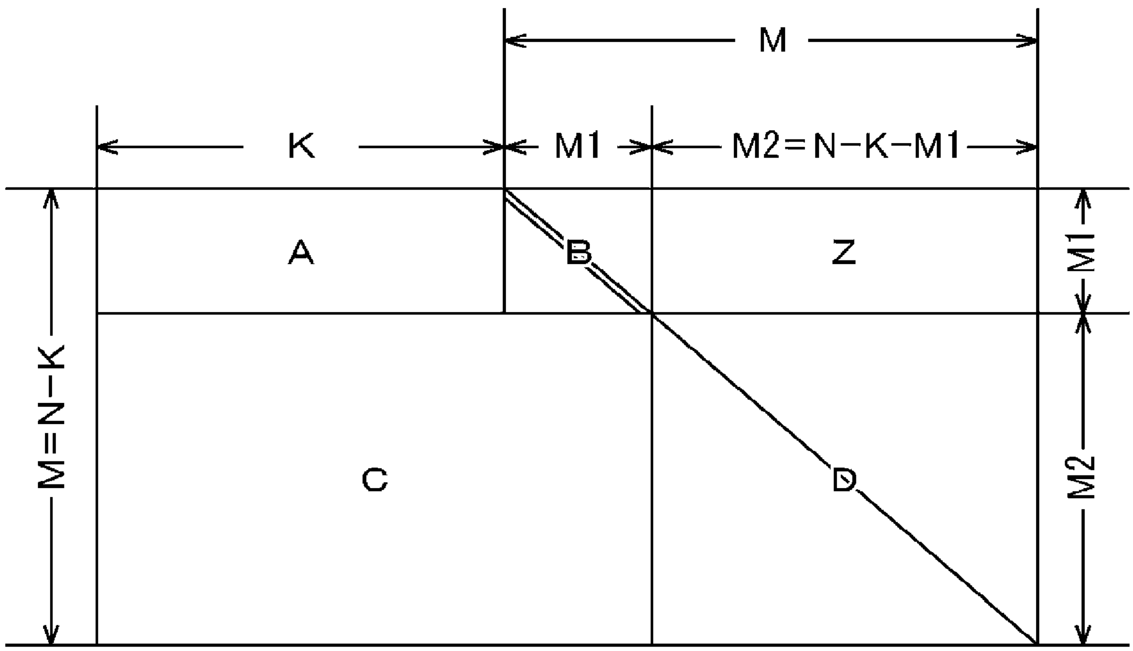
FIG. 22 is a diagram illustrating a structure of a parity check matrix.
FIG. 23 is a diagram illustrating an example of a parity check matrix initial value table.

FIG. 22 is a diagram illustrating a structure of the parity check matrix H by the type A method.

The parity check matrix by the type A method is configured by an A matrix, a B matrix, a C matrix, a D matrix, and a Z matrix.

The A matrix is an upper left matrix in the parity check matrix H, of M1 rows and K columns expressed by a predetermined value M1 and the information length K=the code length N×the coding rate r of the LDPC code.

The B matrix is a matrix of M1 rows and M1 columns having a step structure adjacent to the right of the A matrix.

The C matrix is a matrix of N−K−M1 rows and K+M1 columns adjacent to below the A matrix and the B matrix.

The D matrix is an identity matrix of N−K−M1 rows and N−K−M1 columns adjacent to the right of the C matrix.

The Z matrix is a zero matrix (0 matrix) of M1 rows and N−K−M1 columns adjacent to the right of the B matrix.

In the parity check matrix H by the type A method configured by the above A matrix to D matrix and Z matrix, the A matrix and a part of the C matrix constitute the information matrix, and the B matrix, the rest of the C matrix, the D matrix, and the Z matrix constitute the parity matrix.

Note that, since the B matrix is a matrix with a step structure and the D matrix is an identity matrix, a part (the part of the B matrix) of the parity matrix of the parity check matrix H by the type A method has the step structure and the remaining part (the part of the D matrix) is a diagonal matrix (identity matrix).

The A matrix and the C matrix have a cyclic structure of every parallel factor P columns (for example, 360 columns), similarly to the information matrix of the parity check matrix H by type B method, and the parity check matrix initial value table by the type A method represents the positions of the elements of 1 of the A matrix and the C matrix in every 360 columns.

Here, as described above, since the A matrix and a part of the C matrix constitute the information matrix, the parity check matrix initial value table by the type A method representing the positions of the elements of 1 of the A matrix and the C matrix in every 360 columns can be said to represent at least the positions of the elements of 1 of the information matrix in every 360 columns.

Note that, since the parity check matrix initial value table by the type A method represents the positions of the elements of 1 of the A matrix and the C matrix in every 360 columns, the parity check matrix initial value table can also be said to represent the positions of the elements of 1 of a part (the remaining part of the C matrix) of the parity check matrix in every 360 columns.

FIG. 23 is a diagram illustrating an example of the parity check matrix initial value table by the type A method.

In other words, FIG. 23 illustrates an example of the parity check matrix initial value table representing the parity check matrix H with the code length N of 35 bits and the coding rate r of 2/7.

The parity check matrix initial value table by the type A method is a table representing the positions of the elements of 1 of the A matrix and the C matrix in every parallel factor P. In the i-th row, row numbers of the elements of 1 of the (1+P×(i−1))th column of the parity check matrix H (the row numbers of when the row number of the 1st row of the parity check matrix H is counted as 0) are arranged by the number of the column weight of the (1+P×(i−1))th column.

Note that, here, to simplify the description, the parallel factor P is 5, for example.

The parity check matrix H by the type A method has M1, M2, Q1, and Q2 as parameters.

M1 (FIG. 22) is a parameter for determining the size of the B matrix, and takes a value that is a multiple of the parallel factor P. By adjusting M1, the performance of the LDPC code changes, and M1 is adjusted to a predetermined value when determining the parity check matrix H. Here, it is assumed that 15 is adopted as M1, which is three times the parallel factor P=5.

M2 (FIG. 22) takes a value M−M1 obtained by subtracting M1 from the parity length M.

Here, since the information length K is N×r=35×2/7=10 and the parity length M is N−K=35−10=25, M2 is M−M1=25-15=10.

Q1 is obtained according to an expression Q1=M1/P, and represents the number of shifts (the number of rows) of cyclic shift in the A matrix.

In other words, the columns other than the (1+P×(i−1))th column of the A matrix of the parity check matrix H by the type A method, that is, the (2+P×(i−1))th to (P×i)th columns are obtained by cyclically shifting and arranging the elements of 1 of the (1+P×(i−1))th column determined by the parity check matrix initial value table downward (downward of the columns), and Q1 represents the number of shifts of the cyclic shift in the A matrix.

Q2 is obtained according to an expression Q2=M2/P, and represents the number of shifts (the number of rows) of cyclic shift in the C matrix.

In other words, the columns other than the (1+P×(i−1))th column of the C matrix of the parity check matrix H by the type A method, that is, the (2+P×(i−1))th to (P×i)th columns are obtained by cyclically shifting and arranging the elements of 1 of the (1+P×(i−1))th column determined by the parity check matrix initial value table downward (downward of the columns), and Q2 represents the number of shifts of the cyclic shift in the C matrix.

Here, Q1 is M1/P=15/5=3, and Q2 is M2/P=10/5=2.

In the parity check matrix initial value table in FIG. 23, three numerical values are arranged in the 1st and 2nd rows, and one numerical value is arranged in the 3rd to 5th rows. According to the arrangement of the numerical values, the column weights of the A matrix and the C matrix of the parity check matrix H obtained from the parity check matrix initial value table in FIG. 23 are 3 from 1=(1+5×(1−1))st column to 10=(5×2)th column, and 1 from the 11=(1+5×(3−1))th column to 25=(5×5)th column.

In other words, the 1st row of the parity check matrix initial value table in FIG. 23 is 2, 6, and 18, which represents that, in the 1st column of the parity check matrix H, the elements of the rows with the row numbers of 2, 6, and 18 are 1 (and the other elements are 0).

Here, in this case, since the A matrix (FIG. 22) is a matrix of 15 rows and 10 columns (M1 rows and K columns), and the C matrix (FIG. 22) is a matrix of 10 rows and 25 columns (N−K−M1 rows and K+M1 columns), the rows with the row numbers 0 to 14 of the parity check matrix H are rows of the A matrix, and the rows with the row numbers 15 to 24 of the parity check matrix H are rows of the C matrix.

Therefore, rows #2 and #6 of the rows with the row numbers 2, 6, and 18 (hereinafter described as rows #2, #6, and #18) are rows of the A matrix, and the row #18 is a row of the C matrix.

The 2nd row of the parity check matrix initial value table in FIG. 23 is 2, 10, and 19, which represents that, in the 6 (=1+5×(2−1))th column of the parity check matrix H, the elements of the rows #2, #10, and #19 are 1.

Here, in the 6 (=1+5×(2−1))th column of the parity check matrix H, the rows #2 and #10 of the rows #2, #10, and #19 are rows of the A matrix, and the row #19 is a row of the C matrix.

The 3rd row of the parity check matrix initial value table in FIG. 23 is 22, which represents that, in the 11 (=1+5×(3−1))th column of the parity check matrix H, the element of the row #22 is 1.

Here, the row #22 is a row of the C matrix in the (=1+5×(3−1))th column of the parity check matrix H.

Similarly, 19 in the 4th row of the parity check matrix initial value table in FIG. 23 represents that the element of the row #19 is 1 in the 16 (=1+5×(4−1))th column of the parity check matrix H. 15 in the fifth row of the parity check matrix initial value table in FIG. 23 represents that the element of the row #15 is 1 in the 21 (=1+5×(5−1))st column of the parity check matrix H.

As described above, the parity check matrix initial value table represents the positions of the elements of 1 of the A matrix and the C matrix of the parity check matrix H in every parallel factor P=5 columns.

The columns other than the (1+5×(i−1))th column of the A matrix and the C matrix of the parity check matrix H, that is, the (2+5×(i−1))th to (5×i)th columns are obtained by cyclically shifting and arranging the elements of 1 of the (1+5×(i−1))th column determined by the parity check matrix initial value table downward (downward of the columns) according to the parameters Q1 and Q2.

In other words, for example, the (2+5×(i−1))th column of the A matrix is obtained by cyclically shifting the (1+5×(i−1))th column downward by Q1 (=3). The next (3+5×(i−1))th column is obtained by cyclically shifting the (1+5×(i−1))th column downward by 2×Q1 (=2×3) (by cyclically shifting the (2+5×(i−1))th column downward by Q1).

Furthermore, for example, the (2+5×(i−1))th column of the C matrix is obtained by cyclically shifting the (1+5×(i−1))th column downward by Q2 (=2). The next (3+5×(i−1))th column is obtained by cyclically shifting the (1+5×(i−1))th column downward by 2×Q2 (=2×2) (by cyclically shifting the (2+5×(i−1))th column downward by Q2).

Figure 24:
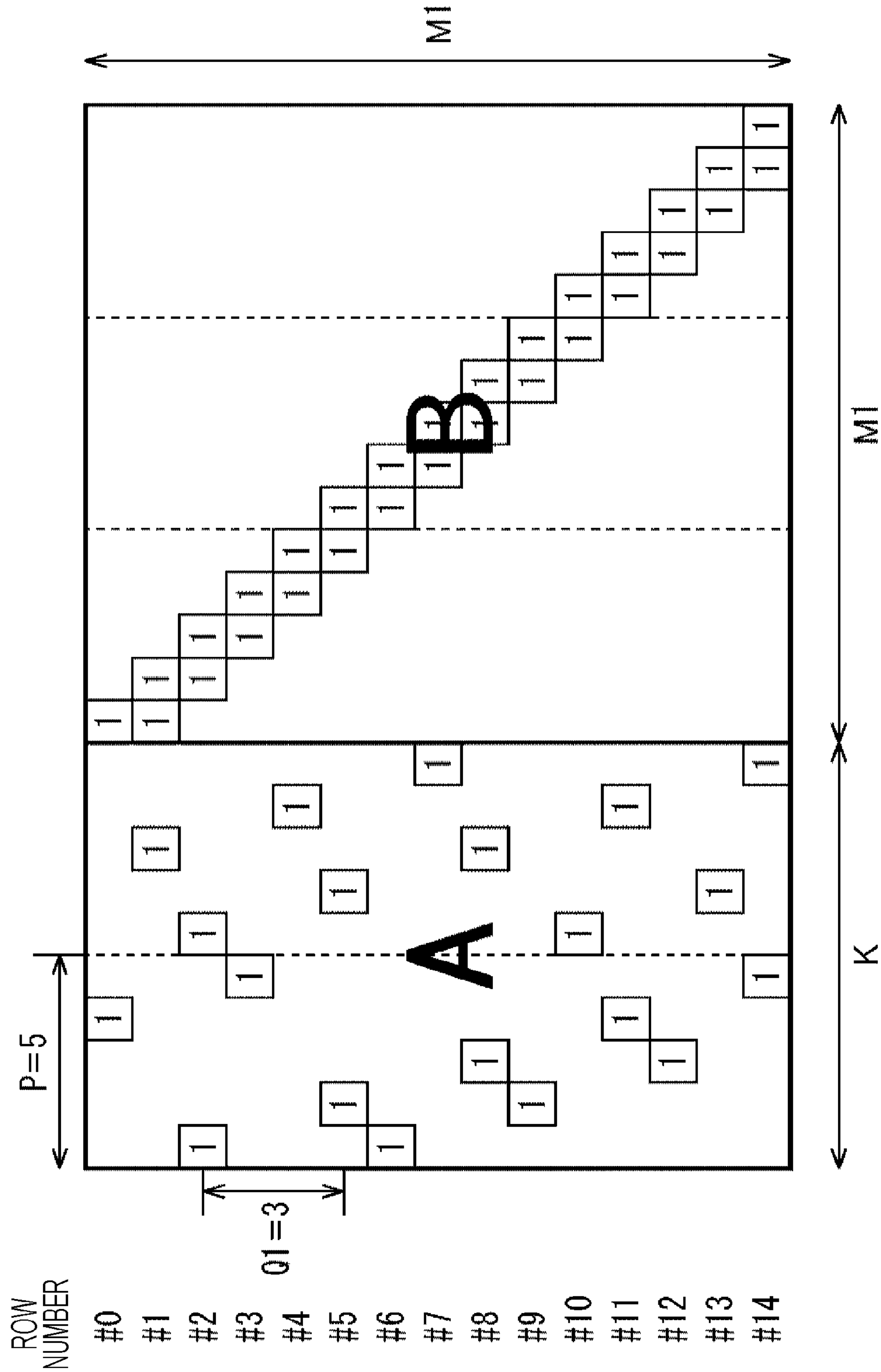
FIG. 24 is a diagram illustrating an A matrix generated from the parity check matrix initial value table.

FIG. 24 is a diagram illustrating the A matrix generated from the parity check matrix initial value table in FIG. 23.

In the A matrix in FIG. 24, the elements of the rows #2 and #6 of the 1 (=1+5×(1−1))st column are 1 according to the 1st row of the parity check matrix initial value table in FIG. 23.

Then, the 2 (=2+5×(1−1))nd to 5 (=5+5×(1−1))th columns are obtained by cyclically shifting the previous columns downward by Q1=3.

Moreover, in the A matrix in FIG. 24, the elements of the rows #2 and #10 of the 6 (=1+5×(2−1))th column are 1 according to the 2nd row of the parity check matrix initial value table in FIG. 23.

Then, the 7 (=2+5×(2−1))th to 10 (=5+5×(2−1))th columns are obtained by cyclically shifting the previous columns downward by Q1=3.

Figure 25:
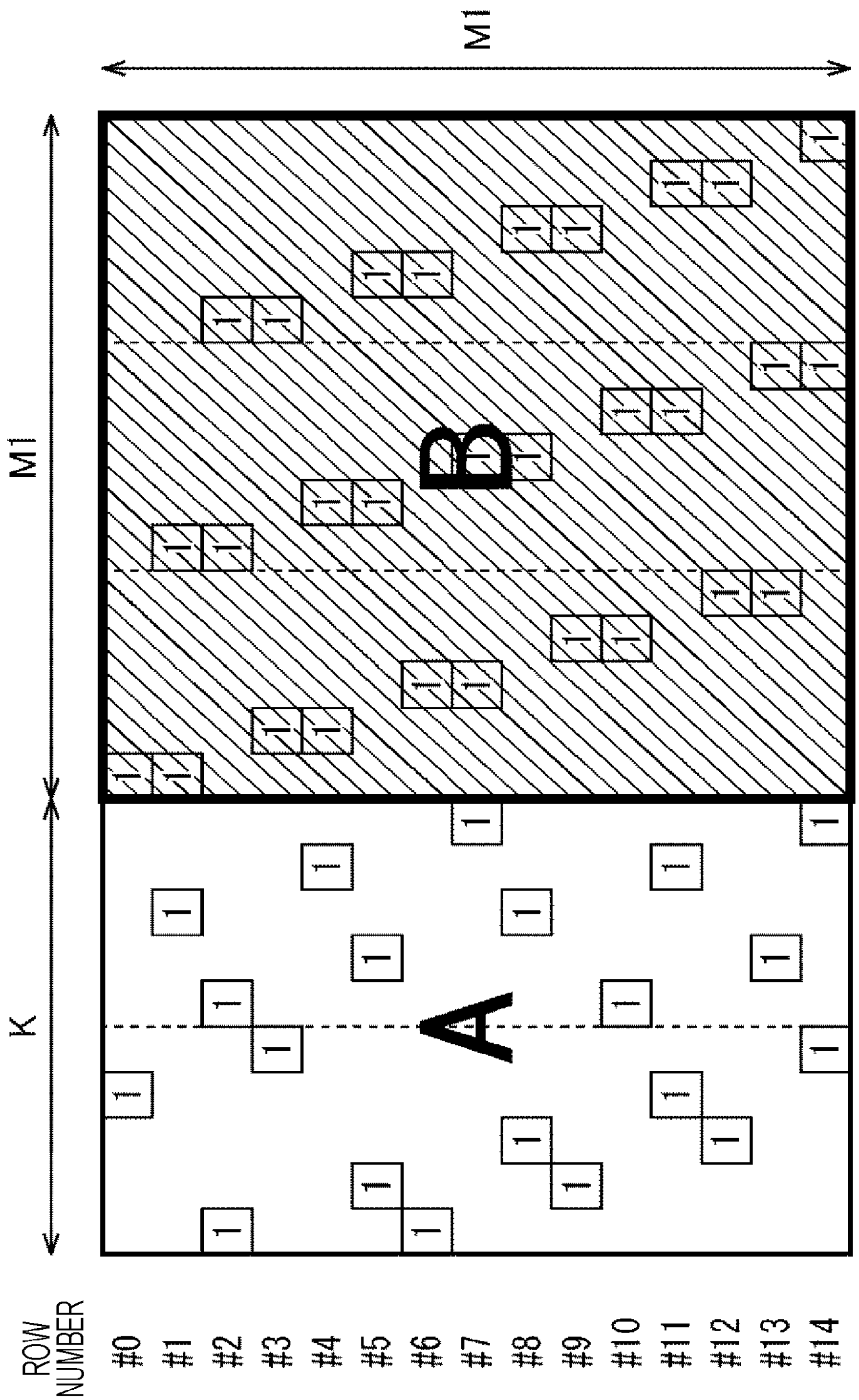
FIG. 25 is a diagram for describing parity interleaving of a B matrix.

FIG. 25 is a diagram illustrating parity interleaving of the B matrix.

The parity check matrix generation unit 613 (FIG. 18) generates the A matrix using the parity check matrix initial value table, and arranges the B matrix having a step structure adjacent to the right of the A matrix. Then, the parity check matrix generation unit 613 treats the B matrix as a parity matrix, and performs parity interleaving such that adjacent elements of 1 of the B matrix having a step structure are separated in the row direction by the parallel factor P=5.

FIG. 25 illustrates the A matrix and the B matrix after the parity interleaving of the B matrix in FIG. 24.

Figure 26:
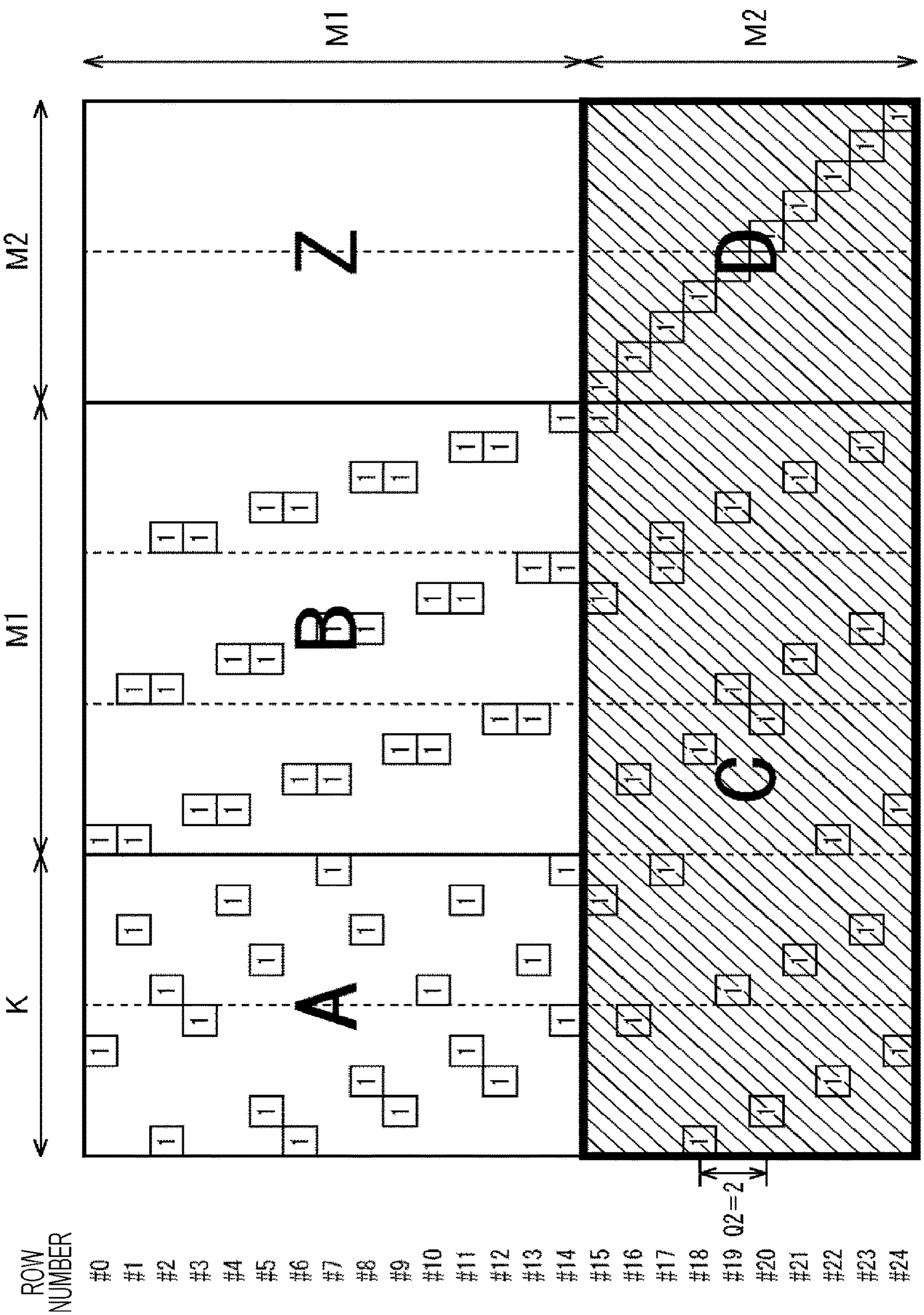
FIG. 26 is a diagram for describing a C matrix generated from the parity check matrix initial value table.

FIG. 26 is a diagram illustrating the C matrix generated from the parity check matrix initial value table in FIG. 23.

In the C matrix in FIG. 26, the element of the row #18 of the 1 (=1+5×(1−1))st column of the parity check matrix H is 1 according to the 1st row of the parity check matrix initial value table in FIG. 23.

Then, the 2 (=2+5×(1−1))nd to 5 (=5+5×(1−1))th columns of the C matrix are obtained by cyclically shifting the previous columns downward by Q2=2.

Moreover, in the C matrix in FIG. 26, according to the 2nd to 5th rows of the parity check matrix initial value table in FIG. 23, the elements of the row #19 of the 6 (=1+5×(2−1))th column, the row #22 of the 11 (=1+5×(3−1))th column, the row #19 of the 16 (=1+5×(4−1))th column, and the row #15 in the 21 (=1+5×(5−1))st columns, of the parity check matrix H, are 1.

Then, the 7 (=2+5×(2−1))th to the 10 (=5+5×(2−1))th columns, the 12 (=2+5×(3−1))th to 15 (=5+5×(3−1))th columns, the 17 (=2+5×(4−1))th to 20 (=5+5×(4−1))th columns, and the 22 (=2+5×(5−1))nd to the 25 (=5+5×(5−1))th columns are obtained by cyclically shifting the previous columns downward by Q2=2.

The parity check matrix generation unit 613 (FIG. 18) generates the C matrix using the parity check matrix initial value table and arranges the C matrix below the A matrix and the B matrix (after parity interleaving).

Moreover, the parity check matrix generation unit 613 arranges the Z matrix adjacent to the right of the B matrix and arranges the D matrix adjacent to the right of the C matrix to generate the parity check matrix H illustrated in FIG. 26.

Figure 27:
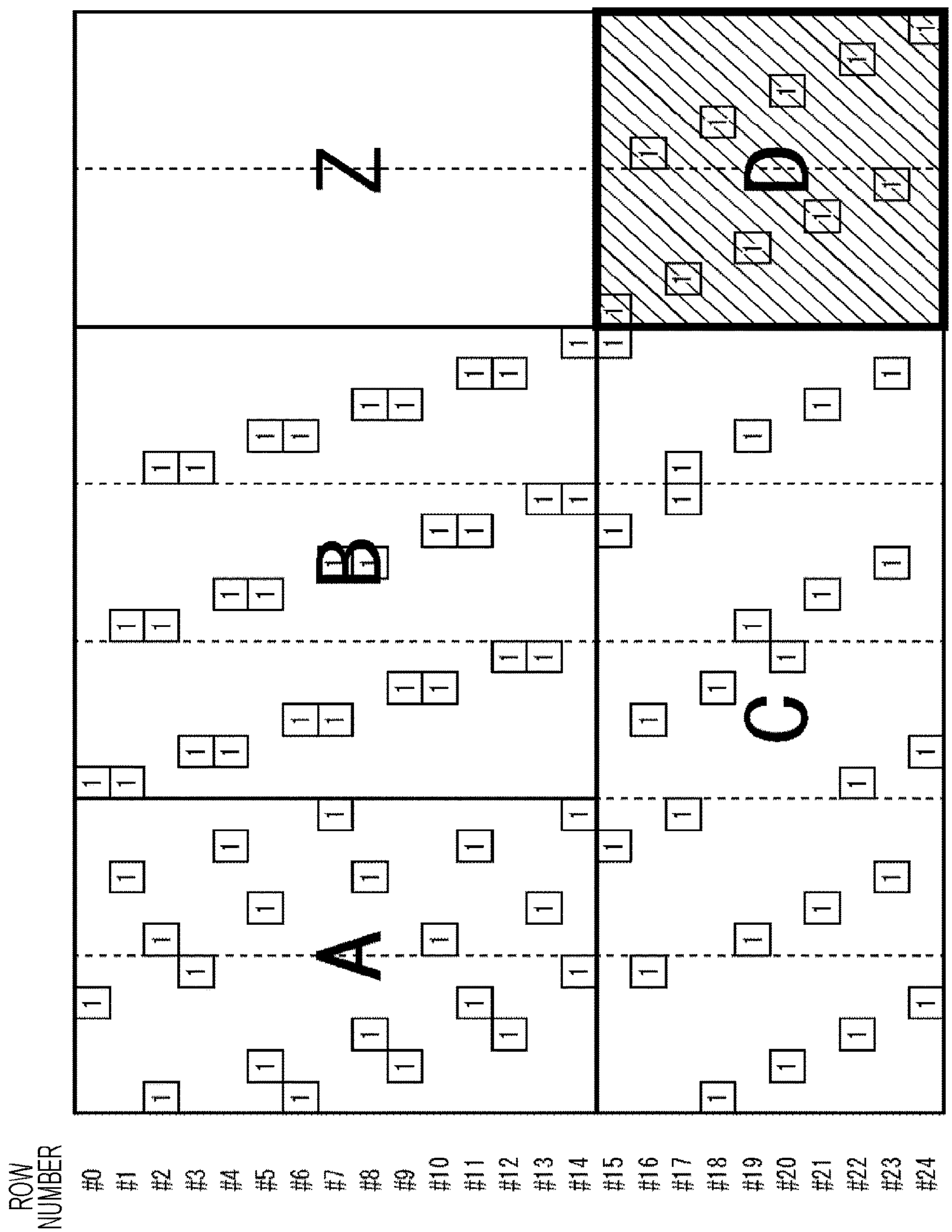
FIG. 27 is a diagram for describing parity interleaving of a D matrix.

FIG. 27 is a diagram illustrating parity interleaving of the D matrix.

The parity check matrix generation unit 613 treats the D matrix after generating the parity check matrix H in FIG. 26 as a parity matrix, and performs parity interleaving (of only the D matrix) such that the elements of 1 of the odd rows and the next even rows of the D matrix as an identity matrix are separated by the parallel factor P=5 in the row direction.

FIG. 27 illustrates the parity check matrix H after performing the parity interleaving of the D matrix for the parity check matrix H in FIG. 26.

(The coding parity operation unit 615 (FIG. 18) of) the LDPC encoder 115 performs LDPC coding (generates an LDPC code) using the parity check matrix H in FIG. 27, for example.

Here, the LDPC code generated using the parity check matrix H in FIG. 27 is an LDPC code for which parity interleaving has been performed. Therefore, it is not necessary to perform the parity interleaving in the parity interleaver 23 (FIG. 9) for the LDPC code generated using the parity check matrix H in FIG. 27. In other words, the LDPC code generated using the parity check matrix H after the parity interleaving of the D matrix is performed is the LDPC code for which the parity interleaving has been performed. Therefore, the parity interleaving in the parity interleaver 23 is skipped for the LDPC code.

Figure 28:
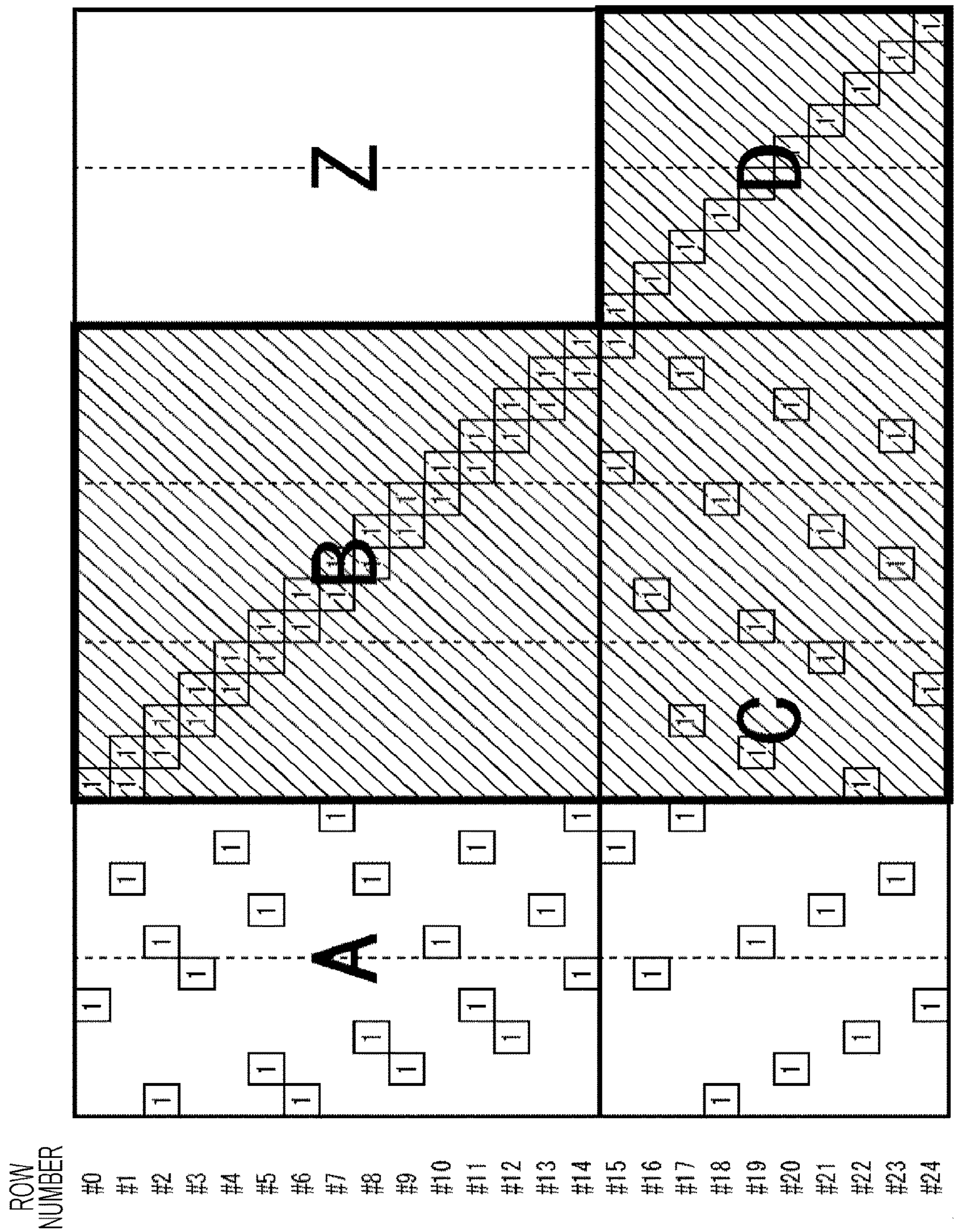
FIG. 28 is a diagram illustrating a parity check matrix for which column permutation as parity deinterleaving for restoring parity interleaving is performed for a parity check matrix.

FIG. 28 illustrates a parity check matrix H for which column permutation as parity deinterleaving for restoring the parity interleaving is performed for the B matrix, a part of the C matrix (a portion of the C matrix arranged below the B matrix), and the D matrix of the parity check matrix H in FIG. 27.

The LDPC encoder 115 can perform LDPC coding (generates an LDPC code) using the parity check matrix H in FIG. 28.

In a case of performing the LDPC coding using the parity check matrix H in FIG. 28, an LDPC code for which parity interleaving is not performed can be obtained according to the LDPC coding. Therefore, in a case of performing the LDPC coding using the parity check matrix H in FIG. 28, the parity interleaving is performed in the parity interleaver 23 (FIG. 9).

Figure 29:
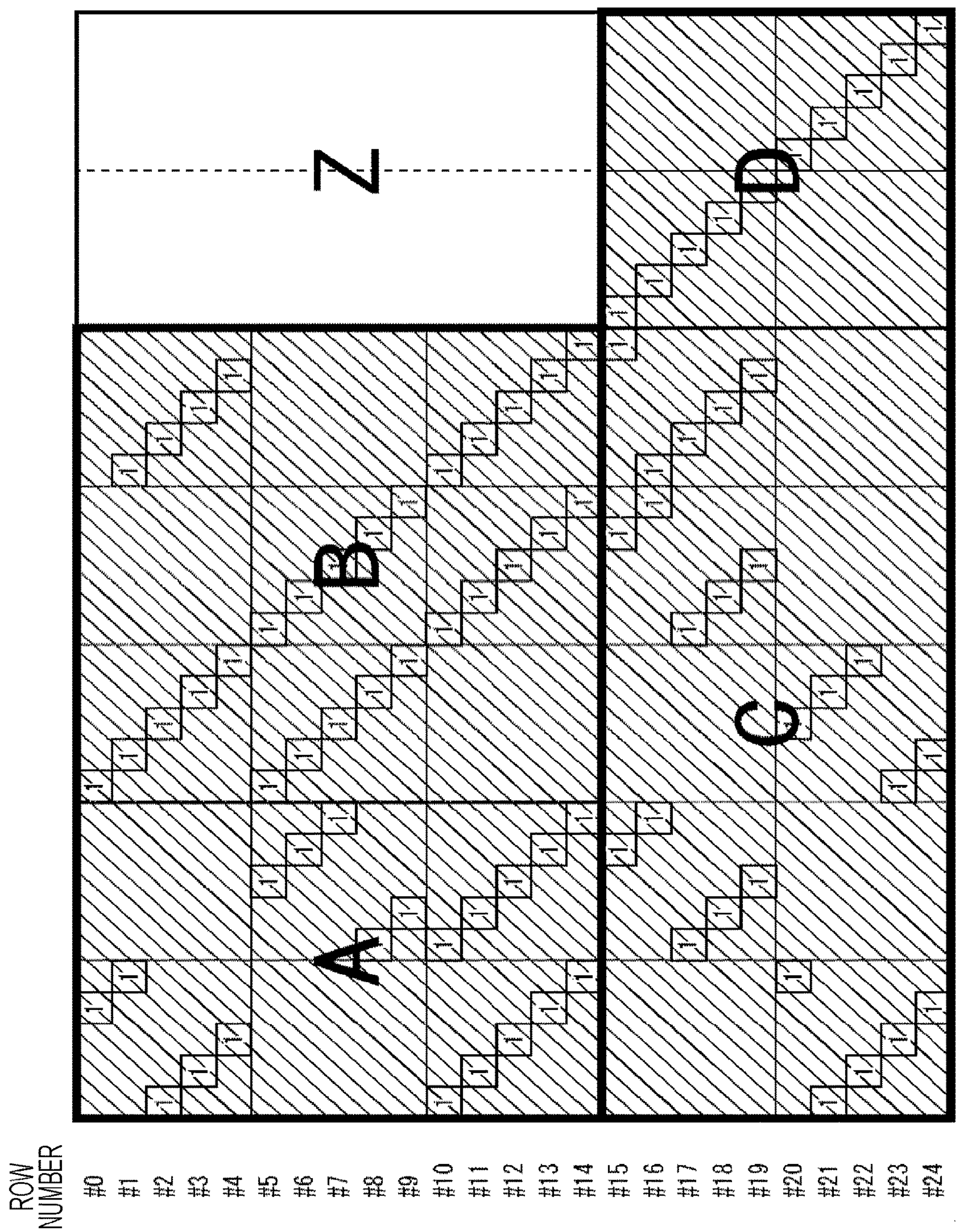
FIG. 29 is a diagram illustrating a transformed parity check matrix obtained by performing row permutation for a parity check matrix.

FIG. 29 is a diagram illustrating a transformed parity check matrix H obtained by performing row permutation for the parity check matrix H in FIG. 27.

The transformed parity check matrix is, as described below, a matrix represented by a combination of a P×P identity matrix, a quasi identity matrix in which one or more of is in the identity matrix is 0, a shift matrix obtained by cyclically shifting the identity matrix or the quasi identity matrix, a sum matrix that is a sum of two or more of the identity matrix, the quasi identity matrix, and the shift matrix, and a P×P zero matrix.

By using the transformed parity check matrix for decoding the LDPC code, architecture of performing P check node operations and variable node operations at the same time can be adopted in decoding the LDPC code, as described below.

<New LDPC Code>

One of methods of securing favorable communication quality in data transmission using an LDPC code, there is a method using an LDPC code with high performance.

Hereinafter, a new LDPC code with high performance (hereinafter also referred to as a new LDPC code) will be described.

As the new LDPC code, for example, the type A code or the type B code corresponding to the parity check matrix H having a cyclic structure with the parallel factor P of 360 similar to that of DVB-T.2, ATSC3.0, or the like, can be adopted.

The LDPC encoder 115 (FIGS. 8 and 18) can perform LDPC coding to obtain the new LDPC code, using (a parity check matrix H obtained from) a parity check matrix initial value table of the new LDPC code with the code length N of 69120 bits, for example, which is longer than 64 k bits, and the coding rate r of any of 2/16, 3/16, 4/16, 5/16, 6/16, 7/16, 8/16, 9/16, 10/16, 11/16, 12/16, 13/16, or 14/16, for example.

In this case, a parity check matrix initial value table of the new LDPC code is stored in the storage unit 602 of the LDPC encoder 115 (FIG. 8).

FIG. 30 is a diagram illustrating an example of a parity check matrix initial value table (of the type A method) representing the parity check matrix H of the type A code (hereinafter also referred to as the type A code with r=2/16) as a new LDPC code with the code length N of 69120 bits and the coding rate r of 2/16.

Figure 32:
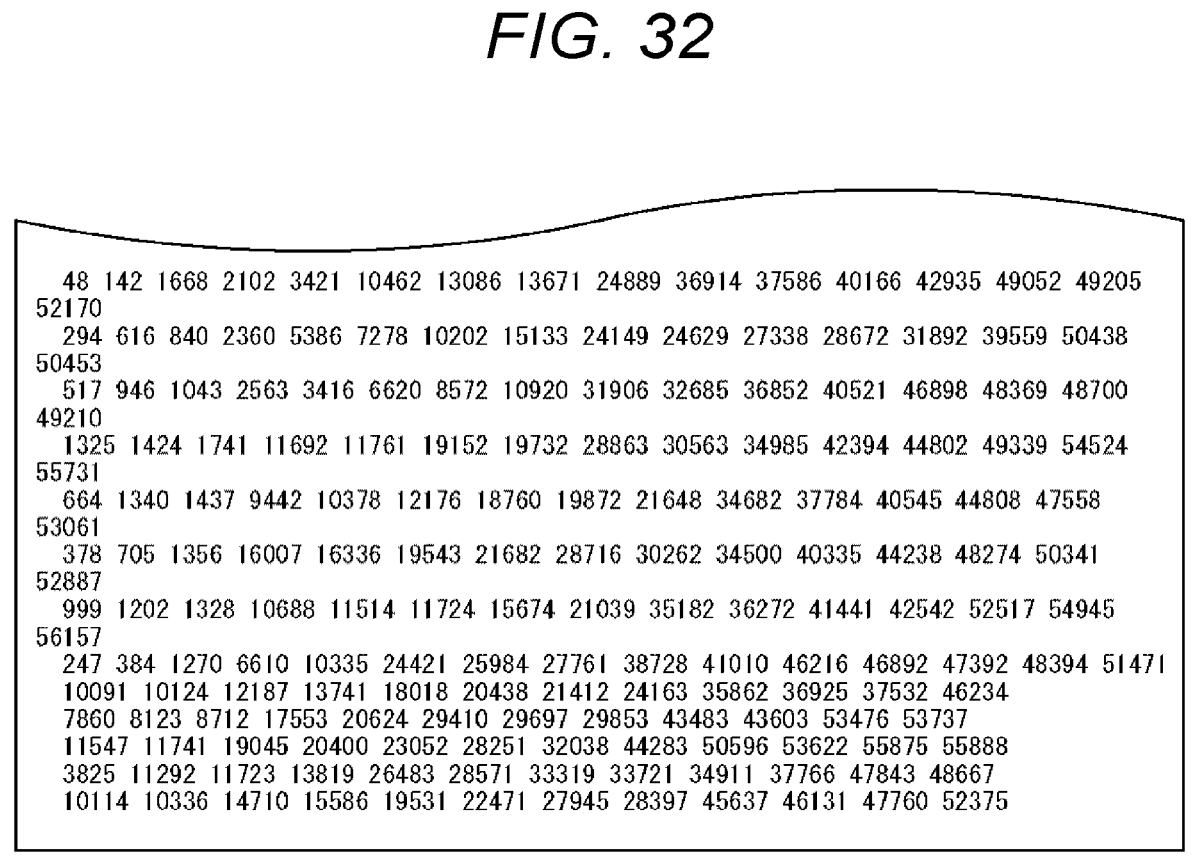

FIGS. 31 and 32 are diagrams illustrating examples of a parity check matrix initial value table representing the parity check matrix H of the type A code (hereinafter also referred to as the type A code with r=3/16) as a new LDPC code with the code length N of 69120 bits and the coding rate r of 3/16.

Note that FIG. 32 is a diagram following FIG. 31.

FIG. 33 is a diagram illustrating an example of a parity check matrix initial value table representing the parity check matrix H of the type A code (hereinafter also referred to as the type A code with r=4/16) as a new LDPC code with the code length N of 69120 bits and the coding rate r of 4/16.

Figure 35:
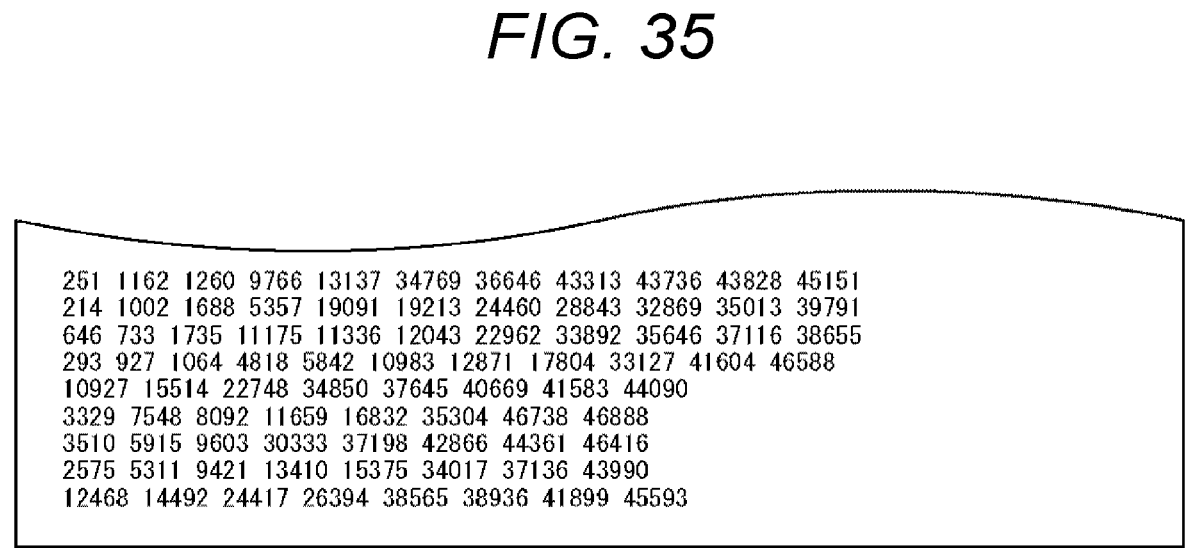

FIGS. 34 and 35 are diagrams illustrating examples of a parity check matrix initial value table representing the parity check matrix H of the type A code (hereinafter also referred to as the type A code with r=5/16) as a new LDPC code with the code length N of 69120 bits and the coding rate r of 5/16.

Note that FIG. 35 is a diagram following FIG. 34.

Figure 37:
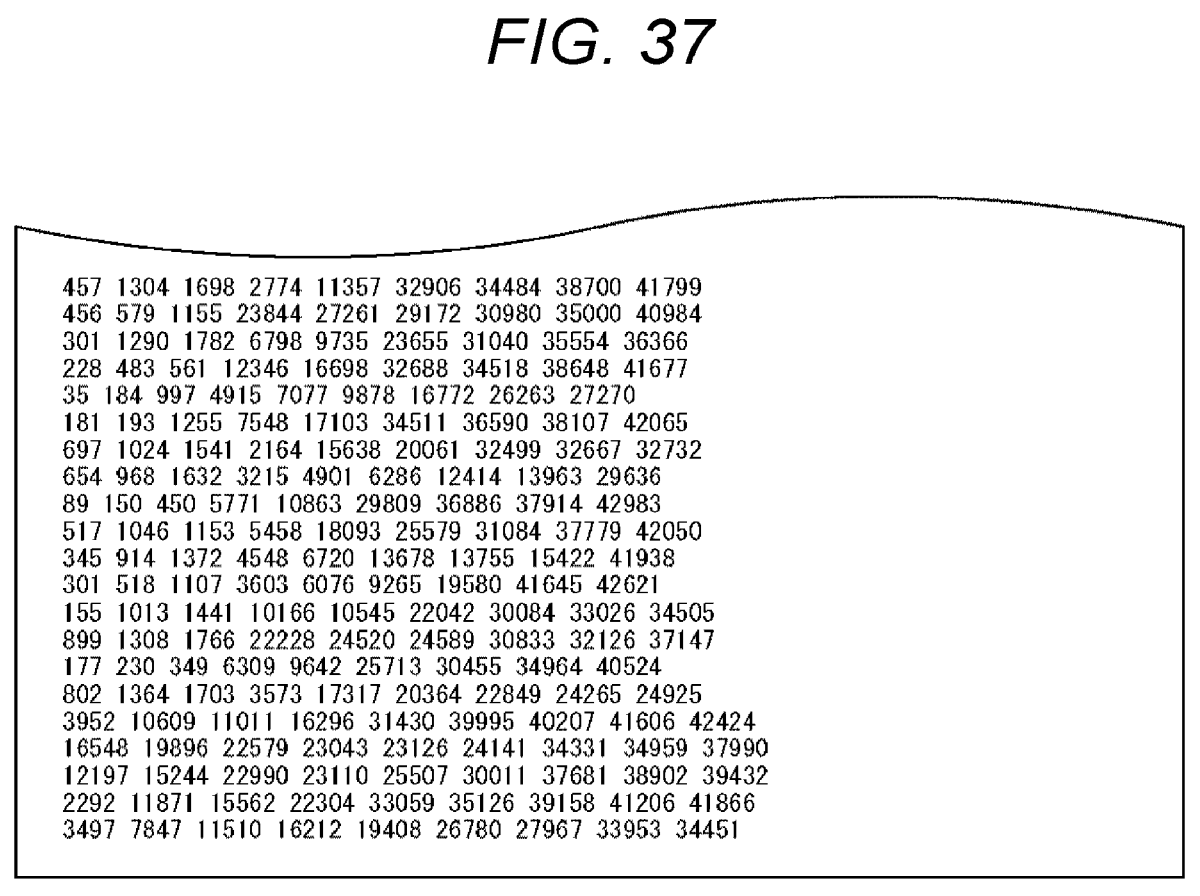

FIGS. 36 and 37 are diagrams illustrating examples of a parity check matrix initial value table representing the parity check matrix H of the type A code (hereinafter also referred to as the type A code with r=6/16) as a new LDPC code with the code length N of 69120 bits and the coding rate r of 6/16.

Note that FIG. 37 is a diagram following FIG. 36.

Figure 39:
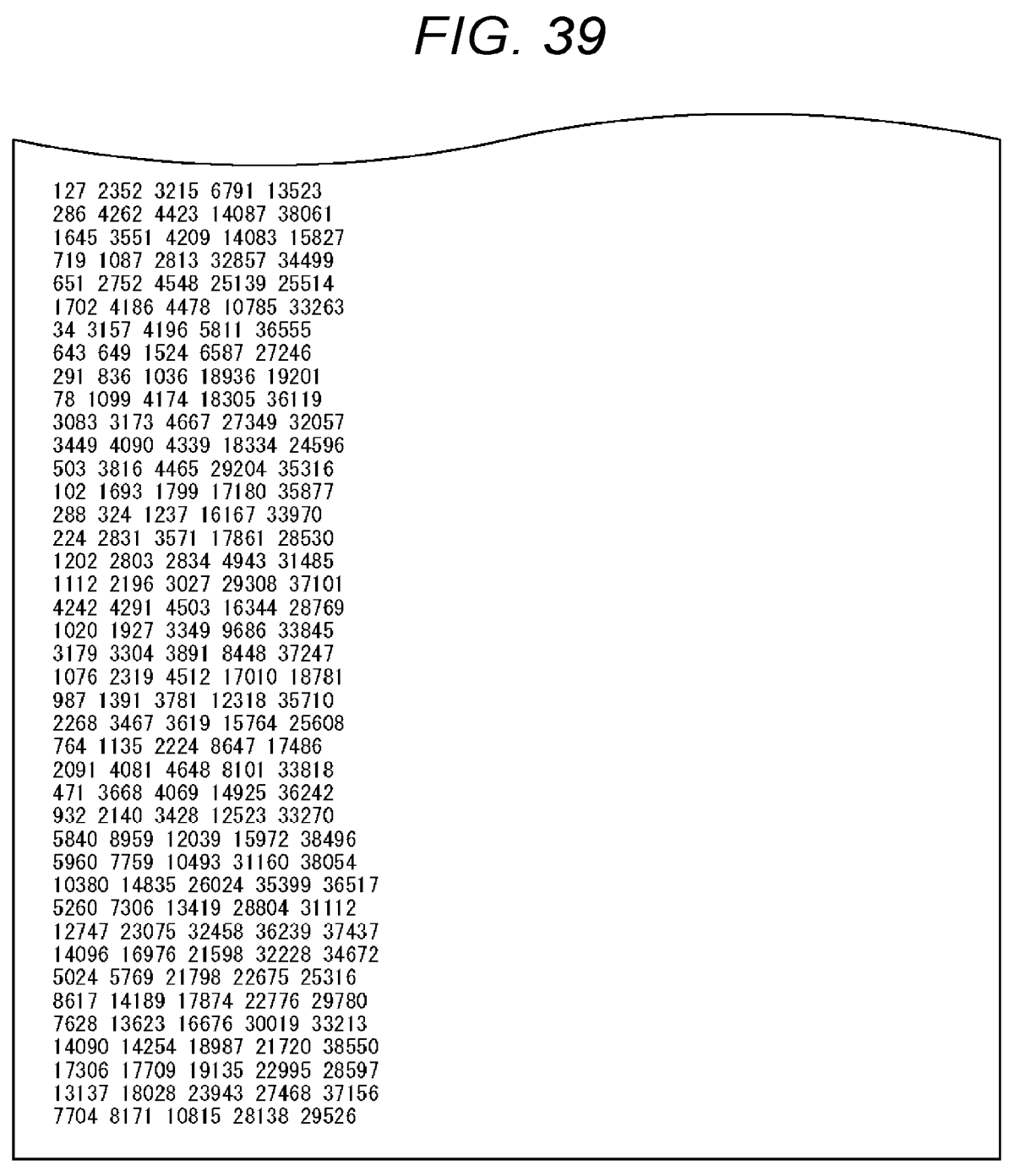

FIGS. 38 and 39 are diagrams illustrating examples of a parity check matrix initial value table representing the parity check matrix H of the type A code (hereinafter also referred to as the type A code with r=7/16) as a new LDPC code with the code length N of 69120 bits and the coding rate r of 7/16.

Note that FIG. 39 is a diagram following FIG. 38.

Figure 41:
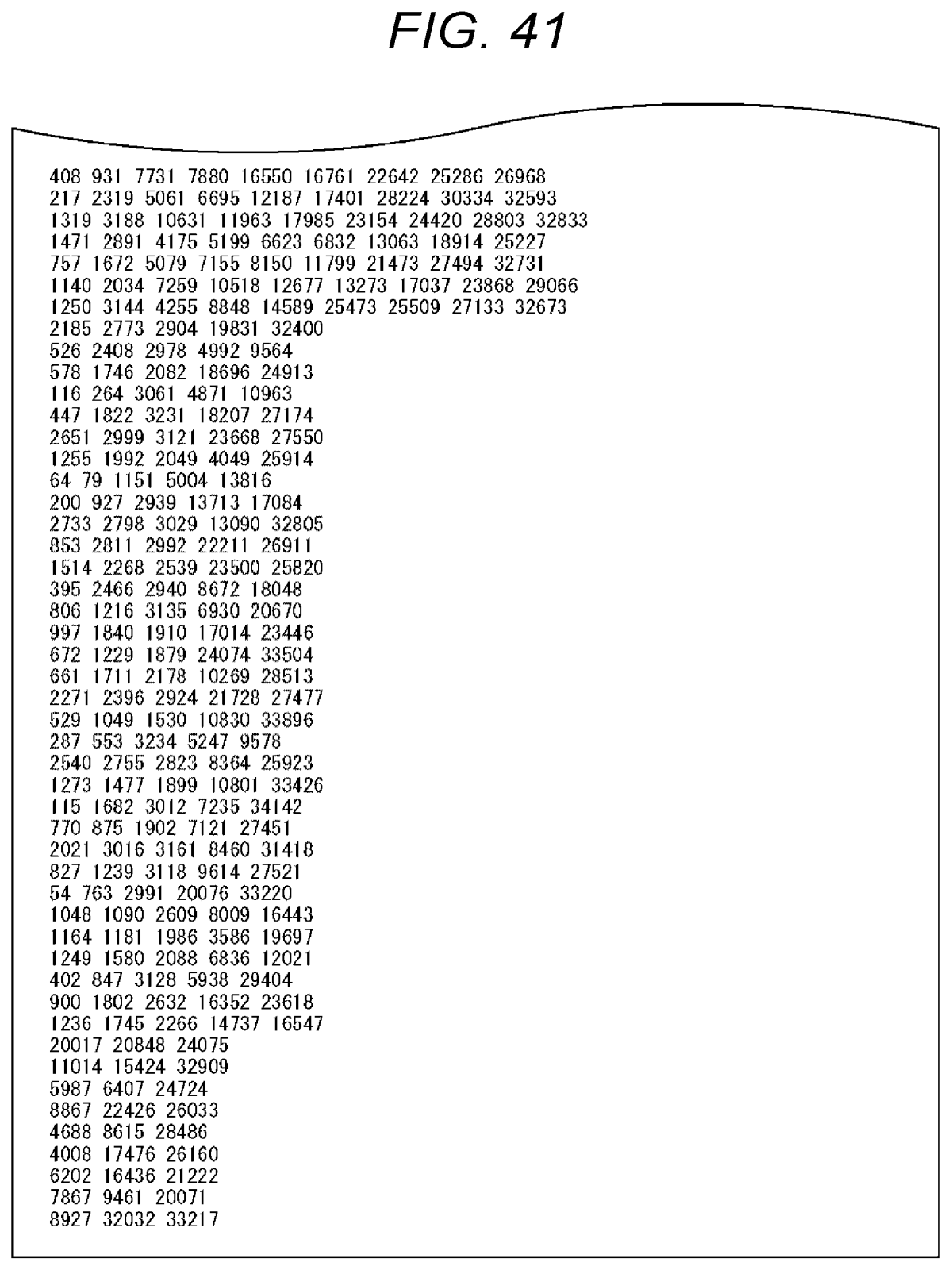

FIGS. 40 and 41 are diagrams illustrating examples of a parity check matrix initial value table representing the parity check matrix H of the type A code (hereinafter also referred to as the type A code with r=8/16) as a new LDPC code with the code length N of 69120 bits and the coding rate r of 8/16.

Note that FIG. 41 is a diagram following FIG. 40.

Figure 43:
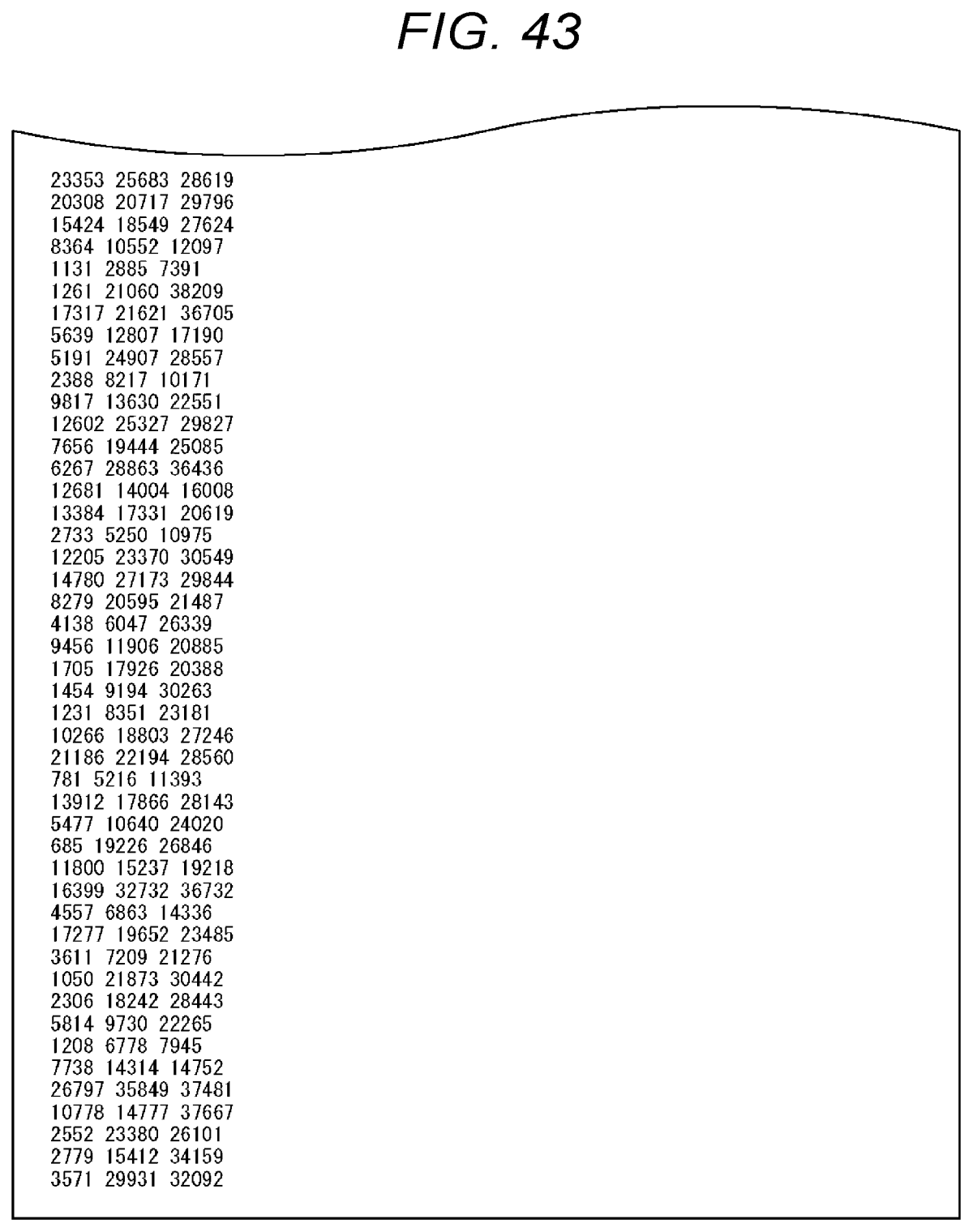

FIGS. 42 and 43 are diagrams illustrating examples of a parity check matrix initial value table (of the type B method) representing the parity check matrix H of the type B code (hereinafter also referred to as the type B code with r=7/16) as a new LDPC code with the code length N of 69120 bits and the coding rate r of 7/16.

Note that FIG. 43 is a diagram following FIG. 42.

Figure 45:
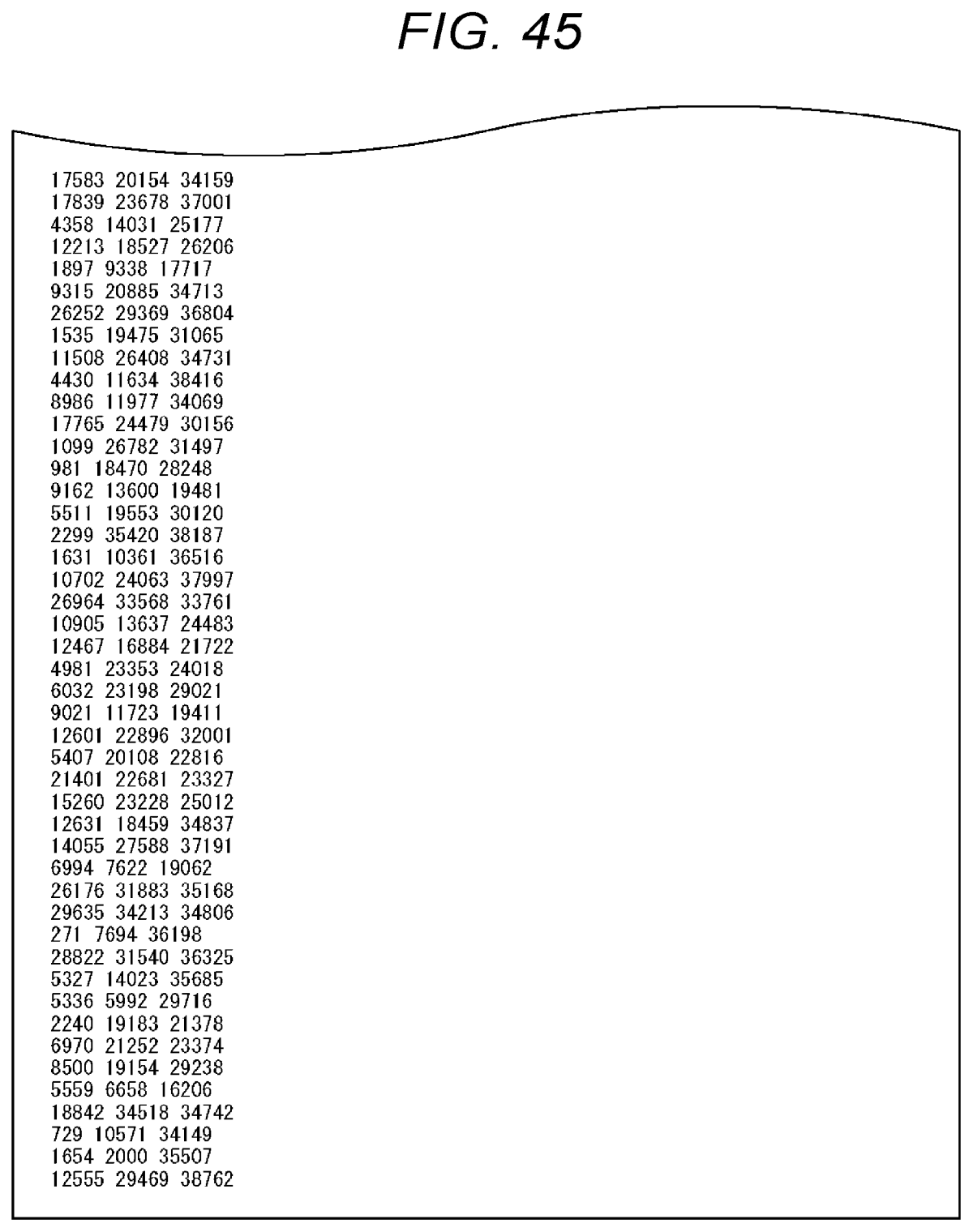

FIGS. 44 and 45 are diagrams illustrating another example of a parity check matrix initial value table representing the parity check matrix H of the type B code with r=7/16.

Note that FIG. 45 is a diagram following FIG. 44. The type B code with r=7/16 obtained from (the parity check matrix H represented by) the parity check matrix initial value table in FIGS. 44 and 45 will be also hereinafter referred to as another type B code with r=7/16.

FIGS. 46 and 47 are diagrams illustrating examples of a parity check matrix initial value table representing the parity check matrix H of the type B code (hereinafter also referred to as the type B code with r=8/16) as a new LDPC code with the code length N of 69120 bits and the coding rate r of 8/16.

Note that FIG. 47 is a diagram following FIG. 46.

Figure 49:
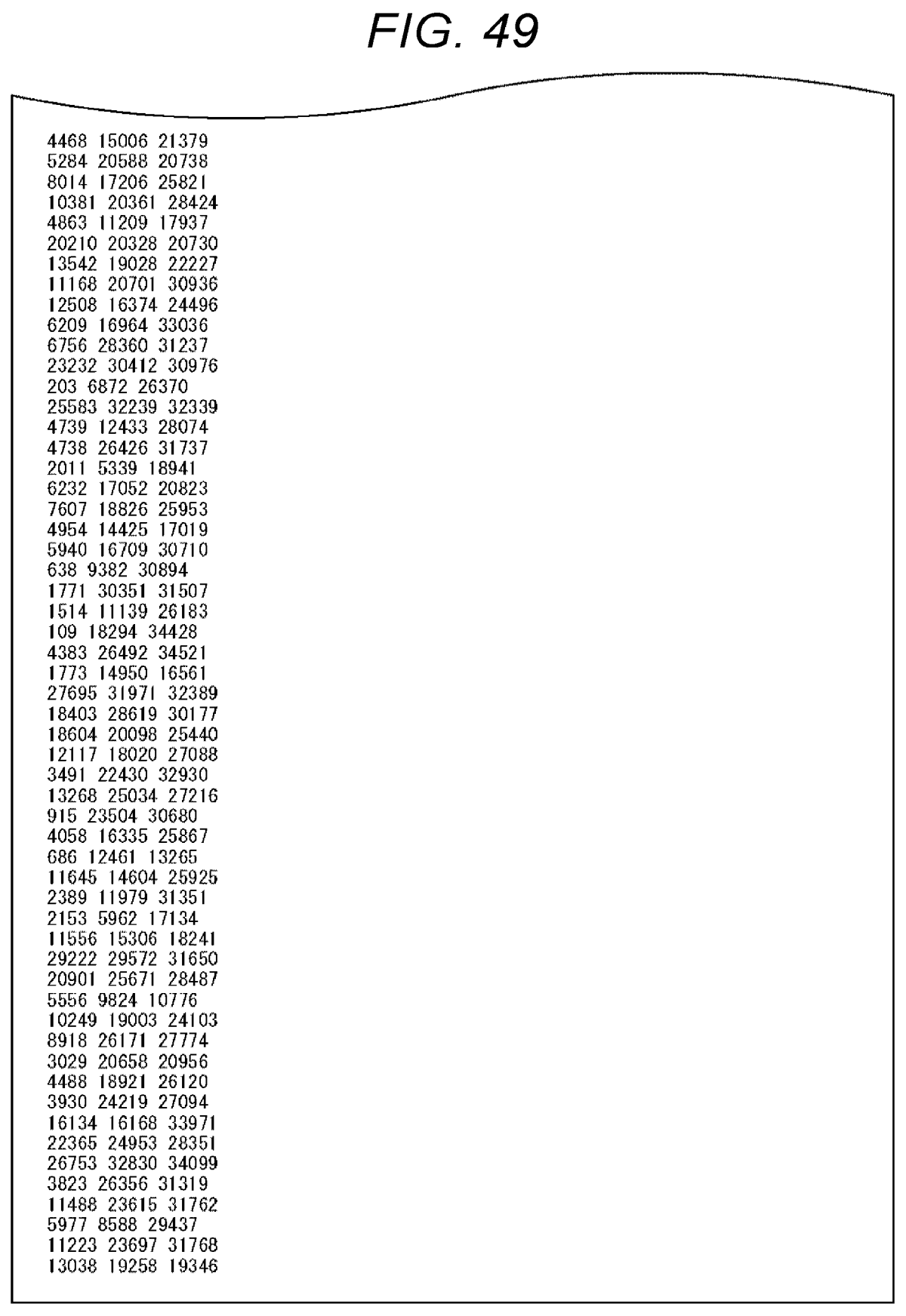

FIGS. 48 and 49 are diagrams illustrating another example of a parity check matrix initial value table representing the parity check matrix H of the type B code with r=8/16.

Note that FIG. 49 is a diagram following FIG. 48. The type B code with r=8/16 obtained from the parity check matrix initial value table in FIGS. 48 and 49 will be also hereinafter referred to as another type B code with r=8/16.

Figure 51:
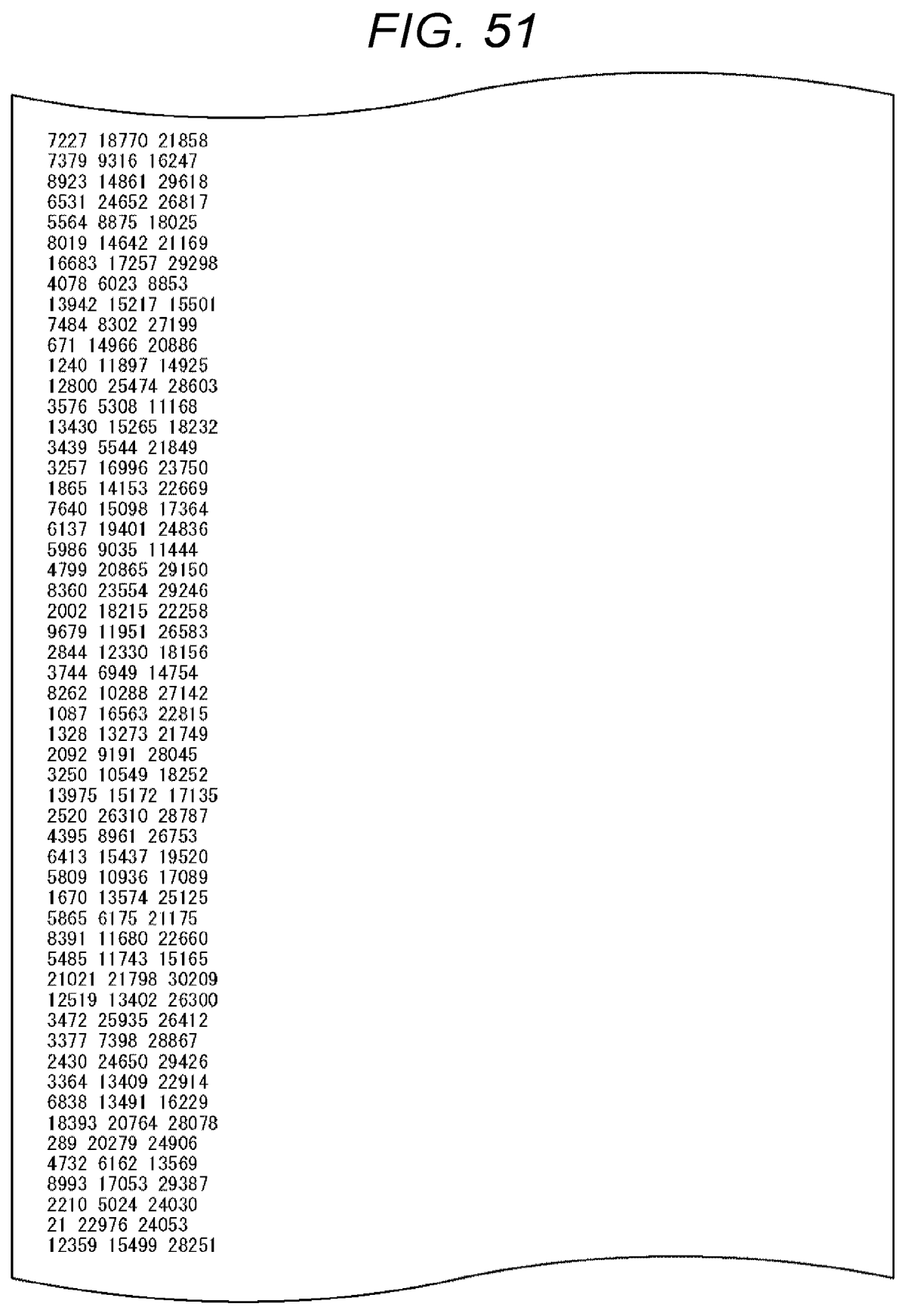
Figure 52:
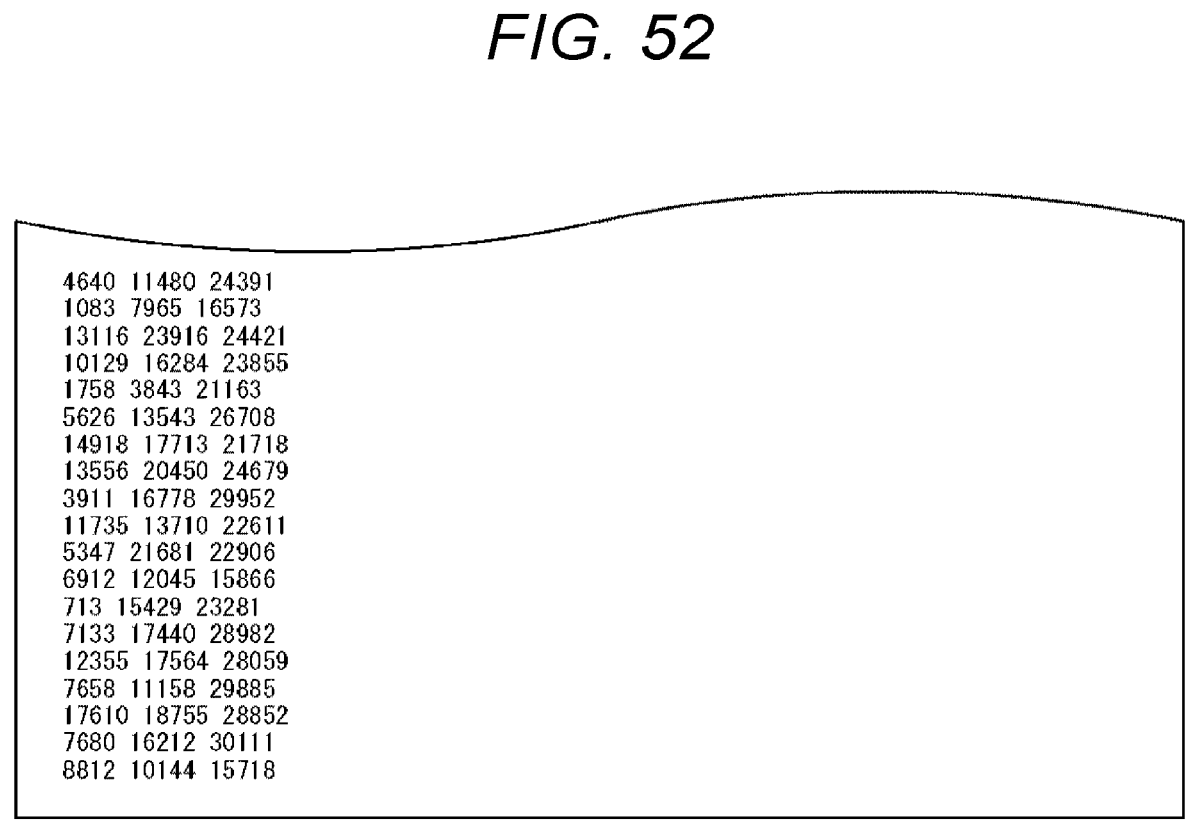

FIGS. 50, 51, and 52 are diagrams illustrating examples of a parity check matrix initial value table representing the parity check matrix H of the type B code (hereinafter also referred to as the type B code with r=9/16) as a new LDPC code with the code length N of 69120 bits and the coding rate r of 9/16.

Note that FIG. 51 is a diagram following FIG. 50 and FIG. 52 is a diagram following FIG. 51.

Figure 54:
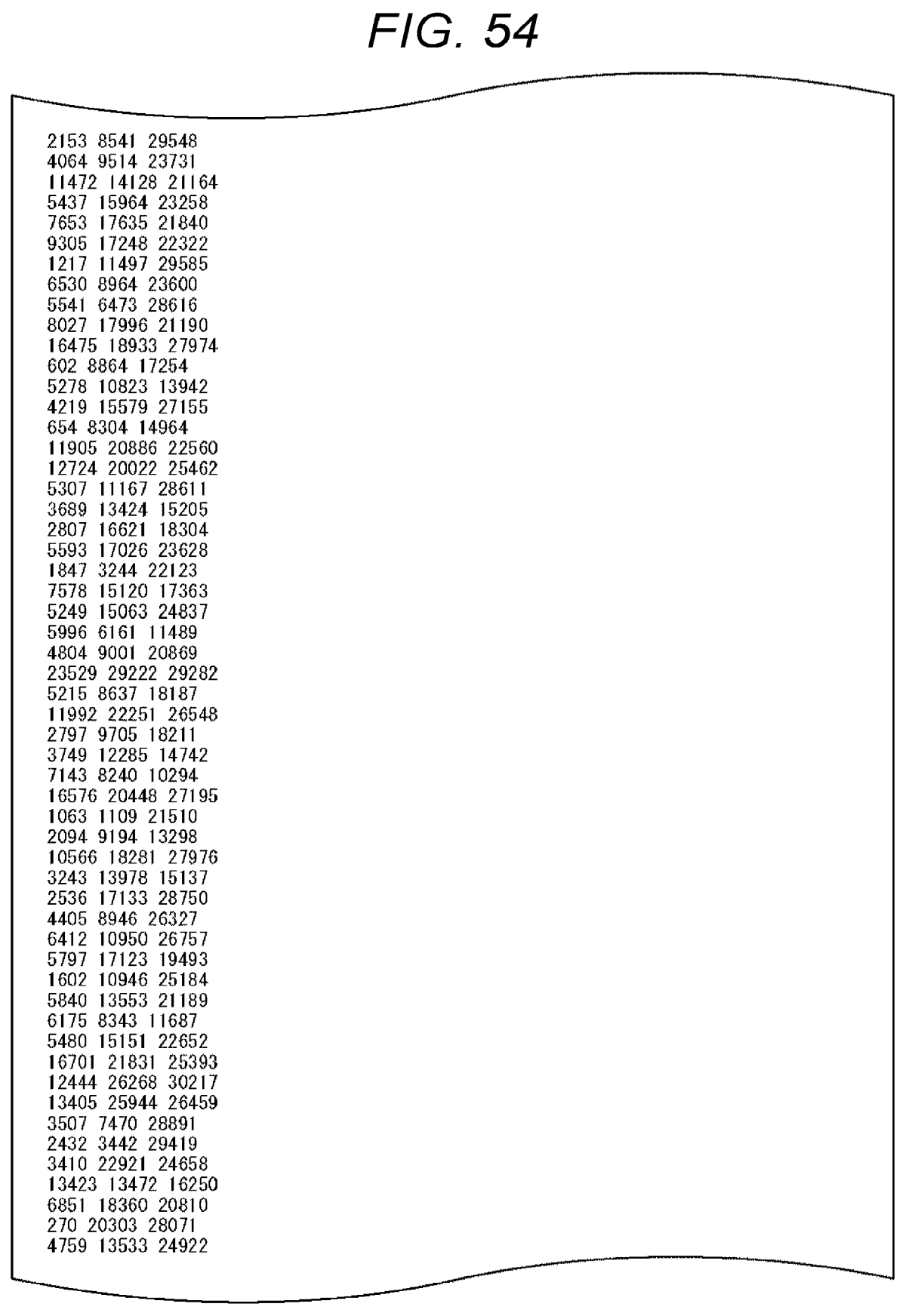
Figure 55:
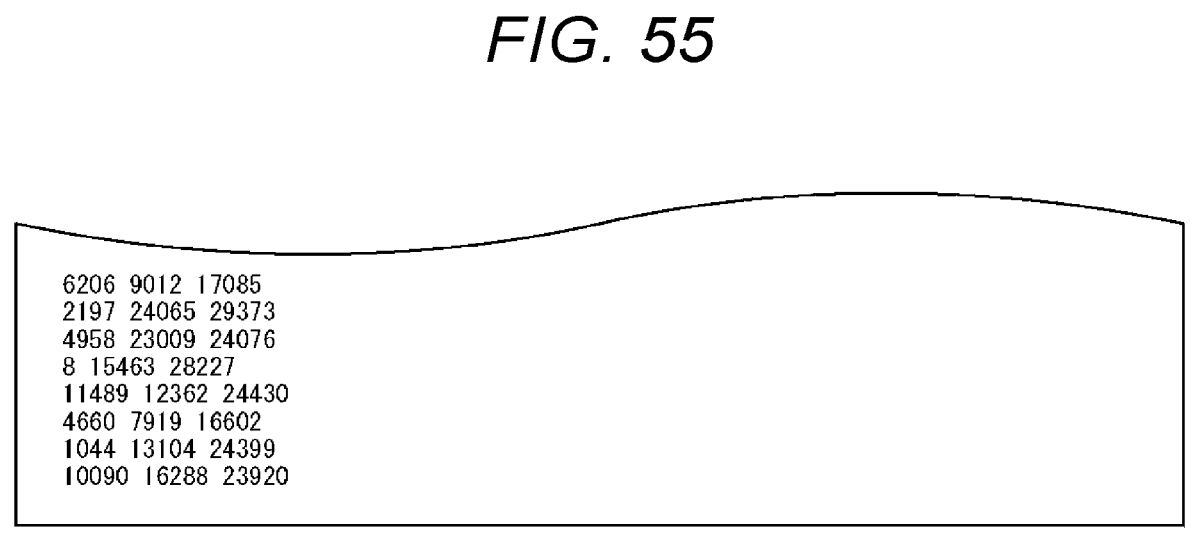

FIGS. 53, 54, and 55 are diagrams illustrating another example of a parity check matrix initial value table representing the parity check matrix H of the type B code with r=9/16.

Note that FIG. 54 is a diagram following FIG. 53 and FIG. 55 is a diagram following FIG. 54. The type B code with r=9/16 obtained from the parity check matrix initial value table in FIGS. 53 to 55 will be also hereinafter referred to as another type B code with r=9/16.

Figure 57:
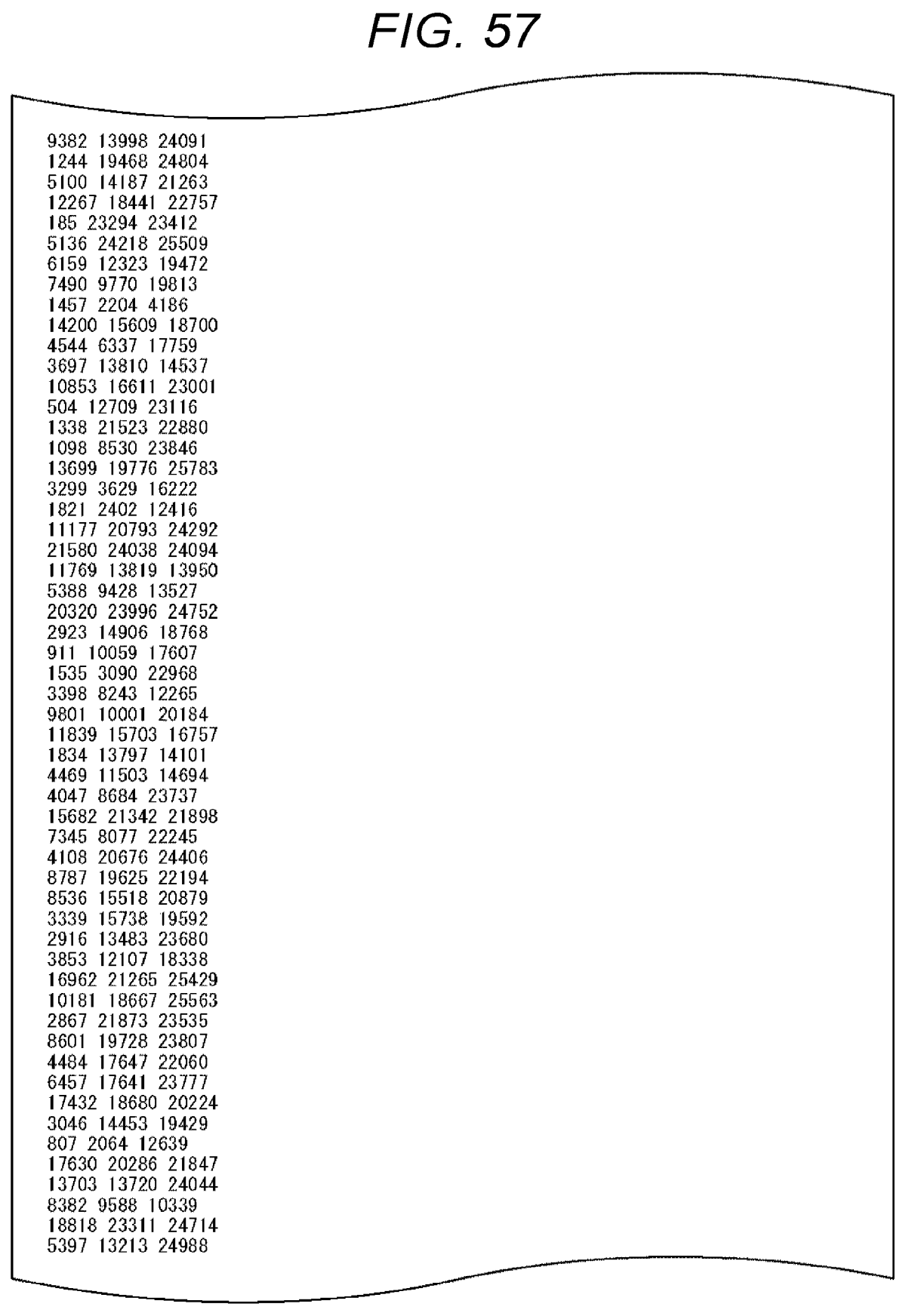
Figure 58:
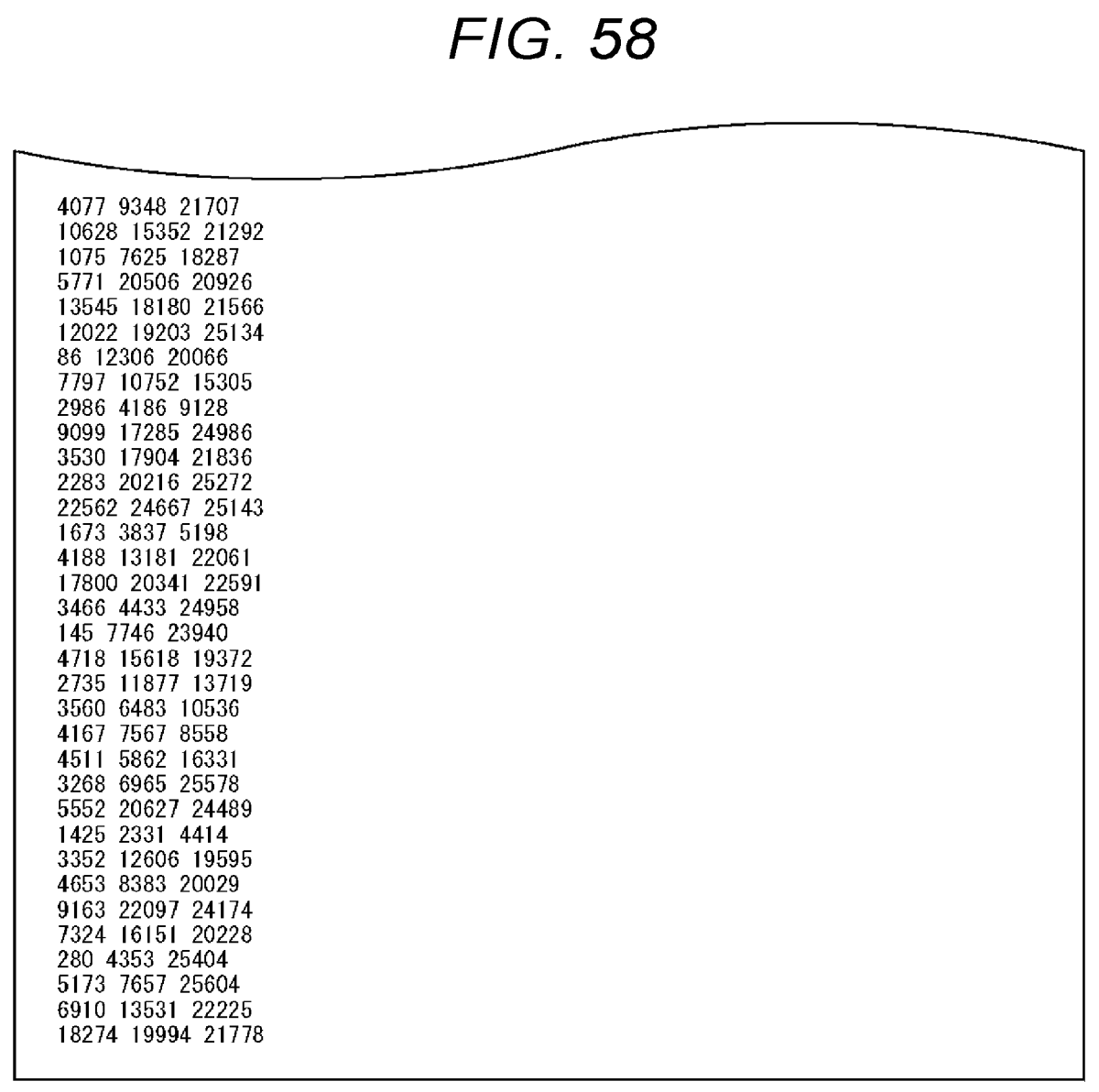

FIGS. 56, 57, and 58 are diagrams illustrating examples of a parity check matrix initial value table representing the parity check matrix H of the type B code (hereinafter also referred to as the type B code with r=10/16) as a new LDPC code with the code length N of 69120 bits and the coding rate r of 10/16.

Note that FIG. 57 is a diagram following FIG. 56 and FIG. 58 is a diagram following FIG. 57.

Figure 60:
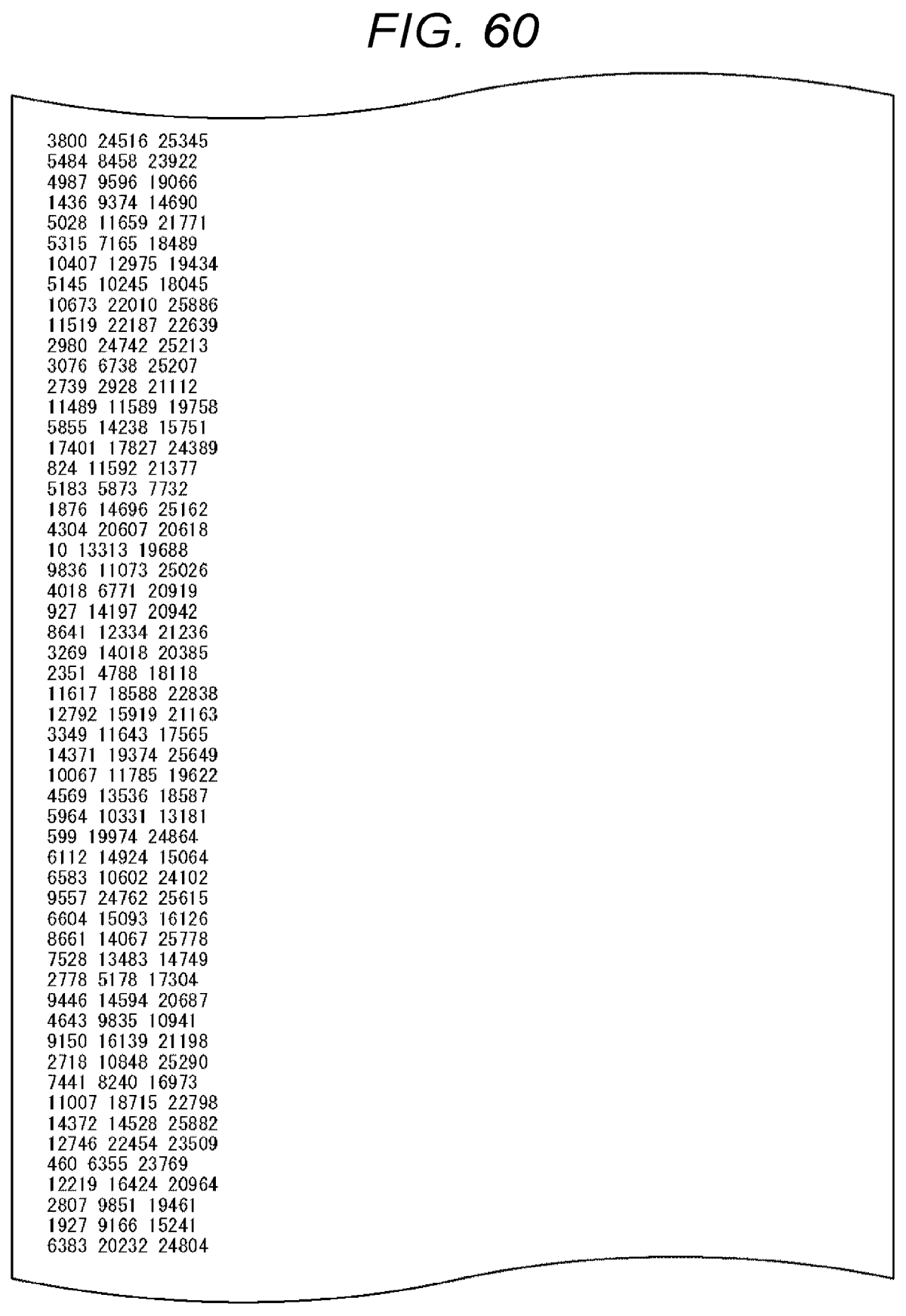
Figure 61:
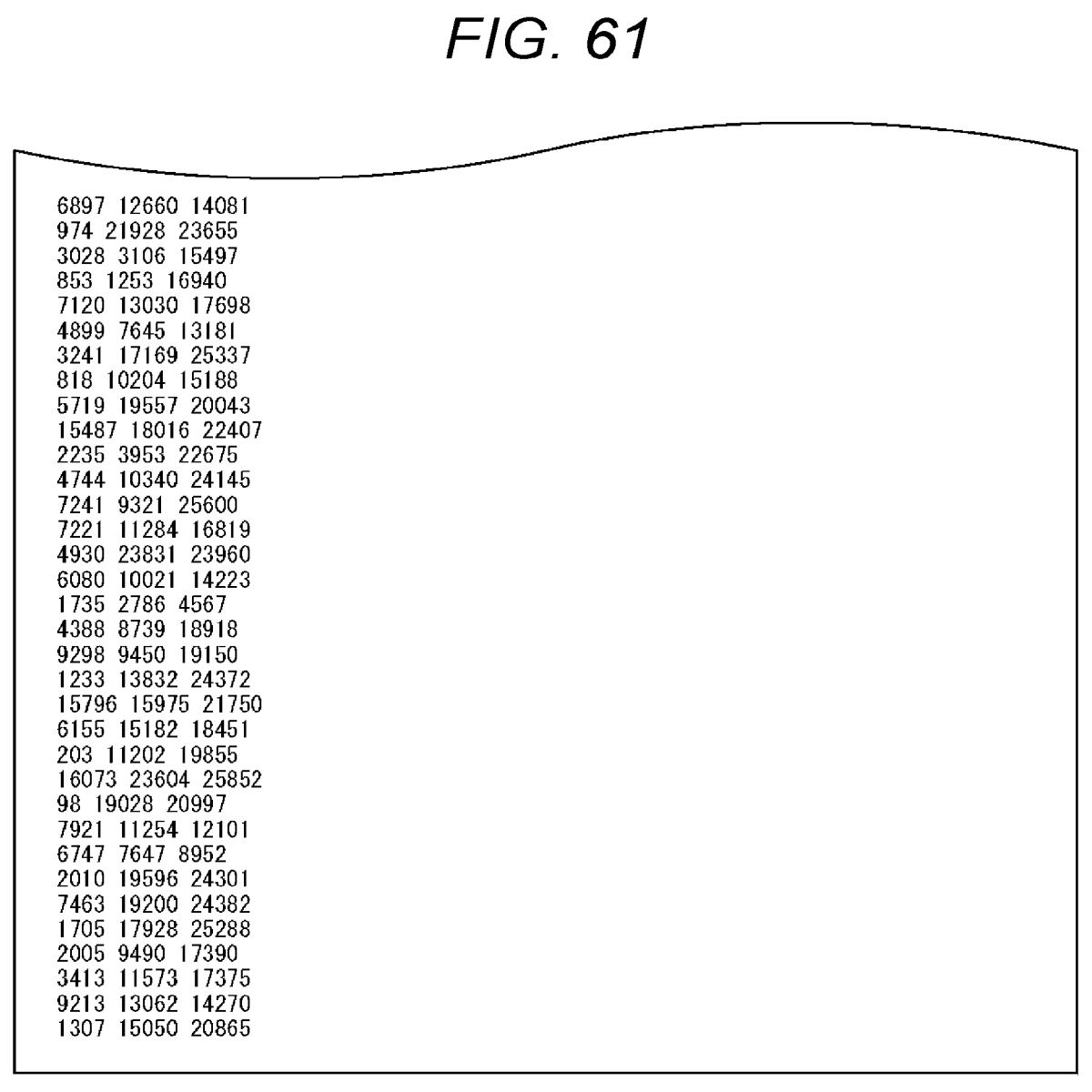

FIGS. 59, 60, and 61 are diagrams illustrating another example of a parity check matrix initial value table representing the parity check matrix H of the type B code with r=10/16.

Note that FIG. 60 is a diagram following FIG. 59 and FIG. 61 is a diagram following FIG. 60. The type B code with r=10/16 obtained from the parity check matrix initial value table in FIGS. 59 to 61 will be also hereinafter referred to as another type B code with r=10/16.

Figure 63:
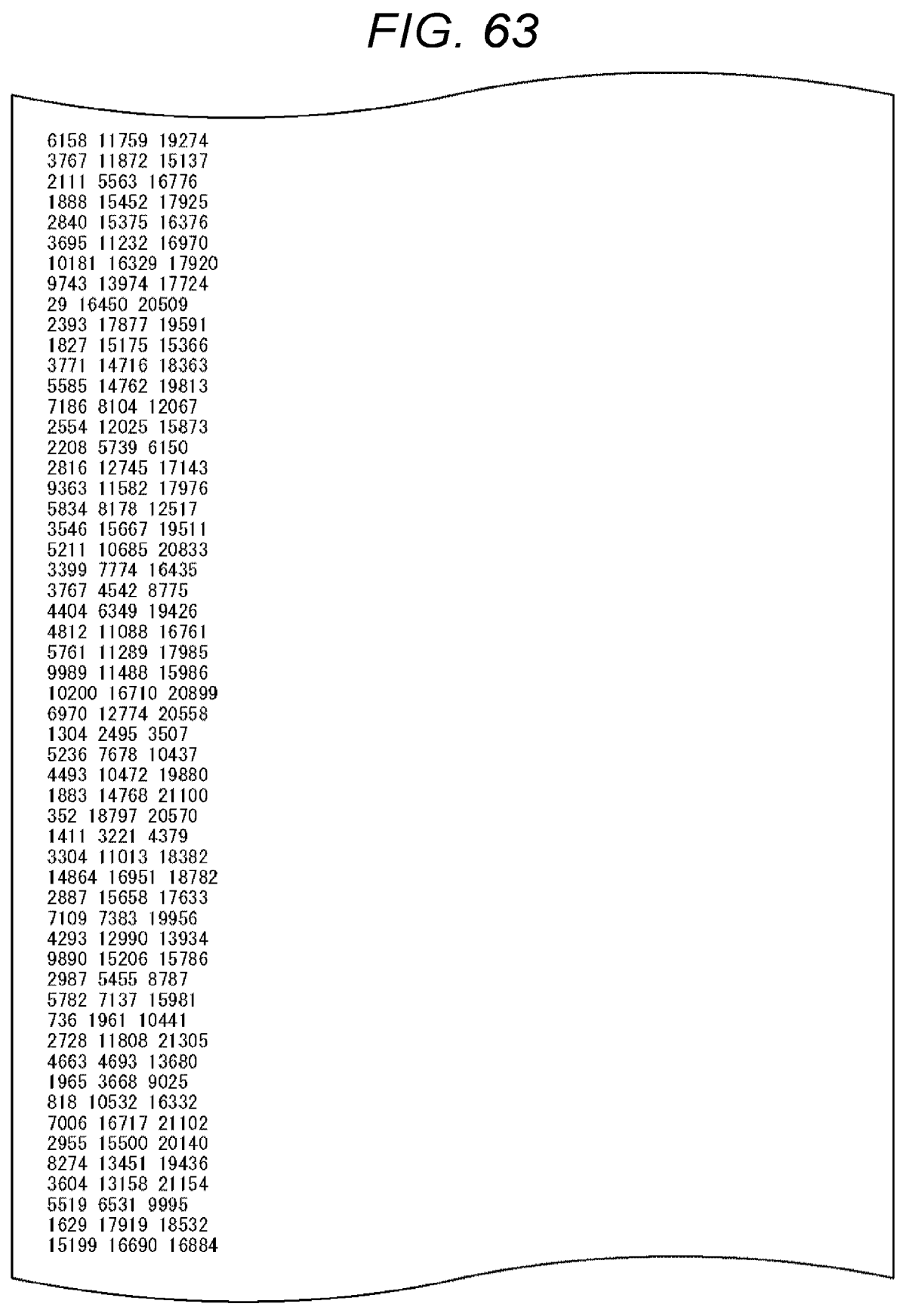
Figure 64:
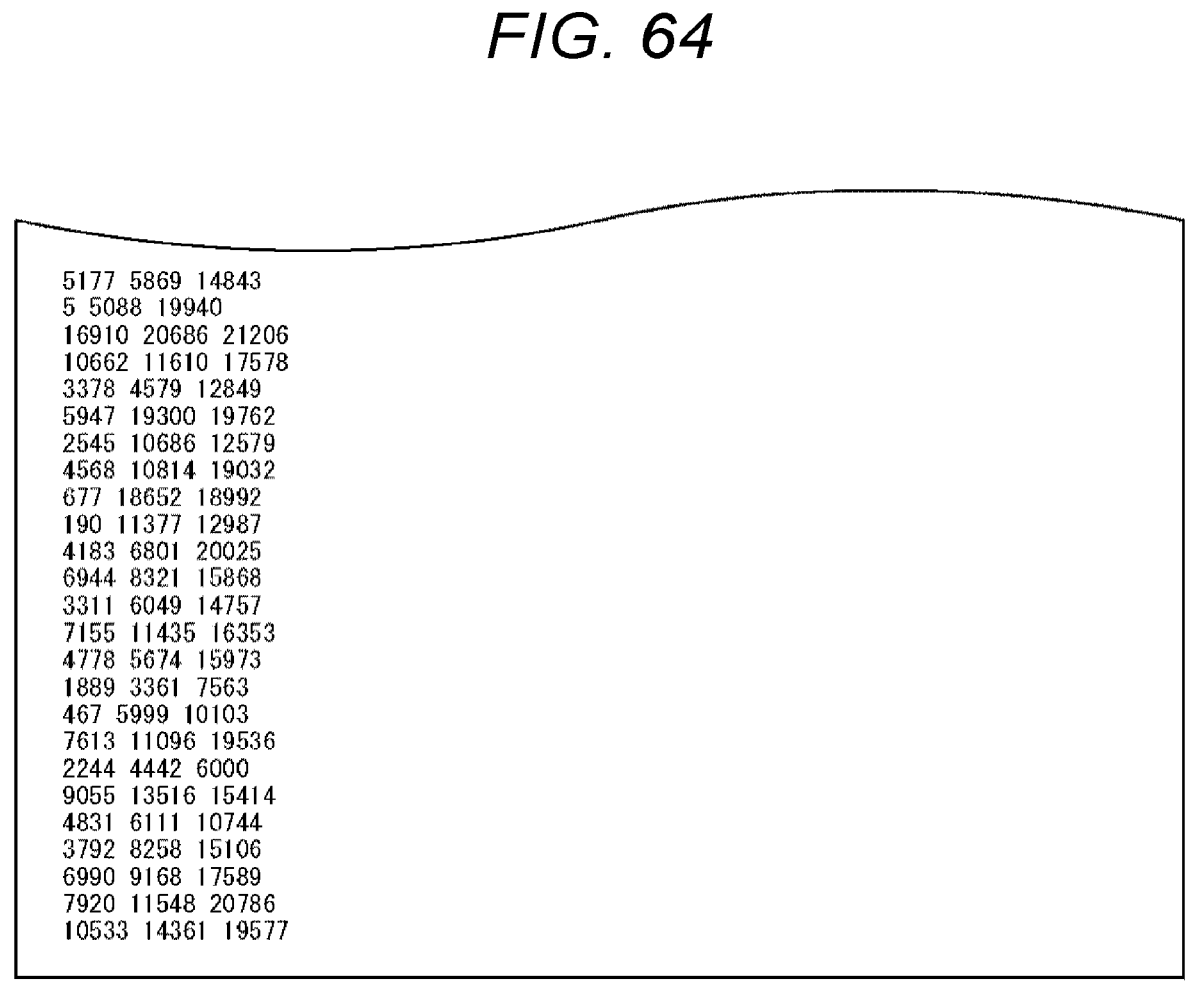

FIGS. 62, 63, and 64 are diagrams illustrating examples of a parity check matrix initial value table representing the parity check matrix H of the type B code (hereinafter also referred to as the type B code with r=11/16) as a new LDPC code with the code length N of 69120 bits and the coding rate r of 11/16.

Note that FIG. 63 is a diagram following FIG. 62 and FIG. 64 is a diagram following FIG. 63.

Figure 66:
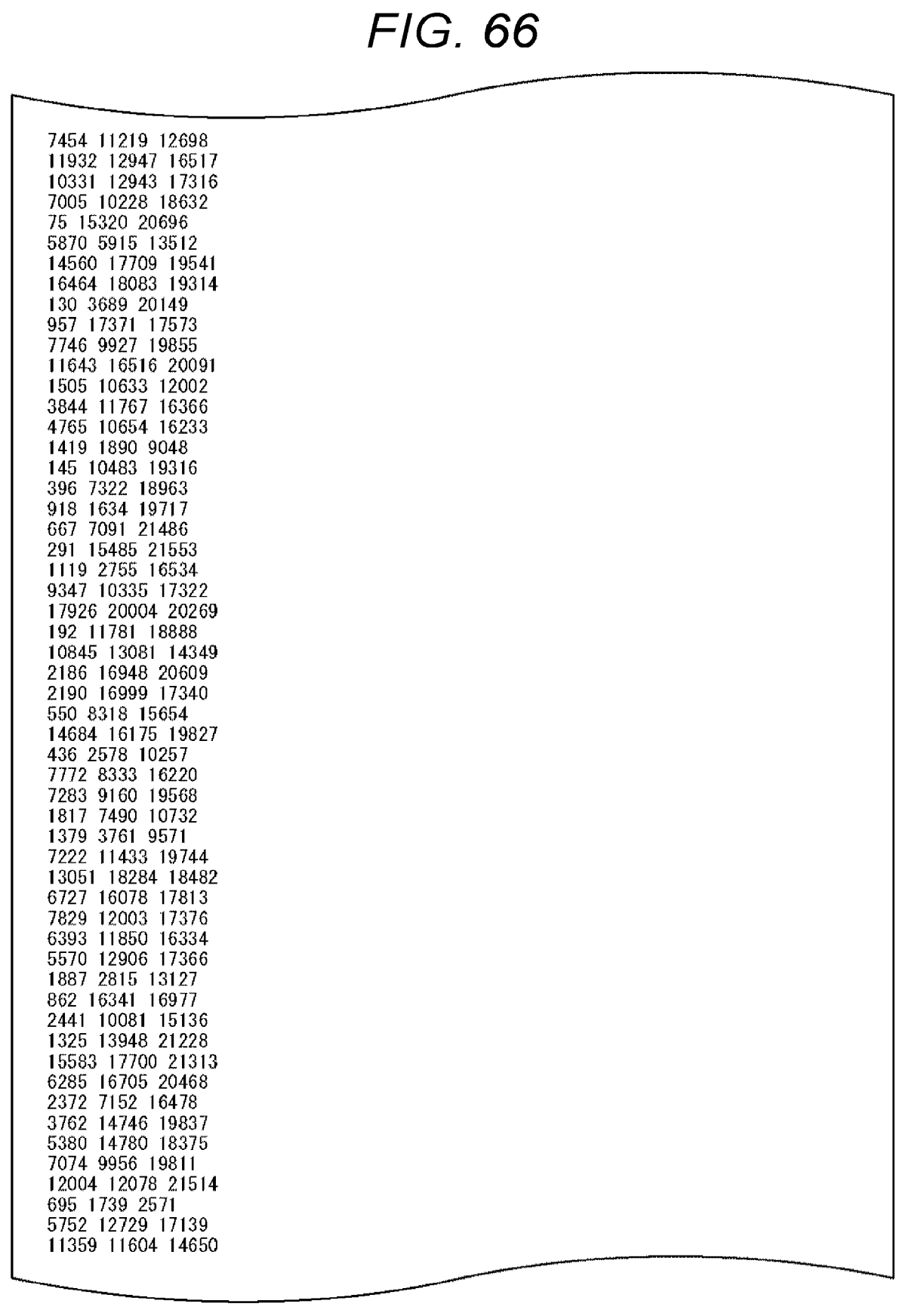
Figure 67:
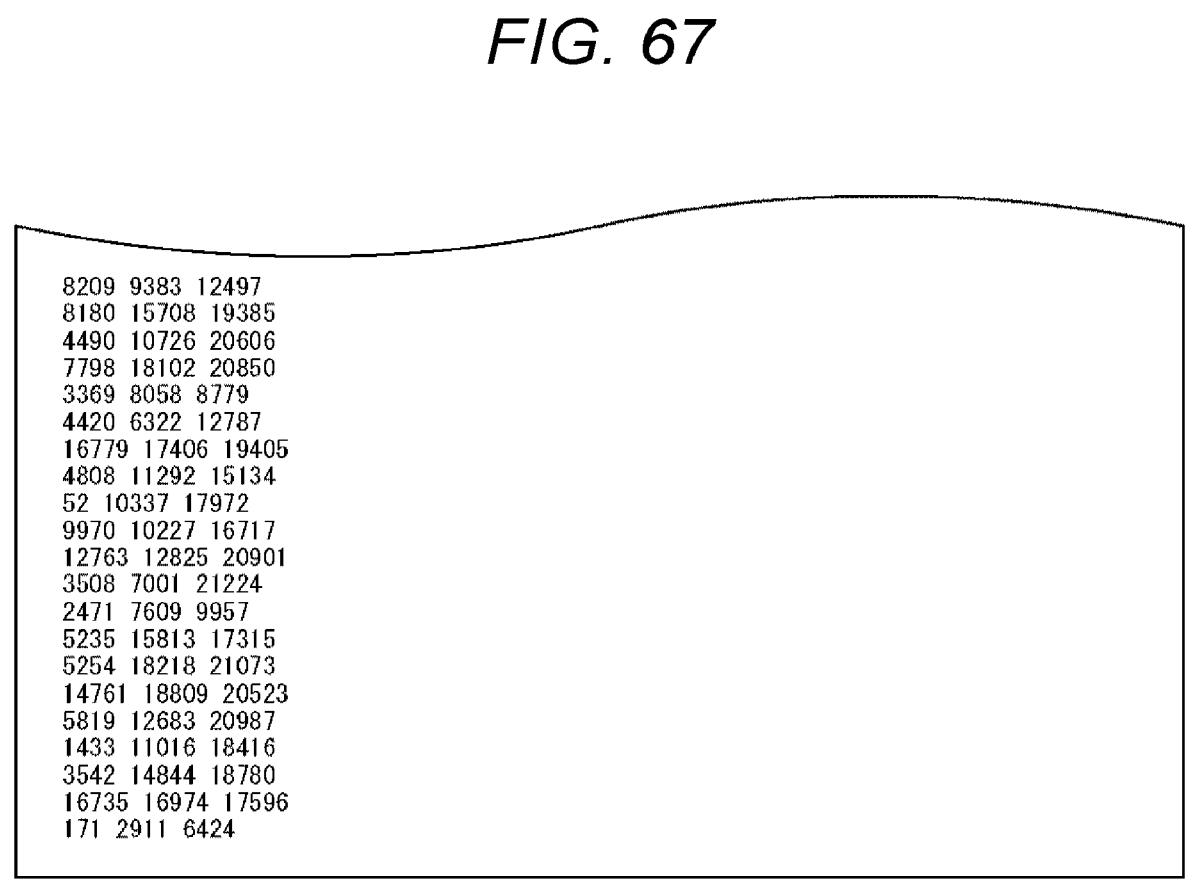

FIGS. 65, 66, and 67 are diagrams illustrating another example of a parity check matrix initial value table representing the parity check matrix H of the type B code with r=11/16.

Note that FIG. 66 is a diagram following FIG. 65 and FIG. 67 is a diagram following FIG. 66. The type B code with r=11/16 obtained from the parity check matrix initial value table in FIGS. 65 to 67 will be also hereinafter referred to as another type B code with r=11/16.

Figure 69:
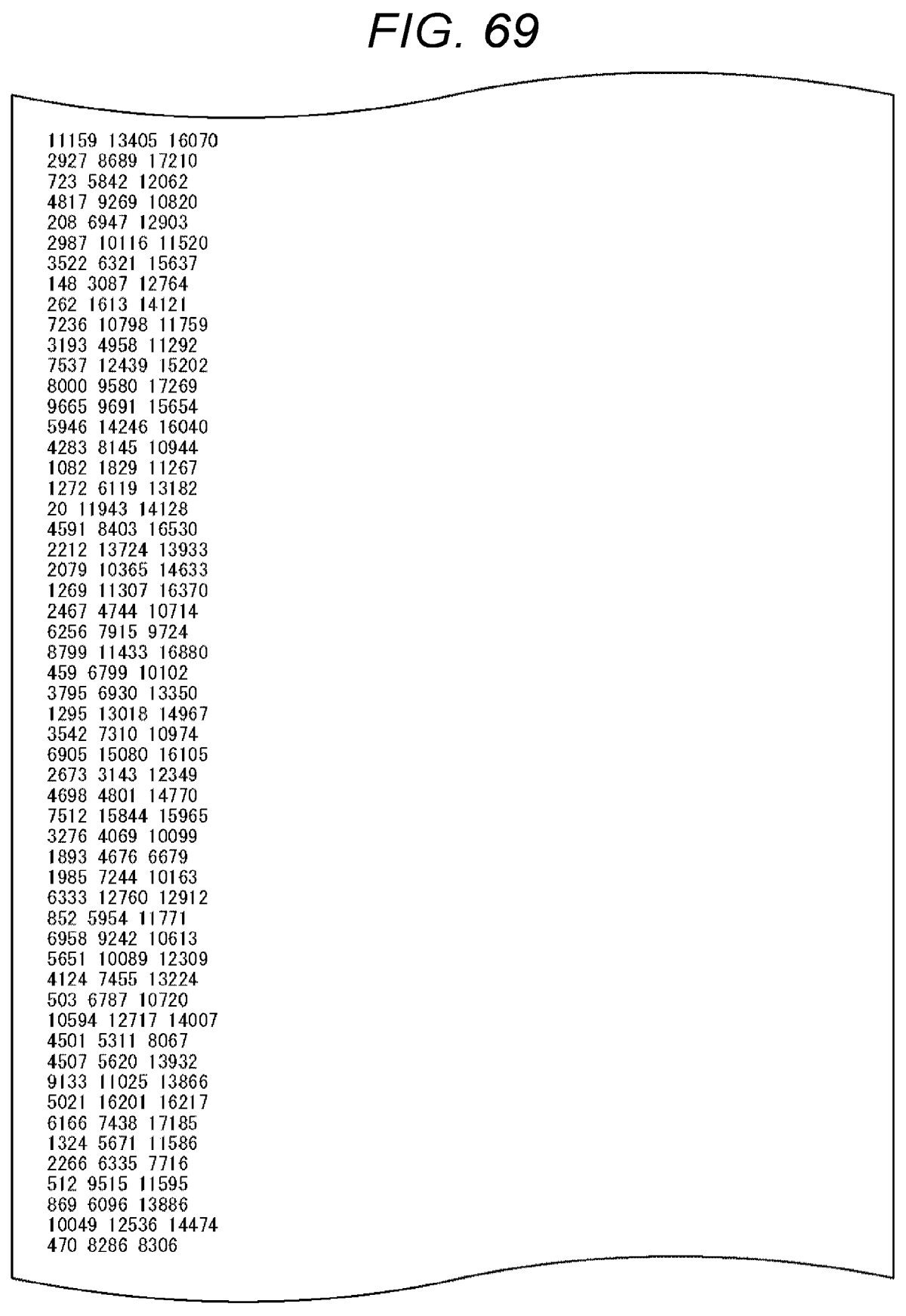
Figure 70:
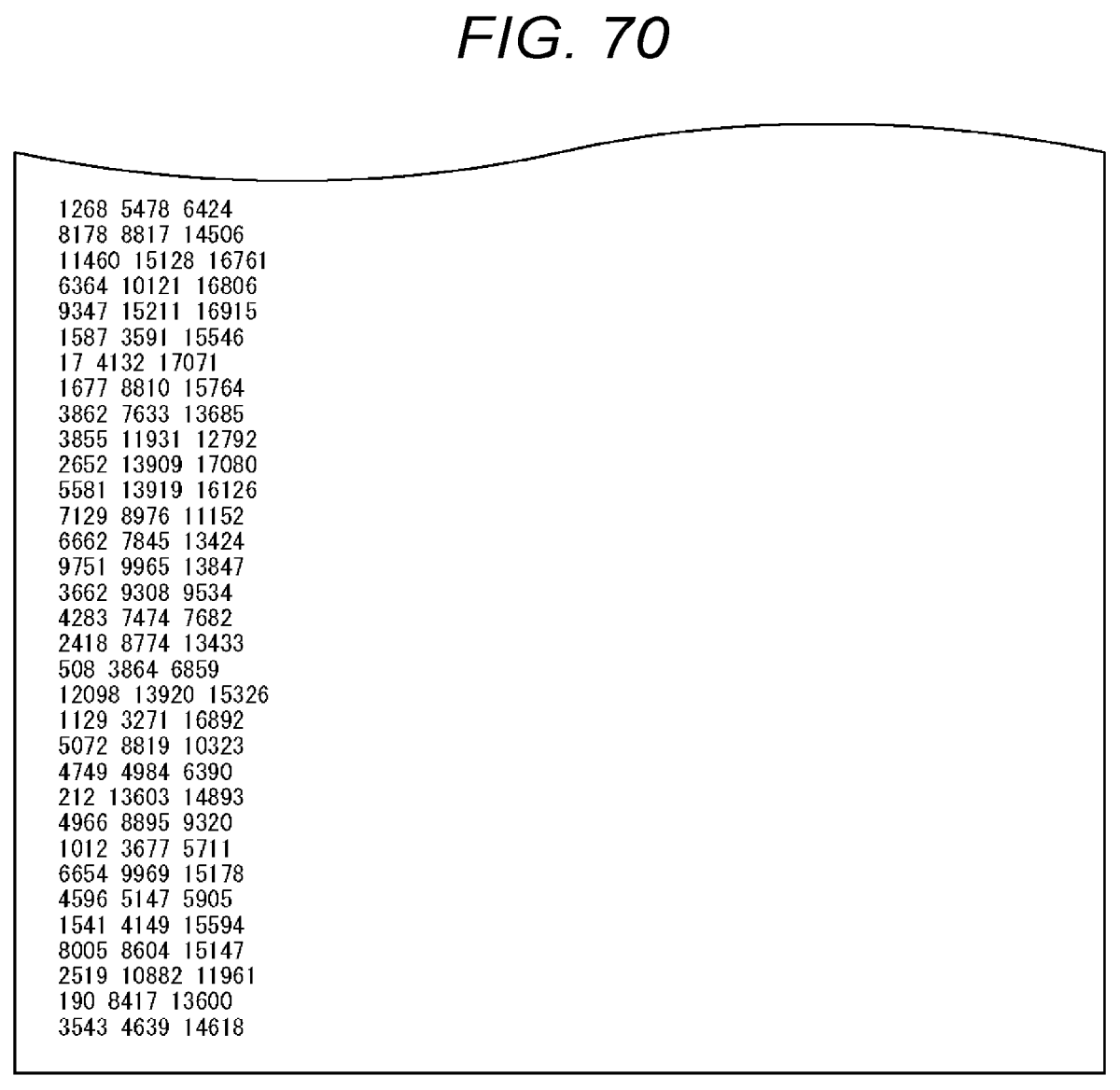

FIGS. 68, 69, and 70 are diagrams illustrating examples of a parity check matrix initial value table representing the parity check matrix H of the type B code (hereinafter also referred to as the type B code with r=12/16) as a new LDPC code with the code length N of 69120 bits and the coding rate r of 12/16.

Note that FIG. 69 is a diagram following FIG. 68 and FIG. 70 is a diagram following FIG. 69.

Figure 72:
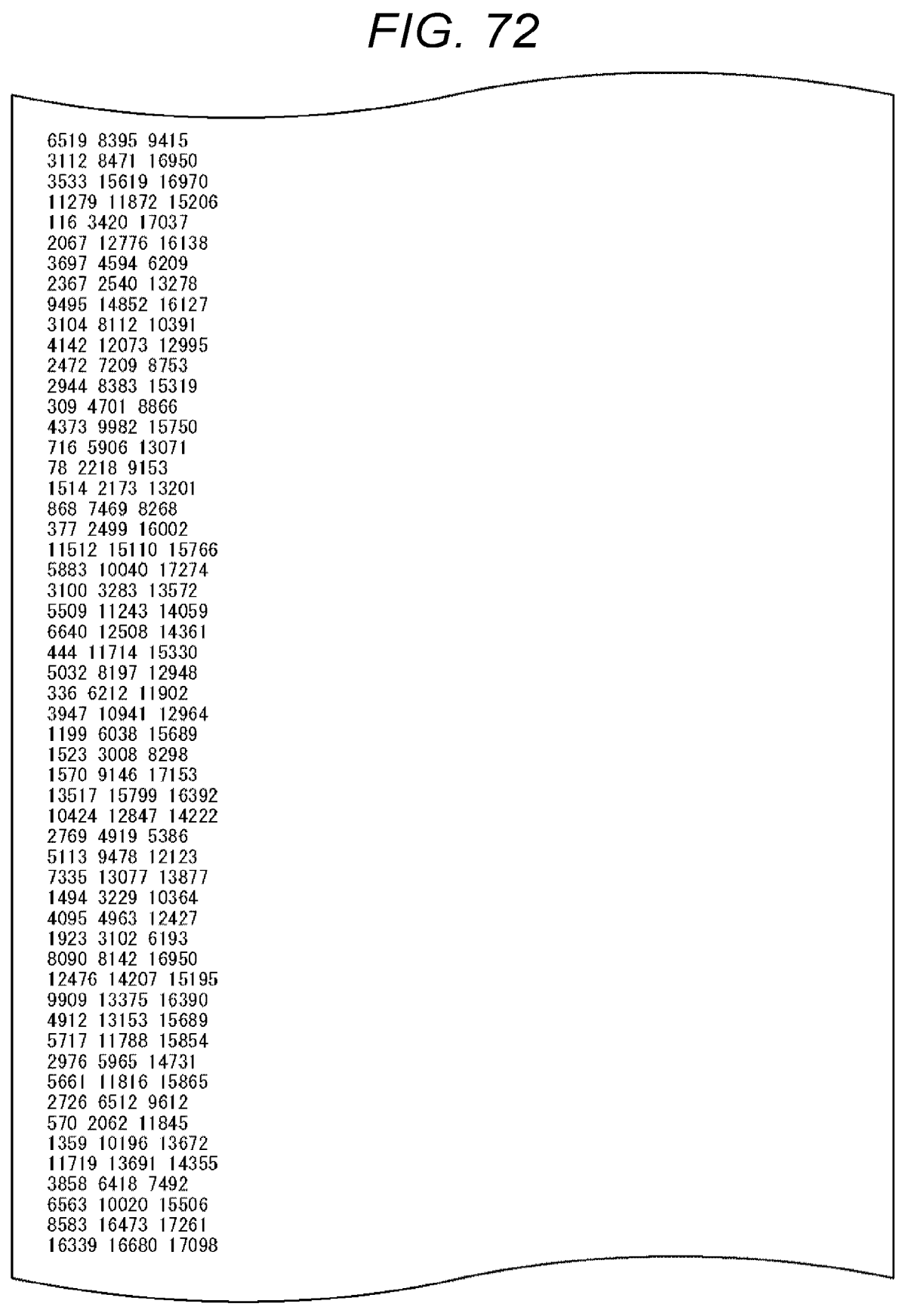
Figure 73:
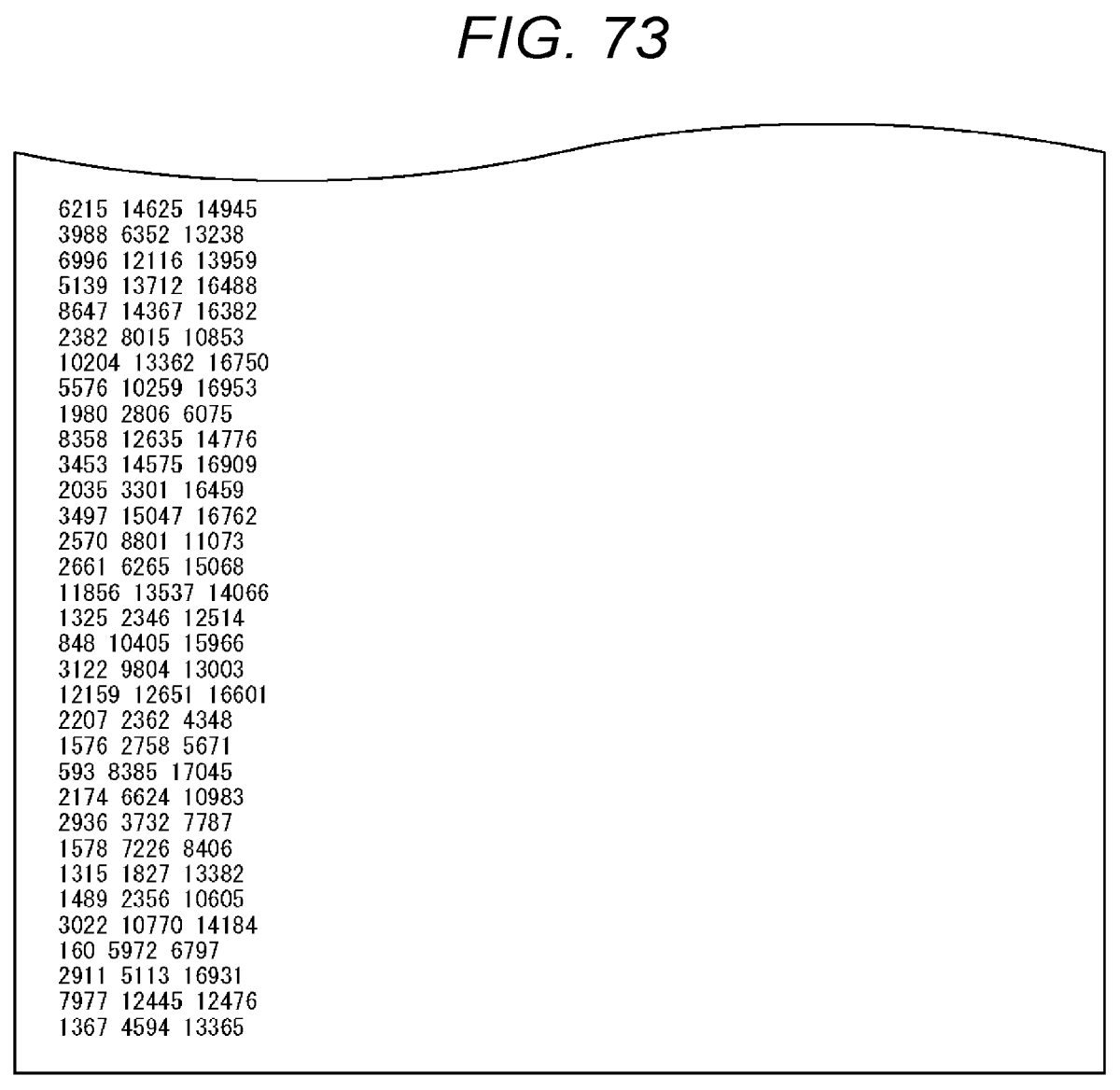

FIGS. 71, 72, and 73 are diagrams illustrating another example of a parity check matrix initial value table representing the parity check matrix H of the type B code with r=12/16.

Note that FIG. 72 is a diagram following FIG. 71 and FIG. 73 is a diagram following FIG. 72. The type B code with r=12/16 obtained from the parity check matrix initial value table in FIGS. 71 to 73 will be also hereinafter referred to as another type B code with r=12/16.

Figure 75:
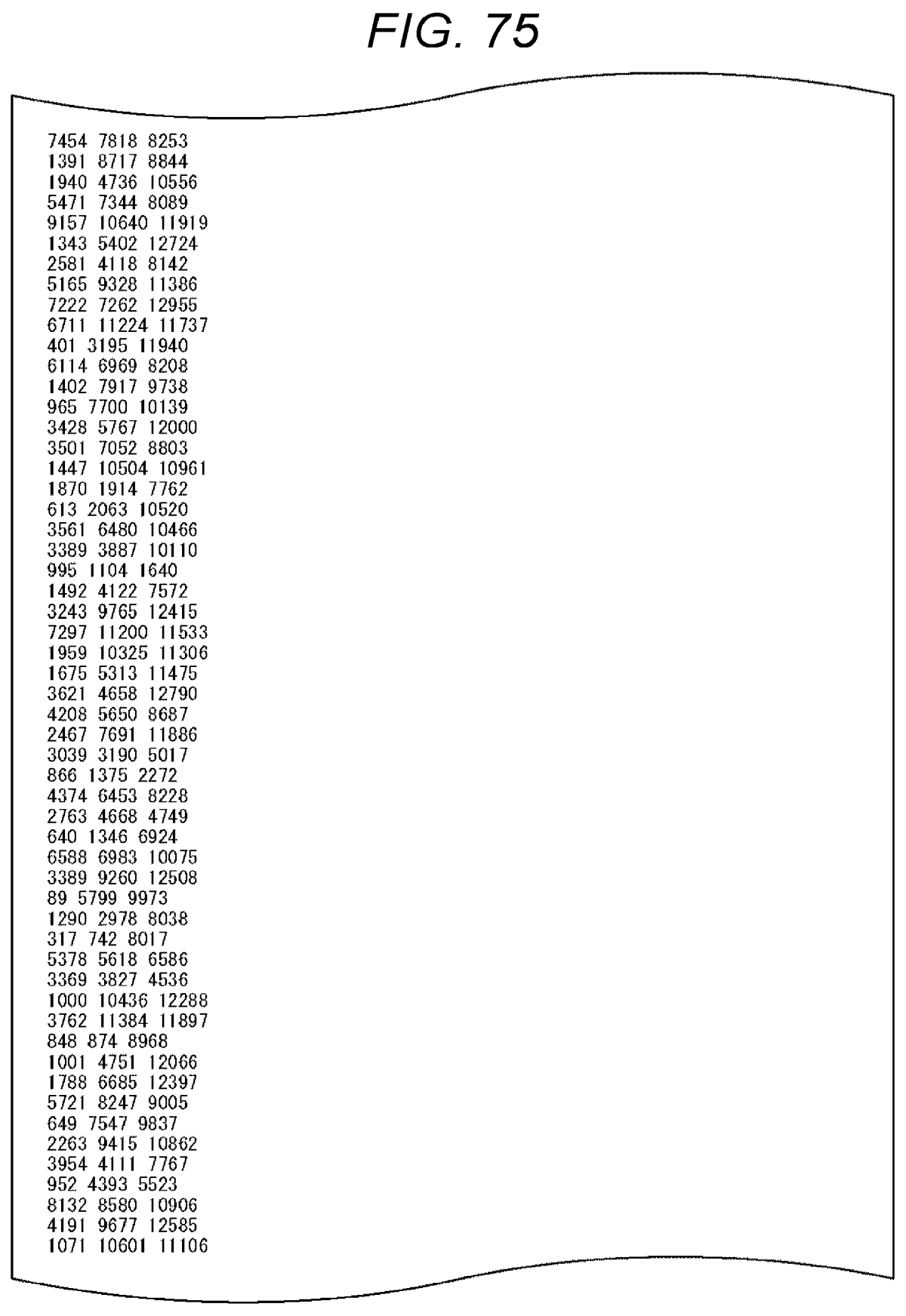
Figure 76:
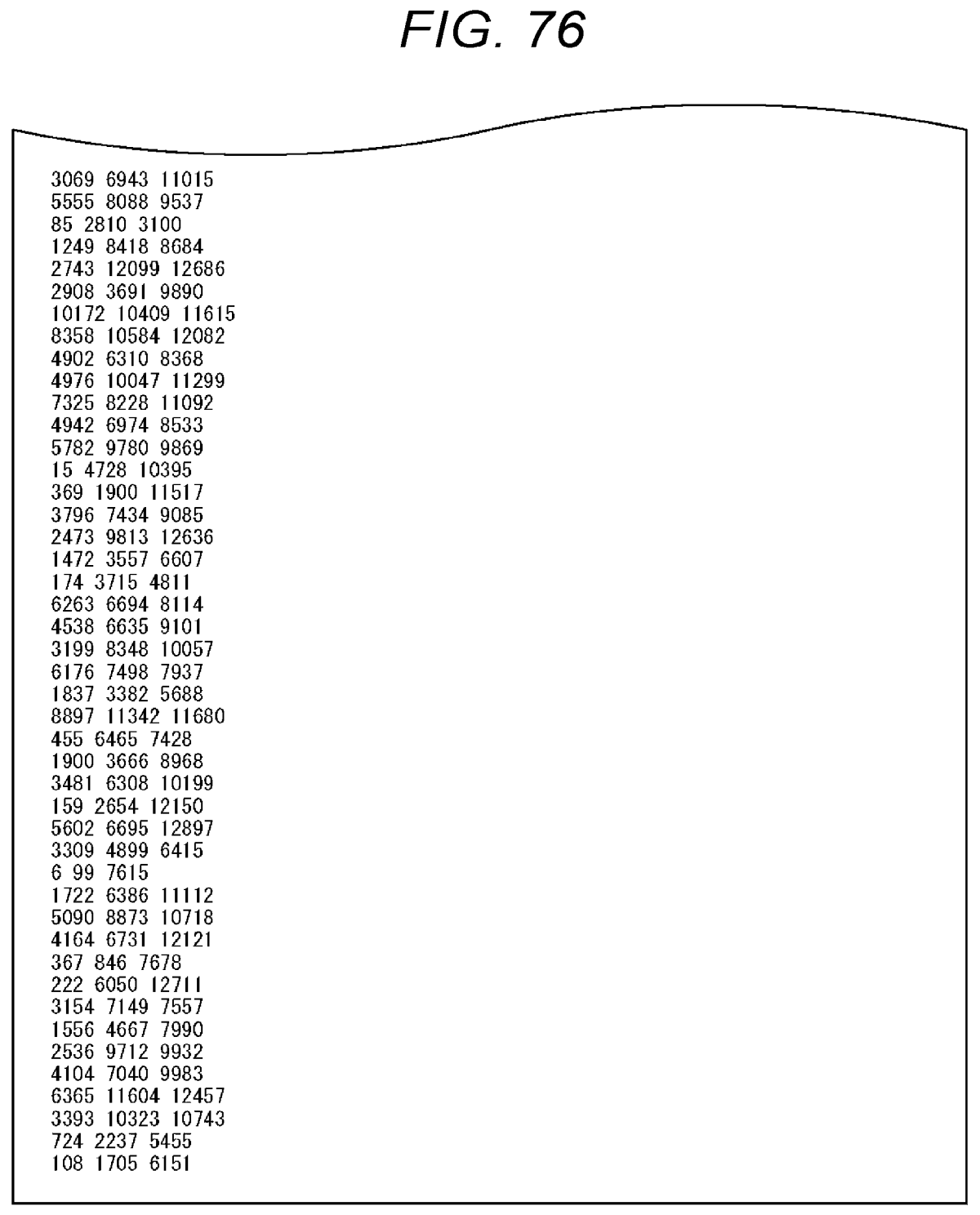

FIGS. 74, 75, and 76 are diagrams illustrating examples of a parity check matrix initial value table representing the parity check matrix H of the type B code (hereinafter also referred to as the type B code with r=13/16) as a new LDPC code with the code length N of 69120 bits and the coding rate r of 13/16.

Note that FIG. 75 is a diagram following FIG. 74 and FIG. 76 is a diagram following FIG. 75.

Figure 78:
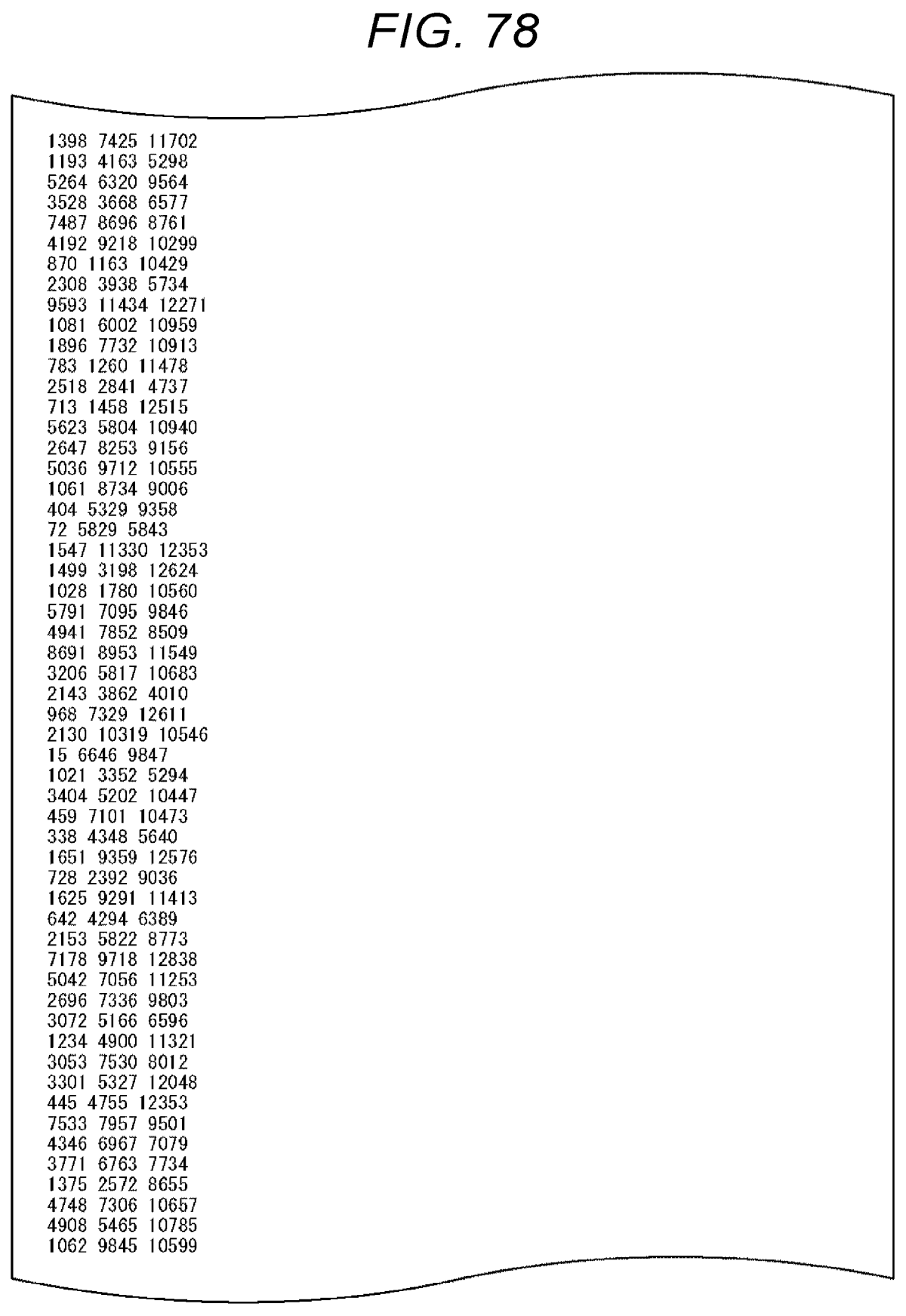
Figure 79:
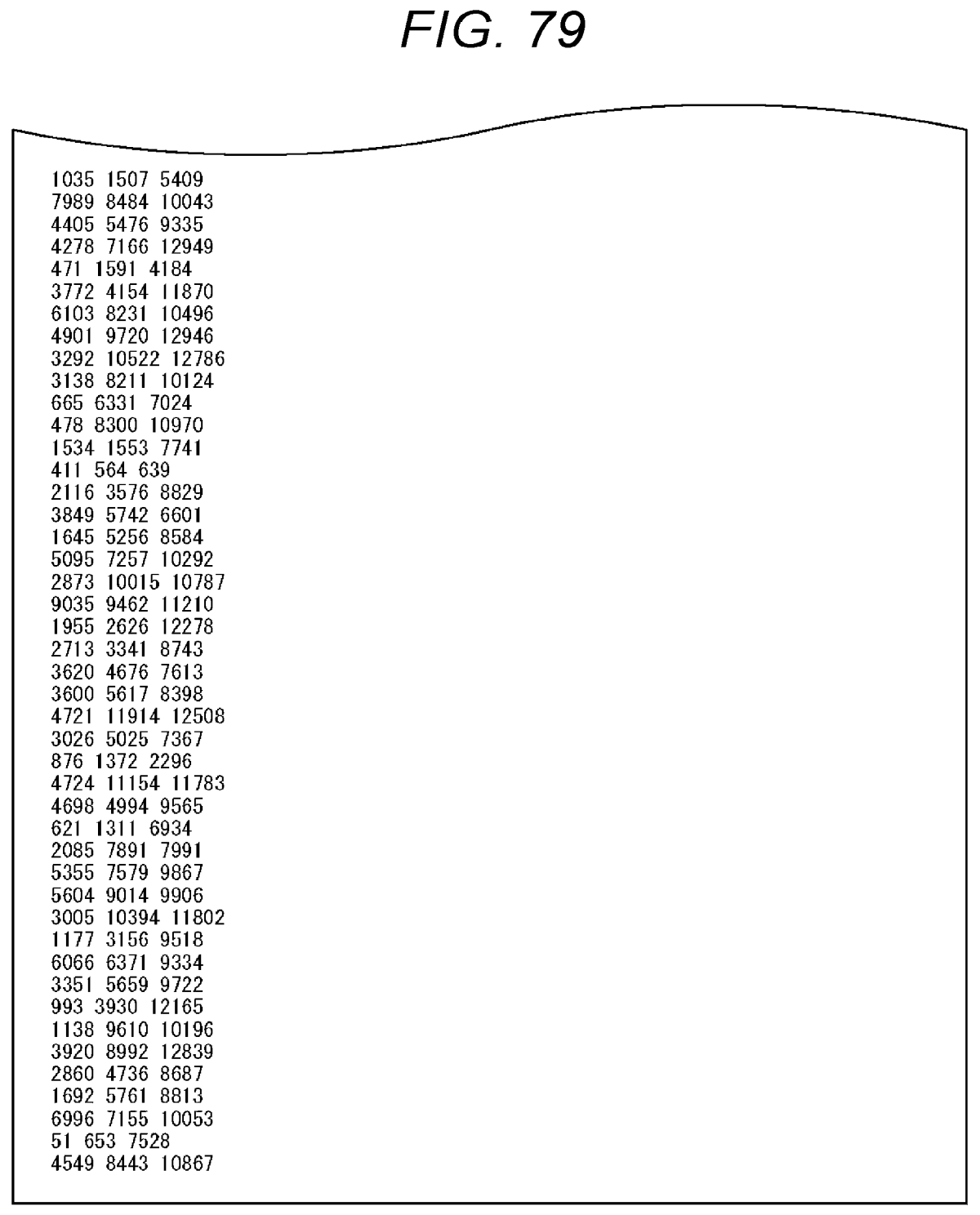

FIGS. 77, 78, and 79 are diagrams illustrating another example of a parity check matrix initial value table representing the parity check matrix H of the type B code with r=13/16.

Note that FIG. 78 is a diagram following FIG. 77 and FIG. 79 is a diagram following FIG. 78. The type B code with r=13/16 obtained from the parity check matrix initial value table in FIGS. 77 to 79 will be also hereinafter referred to as another type B code with r=13/16.

Figure 81:
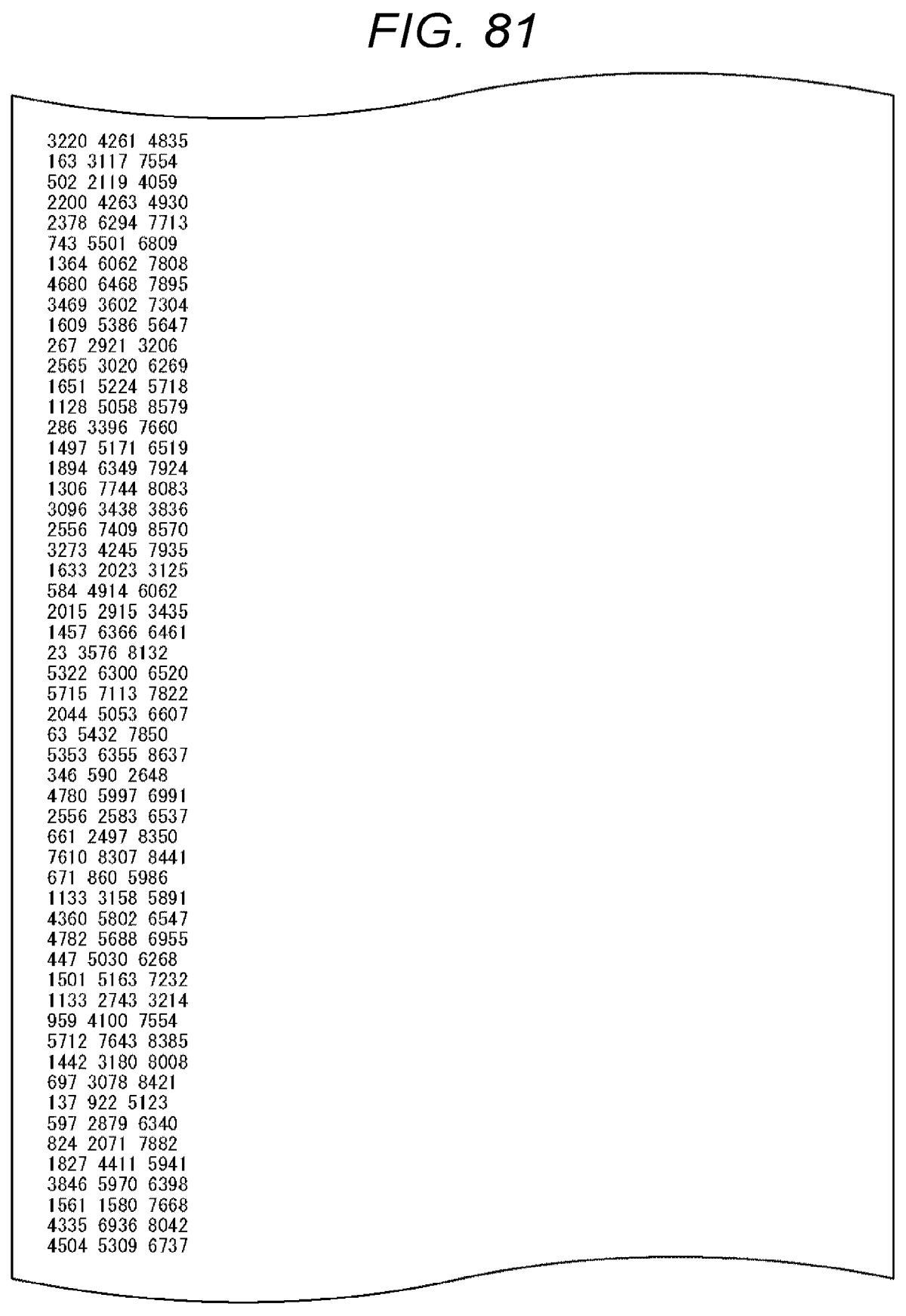
Figure 82:
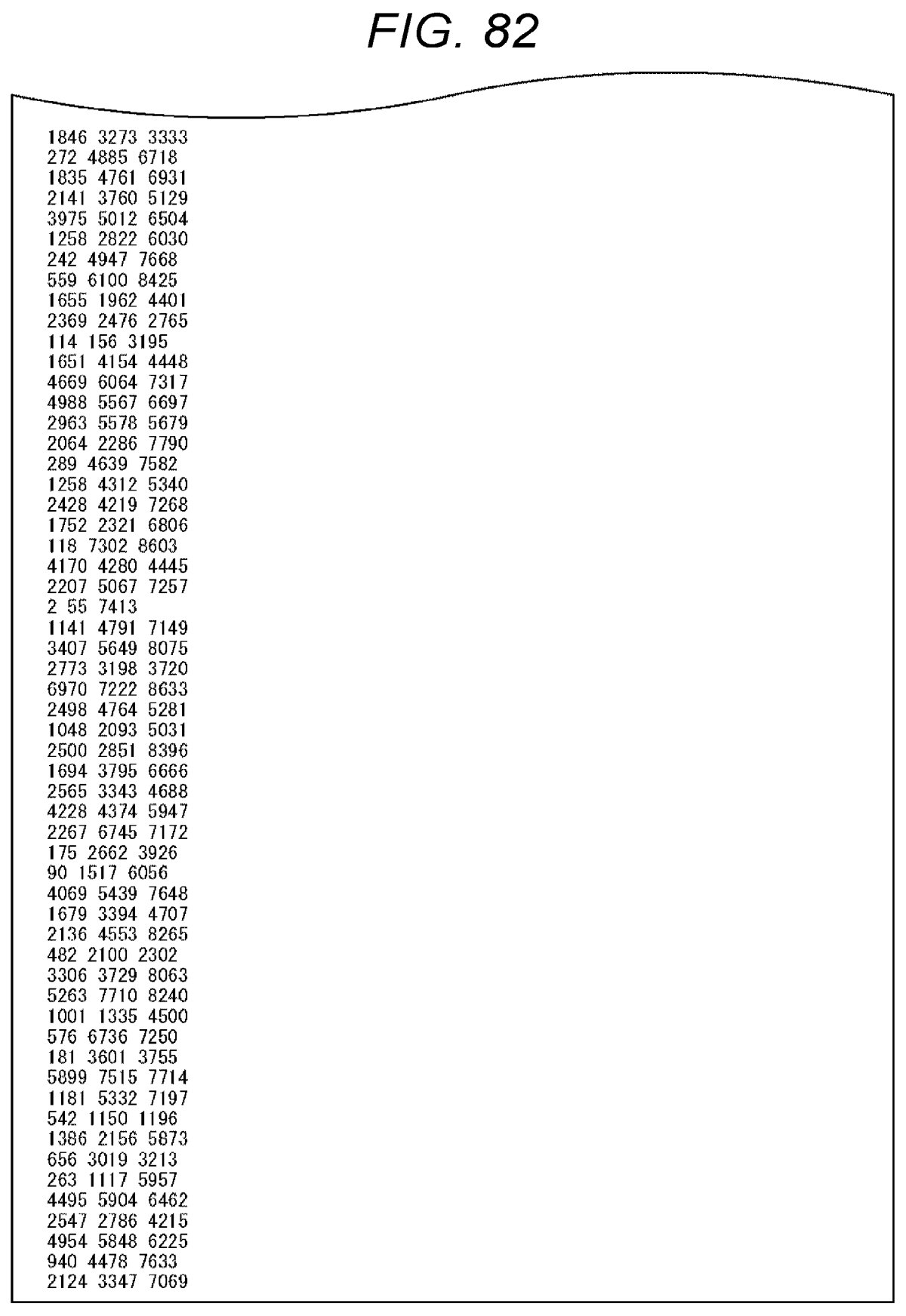

FIGS. 80, 81, and 82 are diagrams illustrating examples of a parity check matrix initial value table representing the parity check matrix H of the type B code (hereinafter also referred to as the type B code with r=14/16) as a new LDPC code with the code length N of 69120 bits and the coding rate r of 14/16.

Note that FIG. 81 is a diagram following FIG. 80 and FIG. 82 is a diagram following FIG. 81.

Figure 84:
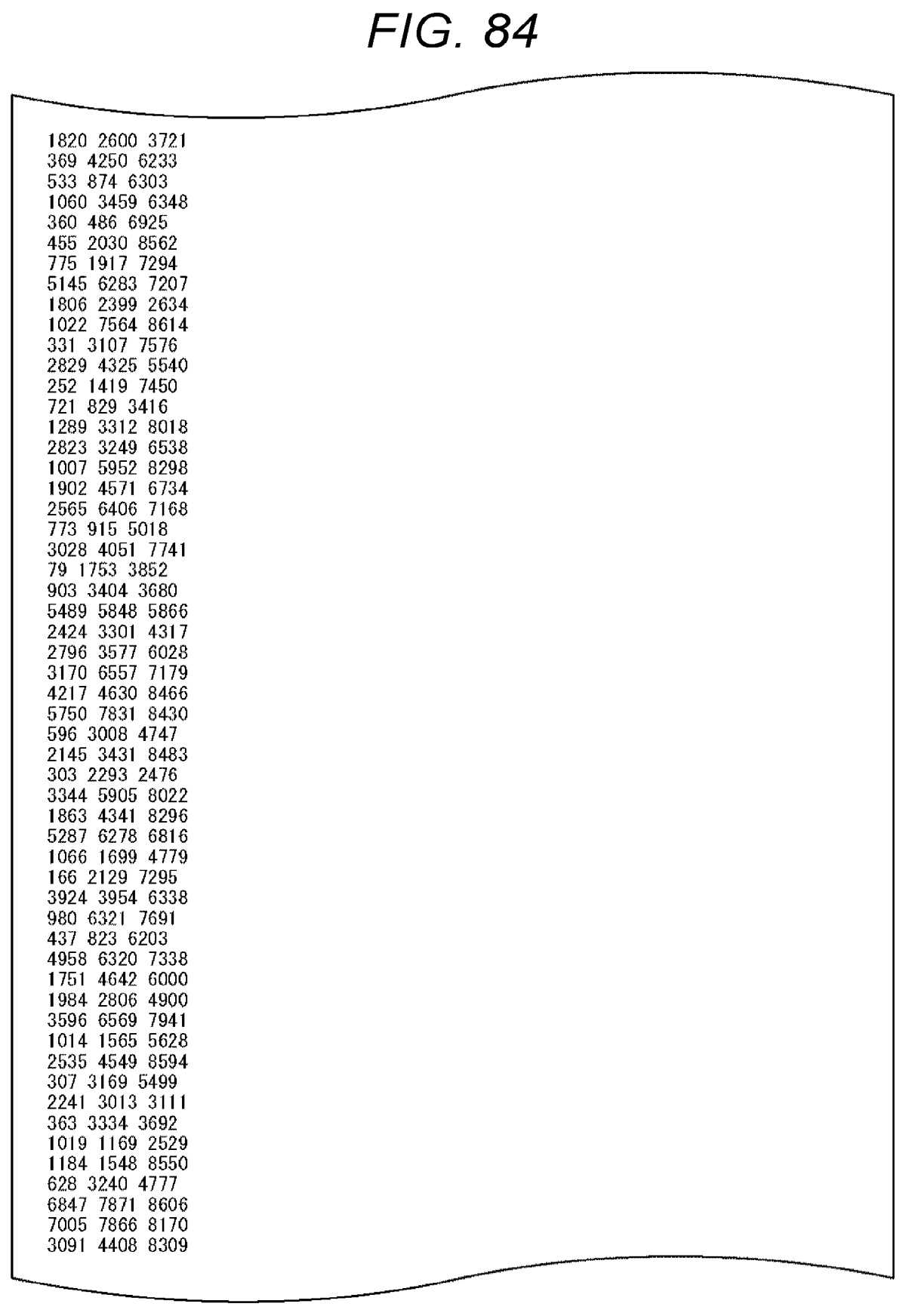
Figure 85:
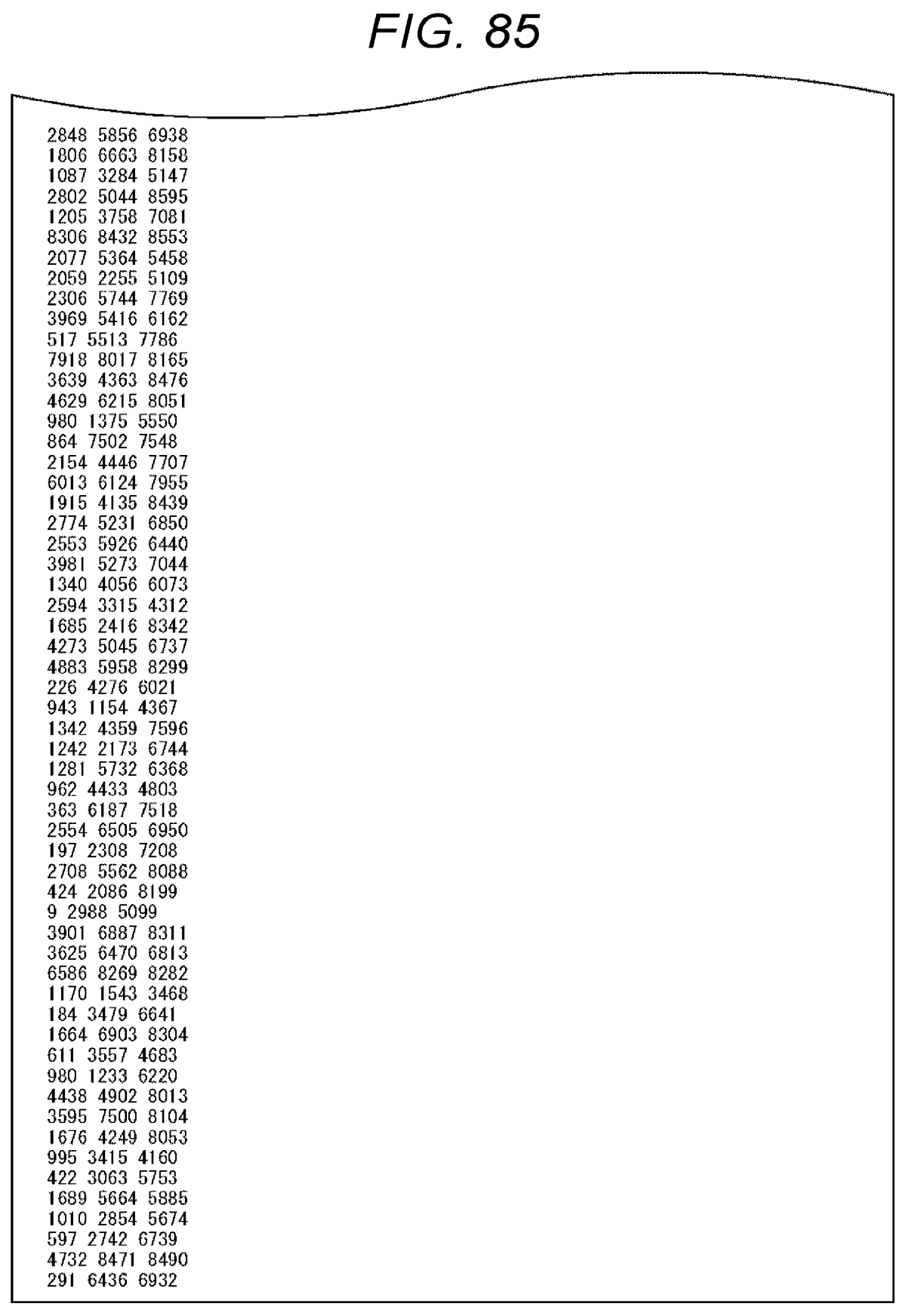

FIGS. 83, 84, and 85 are diagrams illustrating another example of a parity check matrix initial value table representing the parity check matrix H of the type B code with r=14/16.

Note that FIG. 84 is a diagram following FIG. 83 and FIG. 85 is a diagram following FIG. 84. The type B code with r=14/16 obtained from the parity check matrix initial value table in FIGS. 83 to 85 will be also hereinafter referred to as another type B code with r=14/16.

The new LDPC code has become an LDPC code with high performance.

Here, the LDPC code with high performance is an LDPC code obtained from an appropriate parity check matrix H.

The appropriate parity check matrix H is, for example, a parity check matrix that satisfies a predetermined condition that makes a bit error rate (BER) (and a frame error rate (FER)) smaller when the LDPC code obtained from the parity check matrix H is transmitted at low $E_s/N_0$ or $E_b/N_o$ (signal power to noise power ratio per bit).

The appropriate parity check matrix H can be obtained by, for example, performing a simulation to measure BERs of when LDPC codes obtained from various parity check matrices satisfying the predetermined condition are transmitted at low $E_s/N_o$.

Examples of the predetermined condition to be satisfied by the appropriate parity check matrix H include a good analysis result obtained by an analysis method of performance of code called density evolution, and absence of a loop of the elements of 1, called cycle 4.

Here, it is known that the decoding performance of the LDPC code is degraded if the elements of 1 are densely packed in the information matrix $H_A$ as in the cycle 4, and therefore, absence of the cycle 4 is desirable in the parity check matrix H.

In the parity check matrix H, a minimum value of the length of a loop (loop length) configured by the elements of 1 is called girth. The absence of the cycle 4 means that the girth is greater than 4.

Note that the predetermined condition to be satisfied by the appropriate parity check matrix H can be appropriately determined from the viewpoints of improvement of the decoding performance of the LDPC code, facilitation (simplification) of the decoding processing for the LDPC code, and the like.

Figure 86:
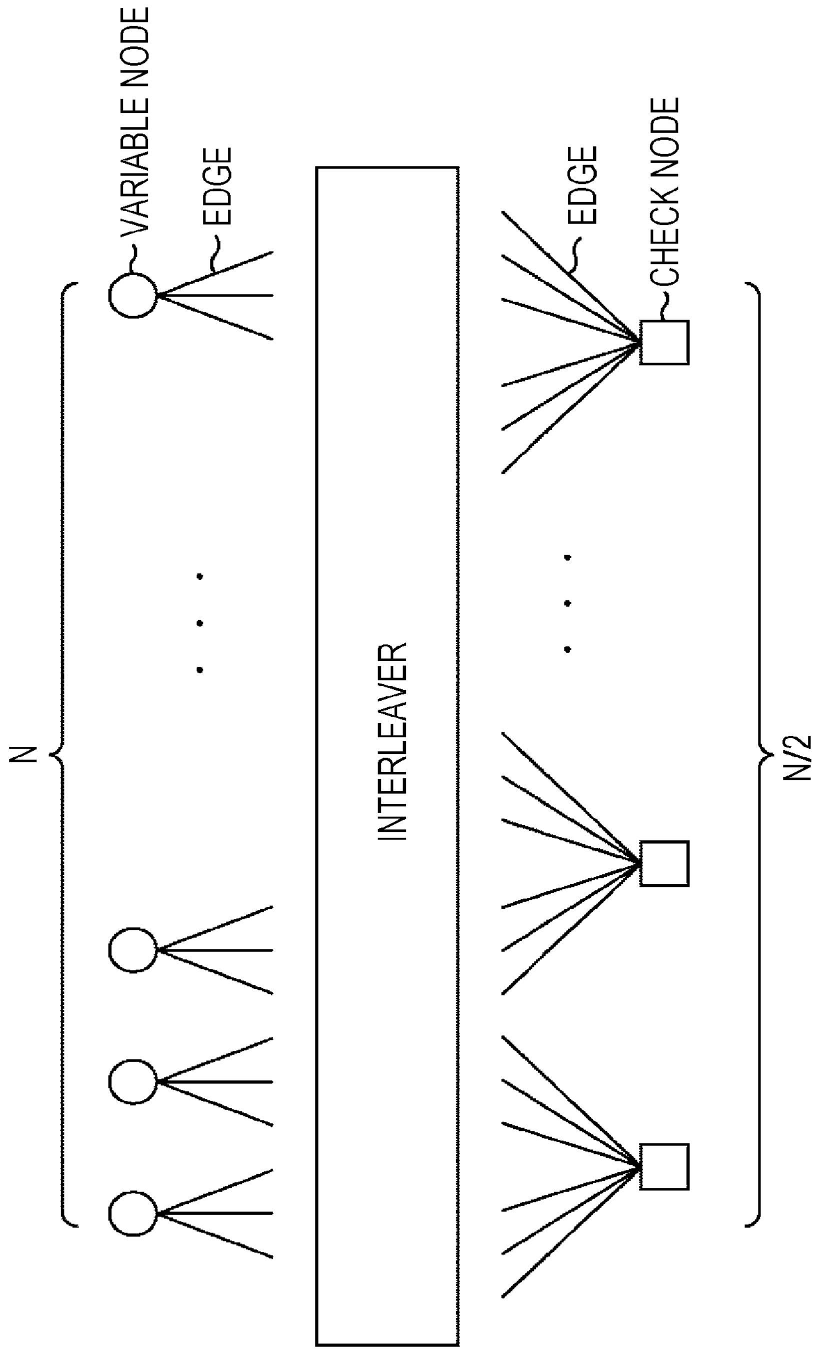
FIG. 86 is a diagram illustrating an example of a Tanner graph of a degree sequence ensemble with a column weight of 3 and a row weight of 6.
Figure 87:
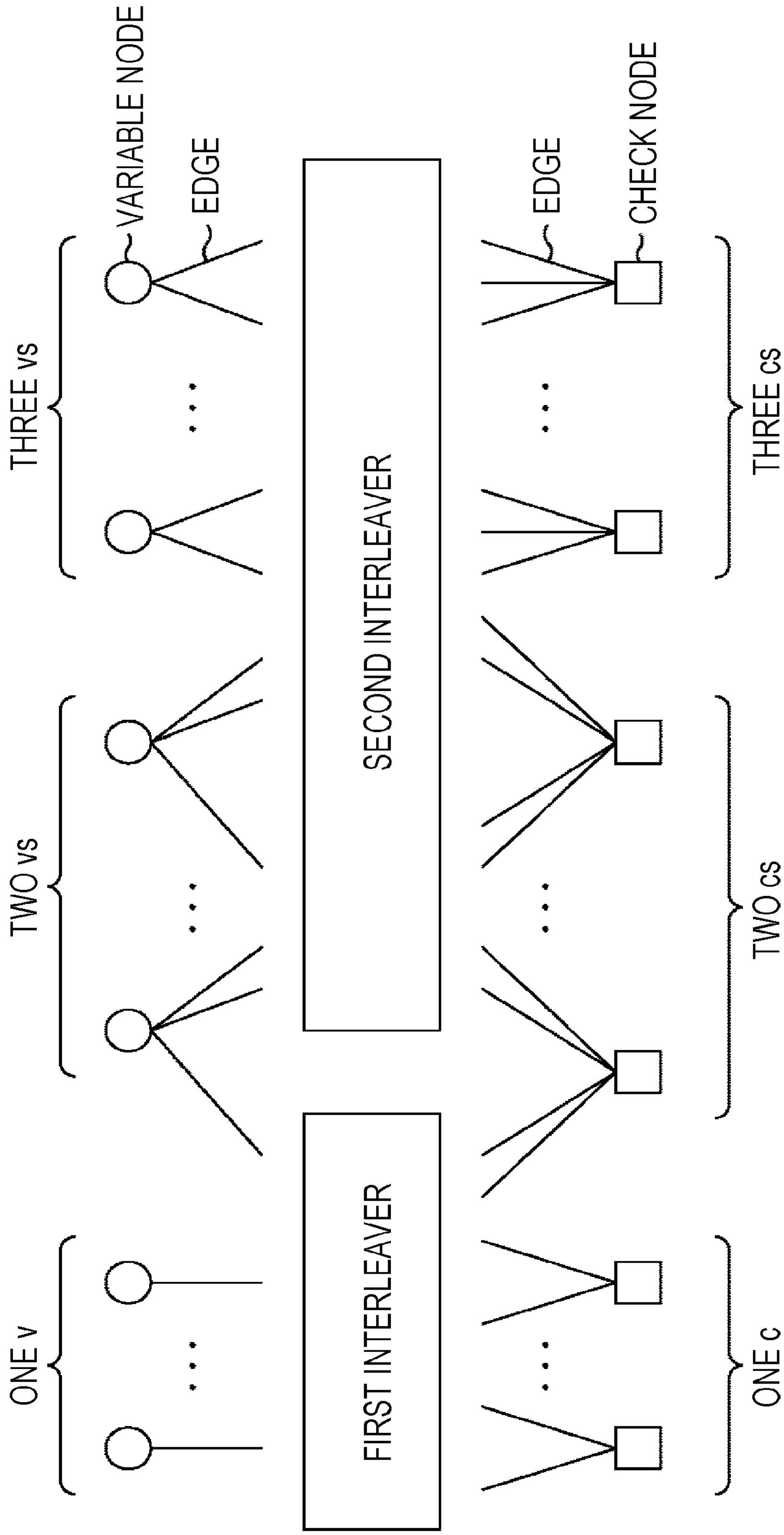
FIG. 87 is a diagram illustrating an example of a Tanner graph of a multi-edge type ensemble.

FIGS. 86 and 87 are diagrams for describing density evolution in which an analysis result as the predetermined condition to be satisfied by the appropriate parity check matrix H can be obtained.

The density evolution is a code analysis method of calculating an expected value of an error probability for the entire LDPC code (ensemble) with the code length N of ∞ characterized by a degree sequence to be described below.

For example, when increasing a variance of noise from 0 on an AWGN channel, the expected value of the error probability of an ensemble is initially 0, but the expected value becomes not 0 when the variance of noise becomes a certain threshold or greater.

According to the density evolution, good or bad of the performance of the ensemble (appropriateness of the parity check matrix) can be determined by comparing the threshold of the variance of noise (hereinafter also referred to as performance threshold) at which the expected value of the error probability becomes not 0.

Note that, for a specific LDPC code, an ensemble to which the LDPC code belongs is determined, and the density evolution is performed for the ensemble, whereby rough performance of the LDPC code can be predicted.

Therefore, if an ensemble with high performance is found, the LDPC code with high performance can be found from LDPC codes belonging to the ensemble.

Here, the above-described degree sequence indicates what ratio the variable nodes and check nodes having weights of respective values exist at to the code length N of the LDPC code.

For example, a regular (3, 6) LDPC code with the coding rate of 1/2 belongs to an ensemble characterized by a degree sequence indicating that the weights (column weights) of all the variable nodes are 3 and the weights (row weights) of all the check nodes are 6.

FIG. 86 shows a Tanner graph of such an ensemble.

In a Tanner bluff in FIG. 86, N variable nodes illustrated by the circles (o) in FIG. 86 exist, the number N being equal to the code length N, and N/2 check nodes illustrated by the squares (□) in FIG. 86 exist, the number N/2 being equal to a multiplication value obtained by multiplying the code length N by the coding rate 1/2.

Three edges with an equal column weight are connected to each variable node. Therefore, there are a total of 3N edges connected to the N variable nodes.

Furthermore, six edges with an equal row weight are connected to each check node. Therefore, there are a total of 3N edges connected to the N/2 check nodes.

Moreover, in the Tanner graph in FIG. 86, there is one interleaver.

The interleaver randomly rearranges the 3N edges connected to the N variable nodes and connects each edge after the rearrangement to any of the 3N edges connected to the N/2 check nodes.

The number of patterns for rearranging the 3N edges connected to the N variable nodes in the interleaver is (3N)! (=(3N)×(3N−1)× . . . ×1). Therefore, the ensemble characterized by the degree sequence indicating that the weights of all the variable nodes are 3 and the weights of all the check nodes are 6 is a set of (3N)! LDPC codes.

In the simulation for finding the LDPC code with high performance (appropriate parity check matrix), a multi-edge type ensemble has been used in the density evolution.

In the multi-edge type ensemble, the interleaver which the edges connected to the variable nodes and the edges connected to the check nodes go through is divided into multi edges, whereby characterization of the ensemble is more strictly performed.

FIG. 87 is a diagram illustrating an example of a Tanner graph of a multi-edge type ensemble.

In the Tanner graph in FIG. 87, there are two interleavers of a first interleaver and a second interleaver.

Furthermore, in the Tanner graph in FIG. 87, v1 variable nodes each connected with one edge connected to the first interleaver and 0 edges connected to the second interleaver, v2 variable nodes each connected with one edge connected to the first interleaver and two edges connected to the second interleaver, and v3 variable nodes each connected with 0 edges connected to the first interleaver and two edges connected to the second interleaver exist.

Moreover, in the Tanner graph in FIG. 87, c1 check nodes each connected with two edges connected to the first interleaver and 0 edges connected to the second interleaver, c2 check nodes each connected with two edges connected to the first interleaver and two edges connected to the second interleaver, and c3 check nodes each connected with 0 edges connected to the first interleaver and three edges connected to the second interleaver exist.

Here, the density evolution and its implementation are described in, for example, "On the Design of Low-Density Parity-Check Codes within 0.0045 dB of the Shannon Limit", S. Y. Chung, C. D. Forney, T. J. Richardson, R. Urbanke, IEEE Communications Leggers, VOL. 5, NO. 2, February 2001.

In the simulation for finding (the parity check matrix of) the new LDPC code, an ensemble in which the performance threshold that is $E_b/N_0$ (signal power to noise power ratio per bit) at which BER starts to drop (starts to become small) becomes a predetermined value or less is found by the multi-edge type density evolution, and the LDPC code that makes BER small in a case of using one or more quadrature modulations such as QPSK is selected from among the LDPC codes belonging to the ensemble as the LDPC code with high performance.

(The parity check matrix initial value table representing the parity check matrix of) the new LDPC code has been obtained by the above simulation.

Therefore, according to the new LDPC code, favorable communication quality can be secured in data transmission.

Figure 88:
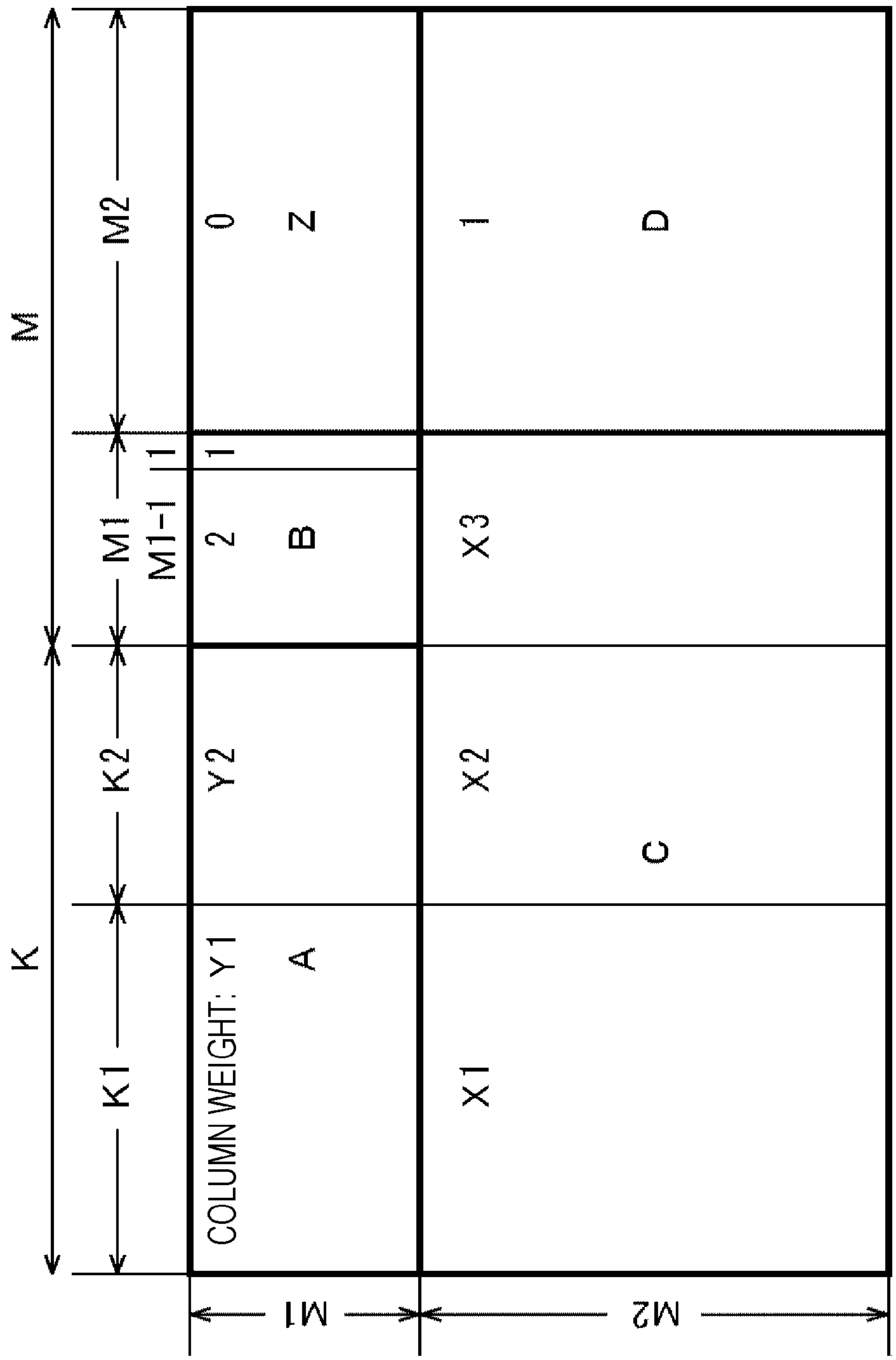
FIG. 88 is a diagram for describing a parity check matrix by a type A method.

FIG. 88 is a diagram for describing the column weights of a parity check matrix H of the type A code as the new LDPC code.

It is assumed that, in regard to the parity check matrix H of the type A code, as illustrated in FIG. 88, the column weights of K1 columns from the 1st column of the A matrix are represented as Y1, the column weights of following K2 columns of the A matrix are represented as Y2, the column weights of K1 columns from 1st column of the C matrix are represented as X1, the column weights of the following K2 columns of the C matrix are represented as X2, and the column weights of the further following M1 columns of the C matrix are represented as X3.

Note that K1+K2 is equal to the information length K, and M1+M2 is equal to the parity length M. Therefore, K1+K2+M1+M2 is equal to the code length N=69120 bits.

Furthermore, in regard to the parity check matrix H of the type A code, the column weights of M1−1 columns from the 1st column of the B matrix are 2, and the column weight of the M1-th column (last column) of the B matrix is 1. Moreover, the column weight of the D matrix is 1 and the column weight of the Z matrix is 0.

FIG. 89 is a diagram illustrating parameters of parity check matrices H of the type A codes (represented by the parity check matrix initial value tables) in FIGS. 30 to 41.

X1, Y1, K1, X2, Y2, K2, X3, M1, and M2 as the parameters and the performance thresholds of the parity check matrices H of the type A codes with r=2/16, 3/16, 4/16, 5/16, 6/16, 7/16, and 8/16 are as illustrated in FIG. 89.

The parameters X1, Y1, K1 (or K2), X2, Y2, X3, and M1 (or M2) are set so as to further improve the performance (for example, the error rate or the like) of the LDPC codes.

Figure 90:
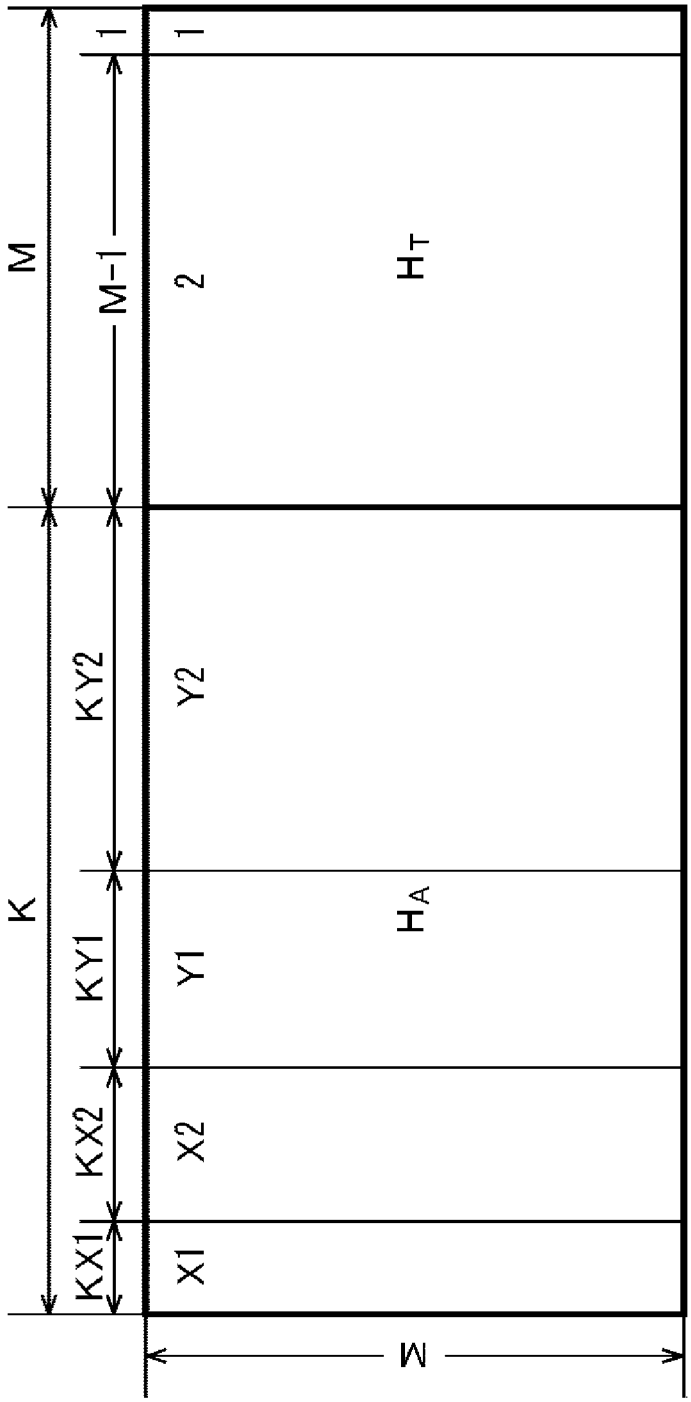
FIG. 90 is a diagram for describing a parity check matrix by a type B method.

FIG. 90 is a diagram for describing the column weights of the parity check matrix H of the type B code as the new LDPC code.

It is assumed that, in regard to the parity check matrix H of the type B code, as illustrated in FIG. 90, the column weights of KX1 columns from the 1st column are represented as X1, the column weights of the following KX2 columns are represented as X2, the column weights of the following KY1 columns are represented as Y1, and the column weights of the following KY2 columns are represented as Y2.

Note that KX1+KX2+KY1+KY2 is equal to the information length K, and KX1+KX2+KY1+KY2+M is equal to the code length N=69120 bits.

Furthermore, in regard to the parity check matrix H of the type B code, the column weights of M−1 columns excluding the last one column, of the last M columns, are 2, and the column weight of the last one column is 1.

FIG. 91 is a diagram illustrating parameters of parity check matrices H of the type B codes (represented by the parity check matrix initial value tables) in FIGS. 42 to 85.

X1, KX1, X2, KX2, Y1, KY1, Y2, KY2, and M as the parameters and the performance thresholds of the parity check matrices H of the type B codes and another type B code with r=7/16, 8/16, 9/16, 10/16, 11/16, 12/16, 13/16, and 14/16 are as illustrated in FIG. 91.

The parameters X1, KX1, X2, KX2, Y1, KY1, Y2, and KY2 are set so as to further improve the performance of the LDPC codes.

According to the new LDPC code, favorable BER/FER is realized, and a capacity (channel capacity) close to the Shannon limit is realized.

FIGS. 92 to 97 are diagrams for describing other examples of the new LDPC code.

That is, FIGS. 92 and 93 are diagrams illustrating examples of a parity check matrix initial value table representing the parity check matrix H of a type A code provided by Japan Broadcasting Corporation (hereinafter also referred to as a new type A code with r=3/16) as the new LDPC code with the code length N of 69120 bits and the coding rate r of 3/16.

Note that FIG. 93 is a diagram following FIG. 92.

FIGS. 94, 95, and 96 are diagrams illustrating examples of a parity check matrix initial value table representing the parity check matrix H of a type A code provided by Japan Broadcasting Corporation (hereinafter also referred to as a new type A code with r=7/16) as the new LDPC code with the code length N of 69120 bits and the coding rate r of 7/16.

Note that FIG. 95 is a diagram following FIG. 94 and FIG. 96 is a diagram following FIG. 95.

FIG. 97 is a diagram illustrating parameters of the parity check matrix H of the new type A code of r=3/16 and the new type A code of r=7/16.

X1, Y1, K1, X2, Y2, K2, X3, M1, and M2 described in FIG. 88 as the parameters of the parity check matrices H of the new type A code with r=3/16 are 13, 3, 9360, 12, 3, 3600, 13, 1800, and 54360.

Furthermore, X1, Y1, K1, X2, Y2, K2, X3, M1, and M2 described in FIG. 88 as the parameters of the parity check matrices H of the new type A code with r=7/16 are 9, 2, 15480, 2, 3, 14760, 5, 4680, and 34200.

<Constellation>

FIGS. 98 to 122 are diagrams illustrating examples of constellations adaptable in the transmission system in FIG. 7.

In the transmission system in FIG. 7, a constellation used in MODCOD can be set for the MODCOD that is a combination of a modulation method (MODulation) and the LDPC code (CODe), for example.

One or more constellations can be set to one MODCOD.

As the constellation, there are a uniform constellation (UC) in which arrangement of signal points is uniform and a non uniform constellation (NUC) in which the arrangement of signal points is non-uniform.

Furthermore, for example, as the NUC, there are a constellation called 1-dimensional ($M^2$-QAM) non-uniform constellation (1D-NUC), a constellation called 2-dimensional (QQAM) non-uniform constellation (2D-NUC), and the like.

In general, the BER is further improved in the 1D-NUC than the UC, and moreover, the BER is further improved in the 2D-NUC than the 1D-NUC.

The constellation with the modulation method of QPSK is the UC. For example, the UC or the 2D-NUC can be adopted as a constellation for the modulation method of 16QAM, 64QAM, 256QAM, or the like. For example, the UC or the 1D-NUC can be adopted as a constellation for the modulation method of 1024QAM, 4096QAM, or the like.

In the transmission system in FIG. 7, for example, constellations defined in ATSC 3.0, DVB-C.2, or the like, and various other constellations that improve the error rate can be used.

In other words, in a case where the modulation method is QPSK, for example, the same UC can be used for the coding rates r of the LDPC codes.

Furthermore, in the case where the modulation method is 16QAM, 64QAM, or 256QAM, for example, the same UC can be used for the coding rates r of the LDPC codes. Moreover, in the case where the modulation method is 16QAM, 64QAM, or 256QAM, for example, different 2D NUCs can be used for the coding rates r of the LDPC codes, respectively.

Furthermore, in the case where the modulation method is 1024QAM, or 4096QAM, for example, the same UC can be used for each coding rate r of the LDPC code. Moreover, in the case where the modulation method is 1024QAM, or 4096QAM, for example, different 1D-NUCs can be used for the coding rates r of the LDPC codes, respectively.

Here, the UC of QPSK is also described as QPSK-UC, and the UC of $2^m$QAM is also described as $2^m$QAM-UC. Furthermore, the 1D-NUC and 2D-NUC of $2^m$QAM are also described as $2^m$QAM-1D-NUC and $2^m$QAM-2D-NUC, respectively.

Hereinafter, some of the constellations defined in ATSC 3.0 will be described.

FIG. 98 is a diagram illustrating coordinates of signal points of QPSK-UC used for all the coding rates of the LDPC codes defined in ATSC 3.0 in the case where the modulation method is QPSK.

In FIG. 98, "Input Data cell y" represents a 2-bit symbol to be mapped to QPSK-UC, and "Constellation point $z_s$" represents a coordinate of a signal point $z_s$. Note that an index s of the signal point $z_s$ (an index q of a signal point $z_q$ as described below is similar) indicates discrete time of symbols (time interval between one symbol and a next symbol).

In FIG. 98, the coordinate of the signal point $z_s$ is expressed in the form of a complex number, and j represents an imaginary unit (√/(−1)).

FIG. 99 is a diagram illustrating coordinates of signal points of 16QAM-2D-NUC used for the coding rates r (CR)=2/15, 3/15, 4/15, 5/15, 6/15, 7/15, 8/15, 9/15, 10/15, 11/15, 12/15, and 13/15 of the LDPC codes defined in ATSC3.0 in the case where the modulation method is 16QAM.

In FIG. 99, the coordinate of the signal point $z_s$ is expressed in the form of a complex number, and j represents an imaginary unit, similarly to FIG. 98.

In FIG. 99, w #k represents a coordinate of a signal point in the first quadrant of the constellation.

In the 2D-NUC, a signal point in the second quadrant of the constellation is arranged at a position obtained by symmetrically moving a signal point in the first quadrant with respect to a Q axis, and a signal point in the third quadrant of the constellation is arranged at a position obtained by symmetrically moving a signal point in the first quadrant with respect to the origin. Then, a signal point in the fourth quadrant of the constellation is arranged at a position obtained by symmetrically moving a signal point in the first quadrant with respect to an I axis.

Here, in a case where the modulation method is $2^m$QAM, m bits are regarded as one symbol, and the one symbol is mapped to the signal point corresponding to the symbol.

The m-bit symbol can be expressed by, for example, an integer value of 0 to $2^m-1$. Now, symbols y(0), y(1), . . . , y($2^m-1$) represented by integer values of 0 to $2^m-1$ where $b=2^m/4$ can be classified into four: symbols y(0) to y(b−1), y(b) to y(2b−1), y(2b) to y(3b−1), and y(3b) to y(4b−1).

In FIG. 99, the suffix k of w #k takes an integer value in a range of 0 to b−1, and w #k represents a coordinate of a signal point corresponding to a symbol y(k) in a range of symbols y(0) to y(b−1).

Then, coordinates of a signal point corresponding to a symbol y(k+b) in a range of symbols y(b) to y(2b−1) are represented as −conj(w #k), and coordinates of a signal point corresponding to a symbol y(k+2b) in a range of symbols y(2b) to y(3b−1) are represented as conj(w #k). Furthermore, coordinates of a signal point corresponding to a symbol y(k+3b) in a range of symbols y(3b) to y(4b−1) are represented by −w #k.

Here, conj(w #k) represents a complex conjugate of w #k.

For example, in a case where the modulation method is 16QAM, symbols y(0), y(1), . . . , and y(15) of m=4 bits where $b=2^4/4=4$ are classified into four: symbols y(0) to y(3), y(4) to y(7), y(8) to y(11), and y(12) to y(15).

Then, for example, the symbol y(12), of the symbols y(0) to y(15), is a symbol y(k+3b)=y(0+3×4) in the range of symbols y(3b) to y(4b−1)) and k=0, and therefore the coordinates of the signal point corresponding to the symbol y(12) is −w #k=−w0.

Now, assuming that the coding rate r (CR) of the LDPC code is, for example, 9/15, w0 in a case where the modulation method is 16QAM and the coding rate r is 9/15 is 0.2386+j0.5296 according to FIG. 99, and thus the coordinate −w0 of the signal point corresponding to the symbol y(12) is −(0.2386+j0.5296).

FIG. 100 is a diagram illustrating examples of coordinates of signal points of 1024QAM-1D-NUC used for the coding rates r (CR)=2/15, 3/15, 4/15, 5/15, 6/15, 7/15, 8/15, 9/15, 10/15, 11/15, 12, 15, and 13/15 of the LDPC codes defined in ATSC3.0 in the case where the modulation method is 1024QAM.

In FIG. 100, u #k represents a real part $Re(z_s)$ and an imaginary part $Im(z_s)$ of the complex number as the coordinate of the signal point $z_s$ of 1D-NUC, and is a component of a vector u=(u0, u1, u #V−1) called position vector. The number V of the components u #k of the position vector u is given by an expression $V=(2^m)/2$.

FIG. 101 is a diagram illustrating a relationship between the symbol y of 1024QAM and (the component u #k of) the position vector u.

Now, it is assumed that the 10-bit symbol y of 1024QAM is represented as, from the lead bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, and $y_{9,s}$.

A in FIG. 101 illustrates a correspondence between the even-numbered 5 bits $y_{1,s}$, $y_{3,s}$, $y_{5,s}$, $y_{7,s}$, and $y_{9,s}$, of the symbol y, and u #k representing the real part $Re(z_s)$ (of the coordinate) of the signal point $z_s$ corresponding to the symbol y.

B in FIG. 101 illustrates a correspondence between the odd-numbered 5 bits $y_{0,s}$, $y_{2,s}$, $y_{4,s}$, $y_{6,s}$, and $y_{8,s}$ of the symbol y, and u #k representing the imaginary part $Im(z_s)$ of the signal point $z_s$ corresponding to the symbol y.

In a case where the 10-bit symbol y=($y_{0,s}$, $y_{1,s}$, $y_{2,s}$, $y_{3,s}$, $y_{4,s}$, $y_{5,s}$, $y_{6,s}$, $y_{7,s}$, $y_{8,s}$, and $y_{9,s}$) of 1024QAM is (0, 0, 1, 0, 0, 1, 1, 1, 0, 0), for example, the odd-numbered 5 bits ($y_{0,s}$, $y_{2,s}$, $y_{4,s}$, $y_{6,s}$, and $y_{8,s}$) are (0, 1, 0, 1, 0) and the even-numbered 5 bits ($y_{1,s}$, $y_{3,s}$, $y_{5,s}$, $y_{7,s}$, and $y_{9,s}$) are (0, 0, 1, 1, 0).

In A in FIG. 101, the even-numbered 5 bits (0, 0, 1, 1, 0) are associated with u11, and therefore the real part $Re(z_s)$ of the signal point $z_s$ corresponding to the symbol y=(0, 0, 1, 0, 0, 1, 1, 1, 0, 0) is u11.

In B in FIG. 101, the odd-numbered 5 bits (0, 1, 0, 1, 0) are associated with u3, and therefore the imaginary part $Im(z_s)$ of the signal point $z_s$ corresponding to the symbol y=(0, 0, 1, 0, 0, 1, 1, 1, 0, 0) is u3.

Meanwhile, when the coding rate r of the LDPC code is 6/15, for example, u3 is 0.1295 and u11 is 0.7196 according to FIG. 100 in regard to the 1D-NUC used in a case where the modulation method is 1024QAM and the coding rate r (CR) of the LDPC code=6/15.

Therefore, the real part $Re(z_s)$ of the signal point $z_s$ corresponding to the symbol y=(0, 0, 1, 0, 0, 1, 1, 1, 0, 0) is u11=0.7196 and the imaginary part $Im(z_s)$ is u3=0.1295. As a result, the coordinates of the signal point $z_s$ corresponding to the symbol y=(0, 0, 1, 0, 0, 1, 1, 1, 0, 0) are expressed by 0.7196+j0.1295.

Note that the signal points of the 1D-NUC are arranged in a lattice on a straight line parallel to the I axis and a straight line parallel to the Q axis in the constellation. However, the interval between signal points is not constant. Furthermore, average power of the signal points on the constellation can be normalized in transmission of (data mapped to) the signal points. Normalization can be performed by, where the root mean square of absolute values of all (the coordinates of) the signal points on the constellation is $P_{ave}$, multiplying each signal point $z_s$ on the constellation by a reciprocal $1/(\sqrt{P_{ave}})$ of the square root $\sqrt{P_{ave}}$ of the root mean square value $P_{ave}$.

The transmission system in FIG. 7 can use the constellation defined in ATSC 3.0 as described above.

FIGS. 102 to 113 illustrate coordinates of signal points of UCs defined in DVB-C.2.

In other words, FIG. 102 is a diagram illustrating a real part $Re(z_q)$ of a coordinate $z_q$ of a signal point of QPSK-UC (UC in QPSK) defined in DVB-C.2. FIG. 103 is a diagram illustrating imaginary parts $Im(z_q)$ of coordinates $z_q$ of signal points of QPSK-UC defined in DVB-C.2.

FIG. 104 is a diagram illustrating real parts $Re(z_q)$ of coordinates $z_q$ of signal points of 16QAM-UC (UC of 16QAM) defined in DVB-C.2. FIG. 105 is a diagram illustrating imaginary parts $Im(z_q)$ of coordinates $z_q$ of signal points of 16QAM-UC defined in DVB-C.2.

FIG. 106 is a diagram illustrating real parts $Re(z_q)$ of coordinates $z_q$ of signal points of 64QAM-UC (UC of 64QAM) defined in DVB-C.2. FIG. 107 is a diagram illustrating imaginary parts $Im(z_q)$ of coordinates $z_q$ of signal points of 64QAM-UC defined in DVB-C.2.

FIG. 108 is a diagram illustrating real parts $Re(z_q)$ of coordinates $z_q$ of signal points of 256QAM-UC (UC of 256QAM) defined in DVB-C.2. FIG. 109 is a diagram illustrating imaginary parts $Im(z_q)$ of coordinates $z_q$ of signal points of 256QAM-UC defined in DVB-C.2.

FIG. 110 is a diagram illustrating real parts $Re(z_q)$ of coordinates $z_q$ of signal points of 1024QAM-UC (UC of 1024QAM) defined in DVB-C.2. FIG. 111 is a diagram illustrating imaginary parts $Im(z_q)$ of coordinates $z_q$ of signal points of 1024QAM-UC defined in DVB-C.2.

FIG. 112 is a diagram illustrating real parts $Re(z_q)$ of coordinates $z_q$ of signal points of 4096QAM-UC (UC of 4096QAM) defined in DVB-C.2. FIG. 113 is a diagram illustrating imaginary parts $Im(z_q)$ of coordinates $z_q$ of signal points of 4096QAM-UC defined in DVB-C.2.

Note that, in FIGS. 102 to 113, $y_{i,q}$ represents the (i+1)th bit from the head of the m-bit symbol (for example, a 2-bit symbol in QPSK) of $2^m$QAM. Furthermore, average power of the signal points on the constellation can be normalized in transmission of (data mapped to) the signal points of UC. Normalization can be performed by, where the root mean square of absolute values of all (the coordinates of) the signal points on the constellation is $P_{ave}$, multiplying each signal point $z_q$ on the constellation by a reciprocal $1/(\sqrt{P_{ave}})$ of the square root $\sqrt{P_{ave}}$ of the root mean square value $P_{ave}$.

In the transmission system in FIG. 7, the UC defined in DVB-C.2 as described above can be used.

In other words, the UCs illustrated in FIGS. 102 to 113 can be used for the new LDPC codes (corresponding to the parity check matrix initial value tables) with the code length N of 69120 bits and the coding rates r of 2/16, 3/16, 4/16, 5/16, 6/16, 7/16, 8/16, 9/16, 10/16, 11/16, 12/16, 13/16, and 14/16 in FIGS. 30 to 85 and FIGS. 92 to 96.

FIGS. 114 to 122 are diagrams illustrating examples of coordinates of signal points of NUC, which can be obtained for the new LDPC codes with the code length N of 69120 and the coding rates r of 2/16, 3/16, 4/16, 5/16,/16, 7/16, 8/16, 9/16, 10/16, 11/16, 12/16, 13/16, and 14/16 in FIGS. 30 to 85 and FIGS. 92 to 96.

That is, FIG. 114 is a diagram illustrating examples of coordinates of signal points of 16QAM-2D-NUC that can be used for the new LDPC code.

FIG. 115 is a diagram illustrating examples of coordinates of signal points of 64QAM-2D-NUC that can be used for the new LDPC code.

FIGS. 116 and 117 are diagrams illustrating examples of coordinates of signal points of 256QAM-2D-NUC that can be used for the new LDPC code.

Note that FIG. 117 is a diagram following FIG. 116.

In FIGS. 114 to 117, the coordinate of the signal point $z_s$ is expressed in the form of a complex number, and j represents an imaginary unit, similarly to FIG. 99.

In FIGS. 114 to 117, w #k represents a coordinate of a signal point in the first quadrant of the constellation, similarly to FIG. 99.

Here, as described in FIG. 99, when the m-bit symbol is expressed by an integer value of 0 to $2^m-1$, and $b=2^m/4$ is established, the symbols y(0), y(1), . . . , $y(2^m-1)$ expressed by the integer values of 0 to $2^m-1$ can be classified into four groups of symbols y(0) to y(b−1), y(b) to y(2b−1), y(2b) to y(3b−1), and y(3b) to y(4b−1).

In FIGS. 114 to 117, the suffix k of w #k takes an integer value in the range of 0 to b−1, and w #k represents a coordinate of a signal point corresponding to the symbol y(k) in the range of symbols y(0) to y(b−1), similarly to FIG. 99.

Moreover, in FIGS. 114 to 117, a coordinate of a signal point corresponding to the symbol y(k+3b) in the range of symbols y(3b) to y(4b−1) is represented by −w #k, similarly to FIG. 99.

Note that, in FIG. 99, a coordinate of a signal point corresponding to the symbol y(k+b) in the range of symbols y(b) to y(2b−1) is represented as −conj(w #k), and a coordinate of a signal point corresponding to the symbol y(k+2b) in the range of symbols y(2b) to y(3b−1) is represented as conj(w #k). However, the sign of conj is inverted in FIGS. 114 to 117.

In other words, in FIGS. 114 to 117, a coordinate of a signal point corresponding to the symbol y(k+b) in the range of symbols y(b) to y(2b−1) is represented as conj(w #k), and a coordinate of a signal point corresponding to the symbol y(k+2b) in the range of symbols y(2b) to y(3b−1) is represented as −conj(w #k).

FIG. 118 is a diagram illustrating examples of coordinates of signal points of 1024QAM-1D-NUC that can be used for the new LDPC code.

In other words, FIG. 118 is a diagram illustrating a relationship between the real part $Re(z_s)$ and the imaginary part $Im(z_s)$ of the complex number as the coordinate of the signal point $z_s$ of 1024QAM-1D-NUC and (the component u #k of) the position vector u.

FIG. 119 is a diagram illustrating a relationship between the symbol y of 1024QAM and (the component u #k of) the position vector u in FIG. 118.

In other words, now, it is assumed that the 10-bit symbol y of 1024QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, and $y_{9,s}$.

A in FIG. 119 illustrates a correspondence between the odd-numbered 5 bits $y_{0,s}$, $y_{2,s}$, $y_{4,s}$, $y_{6,s}$, and $y_{8,s}$ of the 10-bit symbol y, and the position vector u #k representing the real part $Re(z_s)$ of (the coordinate of) the signal point $z_s$ corresponding to the symbol y.

B in FIG. 119 illustrates a correspondence between the even-numbered 5 bits $y_{1,s}$, $y_{3,s}$, $y_{5,s}$, $y_{7,s}$, and $y_{9,s}$ of the 10-bit symbol y, and the position vector u #k representing the imaginary part $Im(z_s)$ of the signal point $z_s$ corresponding to the symbol y.

Since the way of obtaining the coordinate of the signal point $z_s$ of when the 10-bit symbol y of 1024QAM is mapped to the signal point $z_s$ of 1024QAM-1D-NUC defined in FIGS. 118 and 119 is similar to the case described in FIGS. 100 and 101, description is omitted.

FIG. 120 is a diagram illustrating examples of coordinates of signal points of 4096QAM-1D-NUC that can be used for the new LDPC code.

In other words, FIG. 120 is a diagram illustrating a relationship between the real part $Re(z_5)$ and the imaginary part $Im(z_s)$ of the complex number as the coordinate of the signal point $z_s$ of 4096QAM-1D-NUC and the position vector u (u #k).

FIGS. 121 and 122 are diagrams illustrating the relationship between the symbol y of 4096QAM and (the component u #k of) the position vector u in FIG. 120.

In other words, now, it is assumed that the 12-bit symbol y of 4096QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, $y_{9,s}$, $y_{10,s}$, $y_{11,s}$.

FIG. 121 illustrates a correspondence between the odd-numbered 6 bits $y_{0,s}$, $y_{2,s}$, $y_{4,s}$, $y_{6,s}$, $y_{8,s}$, and $y_{10,s}$ of the 12-bit symbol y, and the position vector u #k representing the real part $Re(z_s)$ of the signal point $z_s$ corresponding to the symbol y.

FIG. 122 illustrates a correspondence between the even-numbered 6 bits $y_{1,s}$, $y_{3,s}$, $y_{5,s}$, $y_{7,s}$, $y_{9,s}$, and $y_{11,s}$ of the 12-bit symbol y, and the position vector u #k representing the imaginary part $Im(z_s)$ of the signal point $z_s$ corresponding to the symbol y.

Since the way of obtaining the coordinate of the signal point $z_s$ of when the 12-bit symbol y of 4096QAM is mapped to the signal point $z_s$ of 4096QAM-1D-NUC defined in FIGS. 120 to 122 is similar to the case described in FIGS. 100 and 101, description is omitted.

Note that average power of the signal points on the constellation can be normalized in transmission of (data mapped to) the signal points of the NUCs in FIGS. 114 to 122. Normalization can be performed by, where the root mean square of absolute values of all (the coordinates of) the signal points on the constellation is $P_{ave}$, multiplying each signal point $z_s$ on the constellation by a reciprocal $1/(\sqrt{P_{ave}})$ of the square root $\sqrt{P_{ave}}$ of the root mean square value $P_{ave}$.

Furthermore, in FIG. 101 described above, the odd-numbered bits of the symbol y are associated with the position vector u #k representing the imaginary part $Im(z_s)$ of the signal point $z_s$ and the even-numbered bits of the symbol y are associated with the position vector u #k representing the real part $Re(z_s)$ of the signal point $z_s$. In FIG. 119, and FIGS. 121 and 122, conversely, the odd-numbered bits of the symbol y are associated with the position vector u #k representing the real part $Re(z_s)$ of the signal point $z_s$ and the even-numbered bits of the symbol y are associated with the position vector u #k representing the imaginary part $Im(z_s)$ of the signal point $z_s$ <Block Interleaver 25>

Figure 123:
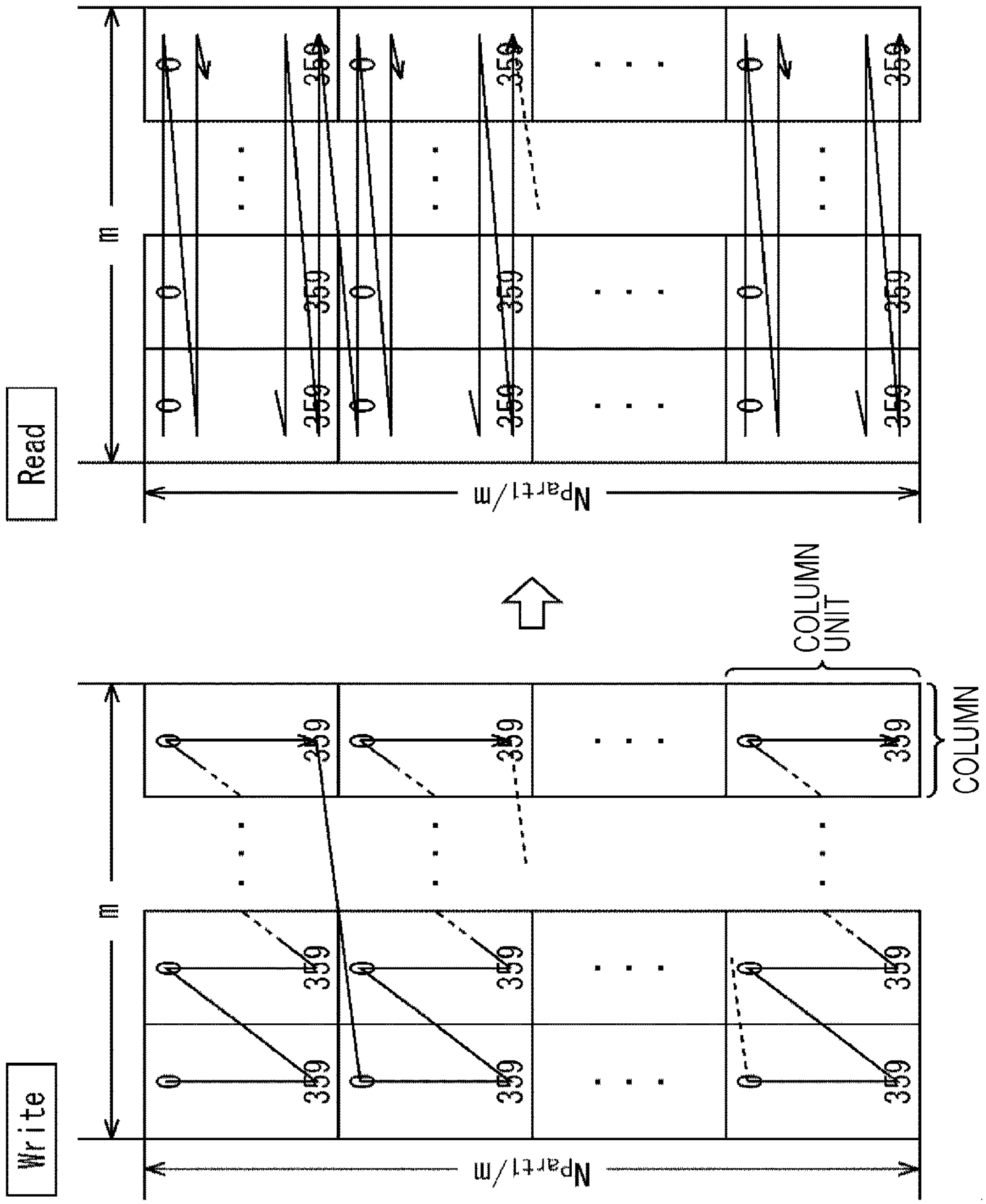

FIG. 123 is a diagram for describing block interleaving performed by the block interleaver 25 in FIG. 9.

The block interleaving is performed by dividing the LDPC code of one codeword into a part called part 1 and a part called part 2 from the head of the LDPC code.

Npart 1+Npart 2 is equal to the code length N, where the length (bit length) of part 1 is Npart 1 and the length of part 2 is Npart 2.

Conceptually, in the block interleaving, columns as storage regions each storing Npart1/m bits in a column (vertical) direction as one direction are arranged in a row direction orthogonal to the column direction by the number m equal to the bit length m of the symbol, and each column is divided from the top into a small unit of 360 bits that is the parallel factor P. This small unit of column is also called column unit.

In the block interleaving, as illustrated in FIG. 123, writing of part 1 of the LDPC code of one codeword downward (in the column direction) from the top of the first column unit of the column is performed in the columns from left to right direction.

Then, when the writing to the first column unit of the rightmost column is completed, the writing returns to the leftmost column, and writing downward from the top of the second column unit of the column is performed in the columns from the left to right direction, as illustrated in FIG. 123. Hereinafter, writing of part 1 of the LDPC code of one codeword is similarly performed.

When the writing of part 1 of the LDPC code of one codeword is completed, part 1 of the LDPC code is read in units of m bits in the row direction from the first column of all the m columns, as illustrated in FIG. 123.

The unit of m bits of part 1 is supplied from the block interleaver 25 to the mapper 117 (FIG. 8) as the m-bit symbol.

The reading of part 1 in units of m bits is sequentially performed toward lower rows of the m columns. When the reading of part 1 is completed, part 2 is divided into units of m bits from the top and is supplied from the block interleaver 25 to the mapper 117 as the m-bit symbol.

Therefore, part 1 is symbolized while being interleaved, and part 2 is sequentially dividing into m bits and symbolized without being interleaved.

Npart1/m as the length of the column is a multiple of 360 as the parallel factor P, and the LDPC code of one codeword is divided into part 1 and part 2 so that Npart1/m becomes a multiple of 360.

FIG. 124 is a diagram illustrating examples of part 1 and part 2 of the LDPC code with the code length N of 69120 bits in the case where the modulation method is QPSK, 16QAM, 64QAM, 256QAM, 1024QAM, and 4096QAM.

In FIG. 124, part 1 is 68400 bits and part 2 is 720 bits in a case where the modulation method is 1024QAM, and part 1 is 69120 bits and part 2 is 0 bits in cases where the modulation methods are QPSK, 16QAM, 64QAM, 256QAM, and 4096QAM.

<Group-Wise Interleaving>

Figure 125:
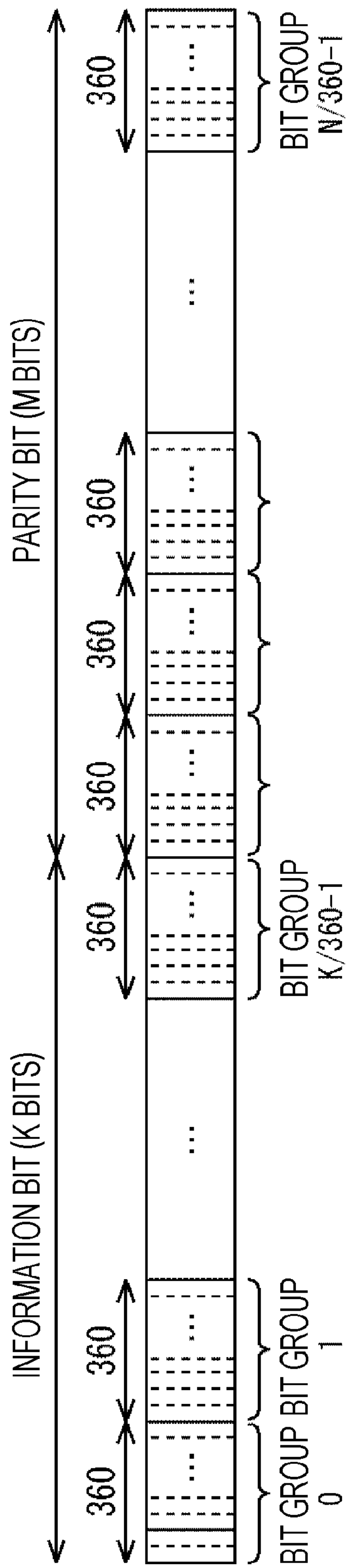

FIG. 125 is a diagram for describing group-wise interleaving performed by the group-wise interleaver 24 in FIG. 9.

In the group-wise interleaving, as illustrated in FIG. 125, the LDPC code of one codeword is interleaved in units of bit groups according to a predetermined pattern (hereinafter also referred to as GW pattern) where one section of 360 bits is set as a bit group, the one section of 360 bits being obtained by dividing the LDPC code of one code into units of 360 bits, the unit being equal to the parallel factor P, from the head of the LDPC code.

Here, the (i+1)th bit group from the head of when the LDPC code of one codeword is divided into bit groups is hereinafter also described as bit group i.

In a case where the parallel factor P is 360, for example, an LDPC code with the code length N of 1800 bits is divided into 5 (=1800/360) bit groups of bit groups 0, 1, 2, 3, and 4. Moreover, for example, an LDPC code with the code length N of 69120 bits is divided into 192 (=69120/360) bit groups of the bit groups 0, 1, . . . , 191.

Furthermore, hereinafter, the GW pattern is represented by a sequence of numbers representing a bit group. For example, regarding the LDPC code of five bit groups 0, 1, 2, 3, and 4 with the code length N of 1800 bits, GW patterns 4, 2, 0, 3, and 1 represent interleaving (rearranging) a sequence of the bit groups 0, 1, 2, 3, and 4 into a sequence of the bit groups 4, 2, 0, 3, and 1, for example.

For example, now, it is assumed that the (i+1)th code bit from the head of the LDPC code with the code length N of 1800 bits is represented by $x_i$.

In this case, according to the group-wise interleaving of the GW patterns 4, 2, 0, 3, and 1, the 1800-bit LDPC code $\{x_0, x_i, \ldots, x_{1799}\}$ is interleaved in a sequence of $\{x_{1440}, x_{1441}, \ldots, x_{1799}\}$, $\{x_{720}, x_{721}, \ldots, x_{1079}\}$, $\{x_0, x_1, \ldots, x_{359}\}$, $\{x_{1080}, x_{1081}, \ldots, x_{1439}\}$ and $\{x_{360}, x_{361}, \ldots, x_{7191}\}$.

The GW pattern can be set for each code length N of the LDPC code, each coding rate r, each modulation method, each constellation, or each combination of two or more of the code length N, the coding rate r, the modulation method, and the constellation.

<Example of GW Pattern for LDPC Code>

Figure 126:
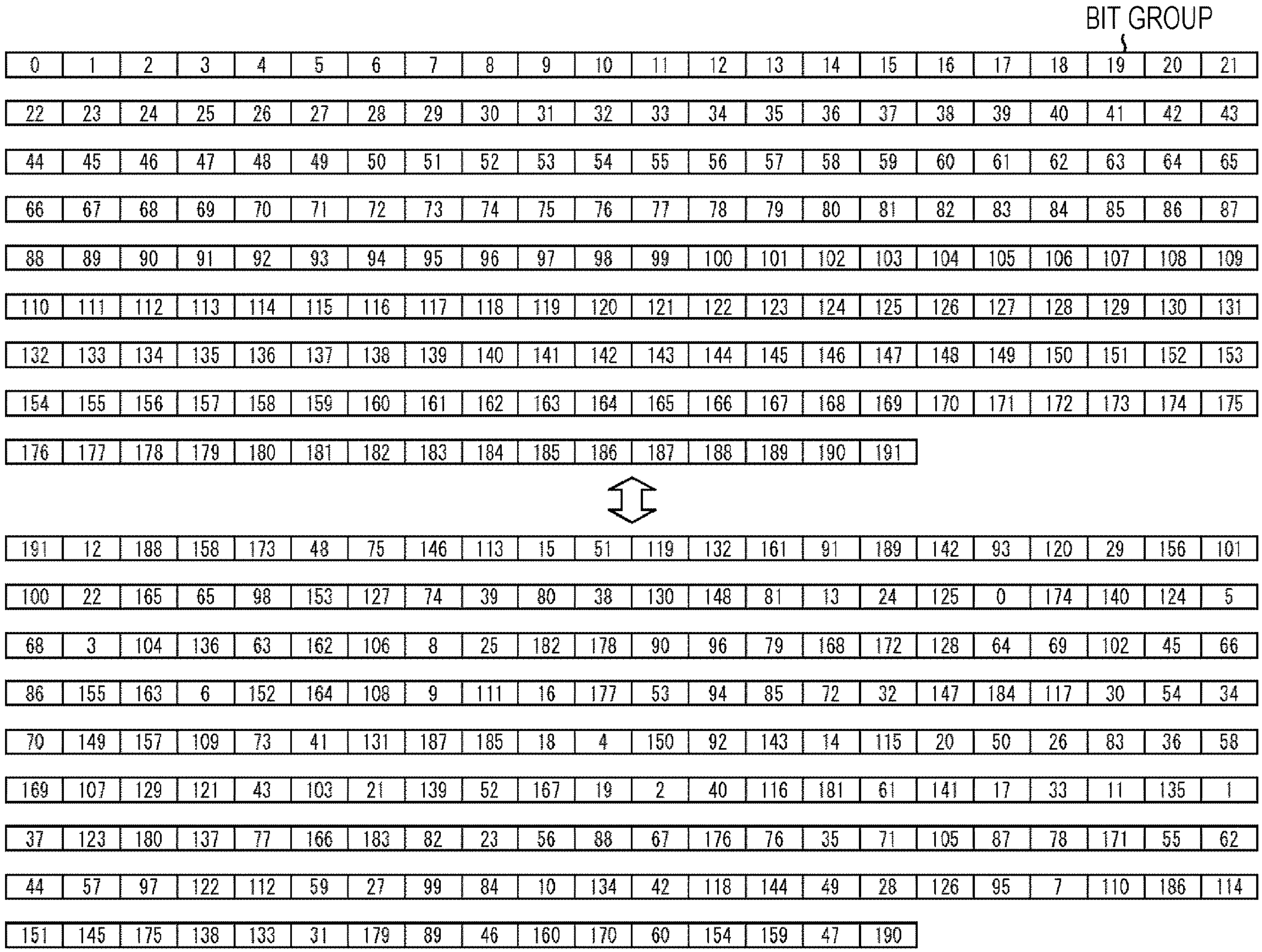

FIG. 126 is a diagram illustrating a first example of the GW pattern for the LDPC code with the code length N of 69120 bits.

According to the GW pattern in FIG. 126, the sequence of bit groups 0 to 191 of the 69120-bit LDPC code is interleaved into a sequence of bit groups 191, 12, 188, 158, 173, 48, 75, 146, 113, 15, 51, 119, 132, 161, 91, 189, 142, 93, 120, 29, 156, 101, 100, 22, 165, 65, 98, 153, 127, 74, 39, 80, 38, 130, 148, 81, 13, 24, 125, 0, 174, 140, 124, 5, 68, 3, 104, 136, 63, 162, 106, 8, 25, 182, 178, 90, 96, 79, 168, 172, 128, 64, 69, 102, 45, 66, 86, 155, 163, 6, 152, 164, 108, 9, 111, 16, 177, 53, 94, 85, 72, 32, 147, 184, 117, 30, 54, 34, 70, 149, 157, 109, 73, 41, 131, 187, 185, 18, 4, 150, 92, 143, 14, 115, 20, 50, 26, 83, 36, 58, 169, 107, 129, 121, 43, 103, 21, 139, 52, 167, 19, 2, 40, 116, 181, 61, 141, 17, 33, 11, 135, 1, 37, 123, 180, 137, 77, 166, 183, 82, 23, 56, 88, 67, 176, 76, 35, 71, 105, 87, 78, 171, 55, 62, 44, 57, 97, 122, 112, 59, 27, 99, 84, 10, 134, 42, 118, 144, 49, 28, 126, 95, 7, 110, 186, 114, 151, 145, 175, 138, 133, 31, 179, 89, 46, 160, 170, 60, 154, 159, 47, 190.

FIG. 127 is a diagram illustrating a second example of the GW pattern for the LDPC code with the code length N of 69120 bits.

According to the GW pattern in FIG. 127, the sequence of bit groups 0 to 191 of the 69120-bit LDPC code is interleaved into a sequence of bit groups 133, 69, 28, 111, 127, 5, 97, 42, 9, 160, 139, 135, 138, 130, 86, 94, 75, 15, 21, 73, 89, 59, 76, 17, 64, 152, 55, 106, 34, 2, 163, 187, 170, 52, 1, 174, 45, 99, 57, 105, 4, 35, 119, 31, 114, 155, 67, 156, 8, 88, 103, 172, 149, 58, 166, 37, 164, 189, 71, 30, 72, 148, 38, 98, 176, 185, 182, 134, 95, 173, 78, 48, 96, 26, 151, 167, 159, 175, 74, 53, 162, 110, 54, 49, 83, 79, 171, 90, 61, 100, 150, 121, 43, 66, 144, 44, 132, 188, 115, 41, 25, 80, 13, 104, 161, 65, 116, 14, 158, 51, 117, 60, 190, 140, 186, 123, 40, 122, 102, 128, 107, 183, 11, 146, 10, 68, 0, 84, 36, 143, 153, 93, 33, 50, 101, 7, 27, 137, 120, 191, 165, 131, 18, 70, 112, 154, 169, 92, 29, 136, 12, 157, 47, 19, 181, 147, 180, 141, 142, 126, 118, 129, 124, 3, 177, 62, 16, 22, 179, 39, 145, 85, 32, 168, 77, 6, 23, 125, 82, 113, 20, 109, 24, 178, 46, 81, 108, 63, 56, 87, 91, 184.

FIG. 128 is a diagram illustrating a third example of the GW pattern for the LDPC code with the code length N of 69120 bits.

According to the GW pattern in FIG. 128, the sequence of bit groups 0 to 191 of the 69120-bit LDPC code is interleaved into a sequence of bit groups 56, 85, 9, 118, 38, 182, 80, 116, 96, 47, 69, 176, 49, 180, 8, 72, 44, 154, 177, 101, 35, 125, 17, 34, 121, 37, 170, 174, 78, 4, 27, 10, 65, 6, 25, 15, 33, 169, 188, 46, 93, 36, 129, 152, 59, 167, 122, 184, 54, 148, 42, 40, 134, 189, 28, 87, 70, 144, 161, 185, 29, 173, 166, 146, 67, 57, 187, 76, 19, 71, 50, 158, 94, 24, 43, 133, 98, 149, 119, 61, 90, 3, 179, 2, 68, 12, 111, 138, 109, 141, 103, 13, 66, 112, 147, 21, 135, 20, 7, 139, 162, 55, 110, 39, 26, 106, 97, 114, 123, 91, 100, 18, 150, 178, 108, 126, 75, 62, 99, 89, 168, 88, 175, 0, 95, 77, 11, 48, 191, 102, 171, 41, 5, 74, 86, 128, 181, 53, 22, 105, 140, 45, 16, 73, 104, 30, 143, 79, 84, 145, 142, 164, 117, 23, 31, 159, 51, 136, 157, 107, 58, 156, 165, 83, 155, 1, 163, 113, 81, 82, 127, 137, 64, 186, 124, 160, 120, 52, 151, 190, 92, 32, 153, 60, 172, 63, 183, 130, 131, 14, 115, 132.

FIG. 129 is a diagram illustrating a fourth example of the GW pattern for the LDPC code with the code length N of 69120 bits.

According to the GW pattern in FIG. 129, the sequence of bit groups 0 to 191 of the 69120-bit LDPC code is interleaved into a sequence of bit groups 17, 64, 171, 69, 132, 126, 31, 140, 181, 157, 32, 119, 50, 3, 158, 86, 51, 82, 154, 176, 60, 70, 117, 110, 107, 111, 61, 186, 178, 7, 188, 81, 19, 30, 165, 104, 22, 35, 145, 113, 155, 97, 131, 26, 179, 142, 63, 57, 175, 122, 105, 12, 24, 4, 42, 147, 172, 183, 120, 25, 180, 95, 48, 15, 150, 162, 170, 148, 108, 20, 149, 90, 23, 83, 47, 103, 5, 187, 163, 137, 52, 189, 184, 11, 87, 84, 151, 177, 174, 34, 139, 75, 54, 96, 102, 33, 166, 167, 59, 127, 134, 78, 121, 182, 133, 46, 124, 9, 106, 71, 37, 76, 94, 123, 45, 16, 144, 115, 10, 160, 185, 85, 164, 99, 91, 136, 173, 1, 66, 141, 152, 6, 13, 41, 14, 168, 89, 101, 72, 67, 98, 29, 62, 190, 93, 73, 100, 153, 28, 135, 161, 39, 116, 65, 56, 156, 2, 27, 80, 143, 40, 129, 36, 21, 146, 88, 18, 138, 38, 169, 74, 109, 68, 49, 159, 112, 114, 58, 118, 77, 191, 53, 8, 92, 44, 55, 0, 130, 128, 125, 79, 43.

FIG. 130 is a diagram illustrating a fifth example of the GW pattern for the LDPC code with the code length N of 69120 bits.

According to the GW pattern in FIG. 130, the sequence of bit groups 0 to 191 of the 69120-bit LDPC code is interleaved into a sequence of bit groups 173, 36, 60, 172, 41, 149, 45, 75, 144, 68, 148, 168, 134, 58, 86, 50, 115, 167, 54, 29, 1, 132, 125, 114, 69, 77, 135, 39, 145, 139, 163, 44, 146, 40, 106, 178, 52, 14, 78, 174, 3, 126, 20, 169, 98, 47, 33, 121, 109, 88, 185, 157, 183, 152, 158, 76, 56, 30, 123, 137, 186, 89, 83, 141, 156, 143, 2, 90, 151, 111, 170, 161, 182, 79, 66, 26, 108, 119, 38, 35, 180, 154, 153, 175, 181, 72, 80, 23, 15, 122, 49, 10, 4, 17, 155, 179, 46, 24, 37, 129, 0, 171, 34, 63, 27, 57, 166, 177, 117, 120, 113, 100, 28, 6, 55, 71, 150, 187, 131, 147, 43, 64, 102, 176, 130, 93, 105, 128, 138, 164, 127, 142, 51, 12, 42, 53, 99, 133, 87, 188, 13, 159, 190, 140, 84, 59, 104, 65, 7, 189, 160, 162, 74, 107, 118, 101, 22, 62, 61, 103, 25, 124, 112, 70, 16, 97, 67, 116, 82, 81, 110, 48, 92, 184, 96, 94, 91, 165, 19, 31, 5, 11, 32, 95, 18, 21, 73, 85, 136, 191, 9, 8.

FIG. 131 is a diagram illustrating a sixth example of the GW pattern for the LDPC code with the code length N of 69120 bits.

According to the GW pattern in FIG. 131, the sequence of bit groups 0 to 191 of the 69120-bit LDPC code is interleaved into a sequence of bit groups 72, 32, 158, 84, 105, 181, 63, 16, 111, 87, 112, 185, 120, 74, 176, 14, 81, 79, 34, 128, 163, 64, 161, 146, 42, 26, 191, 173, 60, 3, 41, 162, 23, 44, 38, 24, 149, 172, 88, 104, 21, 118, 91, 184, 70, 85, 142, 25, 159, 186, 148, 96, 188, 190, 61, 123, 169, 136, 33, 109, 54, 101, 7, 19, 145, 137, 107, 82, 121, 90, 144, 187, 180, 8, 132, 114, 65, 29, 51, 103, 139, 141, 55, 108, 68, 0, 124, 170, 18, 143, 177, 2, 22, 179, 166, 53, 6, 99, 73, 12, 43, 69, 129, 183, 71, 39, 165, 171, 28, 92, 189, 119, 113, 20, 151, 59, 46, 66, 102, 182, 153, 94, 140, 115, 174, 125, 127, 116, 31, 47, 156, 147, 135, 48, 110, 160, 89, 86, 40, 155, 100, 36, 35, 57, 56, 9, 80, 126, 62, 75, 52, 83, 1, 76, 17, 122, 178, 30, 131, 27, 164, 106, 152, 49, 37, 167, 78, 95, 168, 175, 117, 4, 50, 13, 93, 97, 150, 45, 157, 130, 154, 10, 133, 77, 15, 67, 98, 134, 138, 11, 58, 5.

FIG. 132 is a diagram illustrating a seventh example of the GW pattern for the LDPC code with the code length N of 69120 bits.

According to the GW pattern in FIG. 132, the sequence of bit groups 0 to 191 of the 69120-bit LDPC code is interleaved into a sequence of bit groups 9, 5, 13, 50, 156, 80, 30, 150, 18, 84, 54, 87, 40, 140, 12, 169, 1, 65, 90, 99, 21, 94, 20, 158, 27, 168, 19, 128, 57, 151, 37, 36, 15, 45, 59, 136, 4, 2, 106, 160, 83, 48, 103, 78, 173, 33, 172, 186, 24, 164, 181, 35, 183, 72, 73, 176, 161, 119, 76, 125, 121, 124, 16, 174, 66, 34, 177, 137, 46, 44, 126, 116, 69, 41, 145, 3, 114, 132, 32, 7, 105, 31, 56, 134, 155, 135, 108, 93, 89, 167, 81, 190, 131, 127, 102, 88, 62, 49, 163, 170, 53, 63, 38, 178, 0, 77, 188, 22, 180, 185, 191, 153, 61, 129, 144, 39, 138, 166, 14, 154, 82, 29, 110, 146, 123, 60, 187, 11, 162, 25, 157, 52, 91, 118, 133, 17, 28, 10, 130, 111, 159, 42, 58, 141, 142, 189, 68, 107, 8, 113, 6, 74, 47, 75, 109, 175, 147, 64, 149, 92, 43, 85, 96, 122, 117, 171, 152, 26, 79, 86, 51, 95, 67, 165, 112, 148, 182, 143, 179, 120, 139, 97, 184, 104, 71, 70, 115, 23, 100, 98, 101, 55.

FIG. 133 is a diagram illustrating an eighth example of the GW pattern for the LDPC code with the code length N of 69120 bits.

According to the GW pattern in FIG. 133, the sequence of bit groups 0 to 191 of the 69120-bit LDPC code is interleaved into a sequence of bit groups 173, 19, 14, 40, 115, 80, 35, 24, 79, 94, 33, 109, 101, 61, 142, 128, 130, 162, 11, 159, 47, 160, 143, 38, 65, 122, 6, 181, 12, 45, 0, 106, 153, 56, 21, 125, 17, 129, 85, 186, 27, 155, 107, 156, 191, 151, 90, 135, 64, 57, 113, 175, 49, 108, 149, 164, 26, 146, 105, 104, 29, 100, 84, 92, 3, 58, 41, 91, 139, 174, 70, 182, 89, 131, 25, 119, 178, 7, 48, 54, 184, 1, 126, 43, 179, 168, 120, 60, 190, 68, 136, 176, 163, 13, 71, 147, 63, 37, 72, 32, 30, 123, 185, 154, 167, 86, 103, 138, 127, 148, 50, 152, 66, 46, 118, 96, 10, 111, 145, 99, 180, 88, 158, 114, 110, 73, 117, 112, 52, 165, 62, 23, 102, 59, 36, 5, 116, 98, 53, 188, 39, 93, 31, 28, 55, 172, 189, 187, 67, 15, 16, 4, 22, 133, 76, 44, 87, 77, 18, 78, 169, 166, 83, 82, 161, 74, 134, 157, 81, 95, 42, 132, 121, 8, 97, 141, 20, 170, 69, 177, 34, 140, 124, 183, 51, 137, 9, 2, 75, 144, 171, 150.

FIG. 134 is a diagram illustrating a ninth example of the GW pattern for the LDPC code with the code length N of 69120 bits.

According to the GW pattern in FIG. 134, the sequence of bit groups 0 to 191 of the 69120-bit LDPC code is interleaved into a sequence of bit groups 27, 109, 45, 105, 174, 62, 185, 69, 102, 91, 37, 39, 31, 34, 127, 111, 30, 23, 157, 155, 76, 19, 85, 172, 122, 5, 36, 100, 26, 59, 136, 79, 25, 134, 101, 3, 96, 135, 21, 2, 35, 82, 47, 143, 56, 54, 149, 7, 175, 170, 144, 71, 190, 94, 64, 131, 145, 40, 191, 86, 90, 24, 139, 20, 184, 181, 29, 176, 124, 159, 12, 43, 187, 16, 162, 57, 0, 188, 11, 42, 4, 164, 156, 22, 95, 81, 153, 141, 169, 117, 50, 151, 89, 120, 189, 167, 177, 173, 140, 118, 51, 55, 113, 171, 41, 63, 148, 106, 9, 17, 80, 97, 77, 83, 182, 161, 137, 15, 125, 186, 88, 98, 32, 138, 129, 46, 52, 73, 168, 115, 165, 142, 38, 84, 128, 166, 107, 116, 123, 114, 93, 78, 178, 66, 146, 160, 104, 121, 48, 74, 13, 61, 70, 60, 75, 163, 179, 28, 130, 154, 53, 110, 10, 33, 112, 18, 180, 147, 133, 1, 65, 68, 8, 44, 108, 132, 183, 6, 119, 67, 14, 152, 72, 150, 103, 87, 58, 99, 126, 92, 49, 158.

FIG. 135 is a diagram illustrating a tenth example of the GW pattern for the LDPC code with the code length N of 69120 bits.

According to the GW pattern in FIG. 135, the sequence of bit groups 0 to 191 of the 69120-bit LDPC code is interleaved into a sequence of bit groups 50, 30, 180, 100, 44, 21, 25, 130, 190, 135, 154, 84, 150, 20, 16, 184, 137, 109, 189, 36, 105, 151, 49, 107, 108, 79, 148, 121, 88, 128, 62, 7, 185, 145, 166, 64, 141, 102, 181, 191, 94, 171, 1, 14, 11, 170, 63, 67, 17, 51, 90, 155, 98, 115, 173, 26, 56, 87, 138, 81, 13, 31, 27, 24, 29, 46, 54, 78, 118, 120, 164, 58, 95, 122, 106, 85, 96, 41, 3, 187, 72, 0, 143, 142, 186, 146, 101, 89, 23, 133, 83, 92, 22, 99, 136, 158, 156, 91, 97, 28, 162, 147, 65, 139, 111, 38, 161, 163, 4, 75, 125, 177, 12, 70, 114, 6, 45, 165, 126, 132, 134, 40, 149, 104, 188, 80, 55, 34, 119, 175, 66, 93, 39, 47, 153, 8, 69, 157, 61, 35, 182, 124, 168, 76, 131, 59, 112, 152, 82, 116, 123, 9, 73, 15, 86, 159, 172, 18, 183, 68, 103, 167, 113, 5, 74, 42, 174, 140, 2, 10, 32, 19, 127, 48, 169, 117, 129, 178, 53, 179, 71, 52, 60, 110, 57, 144, 160, 43, 37, 33, 77, 176.

FIG. 136 is a diagram illustrating an eleventh example of the GW pattern for the LDPC code with the code length N of 69120 bits.

According to the GW pattern in FIG. 136, the sequence of bit groups 0 to 191 of the 69120-bit LDPC code is interleaved into a sequence of bit groups 163, 174, 26, 190, 68, 80, 112, 146, 97, 44, 156, 134, 51, 167, 19, 127, 145, 102, 20, 58, 30, 9, 153, 143, 32, 63, 189, 180, 110, 41, 101, 166, 104, 138, 89, 42, 27, 8, 161, 67, 72, 81, 106, 132, 175, 107, 116, 186, 108, 13, 96, 154, 10, 103, 139, 99, 164, 29, 12, 118, 123, 109, 133, 61, 64, 0, 128, 17, 6, 45, 159, 1, 66, 24, 38, 33, 95, 187, 50, 120, 21, 168, 182, 184, 141, 148, 31, 79, 25, 144, 170, 18, 176, 135, 183, 7, 90, 52, 94, 77, 65, 3, 15, 85, 43, 100, 35, 124, 39, 57, 78, 88, 70, 76, 171, 149, 121, 125, 84, 16, 140, 40, 150, 157, 36, 48, 162, 2, 62, 22, 147, 83, 53, 82, 177, 98, 115, 69, 105, 151, 136, 181, 56, 173, 122, 111, 47, 179, 191, 119, 87, 178, 155, 131, 185, 91, 60, 55, 54, 37, 172, 169, 4, 188, 158, 11, 59, 160, 129, 5, 34, 14, 137, 117, 126, 114, 49, 73, 74, 28, 75, 152, 142, 71, 23, 86, 93, 130, 92, 113, 46, 165.

The first to eleventh examples of the GW pattern for the LDPC code with the code length N of 69120 bits can be applied to any combination of the LDPC code with the code length N of 69120 bits and an arbitrary coding rate r, an arbitrary modulation method, and an arbitrary constellation.

Note that, as for the group-wise interleaving, the applied GW pattern is set for each combination of the code length N of the LDPC code, the coding rate r of the LDPC code, the modulation method, and the constellation, whereby the error rate can be further improved for each combination.

The GW pattern in FIG. 126 can achieve a particularly favorable error rate by being applied to, for example, a combination of the new type A code (corresponding to the parity check matrix initial value table) with N=69120 and r=7/16 in FIGS. 94 to 96 (the LDPC code with the code length N of 69120 and the coding rate r of 7/16), QPSK, and QPSK-UC in FIGS. 102 and 103.

The GW pattern in FIG. 127 can achieve a particularly favorable error rate by being applied to, for example, a combination of the new type A code with N=69120 and r=3/16 in FIGS. 92 and 93, 16QAM, and 16QAM-UC in FIGS. 104 and 105.

The GW pattern in FIG. 128 can achieve a particularly favorable error rate by being applied to, for example, a combination of the new type A code with N=69120 and r=7/16 in FIGS. 94 to 96, 16QAM, and 16QAM-UC in FIGS. 104 and 105.

The GW pattern in FIG. 129 can achieve a particularly favorable error rate by being applied to, for example, a combination of the new type A code with N=69120 and r=3/16 in FIGS. 92 and 93, 64QAM, and 64QAM-2D-NUC in FIG. 115.

The GW pattern in FIG. 130 can achieve a particularly favorable error rate by being applied to, for example, a combination of the new type A code with N=69120 and r=7/16 in FIGS. 94 to 96, 64QAM, and 64QAM-2D-NUC in FIG. 115.

The GW pattern in FIG. 131 can achieve a particularly favorable error rate by being applied to, for example, a combination of the new type A code with N=69120 and r=3/16 in FIGS. 92 and 93, 256QAM, and 256QAM-UC in FIGS. 108 and 109.

The GW pattern in FIG. 132 can achieve a particularly favorable error rate by being applied to, for example, a combination of the new type A code with N=69120 and r=7/16 in FIGS. 94 to 96, 256QAM, and 256QAM-UC in FIGS. 108 and 109.

The GW pattern in FIG. 133 can achieve a particularly favorable error rate by being applied to, for example, a combination of the new type A code with N=69120 and r=3/16 in FIGS. 92 and 93, 1024QAM, and 1024QAM-1D-NUC in FIGS. 118 and 119.

The GW pattern in FIG. 134 can achieve a particularly favorable error rate by being applied to, for example, a combination of the new type A code with N=69120 and r=7/16 in FIGS. 94 to 96, 1024QAM, and 1024QAM-1D-NUC in FIGS. 118 and 119.

The GW pattern in FIG. 135 can achieve a particularly favorable error rate by being applied to, for example, a combination of the new type A code with N=69120 and r=3/16 in FIGS. 92 and 93, 4096QAM, and 4096QAM-UC in FIGS. 112 and 113.

The GW pattern in FIG. 136 can achieve a particularly favorable error rate by being applied to, for example, a combination of the new type A code with N=69120 and r=7/16 in FIGS. 94 to 96, 4096QAM, and 4096QAM-UC in FIGS. 112 and 113.

<Configuration Example of Reception Device 12>

FIG. 137 is a block diagram illustrating a configuration example of the reception device 12 in FIG. 7.

An OFDM processing unit (OFDM operation) 151 receives an OFDM signal from the transmission device 11 (FIG. 7) and performs signal processing for the OFDM signal. Data obtained by performing the signal processing by the OFDM processing unit 151 is supplied to a frame management unit 152.

The frame management unit 152 processes (interprets) a frame configured by the data supplied from the OFDM processing unit 151, and supplies a signal of resulting target data and a signal of control data to frequency deinterleavers 161 and 153, respectively.

The frequency deinterleaver 153 performs frequency deinterleaving for the data from the frame management unit 152 in units of symbols, and supplies the data to a demapper 154.

The demapper 154 performs demapping (signal point arrangement decoding) and quadrature demodulation for the data (data on the constellation) from the frequency deinterleaver 153 on the basis of arrangement (constellation) of the signal points determined by the quadrature modulation performed on the transmission device 11 side, and supplies resulting data ((likelihood of) the LDPC code) to an LDPC decoder 155.

The LDPC decoder 155 performs LDPC decoding for the LDPC code from the demapper 154, and supplies resulting LDPC target data (here, BCH code) to a BCH decoder 156.

The BCH decoder 156 performs BCH decoding for the LDPC target data from the LDPC decoder 155, and outputs resulting control data (signaling).

Meanwhile, the frequency deinterleaver 161 performs frequency deinterleaving in units of symbols for the data from the frame management unit 152, and supplies the data to an SISO/MISO decoder 162.

The SISO/MISO decoder 162 performs space-time decoding of the data from the frequency deinterleaver 161 and supplies the data to a time deinterleaver 163.

The time deinterleaver 163 time-deinterleaves the data from the SISO/MISO decoder 162 in units of symbols and supplies the data to a demapper 164.

The demapper 164 performs demapping (signal point arrangement decoding) and quadrature demodulation for the data (data on the constellation) from the time deinterleaver 163 on the basis of arrangement (constellation) of the signal points determined by the quadrature modulation performed on the transmission device 11 side, and supplies resulting data to a bit deinterleaver 165.

The bit deinterleaver 165 performs bit deinterleaving for the data from the demapper 164, and supplies (likelihood of) the LDPC code that is data after the bit deinterleaving to the LDPC decoder 166.

The LDPC decoder 166 performs LDPC decoding for the LDPC code from the bit deinterleaver 165, and supplies resulting LDPC target data (here, the BCH code) to a BCH decoder 167.

The BCH decoder 167 performs BCH decoding for the LDPC target data from the LDPC decoder 155, and supplies resulting data to a BB descrambler 168.

The BB descrambler 168 applies BB descrambling to the data from the BCH decoder 167, and supplies resulting data to a null deletion unit 169.

The null deletion unit 169 deletes the null inserted by the padder 112 in FIG. 8 from the data from the BB descrambler 168, and supplies the data to the demultiplexer 170.

The demultiplexer 170 demultiplexes each of one or more streams (target data) multiplexed into the data from the null deletion unit 169, applies necessary processing, and outputs a result as an output stream.

Note that the reception device 12 can be configured without including a part of the blocks illustrated in FIG. 137. In other words, in a case where the transmission device 11 (FIG. 8) is configured without including the time interleaver 118, the SISO/MISO encoder 119, the frequency interleaver 120, and the frequency interleaver 124, for example, the reception device 12 can be configured without including the time deinterleaver 163, the SISO/MISO decoder 162, the frequency deinterleaver 161, and the frequency deinterleaver 153 that are blocks respectively corresponding to the time interleaver 118, the SISO/MISO encoder 119, the frequency interleaver 120, and the frequency interleaver 124 of the transmission device 11.

<Configuration Example of Bit Deinterleaver 165>

FIG. 138 is a block diagram illustrating a configuration example of the bit deinterleaver 165 in FIG. 137.

The bit deinterleaver 165 is configured by a block deinterleaver 54 and a group-wise deinterleaver 55, and performs (bit) deinterleaving of the symbol bit of the symbol that is the data from the demapper 164 (FIG. 137).

In other words, the block deinterleaver 54 performs, for the symbol bit of the symbol from demapper 164, block deinterleaving corresponding to the block interleaving performed by the block interleaver 25 in FIG. 9 (processing reverse to the block interleaving), in other words, block deinterleaving of returning the positions of (the likelihood of) the code bits of the LDPC code rearranged by the block interleaving to the original positions, and supplies a resulting LDPC code to the group-wise deinterleaver 55.

The group-wise deinterleaver 55 performs, for example, for the LDPC code from the block deinterleaver 54, group-wise deinterleaving corresponding to the group-wise interleaving performed by the group-wise interleaver 24 in FIG. 9 (processing reverse to the group-wise interleaving), in other words, group-wise deinterleaving of rearranging, in units of bit groups, the code bits of the LDPC code changed in sequence in units of bit groups by the group-wise interleaving described in FIG. 125 to the original sequence.

Here, in a case where the parity interleaving, the group-wise interleaving, and the block interleaving have been applied to the LDPC code to be supplied from the demapper 164 to the bit deinterleaver 165, the bit deinterleaver 165 can perform all of parity deinterleaving corresponding to the parity interleaving (processing reverse to the parity interleaving, in other words, parity deinterleaving of returning the code bits of the LDPC code changed in sequence by the parity interleaving to the original sequence), the block deinterleaving corresponding to the block interleaving, and the group-wise deinterleaving corresponding to the group-wise interleaving.

Note that the bit deinterleaver 165 in FIG. 138 is provided with the block deinterleaver 54 for performing the block deinterleaving corresponding to the block interleaving, and the group-wise deinterleaver 55 for performing the group-wise deinterleaving corresponding to the group-wise interleaving, but the bit deinterleaver 165 is not provided with a block for performing the parity deinterleaving corresponding to the parity interleaving and does not perform the parity deinterleaving.

Therefore, the LDPC code for which the block deinterleaving and the group-wise deinterleaving are performed and the parity deinterleaving is not performed is supplied from (the group-wise deinterleaver 55 of) the bit deinterleaver 165 to the LDPC decoder 166.

The LDPC decoder 166 performs LDPC decoding for the LDPC code from the bit deinterleaver 165, using a transformed parity check matrix obtained by performing at least column permutation corresponding to the parity interleaving for the parity check matrix H by the type B method used for the LDPC coding by the LDPC encoder 115 in FIG. 8, or a transformed parity check matrix (FIG. 29) obtained by performing row permutation for the parity check matrix (FIG. 27) by the type A method, and outputs resulting data as a decoding result of the LDPC target data.

FIG. 139 is a flowchart for describing processing performed by the demapper 164, the bit deinterleaver 165, and the LDPC decoder 166 in FIG. 138.

In step S111, the demapper 164 performs demapping and quadrature demodulation for the data (the data on the constellation mapped to the signal points) from the time deinterleaver 163 and supplies the data to the bit deinterleaver 165. The processing proceeds to step S112.

In step S112, the bit deinterleaver 165 performs deinterleaving (bit deinterleaving) for the data from the demapper 164. The process proceeds to step S113.

In other words, in step S112, in the bit deinterleaver 165, the block deinterleaver 54 performs block deinterleaving for the data (symbol) from the demapper 164, and supplies code bits of the resulting LDPC code to the group-wise deinterleaver 55.

The group-wise deinterleaver 55 performs group-wise deinterleaving for the LDPC code from the block deinterleaver 54, and supplies (the likelihood of) the resulting LDPC code to the LDPC decoder 166.

In step S113, the LDPC decoder 166 performs LDPC decoding for the LDPC code from the group-wise deinterleaver 55 using the parity check matrix H used for the LDPC coding by the LDPC encoder 115 in FIG. 8, in other words, the transformed parity check matrix obtained from the parity check matrix H, for example, and supplies resulting data as a decoding result of the LDPC target data to the BCH decoder 167.

Note that, even in FIG. 138, the block deinterleaver 54 for performing the block deinterleaving and the group-wise deinterleaver 55 for performing the group-wise deinterleaving are separately configured, as in the case in FIG. 9, for convenience of description. However, the block deinterleaver 54 and the group-wise deinterleaver 55 can be integrally configured.

Furthermore, in a case where the group-wise interleaving is not performed in the transmission device 11, the reception device 12 can be configured without including the group-wise deinterleaver 55 for performing the group-wise deinterleaving.

<LDPC Decoding>

The LDPC decoding performed by the LDPC decoder 166 in FIG. 137 will be further described.

The LDPC decoder 166 in FIG. 137 performs the LDPC decoding for the LDPC code from the group-wise deinterleaver 55, for which the block deinterleaving and the group-wise deinterleaving have been performed and the parity deinterleaving has not been performed, using the transformed parity check matrix obtained by performing at least column permutation corresponding to the parity interleaving for the parity check matrix H by the type B method used for the LDPC coding by the LDPC encoder 115 in FIG. 8, or the transformed parity check matrix (FIG. 29) obtained by performing row permutation for the parity check matrix (FIG. 27) by the type A method.

Here, LDPC decoding for enabling suppression of a circuit scale and suppression of an operation frequency within a sufficiently feasible range by being performed using a transformed parity check matrix has been previously proposed (for example, see Japanese Patent No. 4224777).

Therefore, first, the LDPC decoding using a transformed parity check matrix, which has been previously proposed, will be described with reference to FIGS. 140 to 143.

FIG. 140 is a diagram illustrating an example of the parity check matrix H of the LDPC code with the code length N of 90 and the coding rate of 2/3.

Note that, in FIG. 140 (similarly performed in FIGS. 141 and 142 described below), 0 is expressed by a period (.).

In the parity check matrix H in FIG. 140, the parity matrix has a step structure.

FIG. 141 is a diagram illustrating a parity check matrix H' obtained by applying row permutation of the expression (11) and column permutation of the expression (12) to the parity check matrix H in FIG. 140.

$$\text{Row permutation: } (6s+t+1)th \text{ row} \rightarrow (5t+s+1)th \text{ row} \quad (11)$$

$$\text{Column permutation: } (6x+y+61)th \text{ column} \rightarrow (5y+x+61)th \text{ column} \quad (12)$$

Note that, in the expressions (11) and (12), s, t, x, and y are integers in ranges of $0 \le s < 5$, $0 \le t < 6$, $0 \le x < 5$, and $0 \le t < 6$, respectively.

According to the row permutation of the expression (11), permutation is performed in such a manner that the 1, 7, 13, 19, and 25th rows where the remainder becomes 1 when being divided by 6 are respectively permutated to the 1, 2, 3, 4, and 5th rows, and the 2, 8, 14, 20, and 26th rows where the remainder becomes 2 when being divided by 6 are respectively permutated to the 6, 7, 8, 9, and 10th rows.

Furthermore, according to the column permutation of the expression (12), permutation is performed for the 61st and subsequent columns (parity matrix) in such a manner that the 61, 67, 73, 79, and 85th columns where the remainder becomes 1 when being divided by 6 are respectively permutated to the 61, 62, 63, 64, and 65, and the 62, 68, 74, 80, and 86th columns where the remainder becomes 2 when being divided by 6 are respectively permutated to the 66, 67, 68, 69, and 70th columns.

A matrix obtained by performing the row and column permutation for the parity check matrix H in FIG. 140 is the parity check matrix H' in FIG. 141.

Here, the row permutation of the parity check matrix H does not affect the sequence of the code bits of the LDPC code.

Furthermore, the column permutation of the expression (12) corresponds to parity interleaving with the information length K of 60, the parallel factor P of 5, and the divisor q (=M/P) of the parity length M (30 here) of 6, of the parity interleaving of interleaving the position of the (K+Py+x+1)th code bit with the (K+qx+y+1)th code bit.

Therefore, the parity check matrix H' in FIG. 141 is a transformed parity check matrix obtained by performing at least the column permutation of permutating the (K+qx+y+1)th column to the (K+Py+x+1)th column, of the parity check matrix (hereinafter referred to as original parity check matrix as appropriate) H in FIG. 140.

When multiplying the transformed parity check matrix H' in FIG. 141 by a resultant obtained by performing the same permutation as the expression (12) for the LDPC code of the original parity check matrix H in FIG. 140, a 0 vector is output. In other words, assuming that a row vector obtained by applying the column permutation of the expression (12) to the row vector c as the LDPC code (one codeword) of the original parity check matrix H is represented by c', $H'c'^T$ naturally becomes a 0 vector because $Hc^T$ becomes a 0 vector from the nature of the parity check matrix.

From the above, the transformed parity check matrix H' in FIG. 141 is a parity check matrix of the LDPC code c' obtained by performing the column permutation of the expression (12) for the LDPC code c of the original parity check matrix H.

Therefore, a similar decoding result to the case of decoding the LDPC code of the original parity check matrix H using the parity check matrix H can be obtained by performing the column permutation of the expression (12) for the LDPC code c of the original parity check matrix H, decoding (LDPC decoding) the LDPC code c' after the column permutation using the transformed parity check matrix H' in FIG. 141, and applying reverse permutation to the column permutation of the expression (12) to the decoding result.

FIG. 142 is a diagram illustrating the transformed parity check matrix H' in FIG. 141, which is separated in units of 5×5 matrix.

In FIG. 142, the transformed parity check matrix H' is represented by a combination of an identity matrix of 5×5 (=P×P) as the parallel factor P, a matrix where one or more of is in the identity matrix become 0 (hereinafter, the matrix is referred to as quasi identify matrix), a matrix obtained by cyclically shifting the identity matrix or the quasi identify matrix (hereinafter the matrix is referred to as shift matrix as appropriate), and a sum of two or more of the identity matrix, the quasi identify matrix, and the shift matrix (hereinafter, the matrix is referred to as sum matrix as appropriate), and a 5×5 zero matrix.

It can be said that the transformed parity check matrix H' in FIG. 142 is configured by the 5×5 identity matrix, the quasi identity matrix, the shift matrix, the sum matrix, and the 0 matrix. Therefore, these 5×5 matrices (the identity matrix, the quasi identity matrix, the shift matrix, the sum matrix, and the 0 matrix) constituting the transformed parity check matrix H' are hereinafter referred to as configuration matrices as appropriate.

For decoding of an LDPC code of a parity check matrix represented by a P×P configuration matrix, an architecture that simultaneously performs P check node operations and variable node operations can be used.

FIG. 143 is a block diagram illustrating a configuration example of a decoding device that performs such decoding.

In other words, FIG. 143 illustrates a configuration example of a decoding device that decodes the LDPC code using the transformed parity check matrix H' in FIG. 142 obtained by performing at least the column permutation of the expression (12) for the original parity check matrix H in FIG. 140.

The decoding device in FIG. 143 includes an edge data storage memory 300 including six FIFOs $\mathbf{300}_1$ to $\mathbf{300}_6$, a selector 301 for selecting the FIFOs $\mathbf{300}_1$ to $\mathbf{300}_6$, a check node calculation unit 302, two cyclic shift circuits 303 and 308, an edge data storage memory 304 including eighteen FIFOs $\mathbf{304}_1$ to $\mathbf{304}_{18}$, a selector 305 for selecting the FIFOs $\mathbf{304}_1$ to $\mathbf{304}_{18}$, a received data memory 306 for storing received data, a variable node calculation unit 307, a decoded word calculation unit 309, a received data rearrangement unit 310, and a decoded data rearrangement unit 311.

First, a method of storing data in the edge data storage memories 300 and 304 will be described.

The edge data storage memory 300 is configured by the six FIFOs $\mathbf{300}_1$ to $\mathbf{300}_6$, the six corresponding to a number obtained by dividing the number of rows of 30 of the transformed parity check matrix H' in FIG. 142 by the number of rows (parallel factor P) of 5 of the configuration matrix. The FIFO $\mathbf{300}_y$ (y=1, 2, . . . , 6) includes storage regions of a plurality of stages, and messages corresponding to five edges, the five corresponding to the number of rows and the number of columns (parallel factor P) of the configuration matrix, can be read and write at the same time with respect to the storage regions of the respective stages. Furthermore, the number of stages of the storage regions of the FIFO $\mathbf{300}_y$ is nine that is the maximum value of the number of is (Hamming weights) in the row direction of the transformed parity check matrix in FIG. 142.

In the FIFO $\mathbf{300}_1$, data (message $v_i$ from the variable node) corresponding to the positions of 1 of the 1st to 5th rows of the transformed parity check matrix H' in FIG. 142 is stored close to each other (ignoring 0) for each row in the cross direction. In other words, data corresponding to the positions of 1 of the 5×5 identity matrix of from (1, 1) to (5, 5) of the transformed parity check matrix H' is stored in the storage region of the first stage of the FIFO $\mathbf{300}_1$, where the j-th row i-th column is represented by (j, i). Data corresponding to the positions of 1 of the shift matrix of from (1, 21) to (5, 25) of the transformed parity check matrix H' (the shift matrix obtained by cyclically shifting the 5×5 identity matrix by only 3 in the right direction) is stored in the storage region of the second stage. Data is stored in association with the transformed parity check matrix H', similarly in the storage regions of the third to eighth stages. Then, data corresponding to the positions of 1 of the shift matrix of from (1, 86) to (5, 90) of the transformed parity check matrix H' (the shift matrix obtained by permutating 1 in the 1st row of the 5×5 identity matrix to 0 and cyclically shifting the identity matrix by only 1 in the left direction) is stored in the storage region of the ninth stage.

Data corresponding to the positions of 1 of from the 6th to 10th rows of the transformed parity check matrix H' in FIG. 142 is stored in the FIFO $\mathbf{300}_2$. In other words, data corresponding to the positions of 1 of a first shift matrix constituting the sum matrix of from (6, 1) to (10, 5) of the transformed parity check matrix H' (the sum matrix that is a sum of the first shift matrix obtained by cyclically shifting the 5×5 identity matrix by 1 to the right and a second shift matrix obtained by cyclically shifting the 5×5 identity matrix by 2 to the right) is stored in the storage region of the first stage of the FIFO $\mathbf{300}_2$. Furthermore, data corresponding to the positions of 1 of the second shift matrix constituting the sum matrix of from (6, 1) to (10, 5) of the transformed parity check matrix H' is stored in the storage region of the second stage.

In other words, in regard to the configuration matrix with the weight of 2 or more, when the configuration matrix is expressed by a form of a sum of some matrices of a P×P identity matrix with the weight of 1, a quasi identity matrix in which one or more of the elements of 1 of the identity matrix are 0, and a shift matrix obtained by cyclically shifting the identity matrix or the quasi identity matrix, the data corresponding to the position of 1 of the identity matrix with the weight of 1, the quasi identity matrix, or the shift matrix (the message corresponding to the edge belonging to the identity matrix, the quasi identity matrix, or the shift matrix) is stored in the same address (the same FIFO of FIFOs $\mathbf{300}_1$ to $\mathbf{300}_6$).

Hereinafter, data is stored in association with the transformed parity check matrix H', similarly in the storage regions of the third to ninth stages.

Data is similarly stored in the FIFOs 3003 to $\mathbf{300}_6$ in association with the transformed parity check matrix H'.

The edge data storage memory 304 is configured by the eighteen FIFOs $\mathbf{304}_1$ to $\mathbf{304}_{18}$, the eighteen corresponding to a number obtained by dividing the number of columns of 90 of the transformed parity check matrix H' by the number of columns (parallel factor P) of 5 of the configuration matrix. The FIFO $\mathbf{304}_x$ (x=1, 2, . . . , 18) includes storage regions of a plurality of stages, and messages corresponding to five edges, the five corresponding to the number of rows and the number of columns (parallel factor P) of the configuration matrix, can be read and written at the same time with respect to the storage regions of the respective stages.

In the FIFO $\mathbf{304}_1$, data (message $u_j$ from the check node) corresponding to the positions of 1 of the 1st to 5th columns of the transformed parity check matrix H' in FIG. 142 is stored close to each other (ignoring 0) for each column in the vertical direction. In other words, data corresponding to the positions of 1 of the 5×5 identity matrix of from (1, 1) to (5, 5) of the transformed parity check matrix H' is stored in the storage region of the first stage of the FIFO $\mathbf{304}_1$. Data corresponding to the positions of 1 of a first shift matrix constituting the sum matrix of from (6, 1) to (10, 5) of the transformed parity check matrix H' (the sum matrix that is a sum of the first shift matrix obtained by cyclically shifting the 5×5 identity matrix by 1 to the right and a second shift matrix obtained by cyclically shifting the 5×5 identity matrix by 2 to the right) is stored in the storage region of the second stage. Furthermore, data corresponding to the positions of 1 of the second shift matrix constituting the sum matrix of from (6, 1) to (10, 5) of the transformed parity check matrix H' is stored in the storage region of the third stage.

In other words, in regard to the configuration matrix with the weight of 2 or more, when the configuration matrix is expressed by a form of a sum of some matrices of a P×P identity matrix with the weight of 1, a quasi identity matrix in which one or more of the elements of 1 of the identity matrix are 0, and a shift matrix obtained by cyclically shifting the identity matrix or the quasi identity matrix, the data corresponding to the position of 1 of the identity matrix with the weight of 1, the quasi identity matrix, or the shift matrix (the message corresponding to the edge belonging to the identity matrix, the quasi identity matrix, or the shift matrix) is stored in the same address (the same FIFO of FIFOs 304$_1$ to 304$_{18}$).

Hereinafter, data is stored in association with the transformed parity check matrix H', similarly in the storage regions of the fourth and fifth stages. The number of stages of the storage regions of the FIFO 304$_1$ is five that is the maximum value of the number of is (Hamming weights) in the row direction in the 1st to 5th columns of the transformed parity check matrix H'.

Data is similarly stored in the FIFOs 304$_2$ and 304$_3$ in association with the transformed parity check matrix H', and respective lengths (stages) are five. Data is similarly stored in the FIFOs 304$_4$ to 304$_{12}$ in association with the transformed parity check matrix H', and respective lengths are three. Data is similarly stored in the FIFOs 304$_{13}$ to 304$_{18}$ in association with the transformed parity check matrix H', and respective lengths are two.

Next, the operation of the decoding device in FIG. 143 will be described.

The edge data storage memory 300 includes six FIFOs 300$_1$ to 300$_6$, and selects FIFO to store data from among the six FIFOs 300$_1$ to 300$_6$ according to information (matrix data) D312 indicating which row of the transformed parity check matrix H' in FIG. 142 five messages D311 supplied from the previous cyclic shift circuit 308 belong to, and collectively stores the five messages D311 to the selected FIFO in order. Furthermore, in reading data, the edge data storage memory 300 sequentially reads the five messages D300$_1$ from the FIFO 300$_1$ and supplies the read messages to the next-stage selector 301. The edge data storage memory 300 sequentially reads the messages from the FIFOs 300$_2$ to 300$_6$ after completion of the reading of the message from the FIFO 300$_1$, and supplies the messages to the selector 301.

The selector 301 selects the five messages from the FIFO currently being read out, of the FIFOs 300$_1$ to 300$_6$, according to a select signal D301, and supplies the messages as message D302 to the check node calculation unit 302.

The check node calculation unit 302 includes five check node calculators 302$_1$ to 302$_5$, and performs the check node operation according to the expression (7), using the messages D302 (D302$_1$ to D302$_5$) (the messages $v_i$ of the expression (7)) supplied through the selector 301, and supplies five messages D303 (D303$_1$ to D303$_5$) obtained as a result of the check node operation (messages $u_j$ of the expression (7)) to the cyclic shift circuit 303.

The cyclic shift circuit 303 cyclically shifts the five messages D303$_1$ to D303$_5$ obtained by the check node calculation unit 302, on the basis of information (matrix data) D305 indicating how many identity matrices (or quasi identify matrices), which are the basis of the transformed parity check matrix H', have been cyclically shifted for the corresponding edge, and supplies a result as a message D304 to the edge data storage memory 304.

The edge data storage memory 304 includes eighteen FIFOs 304$_1$ to 304$_{18}$, and selects FIFO to store data from among the FIFOs 304$_1$ to 304$_{18}$ according to information D305 indicating which row of the transformed parity check matrix H' five messages D304 supplied from the previous cyclic shift circuit 303 belong to, and collectively stores the five messages D304 to the selected FIFO in order. Furthermore, in reading data, the edge data storage memory 304 sequentially reads five messages D306$_1$ from the FIFO 304$_1$ and supplies the read messages to the next-stage selector 305. The edge data storage memory 304 sequentially reads the messages from the FIFOs 304$_2$ to 304$_{18}$ after completion of the reading of the message from the FIFO 304$_1$, and supplies the messages to the selector 305.

The selector 305 selects the five messages from the FIFO currently being read out, of the FIFOs 304$_1$ to 304$_{18}$, according to a select signal D307, and supplies the messages as message D308 to the variable node calculation unit 307 and the decoded word calculation unit 309.

Meanwhile, the received data rearrangement unit 310 rearranges an LDPC code D313 corresponding to the parity check matrix H in FIG. 140, which has been received via the communication path 13, by performing the column permutation of the expression (12), and supplies data as received data D314 to the received data memory 306. The received data memory 306 calculates and stored received LLR (log likelihood ratio) from the received data D314 supplied from the received data rearrangement unit 310, and groups five received LLRs and collectively supplies the five received LLRs as a received value D309 to the variable node calculation unit 307 and the decoded word calculation unit 309.

The variable node calculation unit 307 includes five variable node calculators 3071 to 3075, and performs the variable node operation according to the expression (1), using the messages D308 (D308$_1$ to D308$_5$) (messages $u_j$ of the expression (1)) supplied via the selector 305, and the five received values D309 (received values $u_{0i}$ of the expression (1)) supplied from the received data memory 306, and supplies messages D310 (D310$_1$ to D310$_5$) (messages $v_i$ of the expression (1)) obtained as a result of the operation to the cyclic shift circuit 308.

The cyclic shift circuit 308 cyclically shifts the messages D310$_1$ to D310$_5$ calculated by the variable node calculation unit 307 on the basis of information indicating how many identity matrices (or quasi identify matrices), which are the basis of the transformed parity check matrix H', have been cyclically shifted for the corresponding edge, and supplies a result as a message D311 to the edge data storage memory 300.

By one round of the above operation, one decoding (variable node operation and check node operation) of the LDPC code can be performed. After decoding the LDPC code a predetermined number of times, the decoding device in FIG. 143 obtains and outputs a final decoding result in the decoded word calculation unit 309 and the decoded data rearrangement unit 311.

In other words, the decoded word calculation unit 309 includes five decoded word calculators 309$_1$ to 309$_5$, and calculates, as a final stage of the plurality of times of decoding, the decoding result (decoded word) on the basis of the expression (5), using the five messages D308 (D308$_1$ to D308$_5$) (messages $u_j$ of the expression (5)) output by the selector 305, and the five received values D309 (received values $u_{0i}$ of the expression (5)) supplied from the received data memory 306, and supplies resulting decoded data D315 to the decoded data rearrangement unit 311.

The decoded data rearrangement unit 311 rearranges the decoded data D315 supplied from the decoded word calculation unit 309 by performing reverse permutation to the column permutation of the expression (12), and outputs a final decoding result D316.

As described above, by applying at least one or both of the row permutation and the column permutation to the parity check matrix (original parity check matrix) to transform the parity check matrix into a parity check matrix (transformed parity check matrix) that can be represented by a combination of a P×P identity matrix, a quasi identity matrix in which one or more of is in the identity matrix are 0, a shift matrix obtained by cyclically shifting the identity matrix or the quasi identity matrix, a sum matrix that is a sum of some matrices of the identity matrix, the quasi identify matrix, and the shift matrix, and a P×P zero matrix, that is, by a combination of the configuration matrices, an architecture to perform P check node operations and variable node operations at the same time for decoding of the LDPC code, the P being a number smaller than the number of rows and the number of columns of the parity check matrix, can be adopted. In the case of adopting the architecture to perform P node operations (check node operations and variable node operations) at the same time, the P being the number smaller than the number of rows and the number of columns of the parity check matrix, a large number of repetitive decodings can be performed while suppressing the operation frequency to the feasible range, as compared with a case of performing the number of node operations at the same time, the number being equal to the number of rows and the number of columns of the parity check matrix.

The LDPC decoder 166 constituting the reception device 12 in FIG. 137 performs the LDPC decoding by performing the P check node operations and variable node operations at the same time, for example, similarly to the decoding device in FIG. 143.

In other words, to simplify the description, assuming that the parity check matrix of the LDPC code output by the LDPC encoder 115 constituting the transmission device 11 in FIG. 8 is the parity check matrix H with the parity matrix having a step structure, as illustrated in FIG. 140, for example, the parity interleaver 23 of the transmission device 11 performs the parity interleaving of interleaving the position of the (K+Py+x+1)th code bit with (K+qx+y+1)th code bit with the setting of the information length K of 60, the parallel factor P of 5, the divisor q (=M/P) of the parity length M of 6.

Since this parity interleaving corresponds to the column permutation of the expression (12) as described above, the LDPC decoder 166 does not need to perform the column permutation of the expression (12).

Therefore, the reception device 12 in FIG. 137 performs similar processing to the decoding device in FIG. 143 except that the LDPC code for which the parity deinterleaving has not been performed, that is, the LDPC code in the state where the column permutation of the expression (12) has been performed, is supplied from the group-wise deinterleaver 55 to the LDPC decoder 166, as described above, and the LDPC decoder 166 does not perform the column permutation of the expression (12).

In other words, FIG. 144 is a diagram illustrating a configuration example of the LDPC decoder 166 in FIG. 137.

In FIG. 144, the LDPC decoder 166 is similarly configured to the decoding device in FIG. 143 except that the received data rearrangement unit 310 in FIG. 143 is not provided, and performs similar processing to the decoding device in FIG. 143 except that the column permutation of the expression (12) is not performed. Therefore, description is omitted.

As described above, since the LDPC decoder 166 can be configured without including the received data rearrangement unit 310, the scale can be reduced as compared with the decoding device in FIG. 143.

Note that, in FIGS. 140 to 144, to simplify the description, the code length N of 90, the information length K of 60, the parallel factor (the numbers of rows and columns of the configuration matrix) P of 5, and the divisor q (=M/P) of the parity length M of 6 are set for the LDPC code. However, the code length N, the information length K, the parallel factor P, and the divisor q (=M/P) are not limited to the above-described values.

In other words, in the transmission device 11 in FIG. 8, what the LDPC encoder 115 outputs is the LDPC codes with the code lengths N of 64800, 16200, 69120, and the like, the information length K of N−Pq (=N−M), the parallel factor P of 360, and the divisor q of M/P, for example. However, the LDPC decoder 166 in FIG. 144 can be applied to a case of performing the LDPC decoding by performing the P check node operations and variable node operations at the same time for such LDPC codes.

Furthermore, after the decoding of the LDPC code in the LDPC decoder 166, the parity part of the decoding result is unnecessary, and in a case of outputting only the information bits of the decoding result, the LDPC decoder 166 can be configured without the decoded data rearrangement unit 311.

<Configuration Example of Block Deinterleaver 54>

FIG. 145 is a diagram for describing block deinterleaving performed by the block deinterleaver 54 in FIG. 138.

In the block deinterleaving, reverse processing to the block interleaving by the block interleaver 25 described in FIG. 123 is performed to return (restore) the sequence of the code bits of the LDPC code to the original sequence.

In other words, in the block deinterleaving, for example, as in the block interleaving, the LDPC code is written and read with respect to m columns, the m being equal to the bit length m of the symbol, whereby the sequence of the code bits of the LDPC code is returned to the original sequence.

Note that, in the block deinterleaving, writing of the LDPC code is performed in the order of reading the LDPC code in the block interleaving. Moreover, in the block deinterleaving, reading of the LDPC code is performed in the order of writing the LDPC code in the block interleaving.

In other words, in regard to part 1 of the LDPC code, part 1 of the LDPC code in units of m-bit symbol is written in the row direction from the 1st row of all the m columns, as illustrated in FIG. 145. In other words, the code bit of the LDPC code, which is the m-bit symbol, is written in the row direction.

Writing of part 1 in units of m bits is sequentially performed toward lower rows of the m columns, and when the writing of part 1 is completed, as illustrated in FIG. 145, reading of part 1 downward from the top of the first column unit of the column is performed in the columns from the left to right direction.

When the reading to the rightmost column is completed, the reading returns to the leftmost column, and reading of part 1 downward from the top of the second column unit of the column is performed in the columns from the left to right direction, as illustrated in FIG. 145. Hereinafter, reading of part 1 of the LDPC code of one codeword is similarly performed.

When the reading of part 1 of the LDPC code of one codeword is completed, in regard to part 2 in units of m-bit symbols, the units of m-bit symbols are sequentially concatenated after part 1, whereby the LDPC code in units of symbols is returned to the sequence of code bits of the LDPC code (the LDCP code before block interleaving) of the original one codeword.

<Another Configuration Example of Bit Deinterleaver 165>

FIG. 146 is a block diagram illustrating another configuration example of the bit deinterleaver 165 in FIG. 137.

Note that, in FIG. 146, parts corresponding to those in FIG. 138 are given the same reference numerals, and hereinafter, description thereof will be omitted as appropriate.

In other words, the bit deinterleaver 165 in FIG. 146 is similarly configured to the case in FIG. 138 except that a parity deinterleaver 1011 is newly provided.

In FIG. 146, the bit deinterleaver 165 includes the block deinterleaver 54, the group-wise deinterleaver 55, and the parity deinterleaver 1011, and performs bit deinterleaving for the code bits of the LDPC code from the demapper 164.

In other words, the block deinterleaver 54 performs, for the LDPC code from demapper 164, block deinterleaving corresponding to the block interleaving performed by the block interleaver 25 of the transmission device 11 (processing reverse to the block interleaving), in other words, block deinterleaving of returning the positions of the code bits rearranged by the block interleaving to the original positions, and supplies a resulting LDPC code to the group-wise deinterleaver 55.

The group-wise deinterleaver 55 performs, for the LDPC code from the block deinterleaver 54, group-wise deinterleaving corresponding to group-wise interleaving as rearrangement processing performed by the group-wise interleaver 24 of the transmission device 11.

The LDPC code obtained as a result of group-wise deinterleaving is supplied from the group-wise deinterleaver 55 to the parity deinterleaver 1011.

The parity deinterleaver 1011 performs, for the bit codes after the group-wise deinterleaving in the group-wise deinterleaver 55, parity deinterleaving corresponding to the parity interleaving performed by the parity interleaver 23 of the transmission device 11 (processing reverse to the parity interleaving), in other words, parity deinterleaving of returning the sequence of the code bits of the LDPC code changed in sequence by the parity interleaving to the original sequence.

The LDPC code obtained as a result of the parity deinterleaving is supplied from the parity deinterleaver 1011 to the LDPC decoder 166.

Therefore, in the bit deinterleaver 165 in FIG. 146, the LDPC code for which the block deinterleaving, group-wise deinterleaving, and the parity deinterleaving have been performed, in other words, the LDPC code obtained by the LDPC coding according to the parity check matrix H, is supplied to the LDPC decoder 166.

The LDPC decoder 166 performs LDPC decoding for the LDPC code from the bit deinterleaver 165 using the parity check matrix H used for the LDPC coding by the LDPC encoder 115 of the transmission device 11.

In other words, in the type B method, the LDPC decoder 166 performs, for the LDPC code from the bit deinterleaver 165, the LDPC decoding using the parity check matrix H itself (of the type B method) used for the LDPC coding by the LDPC encoder 115 of the transmission device 11 or using the transformed parity check matrix obtained by performing at least column permutation corresponding to the parity interleaving for the parity check matrix H. Furthermore, in the type A method, the LDPC decoder 166 performs, for the LDPC code from the bit deinterleaver 165, the LDPC decoding using the parity check matrix (FIG. 28) obtained by applying column permutation to the parity check matrix (FIG. 27) (of the type A method) used for the LDPC coding by the LDPC encoder 115 of the transmission device 11 or using the transformed parity check matrix (FIG. 29) obtained by applying row permutation to the parity check matrix (FIG. 27) used for the LDPC coding.

Here, in FIG. 146, since the LDPC code obtained by LDPC coding according to the parity check matrix H is supplied from (the parity deinterleaver 1011 of) the bit deinterleaver 165 to the LDPC decoder 166, in a case of performing LDPC decoding of the LDPC code using the parity check matrix H itself by the type B method used for the LDPC coding by the LDPC encoder 115 of the transmission device 11 or using the parity check matrix (FIG. 28) obtained by applying column permutation to the parity check matrix (FIG. 27) by the type A method used for the LDPC coding, the LDPC decoder 166 can be configured as a decoding device for performing LDPC decoding by a full serial decoding method in which operations of messages (a check node message and a variable node message) are sequentially performed for one node at a time or a decoding device for performing LDPC decoding by a full parallel decoding method in which operations of messages are performed simultaneously (parallelly) for all nodes, for example.

Furthermore, in the LDPC decoder 166, in a case of performing LDPC decoding of the LDPC code using the transformed parity check matrix obtained by applying at least column permutation corresponding to the parity interleaving to the parity check matrix H by the type B method used for the LDPC coding by the LDPC encoder 115 of the transmission device 11 or using the transformed parity check matrix (FIG. 29) obtained by applying row permutation to the parity check matrix (FIG. 27) by the type A method used for the LDPC coding, the LDPC decoder 166 can be configured as an architecture decoding device for simultaneously performing the check node operation and the variable node operation for P nodes (or divisors of P other than 1), the architecture decoding device being also a decoding device (FIG. 143) including the received data rearrangement unit 310 for rearranging the code bits of the LDPC code by applying column permutation similar to the column permutation (parity interleaving) for obtaining the transformed parity check matrix to the LDPC code.

Note that, in FIG. 146, for convenience of description, the block deinterleaver 54 for performing block deinterleaving, the group-wise deinterleaver 55 for performing group-wise deinterleaving, and the parity deinterleaver 1011 for performing parity deinterleaving are separately configured. However, two or more of the block deinterleaver 54, the group-wise deinterleaver 55, and the parity deinterleaver 1011 can be integrally configured similarly to the parity interleaver 23, the group-wise interleaver 24, and the block interleaver 25 of the transmission device 11.

<Configuration Example of Reception System>

FIG. 147 is a block diagram illustrating a first configuration example of the reception system to which the reception device 12 is applicable.

In FIG. 147, the reception system includes an acquisition unit 1101, a transmission path decoding processing unit 1102, and an information source decoding processing unit 1103.

The acquisition unit 1101 acquires a signal including the LDPC code obtained by performing at least the LDPC coding for the LDPC target data such as image data and audio data of a program or the like, via a transmission path (communication path, not illustrated) such as, for example, terrestrial digital broadcasting, satellite digital broadcasting, a cable television (CATV) network, the Internet, or another network, and supplies the signal to the transmission path decoding processing unit 1102.

Here, in a case where the signal acquired by the acquisition unit 1101 is broadcasted from, for example, a broadcasting station via terrestrial waves, satellite waves, cable television (CATV) networks, or the like, the acquisition unit 1101 is configured by a tuner, a set top box (STB), or the like. Furthermore, in a case where the signal acquired by the acquisition unit 1101 is transmitted from a web server by multicast like an internet protocol television (IPTV), for example, the acquisition unit 1101 is configured by, for example, a network interface (I/F) such as a network interface card (NIC).

The transmission path decoding processing unit 1102 corresponds to the reception device 12. The transmission path decoding processing unit 1102 applies transmission path decoding processing including at least processing of correcting an error occurring in the transmission path to the signal acquired by the acquisition unit 1101 via the transmission path, and supplies a resulting signal to the information source decoding processing unit 1103.

In other words, the signal acquired by the acquisition unit 1101 via the transmission path is a signal obtained by performing at least error correction coding for correcting an error occurring in the transmission path, and the transmission path decoding processing unit 1102 applies the transmission path decoding processing such as the error correction processing to such a signal, for example.

Here, examples of the error correction coding include LDPC coding, BCH coding, and the like. Here, at least the LDPC coding is performed as the error correction coding.

Furthermore, the transmission path decoding processing may include demodulation of a modulated signal, and the like.

The information source decoding processing unit 1103 applies information source decoding processing including at least processing of decompressing compressed information into original information to the signal to which the transmission path decoding processing has been applied.

In other words, compression encoding for compressing information is sometimes applied to the signal acquired by the acquisition unit 1101 via the transmission path in order to reduce the amount of data such as image and sound as the information. In that case, the information source decoding processing unit 1103 applies the information source decoding processing such as processing of decompressing the compressed information into the original information (decompression processing) to the signal to which the transmission path decoding processing has been applied.

Note that, in a case where the compression encoding has not been applied to the signal acquired by the acquisition unit 1101 via the transmission path, the information source decoding processing unit 1103 does not perform the processing of decompressing the compressed information into the original information.

Here, an example of the decompression processing includes MPEG decoding and the like. Furthermore, the transmission path decoding processing may include descrambling and the like in addition to the decompression processing.

In the reception system configured as described above, the acquisition unit 1101 acquires the signal obtained by applying the compression encoding such as MPEG coding to data such as image and sound, for example, and further applying the error correction coding such as the LDPC coding to the compressed data, via the transmission path, and supplies the acquired signal to the transmission path decoding processing unit 1102.

The transmission path decoding processing unit 1102 applies processing similar to the processing performed by the reception device 12 or the like, for example, to the signal from the acquisition unit 1101 as the transmission path decoding processing, and supplies the resulting signal to the information source decoding processing unit 1103.

The information source decoding processing unit 1103 applies the information source decoding processing such as MPEG decoding to the signal from the transmission path decoding processing unit 1102, and outputs resulting image or sound.

The reception system in FIG. 147 as described above can be applied to, for example, a television tuner for receiving television broadcasting as digital broadcasting and the like.

Note that the acquisition unit 1101, the transmission path decoding processing unit 1102, and the information source decoding processing unit 1103 can be configured as independent devices (hardware (integrated circuits (ICs) or the like) or software modules), respectively.

Furthermore, the acquisition unit 1101, the transmission path decoding processing unit 1102, and the information source decoding processing unit 1103 can be configured as a set of the acquisition unit 1101 and the transmission path decoding processing unit 1102, a set of the transmission path decoding processing unit 1102 and the information source decoding processing unit 1103, or a set of the acquisition unit 1101, the transmission path decoding processing unit 1102, and the information source decoding processing unit 1103, as an independent device.

FIG. 148 is a block diagram illustrating a second configuration example of the reception system to which the reception device 12 is applicable.

Note that, in FIG. 148, parts corresponding to those in FIG. 147 are given the same reference numerals, and hereinafter, description thereof will be omitted as appropriate.

The reception system in FIG. 148 is common to the case in FIG. 147 in including the acquisition unit 1101, the transmission path decoding processing unit 1102, and the information source decoding processing unit 1103 but is different from the case in FIG. 147 in newly including an output unit 1111.

The output unit 1111 is, for example, a display device for displaying an image or a speaker for outputting a sound, and outputs an image, a sound, or the like as a signal output from the information source decoding processing unit 1103. In other words, the output unit 1111 displays an image or outputs a sound.

The reception system in FIG. 148 as described above can be applied to, for example, a television (TV) receiver for receiving television broadcasting as the digital broadcasting, a radio receiver for receiving radio broadcasting, or the like.

Note that, in a case where the compression encoding has not been applied to the signal acquired by the acquisition unit 1101, the signal output by the transmission path decoding processing unit 1102 is supplied to the output unit 1111.

FIG. 149 is a block diagram illustrating a third configuration example of the reception system to which the reception device 12 is applicable.

Note that, in FIG. 149, parts corresponding to those in FIG. 147 are given the same reference numerals, and hereinafter, description thereof will be omitted as appropriate.

The reception system in FIG. 149 is common to the case in FIG. 147 in including the acquisition unit 1101 and the transmission path decoding processing unit 1102.

However, the reception system in FIG. 149 is different from the case in FIG. 147 in not including the information source decoding processing unit 1103 and newly including a recording unit 1121.

The recording unit 1121 records (stores) the signal (for example, a TS packet of TS of MPEG) output by the transmission path decoding processing unit 1102 on a recording (storage) medium such as an optical disk, a hard disk (magnetic disk), or a flash memory.

The reception system in FIG. 149 as described above can be applied to a recorder for recording television broadcasting or the like.

Note that, in FIG. 149, the reception system includes the information source decoding processing unit 1103, and the information source decoding processing unit 1103 can record the signal to which the information source decoding processing has been applied, in other words, the image or sound obtained by decoding, in the recording unit 1121.

<Embodiment of Computer>

Next, the above-described series of processing can be executed by hardware or software. In a case of executing the series of processing by software, a program that configures the software is installed in a general-purpose computer or the like.

Thus, FIG. 150 illustrates a configuration example of an embodiment of a computer to which a program for executing the above-described series of processing is installed.

The program can be recorded in advance in a hard disk 705 or a ROM 703 as a recording medium built in the computer.

Alternatively, the program can be temporarily or permanently stored (recorded) on a removable recording medium 711 such as a flexible disk, a compact disc read only memory (CD-ROM), a magneto optical (MO) disk, a digital versatile disc (DVD), a magnetic disk, or a semiconductor memory. Such a removable recording medium 711 can be provided as so-called package software.

Note that the program can be installed from the above-described removable recording medium 711 to the computer, can be transferred from a download site to the computer via an artificial satellite for digital satellite broadcasting, or can be transferred by wired means to the computer via a network such as a local area network (LAN) or the internet, and the program thus transferred can be received by a communication unit 708 and installed on the built-in hard disk 705 in the computer.

The computer incorporates a central processing unit (CPU) 702. An input/output interface 710 is connected to the CPU 702 via a bus 701. The CPU 702 executes the program stored in the read only memory (ROM) 703 according to a command when the command is input by the user by an operation of an input unit 707 including a keyboard, a mouse, a microphone, and the like via the input/output interface 710, for example. Alternatively, the CPU 702 loads the program stored in the hard disk 705, the program transferred from the satellite or the network, received by the communication unit 708, and installed in the hard disk 705, or the program read from the removable recording medium 711 attached to a drive 709 and installed in the hard disk 705 to a random access memory (RAM) 704 and executes the program. As a result, the CPU 702 performs the processing according to the above-described flowchart or the processing performed by the configuration of the above-described block diagram. Then, the CPU 702 causes an output unit 706 including a liquid crystal display (LCD), a speaker, and the like to output the processing result, the communication unit 708 to transmit the processing result, and the hard disk 705 to record the processing result, via the input/output interface 710, as necessary, for example.

Here, processing steps describing the program for causing the computer to perform various types of processing does not necessarily need to be processed chronologically according to the order described in the flowcharts, and includes processing executed in parallel or individually (for example, processing by parallel processing or object).

Furthermore, the program may be processed by one computer or may be processed in a distributed manner by a plurality of computers. Moreover, the program may be transferred to a remote computer and executed.

Note that embodiments of the present technology are not limited to the above-described embodiments, and various modifications can be made without departing from the gist of the present technology.

For example, (the parity check matrix initial value table of) the above-described new LDPC code and GW pattern can be used for a satellite channel, a ground wave, a cable (wired channel), and another communication path 13 (FIG. 7). Moreover, the new LDPC code and GW pattern can be used for data transmission other than digital broadcasting.

Note that the effects described in the present specification are merely examples and are not limited, and other effects may be exhibited.

REFERENCE SIGNS LIST

11 Transmission device
12 Reception device
23 Parity interleaver
24 Group-wise interleaver
25 Block interleaver
54 Block deinterleaver
55 Group-wise deinterleaver
111 Mode adaptation/multiplexer
112 Padder
113 BB scrambler
114 BCH encoder
115 LDPC encoder
116 Bit interleaver
117 Mapper
118 Time interleaver
119 SISO/MISO encoder
120 Frequency interleaver
121 BCH encoder
122 LDPC encoder
123 Mapper
124 Frequency interleaver
131 Frame builder/resource allocation unit
132 OFDM generation unit
151 OFDM processing unit
152 Frame management unit
153 Frequency deinterleaver
154 Demapper
155 LDPC decoder
156 BCH decoder
161 Frequency deinterleaver
162 SISO/MISO decoder
163 Time deinterleaver
164 Demapper
165 Bit deinterleaver
166 LDPC decoder
167 BCH decoder
168 BB descrambler
169 Null deletion unit
170 Demultiplexer

300 Edge data storage memory
301 Selector
302 Check node calculation unit
303 Cyclic shift circuit
304 Edge data storage memory
305 Selector
306 Received data memory
307 Variable node calculation unit
308 Cyclic shift circuit
309 Decoded word calculation unit
310 Received data rearranging unit
311 Decoded data rearranging unit
601 Coding processing unit
602 Storage unit
611 Coding rate setting unit
612 Initial value table reading unit
613 Parity check matrix generation unit
614 Information bit reading unit
615 Coding parity operation unit
616 Control unit
701 Bus
702 CPU
703 ROM
704 RAM
705 Hard disk
706 Output unit
707 Input unit
708 Communication unit
709 Drive
710 Input/output interface
711 Removable recording medium
1001 Reverse permutation unit
1002 Memory
1011 Parity deinterleaver
1101 Acquisition unit
1102 Transmission path decoding processing unit
1103 Information source decoding processing unit
1111 Output unit
1121 Recording unit

The invention claimed is:

1. A transmission method comprising:

performing LDPC coding on a basis of a parity check matrix of an LDPC code with a code length N of 69120 bits and a coding rate r of 7/16;

performing group-wise interleaving in which the LDPC code is interleaved in units of bit groups of 360 bits;

mapping the LDPC code to one of 4 signal points of quadrature phase shift keying (QPSK) on a 2-bit basis to generate a transmission signal for transmission; and transmitting the transmission signal, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 191, 12, 188, 158, 173, 48, 75, 146, 113, 15, 51, 119, 132, 161, 91, 189, 142, 93, 120, 29, 156, 101, 100, 22, 165, 65, 98, 153, 127, 74, 39, 80, 38, 130, 148, 81, 13, 24, 125, 0, 174, 140, 124, 5, 68, 3, 104, 136, 63, 162, 106, 8, 25, 182, 178, 90, 96, 79, 168, 172, 128, 64, 69, 102, 45, 66, 86, 155, 163, 6, 152, 164, 108, 9, 111, 16, 177, 53, 94, 85, 72, 32, 147, 184, 117, 30, 54, 34, 70, 149, 157, 109, 73, 41, 131, 187, 185, 18, 4, 150, 92, 143, 14, 115, 20, 50, 26, 83, 36, 58, 169, 107, 129, 121, 43, 103, 21, 139, 52, 167, 19, 2, 40, 116, 181, 61, 141, 17, 33, 11, 135, 1, 37, 123, 180, 137, 77, 166, 183, 82, 23, 56, 88, 67, 176, 76, 35, 71, 105, 87, 78, 171, 55, 62, 44, 57, 97, 122, 112, 59, 27, 99, 84, 10, 134, 42, 118, 144, 49, 28, 126, 95, 7, 110, 186, 114, 151, 145, 175, 138, 133, 31, 179, 89, 46, 160, 170, 60, 154, 159, 47, 190, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |

-continued

| | | | | | | | | | | |
|---|---|---|---|---|---|---|---|---|---|---|
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |
| 5419 | 17091 | 17716 | 18981 | 31131 | | | | | | |
| 15196 | 21587 | 28478 | 32583 | 36053 | | | | | | |
| 17134 | 18820 | 32977 | 34175 | 36060 | | | | | | |
| 15599 | 21709 | 22462 | 28663 | 33979 | | | | | | |
| 4691 | 13050 | 23737 | 30447 | 37128 | | | | | | |
| 22733 | 24839 | 26808 | 37191 | 37396 | | | | | | |
| 8896 | 14951 | 16202 | 26775 | 29470 | | | | | | |
| 13355 | 19354 | 27988 | 36027 | 37312 | | | | | | |
| 8938 | 11340 | 12434 | 19496 | 37986 | | | | | | |
| 5876 | 25181 | 32766 | 33412 | 35330. | | | | | | |

2. A reception device comprising:

processing circuitry configured to:

receive a transmission signal including an LDPC code; and return a sequence of the LDPC code with a code length N of 69120 bits and a coding rate r of 7/16 after group-wise interleaving to an original sequence, the sequence being obtained from the transmission signal that is generated based on LDPC coding being performed on a basis of a parity check matrix of the LDPC code, group-wise interleaving being performed in which the LDPC code is interleaved in units of bit groups of 360 bits, and the LDPC code being mapped to one of 4 signal points of quadrature phase shift keying (QPSK) on a 2-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 191, 12, 188, 158, 173, 48, 75, 146, 113, 15, 51, 119, 132, 161, 91, 189, 142, 93, 120, 29, 156, 101, 100, 22, 165, 65, 98, 153, 127, 74, 39, 80, 38, 130, 148, 81, 13, 24, 125, 0, 174, 140, 124, 5, 68, 3, 104, 136, 63, 162, 106, 8, 25, 182, 178, 90, 96, 79, 168, 172, 128, 64, 69, 102, 45, 66, 86, 155, 163, 6, 152, 164, 108, 9, 111, 16, 177, 53, 94, 85, 72, 32, 147, 184, 117, 30, 54, 34, 70, 149, 157, 109, 73, 41, 131, 187, 185, 18, 4, 150, 92, 143, 14, 115, 20, 50, 26, 83, 36, 58, 169, 107, 129, 121, 43, 103, 21, 139, 52, 167, 19, 2, 40, 116, 181, 61, 141, 17, 33, 11, 135, 1, 37, 123, 180, 137, 77, 166, 183, 82, 23, 56, 88, 67, 176, 76, 35, 71, 105, 87, 78, 171, 55, 62, 44, 57, 97, 122, 112, 59, 27, 99, 84, 10, 134, 42, 118, 144, 49, 28, 126, 95, 7, 110, 186, 114, 151, 145, 175, 138, 133, 31, 179, 89, 46, 160, 170, 60, 154, 159, 47, 190, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |

-continued

| | | | | |
|---|---|---|---|---|
| 27 | 165 | 1499 | 11445 | 26229 |
| 2740 | 3378 | 4070 | 8121 | 11725 |
| 464 | 695 | 2670 | 19972 | 31016 |
| 58 | 551 | 769 | 13142 | 18176 |
| 1818 | 2794 | 3077 | 14099 | 28393 |
| 649 | 4125 | 4624 | 29698 | 32032 |
| 200 | 2480 | 2912 | 23789 | 36598 |
| 212 | 3477 | 4526 | 10049 | 30926 |
| 901 | 2299 | 3757 | 10605 | 24358 |
| 321 | 1488 | 1718 | 24930 | 25738 |
| 2283 | 3823 | 3943 | 16768 | 35564 |
| 253 | 2932 | 4234 | 21419 | 29606 |
| 2701 | 3576 | 4425 | 9250 | 24023 |
| 2217 | 3403 | 4654 | 14977 | 23115 |
| 817 | 2872 | 3491 | 17773 | 23918 |
| 1783 | 1838 | 4330 | 11645 | 36545 |
| 1231 | 3435 | 4503 | 9035 | 29888 |
| 826 | 1836 | 2994 | 22108 | 22827 |
| 229 | 1417 | 2078 | 14324 | 17714 |
| 567 | 3244 | 3728 | 22202 | 33883 |
| 799 | 1180 | 1329 | 12496 | 22390 |
| 549 | 1311 | 3657 | 17564 | 35009 |
| 132 | 517 | 3180 | 5304 | 35588 |
| 2767 | 3953 | 4221 | 30887 | 34291 |
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

3. A transmission method comprising:

performing LDPC coding on a basis of a parity check matrix of an LDPC code with a code length N of 69120 bits and a coding rate r of 3/16;

performing group-wise interleaving in which the LDPC code is interleaved in units of bit groups of 360 bits;

mapping the LDPC code to one of 16 signal points of uniform constellation (UC) in 16 quadrature amplitude modulation (16QAM) on a 4-bit basis to generate a transmission signal for transmission; and transmitting the transmission signal, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 133, 69, 28, 111, 127, 5, 97, 42, 9, 160, 139, 135, 138, 130, 86, 94, 75, 15, 21, 73, 89, 59, 76, 17, 64, 152, 55, 106, 34, 2, 163, 187, 170, 52, 1, 174, 45, 99, 57, 105, 4, 35, 119, 31, 114, 155, 67, 156, 8, 88, 103, 172, 149, 58, 166, 37, 164, 189, 71, 30, 72, 148, 38, 98, 176, 185, 182, 134, 95, 173, 78, 48, 96, 26, 151, 167, 159, 175, 74, 53, 162, 110, 54, 49, 83, 79, 171, 90, 61, 100, 150, 121, 43, 66, 144, 44, 132, 188, 115, 41, 25, 80, 13, 104, 161, 65, 116, 14, 158, 51, 117, 60, 190, 140, 186, 123, 40, 122, 102, 128, 107, 183, 11, 146, 10, 68, 0, 84, 36, 143, 153, 93, 33, 50, 101, 7, 27, 137, 120, 191, 165, 131, 18, 70, 112, 154, 169, 92, 29, 136, 12, 157, 47, 19, 181, 147, 180, 141, 142, 126, 118, 129, 124, 3, 177, 62, 16, 22, 179, 39, 145, 85, 32, 168, 77, 6, 23, 125, 82, 113, 20, 109, 24, 178, 46, 81, 108, 63, 56, 87, 91, 184, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |

-continued

| | | | | | | | | | |
|---|---|---|---|---|---|---|---|---|---|
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

4. A reception device comprising:

processing circuitry configured to:

receive a transmission signal including an LDPC code; and return a sequence of the LDPC code with a code length N of 69120 bits and a coding rate r of 3/16 after group-wise interleaving to an original sequence, the sequence being obtained from the transmission signal that is generated based on LDPC coding being performed on a basis of a parity check matrix of the LDPC code, group-wise interleaving being performed in which the LDPC code is interleaved in units of bit groups of 360 bits, and the LDPC code being mapped to one of 16 signal points of uniform constellation (UC) of 16 quadrature amplitude modulation (16QAM) on a 4-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 133, 69, 28, 111, 127, 5, 97, 42, 9, 160, 139, 135, 138, 130, 86, 94, 75, 15, 21, 73, 89, 59, 76, 17, 64, 152, 55, 106, 34, 2, 163, 187, 170, 52, 1, 174, 45, 99, 57, 105, 4, 35, 119, 31, 114, 155, 67, 156, 8, 88, 103, 172, 149, 58, 166, 37, 164, 189, 71, 30, 72, 148, 38, 98, 176, 185, 182, 134, 95, 173, 78, 48, 96, 26, 151, 167, 159, 175, 74, 53, 162, 110, 54, 49, 83, 79, 171, 90, 61, 100, 150, 121, 43, 66, 144, 44, 132, 188, 115, 41, 25, 80, 13, 104, 161, 65, 116, 14, 158, 51, 117, 60, 190, 140, 186, 123, 40, 122, 102, 128, 107, 183, 11, 146, 10, 68, 0, 84, 36, 143, 153, 93, 33, 50, 101, 7, 27, 137, 120, 191, 165, 131, 18, 70, 112, 154, 169, 92, 29, 136, 12, 157, 47, 19, 181, 147, 180, 141, 142, 126, 118, 129, 124, 3, 177, 62, 16, 22, 179, 39, 145, 85, 32, 168, 77, 6, 23, 125, 82, 113, 20, 109, 24, 178, 46, 81, 108, 63, 56, 87, 91, 184, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |

-continued

| | | | | | | | | | |
|---|---|---|---|---|---|---|---|---|---|
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

5. A transmission method comprising:

performing LDPC coding on a basis of a parity check matrix of an LDPC code with a code length N of 69120 bits and a coding rate r of 7/16;

performing group-wise interleaving in which the LDPC code is interleaved in units of bit groups of 360 bits;

mapping the LDPC code to one of 16 signal points of uniform constellation (UC) in 16 quadrature amplitude modulation (16QAM) on a 4-bit basis to generate a transmission signal for transmission; and transmitting the transmission signal, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 56, 85, 9, 118, 38, 182, 80, 116, 96, 47, 69, 176, 49, 180, 8, 72, 44, 154, 177, 101, 35, 125, 17, 34, 121, 37, 170, 174, 78, 4, 27, 10, 65, 6, 25, 15, 33, 169, 188, 46, 93, 36, 129, 152, 59, 167, 122, 184, 54, 148, 42, 40, 134, 189, 28, 87, 70, 144, 161, 185, 29, 173, 166, 146, 67, 57, 187, 76, 19, 71, 50, 158, 94, 24, 43, 133, 98, 149, 119, 61, 90, 3, 179, 2, 68, 12, 111, 138, 109, 141, 103, 13, 66, 112, 147, 21, 135, 20, 7, 139, 162, 55, 110, 39, 26, 106, 97, 114, 123, 91, 100, 18, 150, 178, 108, 126, 75, 62, 99, 89, 168, 88, 175, 0, 95, 77, 11, 48, 191, 102, 171, 41, 5, 74, 86, 128, 181, 53, 22, 105, 140, 45, 16, 73, 104, 30, 143, 79, 84, 145, 142, 164, 117, 23, 31, 159, 51, 136, 157, 107, 58, 156, 165, 83, 155, 1, 163, 113, 81, 82, 127, 137, 64, 186, 124, 160, 120, 52, 151, 190, 92, 32, 153, 60, 172, 63, 183, 130, 131, 14, 115, 132, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |

-continued

| | | | | |
|---|---|---|---|---|
| 2767 | 3953 | 4221 | 30887 | 34291 |
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

6. A reception device comprising:

processing circuitry configured to:

receive a transmission signal including an LDPC code; and return a sequence of the LDPC code with a code length N of 69120 bits and a coding rate r of 7/16 after group-wise interleaving to an original sequence, the sequence being obtained from the transmission signal that is generated based on LDPC coding being performed on a basis of a parity check matrix of the LDPC code, group-wise interleaving being performed in which the LDPC code is interleaved in units of bit groups of 360 bits, and the LDPC code being mapped to one of 16 signal points of uniform constellation (UC) of 16 quadrature amplitude modulation (16QAM) on a 4-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 56, 85, 9, 118, 38, 182, 80, 116, 96, 47, 69, 176, 49, 180, 8, 72, 44, 154, 177, 101, 35, 125, 17, 34, 121, 37, 170, 174, 78, 4, 27, 10, 65, 6, 25, 15, 33, 169, 188, 46, 93, 36, 129, 152, 59, 167, 122, 184, 54, 148, 42, 40, 134, 189, 28, 87, 70, 144, 161, 185, 29, 173, 166, 146, 67, 57, 187, 76, 19, 71, 50, 158, 94, 24, 43, 133, 98, 149, 119, 61, 90, 3, 179, 2, 68, 12, 111, 138, 109, 141, 103, 13, 66, 112, 147, 21, 135, 20, 7, 139, 162, 55, 110, 39, 26, 106, 97, 114, 123, 91, 100, 18, 150, 178, 108, 126, 75, 62, 99, 89, 168, 88, 175, 0, 95, 77, 11, 48, 191, 102, 171, 41, 5, 74, 86, 128, 181, 53, 22, 105, 140, 45, 16, 73, 104, 30, 143, 79, 84, 145, 142, 164, 117, 23, 31, 159, 51, 136, 157, 107, 58, 156, 165, 83, 155, 1, 163, 113, 81, 82, 127, 137, 64, 186, 124, 160, 120, 52, 151, 190, 92, 32, 153, 60, 172, 63, 183, 130, 131, 14, 115, 132, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |

-continued

| | | | | | | | | | | |
|---|---|---|---|---|---|---|---|---|---|---|
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |

-continued

| | | | | |
|---|---|---|---|---|
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

7. A transmission method comprising:

performing LDPC coding on a basis of a parity check matrix of an LDPC code with a code length N of 69120 bits and a coding rate r of 3/16;

performing group-wise interleaving in which the LDPC code is interleaved in units of bit groups of 360 bits;

mapping the LDPC code to one of 64 signal points of 2D-non-uniform constellation (2D-NUC) in 64 quadrature amplitude modulation (64QAM) on a 6-bit basis to generate a transmission signal for transmission; and transmitting the transmission signal, wherein, in the group-wise interleaving, an (i+1)th bit group from a head of the LDPC code is set as a bit group i, and a sequence of bit groups 0 to 191 of the 69120-bit LDPC code is interleaved into a sequence of bit groups 17, 64, 171, 69, 132, 126, 31, 140, 181, 157, 32, 119, 50, 3, 158, 86, 51, 82, 154, 176, 60, 70, 117, 110, 107, 111, 61, 186, 178, 7, 188, 81, 19, 30, 165, 104, 22, 35, 145, 113, 155, 97, 131, 26, 179, 142, 63, 57, 175, 122, 105, 12, 24, 4, 42, 147, 172, 183, 120, 25, 180, 95, 48, 15, 150, 162, 170, 148, 108, 20, 149, 90, 23, 83, 47, 103, 5, 187, 163, 137, 52, 189, 184, 11, 87, 84, 151, 177, 174, 34, 139, 75, 54, 96, 102, 33, 166, 167, 59, 127, 134, 78, 121, 182, 133, 46, 124, 9, 106, 71, 37, 76, 94, 123, 45, 16, 144, 115, 10, 160, 185, 85, 164, 99, 91, 136, 173, 1, 66, 141, 152, 6, 13, 41, 14, 168, 89, 101, 72, 67, 98, 29, 62, 190, 93, 73, 100, 153, 28, 135, 161, 39, 116, 65, 56, 156, 2, 27, 80, 143, 40, 129, 36, 21, 146, 88, 18, 138, 38, 169, 74, 109, 68, 49, 159, 112, 114, 58, 118, 77, 191, 53, 8, 92, 44, 55, 0, 130, 128, 125, 79, 43, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |

-continued

| | | | | | | | | | |
|---|---|---|---|---|---|---|---|---|---|
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

8. A reception device comprising:

processing circuitry configured to:

receive a transmission signal including an LDPC code; and return a sequence of the LDPC code with a code length N of 69120 bits and a coding rate r of 3/16 after group-wise interleaving to an original sequence, the sequence being obtained from the transmission signal that is generated based on LDPC coding being performed on a basis of a parity check matrix of the LDPC code, group-wise interleaving being performed in which the LDPC code is interleaved in units of bit groups of 360 bits, and the LDPC code being mapped to one of 64 signal points of 2D-non-uniform constellation (2D-NUC) of 64 quadrature amplitude modulation (64QAM) on a 6-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 17, 64, 171, 69, 132, 126, 31, 140, 181, 157, 32, 119, 50, 3, 158, 86, 51, 82, 154, 176, 60, 70, 117, 110, 107, 111, 61, 186, 178, 7, 188, 81, 19, 30, 165, 104, 22, 35, 145, 113, 155, 97, 131, 26, 179, 142, 63, 57, 175, 122, 105, 12, 24, 4, 42, 147, 172, 183, 120, 25, 180, 95, 48, 15, 150, 162, 170, 148, 108, 20, 149, 90, 23, 83, 47, 103, 5, 187, 163, 137, 52, 189, 184, 11, 87, 84, 151, 177, 174, 34, 139, 75, 54, 96, 102, 33, 166, 167, 59, 127, 134, 78, 121, 182, 133, 46, 124, 9, 106, 71, 37, 76, 94, 123, 45, 16, 144, 115, 10, 160, 185, 85, 164, 99, 91, 136, 173, 1, 66, 141, 152, 6, 13, 41, 14, 168, 89, 101, 72, 67, 98, 29, 62, 190, 93, 73, 100, 153, 28, 135, 161, 39, 116, 65, 56, 156, 2, 27, 80, 143, 40, 129, 36, 21, 146, 88, 18, 138, 38, 169, 74, 109, 68, 49, 159, 112, 114, 58, 118, 77, 191, 53, 8, 92, 44, 55, 0, 130, 128, 125, 79, 43, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |

-continued

| | | | | | | | | | |
|---|---|---|---|---|---|---|---|---|---|
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

9. A transmission method comprising:

performing LDPC coding on a basis of a parity check matrix of an LDPC code with a code length N of 69120 bits and a coding rate r of 7/16;

performing group-wise interleaving in which the LDPC code is interleaved in units of bit groups of 360 bits;

mapping the LDPC code to one of 64 signal points of 2D-non-uniform constellation (2D-NUC) in 64 quadrature amplitude modulation (64QAM) on a 6-bit basis to generate a transmission signal for transmission; and transmitting the transmission signal, wherein, in the group-wise interleaving, an (i+1)th bit group from a head of the LDPC code is set as a bit group i, and a sequence of bit groups 0 to 191 of the 69120-bit LDPC code is interleaved into a sequence of bit groups 173, 36, 60, 172, 41, 149, 45, 75, 144, 68, 148, 168, 134, 58, 86, 50, 115, 167, 54, 29, 1, 132, 125, 114, 69, 77, 135, 39, 145, 139, 163, 44, 146, 40, 106, 178, 52, 14, 78, 174, 3, 126, 20, 169, 98, 47, 33, 121, 109, 88, 185, 157, 183, 152, 158, 76, 56, 30, 123, 137, 186, 89, 83, 141, 156, 143, 2, 90, 151, 111, 170, 161, 182, 79, 66, 26, 108, 119, 38, 35, 180, 154, 153, 175, 181, 72, 80, 23, 15, 122, 49, 10, 4, 17, 155, 179, 46, 24, 37, 129, 0, 171, 34, 63, 27, 57, 166, 177, 117, 120, 113, 100, 28, 6, 55, 71, 150, 187, 131, 147, 43, 64, 102, 176, 130, 93, 105, 128, 138, 164, 127, 142, 51, 12, 42, 53, 99, 133, 87, 188, 13, 159, 190, 140, 84, 59, 104, 65, 7, 189, 160, 162, 74, 107, 118, 101, 22, 62, 61, 103, 25, 124, 112, 70, 16, 97, 67, 116, 82, 81, 110, 48, 92, 184, 96, 94, 91, 165, 19, 31, 5, 11, 32, 95, 18, 21, 73, 85, 136, 191, 9, 8, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |

-continued

| | | | | | | | | | | |
|---|---|---|---|---|---|---|---|---|---|---|
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |
| 5419 | 17091 | 17716 | 18981 | 31131 | | | | | | |
| 15196 | 21587 | 28478 | 32583 | 36053 | | | | | | |
| 17134 | 18820 | 32977 | 34175 | 36060 | | | | | | |
| 15599 | 21709 | 22462 | 28663 | 33979 | | | | | | |
| 4691 | 13050 | 23737 | 30447 | 37128 | | | | | | |
| 22733 | 24839 | 26808 | 37191 | 37396 | | | | | | |
| 8896 | 14951 | 16202 | 26775 | 29470 | | | | | | |
| 13355 | 19354 | 27988 | 36027 | 37312 | | | | | | |
| 8938 | 11340 | 12434 | 19496 | 37986 | | | | | | |
| 5876 | 25181 | 32766 | 33412 | 35330. | | | | | | |

10. A reception device comprising:

processing circuitry configured to:

receive a transmission signal including an LDPC code;

return a sequence of the LDPC code with a code length N of 69120 bits and a coding rate r of 7/16 after group-wise interleaving to an original sequence, the sequence being obtained from the transmission signal that is generated based on LDPC coding being performed on a basis of a parity check matrix of the LDPC code, group-wise interleaving being performed in which the LDPC code is interleaved in units of bit groups of 360 bits, and the LDPC code being mapped to one of 64 signal points of 2D-non-uniform constellation (2D-NUC) of 64 quadrature amplitude modulation (64QAM) on a 6-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 173, 36, 60, 172, 41, 149, 45, 75, 144, 68, 148, 168, 134, 58, 86, 50, 115, 167, 54, 29, 1, 132, 125, 114, 69, 77, 135, 39, 145, 139, 163, 44, 146, 40, 106, 178, 52, 14, 78, 174, 3, 126, 20, 169, 98, 47, 33, 121, 109, 88, 185, 157, 183, 152, 158, 76, 56, 30, 123, 137, 186, 89, 83, 141, 156, 143, 2, 90, 151, 111, 170, 161, 182, 79, 66, 26, 108, 119, 38, 35, 180, 154, 153, 175, 181, 72, 80, 23, 15, 122, 49, 10, 4, 17, 155, 179, 46, 24, 37, 129, 0, 171, 34, 63, 27, 57, 166, 177, 117, 120, 113, 100, 28, 6, 55, 71, 150, 187, 131, 147, 43, 64, 102, 176, 130, 93, 105, 128, 138, 164, 127, 142, 51, 12, 42, 53, 99, 133, 87, 188, 13, 159, 190, 140, 84, 59, 104, 65, 7, 189, 160, 162, 74, 107, 118, 101, 22, 62, 61, 103, 25, 124, 112, 70, 16, 97, 67, 116, 82, 81, 110, 48, 92, 184, 96, 94, 91, 165, 19, 31, 5, 11, 32, 95, 18, 21, 73, 85, 136, 191, 9, 8, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |

-continued

| | | | | |
|---|---|---|---|---|
| 200 | 2480 | 2912 | 23789 | 36598 |
| 212 | 3477 | 4526 | 10049 | 30926 |
| 901 | 2299 | 3757 | 10605 | 24358 |
| 321 | 1488 | 1718 | 24930 | 25738 |
| 2283 | 3823 | 3943 | 16768 | 35564 |
| 253 | 2932 | 4234 | 21419 | 29606 |
| 2701 | 3576 | 4425 | 9250 | 24023 |
| 2217 | 3403 | 4654 | 14977 | 23115 |
| 817 | 2872 | 3491 | 17773 | 23918 |
| 1783 | 1838 | 4330 | 11645 | 36545 |
| 1231 | 3435 | 4503 | 9035 | 29888 |
| 826 | 1836 | 2994 | 22108 | 22827 |
| 229 | 1417 | 2078 | 14324 | 17714 |
| 567 | 3244 | 3728 | 22202 | 33883 |
| 799 | 1180 | 1329 | 12496 | 22390 |
| 549 | 1311 | 3657 | 17564 | 35009 |
| 132 | 517 | 3180 | 5304 | 35588 |
| 2767 | 3953 | 4221 | 30887 | 34291 |
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

11. A transmission method comprising:

performing LDPC coding on a basis of a parity check matrix of an LDPC code with a code length N of 69120 bits and a coding rate r of 3/16;

performing group-wise interleaving in which the LDPC code is interleaved in units of bit groups of 360 bits;

mapping the LDPC code to one of 256 signal points of uniform constellation (UC) in 256 quadrature amplitude modulation (256QAM) on an 8-bit basis to generate a transmission signal for transmission; and transmitting the transmission signal, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 72, 32, 158, 84, 105, 181, 63, 16, 111, 87, 112, 185, 120, 74, 176, 14, 81, 79, 34, 128, 163, 64, 161, 146, 42, 26, 191, 173, 60, 3, 41, 162, 23, 44, 38, 24, 149, 172, 88, 104, 21, 118, 91, 184, 70, 85, 142, 25, 159, 186, 148, 96, 188, 190, 61, 123, 169, 136, 33, 109, 54, 101, 7, 19, 145, 137, 107, 82, 121, 90, 144, 187, 180, 8, 132, 114, 65, 29, 51, 103, 139, 141, 55, 108, 68, 0, 124, 170, 18, 143, 177, 2, 22, 179, 166, 53, 6, 99, 73, 12, 43, 69, 129, 183, 71, 39, 165, 171, 28, 92, 189, 119, 113, 20, 151, 59, 46, 66, 102, 182, 153, 94, 140, 115, 174, 125, 127, 116, 31, 47, 156, 147, 135, 48, 110, 160, 89, 86, 40, 155, 100, 36, 35, 57, 56, 9, 80, 126, 62, 75, 52, 83, 1, 76, 17, 122, 178, 30, 131, 27, 164, 106, 152, 49, 37, 167, 78, 95, 168, 175, 117, 4, 50, 13, 93, 97, 150, 45, 157, 130, 154, 10, 133, 77, 15, 67, 98, 134, 138, 11, 58, 5, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |

-continued

| | | | | | | | | | |
|---|---|---|---|---|---|---|---|---|---|
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

12. A reception device comprising:

processing circuitry configured to:

receive a transmission signal including an LDPC code; and return a sequence of the LDPC code with a code length N of 69120 bits and a coding rate r of 3/16 after group-wise interleaving to an original sequence, the sequence being obtained from the transmission signal that is generated based on LDPC coding being performed on a basis of a parity check matrix of the LDPC code, group-wise interleaving being performed in which the LDPC code is interleaved in units of bit groups of 360 bits, and the LDPC code being mapped to one of 256 signal points of uniform constellation (UC) of 256 quadrature amplitude modulation (256QAM) on an 8-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 72, 32, 158, 84, 105, 181, 63, 16, 111, 87, 112, 185, 120, 74, 176, 14, 81, 79, 34, 128, 163, 64, 161, 146, 42, 26, 191, 173, 60, 3, 41, 162, 23, 44, 38, 24, 149, 172, 88, 104, 21, 118, 91, 184, 70, 85, 142, 25, 159, 186, 148, 96, 188, 190, 61, 123, 169, 136, 33, 109, 54, 101, 7, 19, 145, 137, 107, 82, 121, 90, 144, 187, 180, 8, 132, 114, 65, 29, 51, 103, 139, 141, 55, 108, 68, 0, 124, 170, 18, 143, 177, 2, 22, 179, 166, 53, 6, 99, 73, 12, 43, 69, 129, 183, 71, 39, 165, 171, 28, 92, 189, 119, 113, 20, 151, 59, 46, 66, 102, 182, 153, 94, 140, 115, 174, 125, 127, 116, 31, 47, 156, 147, 135, 48, 110, 160, 89, 86, 40, 155, 100, 36, 35, 57, 56, 9, 80, 126, 62, 75, 52, 83, 1, 76, 17, 122, 178, 30, 131, 27, 164, 106, 152, 49, 37, 167, 78, 95, 168, 175, 117, 4, 50, 13, 93, 97, 150, 45, 157, 130, 154, 10, 133, 77, 15, 67, 98, 134, 138, 11, 58, 5, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |

-continued

| | | | | | | | | | |
|---|---|---|---|---|---|---|---|---|---|
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

13. A transmission method comprising:

performing LDPC coding on a basis of a parity check matrix of an LDPC code with a code length N of 69120 bits and a coding rate r of 7/16;

performing group-wise interleaving in which the LDPC code is interleaved in units of bit groups of 360 bits;

mapping the LDPC code to one of 256 signal points of uniform constellation (UC) in 256 quadrature amplitude modulation (256QAM) on an 8-bit basis to generate a transmission signal for transmission; and transmitting the transmission signal, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 9, 5, 13, 50, 156, 80, 30, 150, 18, 84, 54, 87, 40, 140, 12, 169, 1, 65, 90, 99, 21, 94, 20, 158, 27, 168, 19, 128, 57, 151, 37, 36, 15, 45, 59, 136, 4, 2, 106, 160, 83, 48, 103, 78, 173, 33, 172, 186, 24, 164, 181, 35, 183, 72, 73, 176, 161, 119, 76, 125, 121, 124, 16, 174, 66, 34, 177, 137, 46, 44, 126, 116, 69, 41, 145, 3, 114, 132, 32, 7, 105, 31, 56, 134, 155, 135, 108, 93, 89, 167, 81, 190, 131, 127, 102, 88, 62, 49, 163, 170, 53, 63, 38, 178, 0, 77, 188, 22, 180, 185, 191, 153, 61, 129, 144, 39, 138, 166, 14, 154, 82, 29, 110, 146, 123, 60, 187, 11, 162, 25, 157, 52, 91, 118, 133, 17, 28, 10, 130, 111, 159, 42, 58, 141, 142, 189, 68, 107, 8, 113, 6, 74, 47, 75, 109, 175, 147, 64, 149, 92, 43, 85, 96, 122, 117, 171, 152, 26, 79, 86, 51, 95, 67, 165, 112, 148, 182, 143, 179, 120, 139, 97, 184, 104, 71, 70, 115, 23, 100, 98, 101, 55, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |

-continued

| | | | | |
|---|---|---|---|---|
| 2767 | 3953 | 4221 | 30887 | 34291 |
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

14. A reception device comprising:

processing circuitry configured to:

receive a transmission signal including an LDPC code; and return a sequence of the LDPC code with a code length N of 69120 bits and a coding rate r of 7/16 after group-wise interleaving to an original sequence, the sequence being obtained from the transmission signal that is generated based on LDPC coding being performed on a basis of a parity check matrix of the LDPC code, group-wise interleaving being performed in which the LDPC code is interleaved in units of bit groups of 360 bits, and the LDPC code being mapped to one of 256 signal points of uniform constellation (UC) of 256 quadrature amplitude modulation (256QAM) on an 8-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 9, 5, 13, 50, 156, 80, 30, 150, 18, 84, 54, 87, 40, 140, 12, 169, 1, 65, 90, 99, 21, 94, 20, 158, 27, 168, 19, 128, 57, 151, 37, 36, 15, 45, 59, 136, 4, 2, 106, 160, 83, 48, 103, 78, 173, 33, 172, 186, 24, 164, 181, 35, 183, 72, 73, 176, 161, 119, 76, 125, 121, 124, 16, 174, 66, 34, 177, 137, 46, 44, 126, 116, 69, 41, 145, 3, 114, 132, 32, 7, 105, 31, 56, 134, 155, 135, 108, 93, 89, 167, 81, 190, 131, 127, 102, 88, 62, 49, 163, 170, 53, 63, 38, 178, 0, 77, 188, 22, 180, 185, 191, 153, 61, 129, 144, 39, 138, 166, 14, 154, 82, 29, 110, 146, 123, 60, 187, 11, 162, 25, 157, 52, 91, 118, 133, 17, 28, 10, 130, 111, 159, 42, 58, 141, 142, 189, 68, 107, 8, 113, 6, 74, 47, 75, 109, 175, 147, 64, 149, 92, 43, 85, 96, 122, 117, 171, 152, 26, 79, 86, 51, 95, 67, 165, 112, 148, 182, 143, 179, 120, 139, 97, 184, 104, 71, 70, 115, 23, 100, 98, 101, 55, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |

-continued

| | | | | | | | | | | |
|---|---|---|---|---|---|---|---|---|---|---|
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |

-continued

| | | | | |
|---|---|---|---|---|
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

15. A transmission method comprising:

performing LDPC coding on a basis of a parity check matrix of an LDPC code with a code length N of 69120 bits and a coding rate r of 3/16;

performing group-wise interleaving in which the LDPC code is interleaved in units of bit groups of 360 bits;

mapping the LDPC code to one of 1024 signal points of 1D-non-uniform constellation (1D-NUC) in 1024 quadrature amplitude modulation (1024QAM) on a 10-bit basis to generate a transmission signal for transmission; and transmitting the transmission signal, wherein, in the group-wise interleaving, an (i+1)th bit group from a head of the LDPC code is set as a bit group i, and a sequence of bit groups 0 to 191 of the 69120-bit LDPC code is interleaved into a sequence of bit groups 173, 19, 14, 40, 115, 80, 35, 24, 79, 94, 33, 109, 101, 61, 142, 128, 130, 162, 11, 159, 47, 160, 143, 38, 65, 122, 6, 181, 12, 45, 0, 106, 153, 56, 21, 125, 17, 129, 85, 186, 27, 155, 107, 156, 191, 151, 90, 135, 64, 57, 113, 175, 49, 108, 149, 164, 26, 146, 105, 104, 29, 100, 84, 92, 3, 58, 41, 91, 139, 174, 70, 182, 89, 131, 25, 119, 178, 7, 48, 54, 184, 1, 126, 43, 179, 168, 120, 60, 190, 68, 136, 176, 163, 13, 71, 147, 63, 37, 72, 32, 30, 123, 185, 154, 167, 86, 103, 138, 127, 148, 50, 152, 66, 46, 118, 96, 10, 111, 145, 99, 180, 88, 158, 114, 110, 73, 117, 112, 52, 165, 62, 23, 102, 59, 36, 5, 116, 98, 53, 188, 39, 93, 31, 28, 55, 172, 189, 187, 67, 15, 16, 4, 22, 133, 76, 44, 87, 77, 18, 78, 169, 166, 83, 82, 161, 74, 134, 157, 81, 95, 42, 132, 121, 8, 97, 141, 20, 170, 69, 177, 34, 140, 124, 183, 51, 137, 9, 2, 75, 144, 171, 150, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |

-continued

| | | | | | | | | | |
|---|---|---|---|---|---|---|---|---|---|
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

16. A reception device comprising:

processing circuitry configured to:

receive a transmission signal including an LDPC code; and return a sequence of the LDPC code with a code length N of 69120 bits and a coding rate r of 3/16 after group-wise interleaving to an original sequence, the sequence being obtained from the transmission signal that is generated based on LDPC coding being performed on a basis of a parity check matrix of the LDPC code, group-wise interleaving being performed in which the LDPC code is interleaved in units of bit groups of 360 bits, and the LDPC code being mapped to one of 1024 signal points of 1D-non-uniform constellation (1D-NUC) of 1024 quadrature amplitude modulation (1024QAM) on a 10-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 173, 19, 14, 40, 115, 80, 35, 24, 79, 94, 33, 109, 101, 61, 142, 128, 130, 162, 11, 159, 47, 160, 143, 38, 65, 122, 6, 181, 12, 45, 0, 106, 153, 56, 21, 125, 17, 129, 85, 186, 27, 155, 107, 156, 191, 151, 90, 135, 64, 57, 113, 175, 49, 108, 149, 164, 26, 146, 105, 104, 29, 100, 84, 92, 3, 58, 41, 91, 139, 174, 70, 182, 89, 131, 25, 119, 178, 7, 48, 54, 184, 1, 126, 43, 179, 168, 120, 60, 190, 68, 136, 176, 163, 13, 71, 147, 63, 37, 72, 32, 30, 123, 185, 154, 167, 86, 103, 138, 127, 148, 50, 152, 66, 46, 118, 96, 10, 111, 145, 99, 180, 88, 158, 114, 110, 73, 117, 112, 52, 165, 62, 23, 102, 59, 36, 5, 116, 98, 53, 188, 39, 93, 31, 28, 55, 172, 189, 187, 67, 15, 16, 4, 22, 133, 76, 44, 87, 77, 18, 78, 169, 166, 83, 82, 161, 74, 134, 157, 81, 95, 42, 132, 121, 8, 97, 141, 20, 170, 69, 177, 34, 140, 124, 183, 51, 137, 9, 2, 75, 144, 171, 150, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |

-continued

| | | | | | | | | | |
|---|---|---|---|---|---|---|---|---|---|
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

17. A transmission method comprising:

performing LDPC coding on a basis of a parity check matrix of an LDPC code with a code length N of 69120 bits and a coding rate r of 7/16;

performing group-wise interleaving in which the LDPC code is interleaved in units of bit groups of 360 bits;

mapping the LDPC code to one of 1024 signal points of 1D-non-uniform constellation (1D-NUC) in 1024 quadrature amplitude modulation (1024QAM) on a 10-bit basis to generate a transmission signal for transmission; and transmitting the transmission signal, wherein, in the group-wise interleaving, an (i+1)th bit group from a head of the LDPC code is set as a bit group i, and a sequence of bit groups 0 to 191 of the 69120-bit LDPC code is interleaved into a sequence of bit groups 27, 109, 45, 105, 174, 62, 185, 69, 102, 91, 37, 39, 31, 34, 127, 111, 30, 23, 157, 155, 76, 19, 85, 172, 122, 5, 36, 100, 26, 59, 136, 79, 25, 134, 101, 3, 96, 135, 21, 2, 35, 82, 47, 143, 56, 54, 149, 7, 175, 170, 144, 71, 190, 94, 64, 131, 145, 40, 191, 86, 90, 24, 139, 20, 184, 181, 29, 176, 124, 159, 12, 43, 187, 16, 162, 57, 0, 188, 11, 42, 4, 164, 156, 22, 95, 81, 153, 141, 169, 117, 50, 151, 89, 120, 189, 167, 177, 173, 140, 118, 51, 55, 113, 171, 41, 63, 148, 106, 9, 17, 80, 97, 77, 83, 182, 161, 137, 15, 125, 186, 88, 98, 32, 138, 129, 46, 52, 73, 168, 115, 165, 142, 38, 84, 128, 166, 107, 116, 123, 114, 93, 78, 178, 66, 146, 160, 104, 121, 48, 74, 13, 61, 70, 60, 75, 163, 179, 28, 130, 154, 53, 110, 10, 33, 112, 18, 180, 147, 133, 1, 65, 68, 8, 44, 108, 132, 183, 6, 119, 67, 14, 152, 72, 150, 103, 87, 58, 99, 126, 92, 49, 158, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |

-continued

| | | | | | | | | | | |
|---|---|---|---|---|---|---|---|---|---|---|
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |
| 5419 | 17091 | 17716 | 18981 | 31131 | | | | | | |
| 15196 | 21587 | 28478 | 32583 | 36053 | | | | | | |
| 17134 | 18820 | 32977 | 34175 | 36060 | | | | | | |
| 15599 | 21709 | 22462 | 28663 | 33979 | | | | | | |
| 4691 | 13050 | 23737 | 30447 | 37128 | | | | | | |
| 22733 | 24839 | 26808 | 37191 | 37396 | | | | | | |
| 8896 | 14951 | 16202 | 26775 | 29470 | | | | | | |
| 13355 | 19354 | 27988 | 36027 | 37312 | | | | | | |
| 8938 | 11340 | 12434 | 19496 | 37986 | | | | | | |
| 5876 | 25181 | 32766 | 33412 | 35330. | | | | | | |

18. A reception device comprising:

processing circuitry configured to:

receive a transmission signal including an LDPC code; and return a sequence of the LDPC code with a code length N of 69120 bits and a coding rate r of 7/16 after group-wise interleaving to an original sequence, the sequence being obtained from the transmission signal that is generated based on LDPC coding being performed on a basis of a parity check matrix of the LDPC code, group-wise interleaving being performed in which the LDPC code is interleaved in units of bit groups of 360 bits, and the LDPC code being mapped to one of 1024 signal points of 1D-non-uniform constellation (1D-NUC) of 1024 quadrature amplitude modulation (1024QAM) on a 10-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 27, 109, 45, 105, 174, 62, 185, 69, 102, 91, 37, 39, 31, 34, 127, 111, 30, 23, 157, 155, 76, 19, 85, 172, 122, 5, 36, 100, 26, 59, 136, 79, 25, 134, 101, 3, 96, 135, 21, 2, 35, 82, 47, 143, 56, 54, 149, 7, 175, 170, 144, 71, 190, 94, 64, 131, 145, 40, 191, 86, 90, 24, 139, 20, 184, 181, 29, 176, 124, 159, 12, 43, 187, 16, 162, 57, 0, 188, 11, 42, 4, 164, 156, 22, 95, 81, 153, 141, 169, 117, 50, 151, 89, 120, 189, 167, 177, 173, 140, 118, 51, 55, 113, 171, 41, 63, 148, 106, 9, 17, 80, 97, 77, 83, 182, 161, 137, 15, 125, 186, 88, 98, 32, 138, 129, 46, 52, 73, 168, 115, 165, 142, 38, 84, 128, 166, 107, 116, 123, 114, 93, 78, 178, 66, 146, 160, 104, 121, 48, 74, 13, 61, 70, 60, 75, 163, 179, 28, 130, 154, 53, 110, 10, 33, 112, 18, 180, 147, 133, 1, 65, 68, 8, 44, 108, 132, 183, 6, 119, 67, 14, 152, 72, 150, 103, 87, 58, 99, 126, 92, 49, 158, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |

-continued

| | | | | |
|---|---|---|---|---|
| 27 | 165 | 1499 | 11445 | 26229 |
| 2740 | 3378 | 4070 | 8121 | 11725 |
| 464 | 695 | 2670 | 19972 | 31016 |
| 58 | 551 | 769 | 13142 | 18176 |
| 1818 | 2794 | 3077 | 14099 | 28393 |
| 649 | 4125 | 4624 | 29698 | 32032 |
| 200 | 2480 | 2912 | 23789 | 36598 |
| 212 | 3477 | 4526 | 10049 | 30926 |
| 901 | 2299 | 3757 | 10605 | 24358 |
| 321 | 1488 | 1718 | 24930 | 25738 |
| 2283 | 3823 | 3943 | 16768 | 35564 |
| 253 | 2932 | 4234 | 21419 | 29606 |
| 2701 | 3576 | 4425 | 9250 | 24023 |
| 2217 | 3403 | 4654 | 14977 | 23115 |
| 817 | 2872 | 3491 | 17773 | 23918 |
| 1783 | 1838 | 4330 | 11645 | 36545 |
| 1231 | 3435 | 4503 | 9035 | 29888 |
| 826 | 1836 | 2994 | 22108 | 22827 |
| 229 | 1417 | 2078 | 14324 | 17714 |
| 567 | 3244 | 3728 | 22202 | 33883 |
| 799 | 1180 | 1329 | 12496 | 22390 |
| 549 | 1311 | 3657 | 17564 | 35009 |
| 132 | 517 | 3180 | 5304 | 35588 |
| 2767 | 3953 | 4221 | 30887 | 34291 |
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

19. A transmission method comprising:

performing LDPC coding on a basis of a parity check matrix of an LDPC code with a code length N of 69120 bits and a coding rate r of 3/16;

performing group-wise interleaving in which the LDPC code is interleaved in units of bit groups of 360 bits;

mapping the LDPC code to one of 4096 signal points of uniform constellation (UC) in 4096 quadrature amplitude modulation (4096QAM) on a 12-bit basis to generate a transmission signal for transmission; and transmitting the transmission signal, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 50, 30, 180, 100, 44, 21, 25, 130, 190, 135, 154, 84, 150, 20, 16, 184, 137, 109, 189, 36, 105, 151, 49, 107, 108, 79, 148, 121, 88, 128, 62, 7, 185, 145, 166, 64, 141, 102, 181, 191, 94, 171, 1, 14, 11, 170, 63, 67, 17, 51, 90, 155, 98, 115, 173, 26, 56, 87, 138, 81, 13, 31, 27, 24, 29, 46, 54, 78, 118, 120, 164, 58, 95, 122, 106, 85, 96, 41, 3, 187, 72, 0, 143, 142, 186, 146, 101, 89, 23, 133, 83, 92, 22, 99, 136, 158, 156, 91, 97, 28, 162, 147, 65, 139, 111, 38, 161, 163, 4, 75, 125, 177, 12, 70, 114, 6, 45, 165, 126, 132, 134, 40, 149, 104, 188, 80, 55, 34, 119, 175, 66, 93, 39, 47, 153, 8, 69, 157, 61, 35, 182, 124, 168, 76, 131, 59, 112, 152, 82, 116, 123, 9, 73, 15, 86, 159, 172, 18, 183, 68, 103, 167, 113, 5, 74, 42, 174, 140, 2, 10, 32, 19, 127, 48, 169, 117, 129, 178, 53, 179, 71, 52, 60, 110, 57, 144, 160, 43, 37, 33, 77, 176, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |

-continued

| | | | | | | | | | |
|---|---|---|---|---|---|---|---|---|---|
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

20. A reception device comprising:

processing circuitry configured to:

receive a transmission signal including an LDPC code; and return a sequence of the LDPC code with a code length N of 69120 bits and a coding rate r of 3/16 after group-wise interleaving to an original sequence, the sequence being obtained from the transmission signal that is generated based on LDPC coding being performed on a basis of a parity check matrix of the LDPC code, group-wise interleaving being performed in which the LDPC code is interleaved in units of bit groups of 360 bits, and the LDPC code being mapped to one of 4096 signal points of uniform constellation (UC) of 4096 quadrature amplitude modulation (4096QAM) on a 12-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 50, 30, 180, 100, 44, 21, 25, 130, 190, 135, 154, 84, 150, 20, 16, 184, 137, 109, 189, 36, 105, 151, 49, 107, 108, 79, 148, 121, 88, 128, 62, 7, 185, 145, 166, 64, 141, 102, 181, 191, 94, 171, 1, 14, 11, 170, 63, 67, 17, 51, 90, 155, 98, 115, 173, 26, 56, 87, 138, 81, 13, 31, 27, 24, 29, 46, 54, 78, 118, 120, 164, 58, 95, 122, 106, 85, 96, 41, 3, 187, 72, 0, 143, 142, 186, 146, 101, 89, 23, 133, 83, 92, 22, 99, 136, 158, 156, 91, 97, 28, 162, 147, 65, 139, 111, 38, 161, 163, 4, 75, 125, 177, 12, 70, 114, 6, 45, 165, 126, 132, 134, 40, 149, 104, 188, 80, 55, 34, 119, 175, 66, 93, 39, 47, 153, 8, 69, 157, 61, 35, 182, 124, 168, 76, 131, 59, 112, 152, 82, 116, 123, 9, 73, 15, 86, 159, 172, 18, 183, 68, 103, 167, 113, 5, 74, 42, 174, 140, 2, 10, 32, 19, 127, 48, 169, 117, 129, 178, 53, 179, 71, 52, 60, 110, 57, 144, 160, 43, 37, 33, 77, 176, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is

| | | | | | | | | | |
|---|---|---|---|---|---|---|---|---|---|
| 952 | 1540 | 1714 | 4127 | 4576 | 13540 | 16051 | 22016 | 28342 | |
| 29021 | 29884 | 34149 | 43069 | 45431 | 45764 | 49218 | | | |
| 560 | 888 | 1582 | 5282 | 7435 | 11414 | 20275 | 21957 | 35445 | |
| 35564 | 36316 | 42800 | 45024 | 49586 | 52439 | 54495 | | | |
| 358 | 690 | 1339 | 2085 | 4919 | 9289 | 13240 | 13592 | 17626 | 36076 |
| 40463 | 47406 | 48151 | 51157 | 51667 | 55260 | | | | |
| 782 | 1148 | 1256 | 4476 | 12529 | 18812 | 26102 | 33987 | 36409 | |
| 37822 | 37985 | 38839 | 40816 | 40824 | 46035 | 52233 | | | |
| 786 | 1114 | 1220 | 8008 | 15266 | 16414 | 18280 | 19544 | 24848 | |
| 27337 | 29277 | 31731 | 31754 | 34852 | 50071 | 50582 | | | |
| 61 | 1023 | 1329 | 5463 | 7360 | 10119 | 16898 | 19922 | 26180 | |
| 27792 | 39278 | 43941 | 46391 | 48767 | 51534 | 55637 | | | |
| 122 | 674 | 1318 | 3163 | 4762 | 11448 | 13800 | 14472 | 17782 | |
| 21492 | 21792 | 22087 | 23199 | 30867 | 32814 | 54930 | | | |
| 201 | 1523 | 1535 | 3026 | 3795 | 21814 | 23438 | 31100 | 33271 | |
| 35220 | 36784 | 41091 | 44823 | 45201 | 52727 | 53980 | | | |
| 214 | 698 | 872 | 11001 | 22869 | 28522 | 37629 | 39576 | 45388 | |
| 45685 | 46767 | 47410 | 49179 | 49707 | 51036 | 54550 | | | |
| 629 | 910 | 1607 | 3729 | 7592 | 12132 | 19142 | 20971 | 26461 | |
| 26884 | 27680 | 28650 | 32579 | 38474 | 44725 | 46511 | | | |
| 459 | 1092 | 1245 | 8857 | 14843 | 36588 | 37166 | 37409 | 39090 | |
| 42239 | 42434 | 44302 | 48827 | 50073 | 54458 | 55508 | | | |

-continued

| | | | | | | | | | |
|---|---|---|---|---|---|---|---|---|---|
| 142 | 1429 | 1738 | 10436 | 11485 | 17886 | 18871 | 19534 | 21030 | |
| 25169 | 29234 | 33017 | 43639 | 46823 | 47778 | 52878 | | | |
| 1045 | 1362 | 1383 | 8988 | 19638 | 19798 | 30793 | 33457 | 36553 | |
| 39107 | 41860 | 42393 | 42880 | 44006 | 51970 | 55778 | | | |
| 179 | 1491 | 1702 | 6636 | 14151 | 22244 | 22565 | 22685 | 27002 | |
| 28848 | 28853 | 31563 | 33775 | 44814 | 46641 | 52692 | | | |
| 493 | 750 | 1681 | 9933 | 18582 | 18955 | 19486 | 26708 | 28169 | |
| 33862 | 37472 | 41993 | 45441 | 46130 | 51970 | 54787 | | | |
| 46 | 612 | 1350 | 4248 | 9202 | 17520 | 19232 | 19497 | 20177 | 24136 |
| 34460 | 36988 | 37528 | 37984 | 55455 | 56037 | | | | |
| 18 | 217 | 234 | 2619 | 5013 | 10736 | 16236 | 22379 | 26775 | 27970 |
| 32100 | 35692 | 38772 | 45572 | 46062 | 55106 | | | | |
| 732 | 980 | 1078 | 2143 | 12258 | 13906 | 20999 | 21282 | 40155 | |
| 41727 | 43555 | 47688 | 47915 | 49860 | 51224 | 51470 | | | |
| 1059 | 1473 | 1575 | 11727 | 20558 | 23005 | 29440 | 34858 | 35139 | |
| 37873 | 38394 | 38409 | 39619 | 44878 | 47821 | 52381 | | | |
| 285 | 1186 | 1679 | 2583 | 9932 | 14540 | 15464 | 20148 | 35790 | |
| 41235 | 43021 | 43062 | 43877 | 48636 | 49400 | 54782 | | | |
| 382 | 840 | 1766 | 6323 | 7463 | 11853 | 15855 | 15888 | 24620 | |
| 24916 | 31935 | 32868 | 33716 | 34665 | 47097 | 51807 | | | |
| 1056 | 1390 | 1573 | 5794 | 10258 | 10870 | 11690 | 13333 | 16252 | |
| 16645 | 18210 | 21635 | 25024 | 29621 | 30501 | 45634 | | | |
| 556 | 1507 | 1725 | 2796 | 15637 | 19402 | 21719 | 25713 | 33014 | |
| 36410 | 41815 | 44160 | 48353 | 51766 | 52608 | 53372 | | | |
| 359 | 1081 | 1747 | 6819 | 17365 | 18139 | 18764 | 20152 | 26540 | |
| 29929 | 30048 | 31032 | 37095 | 46243 | 50419 | 51519 | | | |
| 297 | 746 | 805 | 5707 | 17136 | 27103 | 27890 | 32573 | 41459 | |
| 42684 | 43339 | 44871 | 47175 | 48131 | 54197 | 55984 | | | |
| 526 | 550 | 1548 | 2108 | 3225 | 5925 | 10665 | 19215 | 22974 | 28698 |
| 38245 | 39765 | 42509 | 43235 | 55012 | 55025 | | | | |
| 490 | 576 | 617 | 4353 | 6355 | 9433 | 19430 | 22898 | 27224 | 34620 |
| 39420 | 39883 | 49496 | 54119 | 55305 | | | | | |
| 42 | 933 | 1646 | 4807 | 9972 | 11711 | 12825 | 18574 | 23969 | 24871 |
| 32236 | 41052 | 43446 | 43661 | 47268 | | | | | |
| 404 | 1200 | 1631 | 10778 | 12006 | 14743 | 14965 | 26387 | 29817 | |
| 31421 | 34357 | 36147 | 38146 | 49531 | 53692 | | | | |
| 214 | 291 | 1408 | 8185 | 8434 | 12709 | 15768 | 16504 | 23823 | |
| 24554 | 29691 | 30908 | 37157 | 53726 | 55573 | | | | |
| 104 | 1026 | 1043 | 1978 | 5485 | 5912 | 7899 | 8444 | 11562 | 13092 |
| 13869 | 32334 | 40343 | 40616 | 56077 | | | | | |
| 645 | 724 | 1231 | 7118 | 11033 | 14589 | 17299 | 20360 | 21124 | |
| 24232 | 31152 | 33848 | 38095 | 44594 | 46191 | | | | |
| 358 | 524 | 1066 | 6855 | 8629 | 11142 | 13318 | 20412 | 20422 | |
| 21368 | 26287 | 29401 | 36219 | 39998 | 53475 | | | | |
| 172 | 206 | 323 | 2918 | 6547 | 11296 | 12985 | 18361 | 25257 | 26261 |
| 28464 | 32415 | 33575 | 53342 | 53792 | | | | | |
| 517 | 689 | 1458 | 3764 | 4738 | 6395 | 12184 | 14460 | 16822 | 22290 |
| 33094 | 38976 | 41535 | 43310 | 45909 | | | | | |
| 475 | 762 | 794 | 16878 | 25613 | 26912 | 27498 | 28702 | 30147 | |
| 30402 | 30480 | 40097 | 49193 | 51015 | 52390 | | | | |
| 3582 | 6978 | 16762 | 18054 | 21006 | 23402 | 24053 | 24684 | 32380 | |
| 34957 | 36704 | 38720 | 48479 | | | | | | |
| 3092 | 7012 | 7705 | 12494 | 12593 | 22146 | 25810 | 31500 | 48236 | |
| 49750 | 53385 | 53483 | 53758 | | | | | | |
| 14340 | 14744 | 16962 | 24367 | 25385 | 28318 | 30752 | 38563 | | |
| 47016 | 50468 | 50926 | 52848 | 53000 | 4600 | 5410 | 6591 | 9437 | 16713 |
| 23711 | 25180 | 34179 | 34991 | 45491 | 52486 | 52838 | 53988 | | |
| 9551 | 15754 | 22520 | 24032 | 25914 | 27722 | 29829 | 31308 | | |
| 33362 | 34465 | 47258 | 50435 | 50746. | | | | | |

21. A transmission method comprising:

performing LDPC coding on a basis of a parity check matrix of an LDPC code with a code length N of 69120 bits and a coding rate r of 7/16;

performing group-wise interleaving in which the LDPC code is interleaved in units of bit groups of 360 bits;

mapping the LDPC code to one of 4096 signal points of uniform constellation (UC) in 4096 quadrature amplitude modulation (4096QAM) on a 12-bit basis to generate a transmission signal for transmission; and transmitting the transmission signal, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 163, 174, 26, 190, 68, 80, 112, 146, 97, 44, 156, 134, 51, 167, 19, 127, 145, 102, 20, 58, 30, 9, 153, 143, 32, 63, 189, 180, 110, 41, 101, 166, 104, 138, 89, 42, 27, 8, 161, 67, 72, 81, 106, 132, 175, 107, 116, 186, 108, 13, 96, 154, 10, 103, 139, 99, 164, 29, 12, 118, 123, 109, 133, 61, 64, 0, 128, 17, 6, 45, 159, 1, 66, 24, 38, 33, 95, 187, 50, 120, 21, 168, 182, 184, 141, 148, 31, 79, 25, 144, 170, 18, 176, 135, 183, 7, 90, 52, 94, 77, 65, 3, 15, 85, 43, 100, 35, 124, 39, 57, 78, 88, 70, 76, 171, 149, 121, 125, 84, 16, 140, 40, 150, 157, 36, 48, 162, 2, 62, 22, 147, 83, 53, 82, 177, 98, 115, 69, 105, 151, 136, 181, 56, 173, 122, 111, 47, 179, 191, 119, 87, 178, 155, 131, 185, 91, 60, 55, 54, 37, 172, 169, 4, 188, 158, 11, 59, 160, 129, 5, 34, 14, 137, 117, 126, 114, 49, 73, 74, 28, 75, 152, 142, 71, 23, 86, 93, 130, 92, 113, 46, 165, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |

-continued

| | | | | |
|---|---|---|---|---|
| 2767 | 3953 | 4221 | 30887 | 34291 |
| 2242 | 2335 | 4254 | 31326 | 36839 |
| 1652 | 3276 | 4195 | 6960 | 23609 |
| 1091 | 1113 | 1669 | 9056 | 16776 |
| 2487 | 3652 | 4670 | 6131 | 34644 |
| 302 | 1753 | 3905 | 17009 | 21920 |
| 222 | 1322 | 1942 | 33666 | 36472 |
| 610 | 2708 | 4634 | 17641 | 35678 |
| 363 | 2202 | 3152 | 7833 | 27924 |
| 1851 | 3837 | 4167 | 25505 | 33398 |
| 1057 | 2960 | 3952 | 17247 | 35467 |
| 173 | 1598 | 3061 | 28458 | 36252 |
| 585 | 593 | 1049 | 10807 | 28267 |
| 122 | 277 | 2230 | 16115 | 25459 |
| 366 | 2458 | 4321 | 12655 | 13600 |
| 1611 | 1691 | 2543 | 18867 | 35201 |
| 1831 | 4355 | 4649 | 4774 | 24781 |
| 9157 | 18312 | 20409 | 23571 | 31607 |
| 14457 | 17051 | 29658 | 35875 | 37742 |
| 7110 | 15010 | 19055 | 36741 | 37883 |
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

22. A reception device comprising:

processing circuitry configured to:

receive a transmission signal including an LDPC code; and return a sequence of an LDPC code with a code length N of 69120 bits and a coding rate r of 7/16 after group-wise interleaving to an original sequence, the sequence being obtained from data transmitted by a transmission method including LDPC coding being performed on a basis of a parity check matrix of the LDPC code, group-wise interleaving being performed in which the LDPC code is interleaved in units of bit groups of 360 bits, and the LDPC code being mapped to one of 4096 signal points of uniform constellation (UC) of 4096 quadrature amplitude modulation (4096QAM) on a 12-bit basis, wherein in the group-wise interleaving, an (i+1)th bit group from a head of the LDPC code is set as a bit group i, and a sequence of bit groups 0 to 191 of the 69120-bit LDPC code is interleaved into a sequence of bit groups 163, 174, 26, 190, 68, 80, 112, 146, 97, 44, 156, 134, 51, 167, 19, 127, 145, 102, 20, 58, 30, 9, 153, 143, 32, 63, 189, 180, 110, 41, 101, 166, 104, 138, 89, 42, 27, 8, 161, 67, 72, 81, 106, 132, 175, 107, 116, 186, 108, 13, 96, 154, 10, 103, 139, 99, 164, 29, 12, 118, 123, 109, 133, 61, 64, 0, 128, 17, 6, 45, 159, 1, 66, 24, 38, 33, 95, 187, 50, 120, 21, 168, 182, 184, 141, 148, 31, 79, 25, 144, 170, 18, 176, 135, 183, 7, 90, 52, 94, 77, 65, 3, 15, 85, 43, 100, 35, 124, 39, 57, 78, 88, 70, 76, 171, 149, 121, 125, 84, 16, 140, 40, 150, 157, 36, 48, 162, 2, 62, 22, 147, 83, 53, 82, 177, 98, 115, 69, 105, 151, 136, 181, 56, 173, 122, 111, 47, 179, 191, 119, 87, 178, 155, 131, 185, 91, 60, 55, 54, 37, 172, 169, 4, 188, 158, 11, 59, 160, 129, 5, 34, 14, 137, 117, 126, 114, 49, 73, 74, 28, 75, 152, 142, 71, 23, 86, 93, 130, 92, 113, 46, 165, the parity check matrix includes an A matrix of M1 rows and K columns represented by a predetermined value M1 and an information length K=N×r of the LDPC code, the A matrix being an upper left matrix of the parity check matrix, a B matrix of M1 rows and M1 columns, having a step structure adjacent to right of the A matrix, a Z matrix of M1 rows and N−K−M1 columns, the Z matrix being a zero matrix adjacent to right of the B matrix, a C matrix of N−K−M1 rows and K+M1 columns, adjacent to below the A matrix and the B matrix, and a D matrix of N−K−M1 rows and N−K−M1 columns, the D matrix being an identity matrix adjacent to right of the C matrix, the predetermined value M1 is 4680, the A matrix and the C matrix are represented by a parity check matrix initial value table, and the parity check matrix initial value table is a table representing positions of elements of 1 of the A matrix and the C matrix for every 360 columns, and is

| | | | | | | | | | | |
|---|---|---|---|---|---|---|---|---|---|---|
| 1433 | 3551 | 5930 | 8293 | 11715 | 12425 | 14264 | 17335 | 22718 | 36614 | 38303 |
| 894 | 2650 | 5160 | 5232 | 7528 | 9399 | 10347 | 24238 | 26882 | 29766 | 32375 |
| 1450 | 3997 | 6744 | 7562 | 15569 | 23016 | 27200 | 29193 | 32849 | 33254 | 38785 |
| 864 | 3803 | 6092 | 8688 | 10188 | 12474 | 22379 | 23067 | 27329 | 32483 | 38596 |
| 2013 | 3598 | 5353 | 11116 | 16065 | 30523 | 31706 | 31920 | 35688 | 36896 | 37067 |
| 1058 | 2985 | 6167 | 6222 | 9627 | 20193 | 20308 | 20842 | 22592 | 26702 | 38094 |
| 1148 | 4564 | 10015 | 10902 | 13059 | 15423 | 19165 | 20249 | 22138 | 24136 | 24267 |
| 653 | 3611 | 6814 | 8234 | 14859 | 21339 | 21448 | 24410 | 26141 | 26425 | 38277 |

-continued

| | | | | | | | | | | |
|---|---|---|---|---|---|---|---|---|---|---|
| 342 | 1992 | 4954 | 5102 | 7780 | 15322 | 20102 | 22040 | 24154 | 27668 | 38424 |
| 2771 | 2837 | 7858 | 16144 | 20043 | 20758 | 21990 | 25754 | 32232 | 37322 | 37703 |
| 624 | 948 | 7919 | 10291 | 21186 | 24186 | 25035 | 25311 | 25665 | 30131 | 37831 |
| 438 | 1571 | 5061 | 16288 | 26760 | 26831 | 28652 | 30764 | 35086 | 35358 | 36233 |
| 3530 | 4053 | 9005 | 9297 | 18544 | 19579 | 19981 | 26348 | 34159 | 36716 | 38809 |
| 1101 | 3898 | 13807 | 14319 | 14708 | 17491 | 18247 | 19249 | 26016 | 29336 | 34927 |
| 1573 | 4387 | 7057 | 7652 | 10426 | 12219 | 14867 | 18658 | 19508 | 24925 | 33176 |
| 852 | 959 | 6340 | 8638 | 8740 | 17879 | 17993 | 28036 | 32872 | 33990 | 36190 |
| 913 | 3965 | 9852 | 9931 | 12792 | 13503 | 16904 | 21072 | 27616 | 29701 | 30144 |
| 541 | 4496 | 6682 | 10168 | 16470 | 28558 | 29133 | 33523 | 33712 | 35456 | 37857 |
| 930 | 1456 | 9624 | 12957 | 17441 | 20943 | 23911 | 27488 | 27572 | 28970 | 38385 |
| 762 | 3464 | 10205 | 13291 | 13778 | 21278 | 24444 | 25977 | 26107 | 28740 | 37946 |
| 962 | 2901 | 5701 | 11153 | 14516 | 18395 | 18421 | 19375 | 20526 | 29455 | 38178 |
| 1068 | 3731 | 5566 | 5690 | 18953 | 21960 | 23425 | 25481 | 26598 | 35770 | 38577 |
| 385 | 2499 | 14210 | 15434 | 15795 | 17534 | 26276 | 26999 | 30828 | 31237 | 31570 |
| 712 | 4041 | 6437 | 9346 | 11248 | 13001 | 19788 | 23997 | 25381 | 35072 | 37264 |
| 1541 | 3171 | 9483 | 9780 | 11542 | 18579 | 19629 | 26436 | 26510 | 26530 | 29842 |
| 2826 | 3355 | 7323 | 9453 | 11577 | 23289 | 24321 | 30276 | 31560 | 33505 | 35115 |
| 2607 | 4113 | 13679 | 14818 | 18726 | 19373 | 19484 | 25852 | 28394 | 29075 | 31499 |
| 101 | 3335 | 5484 | 8378 | 10366 | 11346 | 18498 | 22065 | 23394 | 24120 | 28534 |
| 2037 | 3746 | 8809 | 11429 | 18345 | 19858 | 20305 | 20657 | 23642 | 29075 | 32758 |
| 1342 | 1353 | 9580 | 11652 | 12352 | 13162 | 24304 | 25782 | 37628 | 38319 | 38739 |
| 4289 | 4537 | 7789 | 12239 | 12318 | 25144 | 25583 | 27760 | 29935 | 30001 | 33627 |
| 1407 | 2104 | 7593 | 13341 | 13772 | 15658 | 18768 | 22949 | 26269 | 35834 | 37053 |
| 283 | 3666 | 7953 | 8498 | 10715 | 15227 | 15344 | 21624 | 23277 | 23681 | 24658 |
| 1039 | 2615 | 8067 | 10524 | 11121 | 17519 | 17980 | 22329 | 28039 | 30188 | 31876 |
| 2853 | 4138 | 11810 | 11888 | 15736 | 17340 | 18161 | 21094 | 23337 | 29136 | 36861 |
| 732 | 3115 | 12067 | 19926 | 24457 | 24863 | 30681 | 30844 | 33326 | 34660 | 36203 |
| 1689 | 4238 | 5000 | 6964 | 13104 | 17145 | 18382 | 18810 | 21246 | 27798 | 34365 |
| 1988 | 4480 | 6362 | 19230 | 19702 | 20121 | 24061 | 25225 | 32060 | 33790 | 34882 |
| 782 | 3030 | 10663 | 13188 | 15079 | 24594 | 27063 | 29207 | 31128 | 32035 | 38604 |
| 2160 | 3389 | 8023 | 13978 | 15900 | 19635 | 20416 | 22839 | 33076 | 34962 | 38577 |
| 1639 | 4378 | 8166 | 8781 | 22347 | 28062 | 29530 | 30459 | 30907 | 32229 | 37670 |
| 1302 | 3700 | 6531 | 9943 | 20841 | 21722 | 28860 | 30397 | 30966 | 34328 | 34469 |
| 2580 | 3067 | 14591 | 17305 | 24991 | 27155 | 28129 | 31435 | 33702 | 34742 | 38176 |
| 878 | 2302 | 3513 | 8792 | 30097 | | | | | | |
| 27 | 165 | 1499 | 11445 | 26229 | | | | | | |
| 2740 | 3378 | 4070 | 8121 | 11725 | | | | | | |
| 464 | 695 | 2670 | 19972 | 31016 | | | | | | |
| 58 | 551 | 769 | 13142 | 18176 | | | | | | |
| 1818 | 2794 | 3077 | 14099 | 28393 | | | | | | |
| 649 | 4125 | 4624 | 29698 | 32032 | | | | | | |
| 200 | 2480 | 2912 | 23789 | 36598 | | | | | | |
| 212 | 3477 | 4526 | 10049 | 30926 | | | | | | |
| 901 | 2299 | 3757 | 10605 | 24358 | | | | | | |
| 321 | 1488 | 1718 | 24930 | 25738 | | | | | | |
| 2283 | 3823 | 3943 | 16768 | 35564 | | | | | | |
| 253 | 2932 | 4234 | 21419 | 29606 | | | | | | |
| 2701 | 3576 | 4425 | 9250 | 24023 | | | | | | |
| 2217 | 3403 | 4654 | 14977 | 23115 | | | | | | |
| 817 | 2872 | 3491 | 17773 | 23918 | | | | | | |
| 1783 | 1838 | 4330 | 11645 | 36545 | | | | | | |
| 1231 | 3435 | 4503 | 9035 | 29888 | | | | | | |
| 826 | 1836 | 2994 | 22108 | 22827 | | | | | | |
| 229 | 1417 | 2078 | 14324 | 17714 | | | | | | |
| 567 | 3244 | 3728 | 22202 | 33883 | | | | | | |
| 799 | 1180 | 1329 | 12496 | 22390 | | | | | | |
| 549 | 1311 | 3657 | 17564 | 35009 | | | | | | |
| 132 | 517 | 3180 | 5304 | 35588 | | | | | | |
| 2767 | 3953 | 4221 | 30887 | 34291 | | | | | | |
| 2242 | 2335 | 4254 | 31326 | 36839 | | | | | | |
| 1652 | 3276 | 4195 | 6960 | 23609 | | | | | | |
| 1091 | 1113 | 1669 | 9056 | 16776 | | | | | | |
| 2487 | 3652 | 4670 | 6131 | 34644 | | | | | | |
| 302 | 1753 | 3905 | 17009 | 21920 | | | | | | |
| 222 | 1322 | 1942 | 33666 | 36472 | | | | | | |
| 610 | 2708 | 4634 | 17641 | 35678 | | | | | | |
| 363 | 2202 | 3152 | 7833 | 27924 | | | | | | |
| 1851 | 3837 | 4167 | 25505 | 33398 | | | | | | |
| 1057 | 2960 | 3952 | 17247 | 35467 | | | | | | |
| 173 | 1598 | 3061 | 28458 | 36252 | | | | | | |
| 585 | 593 | 1049 | 10807 | 28267 | | | | | | |
| 122 | 277 | 2230 | 16115 | 25459 | | | | | | |
| 366 | 2458 | 4321 | 12655 | 13600 | | | | | | |
| 1611 | 1691 | 2543 | 18867 | 35201 | | | | | | |
| 1831 | 4355 | 4649 | 4774 | 24781 | | | | | | |
| 9157 | 18312 | 20409 | 23571 | 31607 | | | | | | |
| 14457 | 17051 | 29658 | 35875 | 37742 | | | | | | |
| 7110 | 15010 | 19055 | 36741 | 37883 | | | | | | |

-continued

| | | | | |
|---|---|---|---|---|
| 5419 | 17091 | 17716 | 18981 | 31131 |
| 15196 | 21587 | 28478 | 32583 | 36053 |
| 17134 | 18820 | 32977 | 34175 | 36060 |
| 15599 | 21709 | 22462 | 28663 | 33979 |
| 4691 | 13050 | 23737 | 30447 | 37128 |
| 22733 | 24839 | 26808 | 37191 | 37396 |
| 8896 | 14951 | 16202 | 26775 | 29470 |
| 13355 | 19354 | 27988 | 36027 | 37312 |
| 8938 | 11340 | 12434 | 19496 | 37986 |
| 5876 | 25181 | 32766 | 33412 | 35330. |

* * * * *